United States Patent
Rudy et al.

(10) Patent No.: US 12,000,552 B2
(45) Date of Patent: *Jun. 4, 2024

(54) LASER-BASED FIBER-COUPLED WHITE LIGHT SYSTEM FOR A VEHICLE

(71) Applicant: KYOCERA SLD Laser, Inc., Goleta, CA (US)

(72) Inventors: Paul Rudy, Manhattan Beach, CA (US); James W. Raring, Santa Barbara, CA (US)

(73) Assignee: KYOCERA SLD Laser, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/380,217

(22) Filed: Apr. 10, 2019

(65) Prior Publication Data
US 2020/0232618 A1 Jul. 23, 2020

Related U.S. Application Data

(63) Continuation-in-part of application No. 16/252,570, filed on Jan. 18, 2019, now Pat. No. 11,884,202.

(51) Int. Cl.
*F21S 41/16* (2018.01)
*B60Q 1/04* (2006.01)
(Continued)

(52) U.S. Cl.
CPC .............. *F21S 41/16* (2018.01); *B60Q 1/04* (2013.01); *B60Q 3/62* (2017.02); *F21S 41/24* (2018.01);
(Continued)

(58) Field of Classification Search
CPC ......... F21K 9/61; F21S 43/237; F21S 43/245; F21S 41/176; F21S 2/00; F21S 2/005;
(Continued)

(56) References Cited

U.S. PATENT DOCUMENTS 1,655,371 A 1/1928 Keay
3,829,675 A 8/1974 Mariani
(Continued)

FOREIGN PATENT DOCUMENTS

CN 1171692 1/1998
CN 1452254 10/2003
(Continued)

OTHER PUBLICATIONS

Definition of Collimate, retrieved from Merriam Webster Website on Feb. 10, 2021 (Year: 2021).*
(Continued)

*Primary Examiner* — Jia X Pan
*Assistant Examiner* — Steven Y Horikoshi
(74) *Attorney, Agent, or Firm* — Kilpatrick Townsend & Stockton LLP

(57) ABSTRACT

A laser-based fiber-coupled white light system is provided. The system includes a laser device comprising a gallium and nitrogen containing emitting region having an output facet configured to output a laser emission with a first wavelength ranging from 385 nm to 495 nm. The system further includes a phosphor member integrated with light collimation elements. The phosphor member converts the laser emission with the first wavelength to a phosphor emission with a second wavelength in either reflective or transmissive mode and mixed partially with laser emission to produce a white light emission. The system includes a transport fiber coupled to the phosphor member via the light collimation elements to receive the white light emission and deliver the white light emission remotely to a lighthead for either directly distributing white light on road or to a leaky fiber for illumination applications by side-scattering.

21 Claims, 37 Drawing Sheets

(51) Int. Cl.
| | |
|---|---|
| *B60Q 3/62* | (2017.01) |
| *F21S 41/24* | (2018.01) |
| *F21V 8/00* | (2006.01) |
| *H01S 5/0225* | (2021.01) |
| *H01S 5/22* | (2006.01) |
| *H01S 5/343* | (2006.01) |
| *H01L 33/00* | (2010.01) |

(52) U.S. Cl.
CPC ............ *G02B 6/001* (2013.01); *H01S 5/0225* (2021.01); *H01S 5/22* (2013.01); *H01S 5/34333* (2013.01); *H01L 33/0045* (2013.01)

(58) Field of Classification Search
CPC .. F21S 19/005; H01L 33/507; H01L 33/0045; G02B 6/0006; G02B 6/0008; H01S 5/0087; G02V 6/0028
See application file for complete search history.

(56) References Cited

U.S. PATENT DOCUMENTS

| | | | |
|---|---|---|---|
| 4,152,752 A | 5/1979 | Niemi | |
| 4,234,907 A | 11/1980 | Daniel | |
| 4,318,058 A | 3/1982 | Mito et al. | |
| 4,341,592 A | 7/1982 | Shortes et al. | |
| 4,523,806 A | 6/1985 | Kojima et al. | |
| 4,535,394 A | 8/1985 | Dugre | |
| 4,747,648 A | 5/1988 | Gilliland, III | |
| 4,763,975 A | 8/1988 | Scifres et al. | |
| 4,772,093 A | 9/1988 | Abele et al. | |
| 4,777,571 A | 10/1988 | Morgan | |
| 4,860,687 A | 8/1989 | Frijlink | |
| 4,911,102 A | 3/1990 | Manabe et al. | |
| 4,915,745 A | 4/1990 | Pollock et al. | |
| 5,208,307 A * | 5/1993 | Doi ...................... | C08F 210/00 526/262 |
| 5,297,227 A | 3/1994 | Brown et al. | |
| 5,301,090 A | 4/1994 | Hed | |
| 5,331,654 A | 7/1994 | Jewell et al. | |
| 5,334,277 A | 8/1994 | Nakamura | |
| 5,353,294 A * | 10/1994 | Shigeno ............... | H01S 5/02251 372/50.1 |
| 5,366,953 A | 11/1994 | Char et al. | |
| 5,527,417 A | 6/1996 | Iida et al. | |
| 5,535,230 A | 7/1996 | Abe | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,724,464 A | 3/1998 | Kozuka | |
| 5,760,484 A | 6/1998 | Lee et al. | |
| 5,821,555 A | 10/1998 | Saito et al. | |
| 5,888,907 A | 3/1999 | Tomoyasu et al. | |
| 5,901,267 A | 5/1999 | Lee | |
| 5,926,493 A | 7/1999 | O'Brien et al. | |
| 5,951,923 A | 9/1999 | Horie et al. | |
| 5,982,969 A * | 11/1999 | Sugiyama ............ | B60Q 1/26 362/554 |
| 6,065,882 A | 5/2000 | Roller et al. | |
| 6,069,394 A | 5/2000 | Hashimoto et al. | |
| 6,072,197 A | 6/2000 | Horino et al. | |
| 6,129,900 A | 10/2000 | Satoh et al. | |
| 6,147,953 A | 11/2000 | Duncan | |
| 6,150,943 A | 11/2000 | Lehman et al. | |
| 6,153,010 A | 11/2000 | Kiyoku et al. | |
| 6,188,495 B1 * | 2/2001 | Inoue ................... | G02B 6/4246 398/139 |
| 6,195,381 B1 | 2/2001 | Botez et al. | |
| 6,234,640 B1 | 5/2001 | Belfer | |
| 6,239,454 B1 | 5/2001 | Glew et al. | |
| 6,273,948 B1 | 8/2001 | Porowski et al. | |
| 6,283,597 B1 | 9/2001 | Jorke | |
| 6,296,383 B1 | 10/2001 | Henningsen | |
| 6,303,405 B1 | 10/2001 | Yoshida et al. | |
| 6,335,923 B2 | 1/2002 | Kubo et al. | |
| 6,379,985 B1 | 4/2002 | Cervantes et al. | |
| 6,398,867 B1 | 6/2002 | D'Evelyn et al. | |
| 6,406,540 B1 | 6/2002 | Harris et al. | |
| 6,451,157 B1 | 9/2002 | Hubacek | |
| 6,489,636 B1 | 12/2002 | Goetz et al. | |
| 6,547,249 B2 | 4/2003 | Collins, III et al. | |
| 6,567,574 B1 | 5/2003 | Ma et al. | |
| 6,586,762 B2 | 7/2003 | Kozaki | |
| 6,596,079 B1 | 7/2003 | Vaudo et al. | |
| 6,631,150 B1 | 10/2003 | Najda | |
| 6,635,904 B2 | 10/2003 | Goetz et al. | |
| 6,639,925 B2 | 10/2003 | Niwa et al. | |
| 6,656,615 B2 | 12/2003 | Dwilinski et al. | |
| 6,680,959 B2 | 1/2004 | Tanabe et al. | |
| 6,681,064 B2 | 1/2004 | Naniwae | |
| 6,686,608 B1 | 2/2004 | Takahira | |
| 6,734,461 B1 | 5/2004 | Shiomi et al. | |
| 6,755,932 B2 | 6/2004 | Masuda et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,791,103 B2 | 9/2004 | Nakamura et al. | |
| 6,809,781 B2 | 10/2004 | Setlur et al. | |
| 6,814,811 B2 | 11/2004 | Ose | |
| 6,858,081 B2 | 2/2005 | Biwa et al. | |
| 6,858,882 B2 | 2/2005 | Tsuda et al. | |
| 6,861,130 B2 | 3/2005 | D'Evelyn et al. | |
| 6,920,166 B2 | 7/2005 | Akasaka et al. | |
| 6,969,348 B2 | 11/2005 | Araii | |
| 7,001,577 B2 | 2/2006 | Zimmerman et al. | |
| 7,009,199 B2 | 3/2006 | Hall | |
| 7,019,325 B2 | 3/2006 | Li et al. | |
| 7,026,756 B2 | 4/2006 | Shimizu et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,078,731 B2 | 7/2006 | D'Evelyn et al. | |
| 7,098,487 B2 | 8/2006 | D'Evelyn et al. | |
| 7,112,829 B2 | 9/2006 | Picard et al. | |
| 7,119,372 B2 | 10/2006 | Stokes et al. | |
| 7,119,487 B2 | 10/2006 | Ikeda | |
| 7,125,453 B2 | 10/2006 | D'Evelyn et al. | |
| 7,128,849 B2 | 10/2006 | Sellur et al. | |
| 7,135,348 B2 | 11/2006 | Okuyama et al. | |
| 7,141,829 B2 | 11/2006 | Takahashi | |
| 7,160,531 B1 | 1/2007 | Jacques et al. | |
| 7,170,095 B2 | 1/2007 | Vaudo et al. | |
| 7,175,704 B2 | 2/2007 | D'Evelyn et al. | |
| 7,198,671 B2 | 4/2007 | Ueda | |
| 7,200,127 B1 | 4/2007 | Lee et al. | |
| 7,206,133 B2 | 4/2007 | Cassarly et al. | |
| 7,220,324 B2 | 5/2007 | Baker et al. | |
| 7,252,712 B2 | 8/2007 | Dwilinski et al. | |
| 7,303,630 B2 | 12/2007 | Motoki et al. | |
| 7,312,156 B2 | 12/2007 | Granneman et al. | |
| 7,316,746 B2 | 1/2008 | D'Evelyn et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,368,015 B2 | 5/2008 | D'Evelyn et al. | |
| 7,381,391 B2 | 6/2008 | Spencer et al. | |
| 7,390,359 B2 | 6/2008 | Miyanaga et al. | |
| 7,420,261 B2 | 9/2008 | Dwilinski et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,569,206 B2 | 8/2009 | Spencer et al. | |
| 7,598,104 B2 | 10/2009 | Teng et al. | |
| 7,625,446 B2 | 12/2009 | D'Evelyn et al. | |
| 7,642,122 B2 | 1/2010 | Tysoe et al. | |
| 7,667,238 B2 | 2/2010 | Erchak et al. | |
| 7,691,658 B2 | 4/2010 | Kaeding et al. | |
| 7,702,354 B2 | 4/2010 | Kawasaki | |

(56) References Cited

U.S. PATENT DOCUMENTS

| | | |
|---|---|---|
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,769,066 B2 | 8/2010 | Chakraborty et al. |
| 7,806,078 B2 | 10/2010 | Yoshida |
| 7,842,958 B1 | 11/2010 | Sekine et al. |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,100,590 B2 | 1/2012 | Huang et al. |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,178 B2 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,350,273 B2 | 1/2013 | Vielemeyer |
| 8,351,478 B2 | 1/2013 | Raring et al. |
| 8,354,678 B1 | 1/2013 | D'Evelyn et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,494,017 B2 | 7/2013 | Sharma et al. |
| 8,509,275 B1 | 8/2013 | Raring et al. |
| 8,510,979 B1 | 8/2013 | Mortimer |
| 8,582,038 B1 | 11/2013 | Raring et al. |
| 8,591,062 B2 | 11/2013 | Hussell et al. |
| 8,593,980 B2 | 11/2013 | Bae et al. |
| 8,634,442 B1 | 1/2014 | Raring et al. |
| D704,881 S | 5/2014 | Johnson |
| 8,717,505 B1 | 5/2014 | Raring et al. |
| 8,728,842 B2 | 5/2014 | Raring et al. |
| 8,729,559 B2 | 5/2014 | Krames et al. |
| 8,730,410 B1 | 5/2014 | Raring et al. |
| 8,749,719 B2 | 6/2014 | Raring et al. |
| 8,773,598 B2 | 7/2014 | Raring et al. |
| 8,833,564 B1 | 9/2014 | Yun et al. |
| 8,837,546 B1 | 9/2014 | Raring et al. |
| 8,847,249 B2 | 9/2014 | Raring et al. |
| 8,869,672 B2 | 10/2014 | Smith |
| 8,878,230 B2 | 11/2014 | D'Evelyn |
| 8,908,731 B1 | 12/2014 | Raring et al. |
| 8,975,615 B2 | 3/2015 | Felker et al. |
| 8,979,999 B2 | 3/2015 | D'Evelyn |
| 9,013,638 B2 | 4/2015 | Raring et al. |
| 9,014,229 B1 | 4/2015 | Raring et al. |
| 9,019,437 B2 | 4/2015 | Raring et al. |
| 9,025,635 B2 | 5/2015 | Goutain et al. |
| 9,048,170 B2 | 6/2015 | Pfister et al. |
| 9,071,772 B2 | 6/2015 | Raring et al. |
| 9,250,044 B1 | 2/2016 | Raring et al. |
| 9,318,875 B1 | 4/2016 | Goutain |
| 9,362,715 B2 | 6/2016 | Sztein et al. |
| 9,531,164 B2 | 12/2016 | Raring et al. |
| 9,543,738 B2 | 1/2017 | Raring et al. |
| 9,595,813 B2 | 3/2017 | Raring et al. |
| 9,714,749 B1 * | 7/2017 | Salter .................... F21S 43/50 |
| 9,800,017 B1 | 10/2017 | Raring et al. |
| 9,829,778 B2 | 11/2017 | Raring et al. |
| 9,829,780 B2 | 11/2017 | Raring et al. |
| 10,084,281 B1 | 9/2018 | Raring et al. |
| 10,108,079 B2 | 10/2018 | Raring et al. |
| 10,205,300 B1 | 2/2019 | Raring et al. |
| 10,222,529 B1 | 3/2019 | Cohoon et al. |
| 10,297,977 B1 | 5/2019 | Raring et al. |
| 10,551,542 B1 | 2/2020 | Tan et al. |
| 10,732,340 B2 | 8/2020 | Schubert et al. |
| 10,904,506 B1 | 1/2021 | Raring et al. |
| 11,016,378 B2 | 5/2021 | Raring et al. |
| 2001/0011935 A1 | 8/2001 | Lee et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0050517 A1 | 5/2002 | Olivia |
| 2002/0085603 A1 | 7/2002 | Okumura |
| 2002/0105986 A1 | 8/2002 | Yamasaki |
| 2002/0159741 A1 * | 10/2002 | Graves .................... G02B 6/001 |
| | | 385/133 |
| 2002/0171092 A1 | 11/2002 | Goetz et al. |
| 2002/0189532 A1 | 12/2002 | Motoki et al. |
| 2002/0196414 A1 | 12/2002 | Manni et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0063476 A1 * | 4/2003 | English .................... F21S 45/48 |
| | | 362/545 |
| 2003/0129810 A1 | 7/2003 | Barth et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0147261 A1 | 8/2003 | Babbitt et al. |
| 2003/0178617 A1 | 9/2003 | Appenzeller et al. |
| 2003/0183155 A1 | 10/2003 | D'Evelyn et al. |
| 2003/0185265 A1 | 10/2003 | Henrichs |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0223250 A1 | 12/2003 | Ballen et al. |
| 2003/0232512 A1 | 12/2003 | Dickinson et al. |
| 2004/0000266 A1 | 1/2004 | D'Evelyn et al. |
| 2004/0012027 A1 | 1/2004 | Keller et al. |
| 2004/0023427 A1 | 2/2004 | Chua et al. |
| 2004/0025787 A1 | 2/2004 | Selbrede et al. |
| 2004/0031978 A1 | 2/2004 | D'Evelyn et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0105481 A1 | 6/2004 | Ishida et al. |
| 2004/0112866 A1 | 6/2004 | Maleville et al. |
| 2004/0113141 A1 | 6/2004 | Isuda et al. |
| 2004/0137265 A1 | 7/2004 | Shimada et al. |
| 2004/0146264 A1 | 7/2004 | Auner et al. |
| 2004/0149998 A1 | 8/2004 | Henson et al. |
| 2004/0151222 A1 | 8/2004 | Sekine |
| 2004/0165635 A1 | 8/2004 | Sugimoto et al. |
| 2004/0179777 A1 | 9/2004 | Buelow et al. |
| 2004/0196877 A1 | 10/2004 | Kawakami et al. |
| 2004/0213317 A1 | 10/2004 | Hashimoto et al. |
| 2004/0222357 A1 | 11/2004 | King et al. |
| 2004/0233950 A1 | 11/2004 | Furukawa et al. |
| 2004/0245535 A1 | 12/2004 | D'Evelyn et al. |
| 2004/0247275 A1 | 12/2004 | Vakhshoori et al. |

(56) References Cited

U.S. PATENT DOCUMENTS

| | | |
|---|---|---|
| 2004/0259331 A1 | 12/2004 | Ogihara et al. |
| 2004/0262624 A1 | 12/2004 | Akita et al. |
| 2004/0263074 A1 | 12/2004 | Baroky et al. |
| 2005/0040384 A1 | 2/2005 | Tanaka et al. |
| 2005/0072986 A1 | 4/2005 | Sasaoka |
| 2005/0098095 A1 | 5/2005 | D'Evelyn et al. |
| 2005/0105572 A1 | 5/2005 | Simoun-Ou et al. |
| 2005/0128469 A1 | 6/2005 | Hall et al. |
| 2005/0152820 A1 | 7/2005 | D'Evelyn et al. |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0231973 A1* | 10/2005 | Cassarly ................ G02B 6/001 362/551 |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0049421 A1 | 3/2006 | Suehiro et al. |
| 2006/0056855 A1 | 3/2006 | Nakagawa et al. |
| 2006/0060131 A1 | 3/2006 | Atanackovic |
| 2006/0060833 A1 | 3/2006 | Bruckner et al. |
| 2006/0066319 A1 | 3/2006 | Dallenbach et al. |
| 2006/0077795 A1 | 4/2006 | Kitahara et al. |
| 2006/0078009 A1 | 4/2006 | Katayama et al. |
| 2006/0078022 A1 | 4/2006 | Kozaki et al. |
| 2006/0078024 A1 | 4/2006 | Matsumura et al. |
| 2006/0079082 A1 | 4/2006 | Bruhns et al. |
| 2006/0086319 A1 | 4/2006 | Kasai et al. |
| 2006/0087864 A1* | 4/2006 | Peng ..................... G02B 6/001 362/554 |
| 2006/0096521 A1 | 5/2006 | D'Evelyn et al. |
| 2006/0110926 A1 | 5/2006 | Hu et al. |
| 2006/0113553 A1 | 6/2006 | Srivastava et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0138431 A1 | 6/2006 | Dwilinski et al. |
| 2006/0139926 A1 | 6/2006 | Morioka et al. |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0215127 A1 | 9/2006 | Peterson |
| 2006/0216416 A1 | 9/2006 | Sumakeris et al. |
| 2006/0256482 A1 | 11/2006 | Araki et al. |
| 2006/0256559 A1 | 11/2006 | Bitar |
| 2006/0262243 A1 | 11/2006 | Lester et al. |
| 2006/0279662 A1 | 12/2006 | Kapellner et al. |
| 2006/0288928 A1 | 12/2006 | Eom et al. |
| 2007/0012940 A1 | 1/2007 | Suh et al. |
| 2007/0019408 A1 | 1/2007 | McGuire et al. |
| 2007/0029571 A1 | 2/2007 | Hanaoka et al. |
| 2007/0036186 A1 | 2/2007 | Corzine et al. |
| 2007/0039226 A1 | 2/2007 | Stokes |
| 2007/0057337 A1 | 3/2007 | Kano et al. |
| 2007/0081857 A1 | 4/2007 | Yoon |
| 2007/0086916 A1 | 4/2007 | LeBoeuf et al. |
| 2007/0091634 A1* | 4/2007 | Sakurada ............. G02B 6/0006 362/555 |
| 2007/0093073 A1 | 4/2007 | Farrell, Jr. et al. |
| 2007/0101932 A1 | 5/2007 | Schowalter et al. |
| 2007/0105351 A1 | 5/2007 | Motoki et al. |
| 2007/0109463 A1 | 5/2007 | Hutchins |
| 2007/0109504 A1 | 5/2007 | Miyazawa |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0210324 A1 | 9/2007 | Kawaguchi et al. |
| 2007/0215033 A1 | 9/2007 | Imaeda et al. |
| 2007/0215887 A1 | 9/2007 | D'Evelyn et al. |
| 2007/0217462 A1 | 9/2007 | Yamasaki |
| 2007/0218703 A1 | 9/2007 | Kaeding et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 | 2/2008 | Milshtein et al. |
| 2008/0049440 A1 | 2/2008 | Gaydoul |
| 2008/0054280 A1 | 3/2008 | Reginelli et al. |
| 2008/0068845 A1* | 3/2008 | Aida ................ B29D 11/00278 362/311.06 |
| 2008/0083741 A1 | 4/2008 | Giddings et al. |
| 2008/0083970 A1 | 4/2008 | Kamber et al. |
| 2008/0087919 A1 | 4/2008 | Tyspe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0142779 A1 | 6/2008 | Yang et al. |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0192458 A1 | 8/2008 | Li |
| 2008/0193363 A1 | 8/2008 | Tsuji |
| 2008/0198881 A1 | 8/2008 | Farrell et al. |
| 2008/0205477 A1 | 8/2008 | Hama et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0251020 A1 | 10/2008 | Franken et al. |
| 2008/0252778 A1 | 10/2008 | Dunki-Jacobs |
| 2008/0259431 A1 | 10/2008 | Weichmann et al. |
| 2008/0262316 A1 | 10/2008 | Ajima et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0310182 A1 | 12/2008 | Meinl |
| 2008/0315179 A1 | 12/2008 | Kim et al. |
| 2009/0003400 A1 | 1/2009 | Nagahama et al. |
| 2009/0021723 A1 | 1/2009 | De Lega |

(56) References Cited

U.S. PATENT DOCUMENTS

| | | |
|---|---|---|
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0086170 A1 | 4/2009 | El-Ghoroury et al. |
| 2009/0086475 A1 | 4/2009 | Caruso et al. |
| 2009/0092536 A1 | 4/2009 | Kawabata et al. |
| 2009/0095973 A1 | 4/2009 | Tanaka et al. |
| 2009/0141242 A1 | 6/2009 | Silverstein et al. |
| 2009/0141765 A1 | 6/2009 | Kohda et al. |
| 2009/0153752 A1 | 6/2009 | Silverstein |
| 2009/0157229 A1 | 6/2009 | Rulkens et al. |
| 2009/0159869 A1 | 6/2009 | Ponce et al. |
| 2009/0166668 A1 | 7/2009 | Shakuda |
| 2009/0170224 A1 | 7/2009 | Urashima |
| 2009/0173957 A1 | 7/2009 | Brunner et al. |
| 2009/0218593 A1 | 9/2009 | Kamikawa et al. |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0252191 A1 | 10/2009 | Kubota et al. |
| 2009/0267100 A1 | 10/2009 | Miyake et al. |
| 2009/0273005 A1 | 11/2009 | Lin |
| 2009/0296018 A1 | 12/2009 | Harle et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321771 A1 | 12/2009 | Hattori et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0006875 A1 | 1/2010 | Naum et al. |
| 2010/0007852 A1 | 1/2010 | Bietry et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0046234 A1 | 2/2010 | Abu-Ageel |
| 2010/0075175 A1 | 3/2010 | Poblenz et al. |
| 2010/0080001 A1 | 4/2010 | Kunoh et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140630 A1 | 6/2010 | Hamaguchi et al. |
| 2010/0140745 A1 | 6/2010 | Khan et al. |
| 2010/0147210 A1 | 6/2010 | D'Evelyn |
| 2010/0150193 A1 | 6/2010 | Bhat et al. |
| 2010/0151194 A1 | 6/2010 | D'Evelyn |
| 2010/0165306 A1 | 7/2010 | McGettigan et al. |
| 2010/0187550 A1 | 7/2010 | Reed et al. |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0246159 A1 | 9/2010 | Wada |
| 2010/0276663 A1 | 11/2010 | Enya et al. |
| 2010/0290498 A1 | 11/2010 | Hata et al. |
| 2010/0295054 A1 | 11/2010 | Okamoto et al. |
| 2010/0304874 A1 | 12/2010 | Abatemaron |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0001431 A1* | 1/2011 | Brukilacchio ........... A61B 1/07 315/152 |
| 2011/0031508 A1 | 2/2011 | Hamaguchi et al. |
| 2011/0044022 A1 | 2/2011 | Ko et al. |
| 2011/0056429 A1 | 3/2011 | Raring et al. |
| 2011/0057187 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0122646 A1* | 5/2011 | Bickham ............. G02B 6/0003 362/554 |
| 2011/0122927 A1 | 5/2011 | Hikmet et al. |
| 2011/0129669 A1 | 6/2011 | Fujito et al. |
| 2011/0133489 A1 | 6/2011 | Hemeury et al. |
| 2011/0148280 A1* | 6/2011 | Kishimoto ............. F21S 41/322 313/483 |
| 2011/0150020 A1 | 6/2011 | Haase et al. |
| 2011/0164637 A1 | 7/2011 | Yoshizumi et al. |
| 2011/0164846 A1 | 7/2011 | Maeda et al. |
| 2011/0170569 A1 | 7/2011 | Tyagi et al. |
| 2011/0180781 A1 | 7/2011 | Raring et al. |
| 2011/0182056 A1 | 7/2011 | Trottier et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0204408 A1 | 8/2011 | McKenzie et al. |
| 2011/0215700 A1 | 9/2011 | Tong et al. |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0273906 A1 | 11/2011 | Boomgaarden et al. |
| 2011/0280032 A1* | 11/2011 | Kishimoto ............. F21S 41/645 362/538 |
| 2011/0281422 A1 | 11/2011 | Wang et al. |
| 2011/0286200 A1 | 11/2011 | Iimura et al. |
| 2011/0286484 A1 | 11/2011 | Raring et al. |
| 2011/0305000 A1 | 12/2011 | Bukesov et al. |
| 2012/0000415 A1 | 1/2012 | D'Evelyn et al. |
| 2012/0051377 A1 | 3/2012 | Liang et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0118223 A1 | 5/2012 | D'Evelyn |
| 2012/0119218 A1 | 5/2012 | Su |
| 2012/0137866 A1 | 6/2012 | D'Evelyn et al. |
| 2012/0170602 A1 | 7/2012 | Hikmet et al. |
| 2012/0178198 A1 | 7/2012 | Raring et al. |
| 2012/0187371 A1 | 7/2012 | Raring et al. |
| 2012/0199952 A1 | 8/2012 | D'Evelyn et al. |
| 2012/0205825 A1 | 8/2012 | Nagafuji et al. |
| 2012/0224374 A1 | 9/2012 | Aliberti |
| 2012/0224384 A1 | 9/2012 | Takahira et al. |
| 2012/0242912 A1 | 9/2012 | Kitano |
| 2012/0243203 A1 | 9/2012 | Koike et al. |
| 2012/0248483 A1 | 10/2012 | Beppo et al. |
| 2012/0314398 A1 | 12/2012 | Raring et al. |
| 2013/0001627 A1 | 1/2013 | Kinoshita et al. |
| 2013/0003403 A1 | 1/2013 | Takahira et al. |
| 2013/0010456 A1 | 1/2013 | Isha et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0088888 A1* | 4/2013 | Fewkes ................. G02B 6/001 362/558 |
| 2013/0119401 A1 | 5/2013 | D'Evelyn et al. |
| 2013/0155418 A1 | 6/2013 | Shaw et al. |
| 2013/0176705 A1 | 7/2013 | Ohta |
| 2013/0194821 A1 | 8/2013 | Maxik et al. |
| 2013/0201670 A1 | 8/2013 | Pickard et al. |

(56) References Cited

U.S. PATENT DOCUMENTS

| | | |
|---|---|---|
| 2013/0207148 A1 | 8/2013 | Krauter et al. |
| 2013/0208442 A1 | 8/2013 | Reiherzer |
| 2013/0229820 A1* | 9/2013 | Jutila .................. F21S 43/249 362/545 |
| 2013/0234111 A1 | 9/2013 | Plister et al. |
| 2013/0301288 A1 | 11/2013 | Kishimoto et al. |
| 2013/0314613 A1 | 11/2013 | Raring et al. |
| 2013/0314937 A1 | 11/2013 | Takahashi et al. |
| 2014/0050244 A1 | 2/2014 | Ohno et al. |
| 2014/0063837 A1 | 3/2014 | Rowlette, Jr. |
| 2014/0078764 A1 | 3/2014 | Aizawa |
| 2014/0079088 A1 | 3/2014 | Joseph |
| 2014/0086539 A1 | 3/2014 | Goutain et al. |
| 2014/0168942 A1 | 6/2014 | Kishimoto et al. |
| 2014/0247619 A1 | 9/2014 | Bennett et al. |
| 2014/0268815 A1* | 9/2014 | Li ............................ F21K 9/69 362/311.02 |
| 2014/0376246 A1 | 12/2014 | Yatsuda et al. |
| 2015/0055915 A1 | 2/2015 | Logunov et al. |
| 2015/0062953 A1 | 3/2015 | Woelfing et al. |
| 2015/0131306 A1 | 5/2015 | Genier et al. |
| 2015/0138511 A1 | 5/2015 | Domm |
| 2015/0222091 A1 | 8/2015 | Futami et al. |
| 2015/0229107 A1 | 8/2015 | McLaurin et al. |
| 2015/0267880 A1* | 9/2015 | Hadrath ................ G03B 33/06 362/84 |
| 2015/0286122 A1 | 10/2015 | Raring et al. |
| 2015/0323143 A1 | 11/2015 | Raring et al. |
| 2015/0346411 A1 | 12/2015 | Bauco et al. |
| 2015/0377430 A1 | 12/2015 | Bhakta |
| 2016/0061514 A1 | 3/2016 | Seo et al. |
| 2016/0084451 A1 | 3/2016 | Annen et al. |
| 2016/0088804 A1 | 3/2016 | Ooi et al. |
| 2016/0131331 A1 | 5/2016 | Parker |
| 2016/0131334 A1* | 5/2016 | Rousseau ........... G02B 27/0916 362/19 |
| 2016/0159273 A1 | 6/2016 | Nakazato |
| 2016/0236613 A1* | 8/2016 | Trier .................... B60Q 1/0035 |
| 2016/0245471 A1 | 8/2016 | Nakazato et al. |
| 2016/0268770 A1 | 9/2016 | Tazawa et al. |
| 2016/0281954 A1* | 9/2016 | Moisy ................. B60Q 1/2607 |
| 2016/0290584 A1 | 10/2016 | Nomura et al. |
| 2016/0327721 A1 | 11/2016 | Bauco et al. |
| 2017/0051883 A1 | 2/2017 | Raring et al. |
| 2017/0051884 A1* | 2/2017 | Raring ................ H01S 5/02469 |
| 2017/0051885 A1 | 2/2017 | Hirasawa et al. |
| 2017/0059763 A1 | 3/2017 | Lucrecio et al. |
| 2017/0071037 A1 | 3/2017 | Wu et al. |
| 2017/0072841 A1* | 3/2017 | Schabacker ............. B60Q 3/64 |
| 2017/0153319 A1 | 6/2017 | Villeneuve et al. |
| 2017/0314848 A1 | 11/2017 | Ammerman et al. |
| 2017/0327032 A1* | 11/2017 | Fimeri ................... B60R 1/1207 |
| 2018/0017220 A1 | 1/2018 | Kitano |
| 2018/0026421 A1* | 1/2018 | Seidenfaden ......... H01S 5/0231 372/25 |
| 2018/0083422 A1 | 3/2018 | Castiglia et al. |
| 2018/0180789 A1 | 6/2018 | Russert et al. |
| 2018/0235040 A1 | 8/2018 | Yamanaka et al. |
| 2018/0266658 A1 | 9/2018 | Rousseau et al. |
| 2018/0297515 A1 | 10/2018 | Laluet et al. |
| 2018/0316160 A1 | 11/2018 | Raring et al. |
| 2019/0025687 A1 | 1/2019 | Raring et al. |
| 2019/0235182 A1 | 8/2019 | Cheng |
| 2019/0242535 A1 | 8/2019 | Hikmet et al. |
| 2019/0305503 A1 | 10/2019 | Osawa et al. |
| 2020/0200363 A1 | 6/2020 | Harrison et al. |

FOREIGN PATENT DOCUMENTS

| | | |
|---|---|---|
| CN | 1538534 | 10/2004 |
| CN | 1855371 | 8/2005 |
| CN | 1668947 | 9/2005 |
| CN | 1702836 | 11/2005 |
| CN | 1953197 | 4/2007 |
| CN | 1965590 | 5/2007 |
| CN | 101009347 | 8/2007 |
| CN | 101079463 | 11/2007 |
| CN | 101099245 | 1/2008 |
| CN | 101138091 | 3/2008 |
| CN | 101171692 | 4/2008 |
| CN | 101278232 | 10/2008 |
| CN | 101308896 | 11/2008 |
| CN | 102449550 | 6/2016 |
| CN | 105824179 | 1/2018 |
| CN | 108139054 | 6/2018 |
| DE | 112010002177 | 10/2012 |
| EP | 1571715 | 9/2005 |
| EP | 1995834 | 11/2008 |
| EP | 2 796 771 A1 | 10/2014 |
| EP | 3 045 947 A1 | 7/2016 |
| EP | 3 093 556 A1 | 11/2016 |
| EP | 3338023 | 6/2018 |
| IN | 9733/DELNP/2011 | 1/2013 |
| IN | 310119 | 3/2019 |
| JP | 03287770 | 12/1991 |
| JP | 07162081 | 6/1995 |
| JP | 1042316 | 2/1998 |
| JP | H11142652 A | 5/1999 |
| JP | 2001230497 | 8/2001 |
| JP | 2002009402 | 1/2002 |
| JP | 2002185082 | 6/2002 |
| JP | 2004503923 | 2/2004 |
| JP | 2004071885 | 3/2004 |
| JP | 2004152841 | 5/2004 |
| JP | 2004186527 | 7/2004 |
| JP | 2004304111 | 10/2004 |
| JP | 2005289797 | 10/2005 |
| JP | 2006091285 | 4/2006 |
| JP | 2006-126731 A | 5/2006 |
| JP | 2006120923 | 5/2006 |
| JP | 2007068398 | 3/2007 |
| JP | 2007173467 | 7/2007 |
| JP | 2007529910 | 10/2007 |
| JP | 2008-003125 A | 1/2008 |
| JP | 2008130591 | 6/2008 |
| JP | 2008193057 | 8/2008 |
| JP | 2008198952 | 8/2008 |
| JP | 2008533723 | 8/2008 |
| JP | 2008288527 | 11/2008 |
| JP | 2008543089 | 11/2008 |
| JP | 2008311640 | 12/2008 |
| JP | 2009021506 | 1/2009 |
| JP | 2009158893 | 7/2009 |
| JP | 2009170708 | 7/2009 |
| JP | 2009227685 | 10/2009 |
| JP | 2010067952 | 3/2010 |
| JP | 2010093236 | 4/2010 |
| JP | 2010103487 | 5/2010 |
| JP | 2010109147 | 5/2010 |
| JP | 2010109331 | 5/2010 |
| JP | 2010109332 | 5/2010 |
| JP | 2010-129300 A | 6/2010 |
| JP | 2011077326 | 4/2011 |
| JP | 2011-129374 A | 6/2011 |
| JP | 2013-187145 A | 9/2013 |
| JP | 2018085500 | 5/2018 |
| JP | 2018525836 | 9/2018 |
| KR | 1020180044327 | 5/2018 |
| WO | 2006057463 | 1/2006 |
| WO | 2006/038502 A1 | 4/2006 |
| WO | 2006099138 | 6/2006 |
| WO | 2007004495 | 1/2007 |
| WO | 2007119723 | 10/2007 |
| WO | 2008041521 | 4/2008 |
| WO | 2008109296 | 9/2008 |
| WO | 2008143276 | 11/2008 |
| WO | 2008/147415 A1 | 12/2008 |
| WO | 2009124317 | 10/2009 |
| WO | 2010068916 | 6/2010 |
| WO | 2010120819 | 10/2010 |
| WO | 2011149977 | 12/2011 |
| WO | 2012016033 | 2/2012 |

(56) References Cited

FOREIGN PATENT DOCUMENTS

| WO | 2015/090556 A1 | 6/2015 |
|---|---|---|
| WO | 2018/078404 A1 | 5/2018 |
| WO | 2019/086176 A1 | 5/2019 |

OTHER PUBLICATIONS

Collimating and Focusing, retrieved from web.archive.org of an image of www.newport.com/n/focusing-and-collimating, captured on Dec. 24, 2017 (Year: 2017).*
U.S. Appl. No. 16/140,357 Advisory Action dated Jan. 31, 2020, 3 pages.
International Search Report and Written Opinion for Application No. PCT/US2020/014479, dated Apr. 8, 2020, 44 pages.
International Search Report and Written Opinion for Application No. PCT/US2019/068428, dated Apr. 16, 2020, 13 pages.
International Search Report and Written Opinion for Application No. PCT/US2019/068091, dated Apr. 16, 2020, Apr. 16, 2020, 16 pages.
U.S. Appl. No. 16/252,570 Non-Final Office Action dated Apr. 30, 2020, 73 pages.
U.S. Appl. No. 12/133,364, Final Office Action dated Jun. 1, 2011, 7 pages.
U.S. Patent Application No. 12/133,364, Non-Final Office Action dated Nov. 26, 2010, 6 pages.
U.S. Appl. No. 12/133,364, Notice of Allowance dated Oct. 11, 2011, 5 pages.
U.S. Appl. No. 12/133,365, Final Office Action dated Oct. 18, 2011, 22 pages.
U.S. Appl. No. 12/133,365, Non-Final Office Action dated Jun. 9, 2011, 17 pages.
U.S. Appl. No. 12/133,365, Non-Final Office Action dated May 13, 2013, 23 pages.
U.S. Appl. No. 12/334,418, Final Office Action dated Oct. 19, 2011, 24 pages.
U.S. Appl. No. 12/334,418, Non-Final Office Action dated Apr. 5, 2011, 20 pages.
U.S. Appl. No. 12/478,736, Corrected Notice of Allowability dated Oct. 9, 2012, 4 pages.
U.S. Appl. No. 12/478,736, Final Office Action dated Feb. 7, 2012, 6 pages.
U.S. Appl. No. 12/478,736, Non-Final Office Action dated Sep. 27, 2011, 11 pages.
U.S. Appl. No. 12/478,736, Notice of Allowance dated Apr. 23, 2012, 8 pages.
U.S. Appl. No. 12/481,543, Non-Final Office Action dated Jun. 27, 2011, 10 pages.
U.S. Appl. No. 12/482,440, Final Office Action dated Aug. 12, 2011, 7 pages.
U.S. Appl. No. 12/482,440, Non-Final Office Action dated Feb. 23, 2011, 6 pages.
U.S. Appl. No. 12/484,095, Final Office Action dated Jul. 8, 2011, 12 pages.
U.S. Appl. No. 12/484,095, Non-Final Office Action dated Nov. 10, 2010, 9 pages.
U.S. Appl. No. 12/484,924, Final Office Action dated Oct. 31, 2011, 11 pages.
U.S. Appl. No. 12/484,924, Non-Final Office Action dated Apr. 14, 2011, 12 pages.
U.S. Appl. No. 12/484,924, Non-Final Office Action dated Dec. 18, 2013, 15 pages.
U.S. Appl. No. 12/484,924, Notice of Allowance dated May 29, 2014, 9 pages.
U.S. Appl. No. 12/491,169, Final Office Action dated May 11, 2011, 10 pages.
U.S. Appl. No. 12/491,169, Non-Final Ofice Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/497,969, Final Office Action dated Jul. 5, 2012, 18 pages.
U.S. Appl. No. 12/497,969, Non-Final Office Action dated Feb. 2, 2012, 20 pages.
U.S. Appl. No. 12/497,969, Non-Final Office Action dated May 16, 2013, 22 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.
U.S. Appl. No. 12/502,058, Notice of Allowance dated Apr. 16, 2012, 10 pages.
U.S. Appl. No. 12/502,058, Notice of Allowance dated Jul. 19, 2012, 8 pages.
U.S. Appl. No. 12/534,829, Non-Final Office Action dated Apr. 19, 2011, 9 pages.
U.S. Appl. No. 12/534,829, Notice of Allowability dated Dec. 21, 2011, 4 pages.
U.S. Appl. No. 12/534,829, Notice of Allowance dated Dec. 5, 2011, 7 pages.
U.S. Appl. No. 12/534,829, Notice of Allowance dated Oct. 28, 2011, 8 pages.
U.S. Appl. No. 12/534,838, Final Office Action dated Jan. 13, 2012, 12 pages.
U.S. Appl. No. 12/534,838, Non-Final Office Action dated May 3, 2011, 12 pages.
U.S. Appl. No. 12/534,838, Non-Final Office Action dated Mar. 20, 2012, 13 pages ..
U.S. Appl. No. 12/534,838, Notice of Allowance dated Jun. 8, 2012, 8 pages.
U.S. Appl. No. 12/534,843, Non-Final Office Action dated Sep. 10, 2012, 10 pages.
U.S. Appl. No. 12/534,843, Notice of Allowance dated Jan. 24, 2013, 9 pages.
U.S. Appl. No. 12/534,844, Final Office Action dated Feb. 4, 2011, 9 pages.
U.S. Appl. No. 12/534,844, Non-Final Ofice Action dated Apr. 25, 2014, 7 Pages.
U.S. Appl. No. 12/534,844, Non-Final Office Action dated Sep. 16, 2010, 8 pages.
U.S. Appl. No. 12/534,844, Notice of Allowance dated Nov. 17, 2014, 5 pages.
U.S. Appl. No. 12/534,849, Notice of Allowance dated Jul. 31, 2012, 12 pages.
U.S. Appl. No. 12/534,857, Non-Final Office Action dated Sep. 1, 2010, 13 pages.
U.S. Appl. No. 12/534,857, Notice of Allowance dated May 27, 2011, 5 pages.
U.S. Appl. No. 12/546,458, Non-Final Office Action dated Jul. 20, 2011, 5 pages.
U.S. Appl. No. 12/546,458, Notice of Allowance dated Nov. 28, 2011, 5 pages.
U.S. Appl. No. 12/556,558, Non-Final Office Action dated Sep. 16, 2010, 8 pages.
U.S. Appl. No. 12/556,558, Notice of Allowance dated Mar. 22, 2011, 5 pages.
U.S. Appl. No. 12/556,562, Final Office Action dated Mar. 21, 2011, 5 pages.
U.S. Appl. No. 12/556,562, Non-Final Office Action dated Sep. 15, 2010, 7 pages.
U.S. Appl. No. 12/556,562, Notice of Allowance dated Jul. 27, 2011, 5 pages.
U.S. Appl. No. 12/569,337, Non-Final Office Action dated May 9, 2012, 19 pages.
U.S. Appl. No. 12/569,337, Notice of Allowance dated Nov. 15, 2012, 5 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.

(56) References Cited

OTHER PUBLICATIONS

U.S. Appl. No. 12/573,820, Non-Final Office Action dated Oct. 9, 2011, 29 pages.
U.S. Appl. No. 12/573,820, Method and System for Thin Film Processing Using Shower Head Device filed Oct. 5, 2009, 32 pages.
U.S. Appl. No. 12/634,665, Final Office Action dated Oct. 1, 2012, 10 pages.
U.S. Appl. No. 12/634,665, Non-Final Office Action dated Apr. 25, 2012, 11 pages.
U.S. Appl. No. 12/634,665, Notice of Allowance dated Feb. 15, 2013, 9 pages.
U.S. Appl. No. 12/636,683, Non-Final Office Action dated Jun. 12, 2013, 15 pages.
U.S. Appl. No. 12/724,983, Non-Final Office Action dated Mar. 5, 2012, 21 pages.
U.S. Appl. No. 12/727,148, Final Office Action dated Nov. 21, 2013, 10 pages.
U.S. Appl. No. 12/727,148, Non-Final Office Action dated Sep. 11, 2014, 12 Pages.
U.S. Appl. No. 12/727,148, Non-Final Office Action dated May 15, 2013, 27 pages.
U.S. Appl. No. 12/727,148, Strain Mitigation Using Selective Area Epitaxy Growth Method and Structure filed Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jul. 3, 2012, 18 pages.
U.S. Appl. No. 12/749,466, Non-Final Office Action dated Jun. 29, 2011, 20 pages.
U.S. Appl. No. 12/749,466, Notice of Allowance dated Jan. 2, 2013, 8 pages.
U.S. Appl. No. 12/749,476, Final Office Action dated Nov. 8, 2011, 11 pages.
U.S. Appl. No. 12/749,476, Non-Final Ofice Action dated Apr. 11, 2011, 15 pages.
U.S. Appl. No. 12/749,476, Notice of Allowance dated Jun. 26, 2012, 8 pages.
U.S. Appl. No. 12/749,476, Notice of Allowance dated May 4, 2012, 8 pages.
U.S. Appl. No. 12/759,273, Final Office Action dated Jun. 26, 2012, 10 pages.
U.S. Appl. No. 12/759,273, Final Office Action dated Mar. 29, 2016, 12 pages.
U.S. Appl. No. 12/759,273, Final Office Action dated Oct. 24, 2014, 16 pages.
U.S. Appl. No. 12/759,273, Final Office Action dated Jun. 8, 2015, 17 pages.
U.S. Appl. No. 12/759,273, Non-Final Office Action dated Nov. 21, 2011, 10 pages.
U.S. Appl. No. 12/759,273, Non-Final Office Action dated Apr. 3, 2014, 16 pages.
U.S. Appl. No. 12/759,273, Non-Final Office Action dated Jan. 29, 2015, 16 pages.
U.S. Appl. No. 12/759,273, Non-Final Ofice Action dated Sep. 23, 2015, 18 pages.
U.S. Appl. No. 12/759,273, Notice of Allowance dated Aug. 19, 2016, 8 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 9 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/785,404, Non-Final Office Action dated Mar. 6, 2012, 10 pages.
U.S. Appl. No. 12/785,404, Notice of Allowance dated Jul. 16, 2012, 5 pages.
U.S. Appl. No. 12/787,343, Non-Final Office Action dated Dec. 17, 2012, 6 pages.
U.S. Appl. No. 12/787,343, Notice of Allowance dated Jun. 10, 2013, 10 pages.
U.S. Appl. No. 12/789,303, Non-Final Ofice Action dated Sep. 24, 2012, 20 pages.
U.S. Appl. No. 12/789,303, Notice of Allowance dated Dec. 21, 2012, 5 pages.
U.S. Appl. No. 12/859,153, Final Office Action dated Feb. 26, 2013, 24 pages.
U.S. Appl. No. 12/859,153, Non-Final Office Action dated Sep. 25, 2012, 22 pages.
U.S. Appl. No. 12/859,153, Non-Final Office Action dated Jun. 21, 2013, 24 pages.
U.S. Appl. No. 12/868,441, Final Office Action dated Dec. 18, 2012, 34 pages.
U.S. Appl. No. 12/868,441, Non-Final Office Action dated Apr. 30, 2012, 12 pages.
U.S. Appl. No. 12/868,441, Notice of Allowance dated Sep. 18, 2013, 13 pages.
U.S. Appl. No. 12/873,820, Final Office Action dated Apr. 11, 2013, 7 pages.
U.S. Appl. No. 12/873,820, Non-Final Office Action dated Oct. 4, 2012, 10 pages.
U.S. Appl. No. 12/873,820, Notice of Allowance dated Jul. 26, 2013, 6 pages.
U.S. Appl. No. 12/880,803, Non-Final Ofice Action dated Feb. 22, 2012, 9 pages.
U.S. Appl. No. 12/880,803, Notice of Allowance dated Jul. 18, 2012, 5 pages.
U.S. Appl. No. 12/880,889, Final Office Action dated Sep. 19, 2012, 26 pages.
U.S. Appl. No. 12/880,889, Non-Final Office Action dated Oct. 1, 2013, 19 pages.
U.S. Appl. No. 12/880,889, Non-Final Office Action dated Feb. 27, 2012, 13 pages.
U.S. Appl. No. 12/880,889, Blue Green Active Region and Red Phosphor White Leds filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Final Office Action dated Oct. 26, 2015, 11 pages.
U.S. Appl. No. 12/883,652, Final Office Action dated Dec. 19, 2014, 16 pages.
U.S. Appl. No. 12/883,652, Non-Final Office Action dated Apr. 5, 2016, 12 pages.
U.S. Appl. No. 12/883,652, Non-Final Office Action dated May 14, 2014, 14 pages.
U.S. Appl. No. 12/883,652, Non-Final Office Action dated Jun. 3, 2015, 16 pages.
U.S. Appl. No. 12/883,652, Non-Final Office Action dated Apr. 17, 2012, 8 pages.
U.S. Appl. No. 12/883,652, Notice of Allowance dated Aug. 30, 2016, 7 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.

(56) References Cited

OTHER PUBLICATIONS

U.S. Appl. No. 12/884,993, Notice of Allowance dated Nov. 26, 2012, 11 pages.
U.S. Appl. No. 12/891,668, Final Office Action dated Jan. 10, 2013, 31 pages.
U.S. Appl. No. 12/891,668, Non-Final Ofice Action dated Sep. 25, 2012, 21 pages.
U.S. Appl. No. 12/891,668, Notice of Allowance dated Mar. 20, 2013, 14 pages.
U.S. Appl. No. 12/942,817, Final Office Action dated Oct. 22, 2014, 12 pages.
U.S. Appl. No. 12/942,817, Final Office Action dated Jan. 2, 2014, 15 pages.
U.S. Appl. No. 12/942,817, Non-Final Office Action dated Jul. 31, 2014, 11 pages.
U.S. Appl. No. 12/942,817, Non-Final Ofice Action dated Feb. 20, 2013, 12 pages.
U.S. Appl. No. 12/942,817, Notice of Allowance dated Jan. 30, 2015, 8 pages.
U.S. Appl. No. 12/995,946, Final Office Action dated Aug. 2, 2013, 16 pages.
U.S. Appl. No. 12/995,946, Non-Final Office Action dated Mar. 28, 2012, 18 pages.
U.S. Appl. No. 12/995,946, Non-Final Office Action dated Jan. 29, 2013, 25 pages.
U.S. Appl. No. 13/014,622, Final Office Action dated Apr. 30, 2012, 14 pages.
U.S. Appl. No. 13/014,622, Final Office Action dated May 11, 2015, 14 pages.
U.S. Appl. No. 13/014,622, Non-Final Office Action dated Nov. 28, 2011, 14 pages.
U.S. Appl. No. 13/014,622, Non-Final Ofice Action dated Jun. 20, 2014, 15 pages.
U.S. Appl. No. 13/041,199, Final Office Action dated Mar. 12, 2013, 10 pages.
U.S. Appl. No. 13/041,199, Non-Final Office Action dated Apr. 29, 2014, 13 pages.
U.S. Appl. No. 13/041,199, Non-Final Office Action dated Nov. 30, 2012, 14 pages.
U.S. Appl. No. 13/041,199, Notice of Allowance dated Sep. 9, 2014, 8 pages.
U.S. Appl. No. 13/046,565, Final Office Action dated Feb. 2, 2012, 17 pages.
U.S. Appl. No. 13/046,565, Final Office Action dated Jul. 19, 2012, 24 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 13/108,645, Notice of Allowance dated Jan. 28, 2013, 9 pages.
U.S. Appl. No. 13/114,806, Final Office Action dated Mar. 10, 2016, 14 pages.
U.S. Appl. No. 13/114,806, Final Office Action dated May 8, 2015, 20 pages.
U.S. Appl. No. 13/114,806, Final Office Action dated Aug. 26, 2013, 22 pages.
U.S. Appl. No. 13/114,806, Final Office Action dated Aug. 27, 2014, 22 pages.
U.S. Appl. No. 13/114,806, Non-Final Office Action dated Oct. 5, 2015, 15 pages.
U.S. Appl. No. 13/114,806, Non-Final Office Action dated Jan. 14, 2015, 21 pages.
U.S. Appl. No. 13/114,806, Non-Final Office Action dated Apr. 12, 2013, 22 pages.
U.S. Appl. No. 13/114,806, Non-Final Office Action dated Feb. 13, 2014, 23 pages.
U.S. Appl. No. 13/175,739, Non-Final Office Action dated Dec. 7, 2012, 6 pages.
U.S. Appl. No. 13/175,739, Notice of Allowance dated Mar. 21, 2013, 6 pages.
U.S. Appl. No. 13/226,249, Non-Final Office Action dated Oct. 10, 2012, 7 pages ..
U.S. Appl. No. 13/226,249, Notice of Allowance dated Feb. 21, 2013, 5 pages.
U.S. Appl. No. 13/272,981, Final Office Action dated Aug. 15, 2013, 13 Pages.
U.S. Appl. No. 13/272,981, Non-Final Office Action dated Mar. 20, 2013, 19 pages.
U.S. Appl. No. 13/272,981, Notice of Allowance vMar. 13, 2014, 10 pages.
U.S. Appl. No. 13/291,922, Final Office Action dated Jun. 19, 2014, 13 pages.
U.S. Appl. No. 13/291,922, Final Office Action dated Jun. 18, 2013, 9 pages.
U.S. Appl. No. 13/291,922, Non-Final Office Action dated Feb. 20, 2013, 10 pages.
U.S. Appl. No. 13/291,922, Non-Final Office Action dated Dec. 20, 2013, 12 pages.
U.S. Appl. No. 13/291,922, Notice of Allowance dated Nov. 7, 2014, 9 pages.
U.S. Appl. No. 13/346,507, Non-Final Office Action dated Dec. 21, 2012, 9 pages.
U.S. Appl. No. 13/346,507, Notice of Allowance dated Apr. 22, 2013, 8 pages.
U.S. Appl. No. 13/354,639, Non-Final Office Action dated Nov. 7, 2012, 12 pages.
U.S. Appl. No. 13/354,639, Notice of Allowance dated Dec. 14, 2012, 8 pages.
U.S. Appl. No. 13/425,304, Notice of Allowance dated Aug. 22, 2012, 9 pages.
U.S. Appl. No. 13/425,354, Final Office Action dated Aug. 2, 2013, 16 pages.
U.S. Appl. No. 13/425,354, Non-Final Office Action dated Feb. 14, 2013, 13 pages.
U.S. Appl. No. 13/425,354, Notice of Allowance dated Feb. 7, 2014, 8 pages.
U.S. Appl. No. 13/548,312, Final Office Action dated Mar. 13, 2014, 5 pages.
U.S. Appl. No. 13/548,312, Notice of Allowance dated Jun. 23, 2014, 7 pages.
U.S. Appl. No. 13/548,635, Non-Final Office Action dated Jun. 14, 2013, 6 pages.
U.S. Appl. No. 13/548,635, Notice of Allowance dated Sep. 16, 2013, 6 pages.
U.S. Appl. No. 13/548,931, Notice of Allowance dated Jun. 3, 2013, 11 pages.
U.S. Appl. No. 13/606,894, Non-Final Office Action dated Feb. 5, 2013, 8 pages.
U.S. Appl. No. 13/606,894, Notice of Allowance dated May 24, 2013, 9 pages.
U.S. Appl. No. 13/678,101, Notice of Allowance dated Jan. 24, 2014, 10 pages.
U.S. Appl. No. 13/678,122, Notice of Allowance dated Mar. 4, 2014, 18 pages.
U.S. Appl. No. 13/739,961, Notice of Allowance dated Dec. 10, 2013, 13 pages.
U.S. Appl. No. 13/752,158, Final Office Action dated Apr. 1, 2014, 15 pages.
U.S. Appl. No. 13/752,158, Non-Final Office Action dated Oct. 7, 2013, 14 pages.
U.S. Appl. No. 13/752,158, Notice of Allowance dated Sep. 16, 2014, 9 Pages.
U.S. Appl. No. 13/853,694, Notice of Allowance dated Sep. 3, 2013, 8 pages.
U.S. Appl. No. 13/937,981, Notice of Allowance dated Nov. 27, 2013, 11 pages.
U.S. Appl. No. 13/937,981, Notice of Allowance dated Mar. 28, 2014, 9 pages.
U.S. Appl. No. 13/938,048, Final Office Action dated Jul. 27, 2015, 5 pages.

(56) References Cited

OTHER PUBLICATIONS

U.S. Appl. No. 13/938,048, Non-Final Office Action dated Apr. 9, 2015, 10 pages.
U.S. Appl. No. 13/938,048, Notice of Allowance dated Sep. 30, 2015, 5 pages.
U.S. Appl. No. 14/035,045, Notice of Allowance dated Jan. 13, 2014, 9 pages.
U.S. Appl. No. 14/176,403, Non-Final Office Action dated Sep. 11, 2015, 13 pages.
U.S. Appl. No. 14/176,403, Notice of Allowance dated Feb. 12, 2016, 8 pages.
U.S. Appl. No. 14/199,672, Non-Final Office Action dated Oct. 8, 2014, 7 pages.
U.S. Appl. No. 14/199,672, Notice of Allowance dated Feb. 2, 2015, 5 pages.
U.S. Appl. No. 14/249,242, Notice of Allowance dated Mar. 10, 2015, 16 pages.
U.S. Appl. No. 14/262,208, Non-Final Office Action dated Dec. 22, 2014, 10 pages.
U.S. Appl. No. 14/262,208, Notice of Allowance dated Apr. 23, 2015, 5 pages.
U.S. Appl. No. 14/307,214, Notice of Allowance dated Feb. 27, 2015, 10 pages.
U.S. Appl. No. 14/509,596, Notice of Allowance dated Jan. 22, 2015, 9 pages.
U.S. Appl. No. 14/534,636, Non-Final Office Action dated Jun. 3, 2015, 9 pages.
U.S. Appl. No. 14/534,636, Notice of Allowance dated Sep. 15, 2015, 11 pages.
U.S. Appl. No. 14/743,971, Final Office Action dated Nov. 30, 2016, 23 pages.
U.S. Appl. No. 14/743,971, Non-Final Office Action dated May 12, 2017, 20 pages.
U.S. Appl. No. 14/743,971, Non-Final Office Action dated Apr. 21, 2016, 23 pages.
U.S. Appl. No. 14/743,971, Notice of Allowance dated Jul. 28, 2017, 5 pages.
U.S. Appl. No. 14/802,960, Final Office Action dated Nov. 30, 2016, 23 pages.
U.S. Appl. No. 14/802,960, Non-Final Office Action dated May 8, 2017, 19 pages.
U.S. Appl. No. 14/802,960, Non-Final Office Action dated Apr. 15, 2016, 23 pages.
U.S. Appl. No. 14/802,960, Notice of Allowance dated Jul. 31, 2017, 5 pages.
U.S. Appl. No. 14/822,845, Final Office Action dated May 4, 2017, 15 pages.
U.S. Appl. No. 14/822,845, Non-Final Office Action dated Jan. 6, 2017, 17 pages.
U.S. Appl No. 14/822,845, Notice of Allowance dated Jun. 21, 2017, 7 pages.
U.S. Appl. No. 14/829,927, Advisory Action dated Nov. 1, 2018, 7 pages.
U.S. Appl. No. 14/829,927, Final Office Action dated Jul. 26, 2018, 39 pages.
U.S. Appl. No. 14/829,927, Non-Final Office Action dated Mar. 21, 2019, 26 pages.
U.S. Appl. No. 14/829,927, Non-Final Office Action dated Sep. 26, 2017, 44 pages.
U.S. Appl. No. 14/984,108, Advisory Action dated Apr. 26, 2018, 2 pages.
U.S. Appl. No. 14/984,108, Final Office Action dated Jan. 18, 2018, 12 pages.
U.S. Appl. No. 14/984,108, Non-Final Office Action dated Sep. 6, 2017, 10 pages.
U.S. Appl. No. 14/984,108, Notice of Allowance dated Oct. 1, 2018, 5 pages.
U.S. Appl. No. 15/160,873, Final Office Action dated Nov. 19, 2018, 37 pages.
U.S. Appl. No. 15/160,873, Non-Final Office Action dated Apr. 4, 2019, 31 pages.
U.S. Appl. No. 15/160,873, Non-Final Office Action dated Apr. 5, 2018, 45 pages.
U.S. Appl. No. 15/710,715, Notice of Allowance dated May 25, 2018, 17 pages.
U.S. Appl. No. 15/796,568, First Action Interview Pilot Program Pre-Interview Communication dated Apr. 17, 2018, 5 pages.
U.S. Appl. No. 15/796,568, Notice of Allowance dated Jun. 22, 2018, 6 pages.
U.S. Appl. No. 16/000,802, Notice of Allowance dated Dec. 19, 2018, 14 pages.
U.S. Appl. No. 16/140,357, First Action Interview Pilot Program Pre-Interview Communication dated Aug. 1, 2019, 5 pages.
U.S. Appl. No. 61/164,409, Optical Device Structure Using Miscut GaN Substrates for Laser Applications filed Mar. 28, 2009, 32 pages.
U.S. Appl. No. 61/182,105, Laser Display and Method filed May 29, 2009, 17 pages.
U.S. Appl. No. 61/249,568, Low Voltage Laser Diodes on {20-21} Gallium and Nitrogen Containing Substrates filed Oct. 7, 2009, 70 pages.
Abare et al., Cleaved and Etched Facet Nitride Laser Diodes, IEEE Journal of Selected Topics in Quantum Electronics, vol. 4, No. 3, May-Jun. 1998, pp. 505-509.
Adesida et al., Characteristics of Chemically Assisted Ion Beam Etching of Gallium Nitride, Applied Physics Letters, vol. 65, Issue 7, Aug. 15, 1994, pp. 889-891.
Altoukhov et al., High Reflectivity Airgap Distributed Bragg Reflectors Realized by Wet Etching of AlInN Sacrificial Layers, Applied Physics Letters, vol. 95, 2009, pp. 191102-1-191102-3.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. 10024-10027.
Callahan et al., Synthesis and Growth of Gallium Nitride by the Chemical Vapor Reaction Process (CVRP), MRS Internet Journal Nitride Semiconductor Research, vol. 4, No. 10, 1999, pp. 1-6.
Caneau et al., Studies on the Selective OMVPE of (Ga,In)/(As,P), Journal of Crystal Growth, vol. 124, Nov. 1992, pp. 243-248.
Chen et al., Growth and Optical Properties of Highly Uniform and Periodic InGaN Nanostructures, Advanced Materials, vol. 19, No. 13, Jul. 2007, pp. 1707-1710.
Choi et al., 2.5λ Microcavity InGaN Light-Emitting Diodes Fabricated by a Selective Dry-Etch Thinning Process, Applied Physics Letters, vol. 91, No. 6, 2007, pp. 061120-1-061120-3.
Chinese Application No. 200980134723.8, Office Action dated Nov. 1, 2012, 35 pages (14 pages of Original Document and 21 pages of English Translation).
Chinese Application No. 201080023738.X, Office Action, dated Feb. 27, 2015, 13 pages.
Chinese Application No. 201080023738.X, Office Action dated Sep. 23, 2014, 15 pages.
Chinese Application No. 201080023738.X, Office Action dated Feb. 8, 2014, 5 pages.
Chinese Application No. 201080023738.X, Office Action dated Nov. 4, 2015, 5 pages.
Chinese Application No. 201080023738.X, Office Action dated Jun. 3, 2015, 9 pages.
Chinese Application No. 201610323828.X, Office Action dated Mar. 28, 2017, 11 pages.
Data Table For. Non-Ferrous Metals: Other Metals, Molybdenum, Available online at: http://www.matbase.com/material/non-ferrous-metals/other/molybdenum/properties, Mar. 28, 2011, 1 page.
D'Evelyn et al., Bulk GaN Crystal Growth by the High-Pressure Ammonothermal Method, Journal of Crystal Growth, vol. 300, No. 1, Jan. 26, 2007, pp. 11-16.

(56) References Cited

OTHER PUBLICATIONS

Dorsaz et al., Selective Oxidation of AlInN Layers for Current Confinement III-Nitride Devices, Applied Physics Letters, vol. 87, 2005, pp. 072102-1-072102-3.
Ehrentraut et al., The Ammonothermal Crystal Growth of Gallium Nitride—A Technique on the Up Rise, Proceedings IEEE, vol. 98, No. 7, 2010, pp. 1316-1323.
European Application No. 16837921.2, Extended European Search Report dated May 16, 2019, 14 pages.
Fang et al., Deep Centers in Semi-insulating Fe-doped Native GaN Substrates Grown by Hydride Vapour Phase Epitaxy, Physica Status Solidi, vol. 5, No. 6, 2008, pp. 1508-1511.
Founta et al., Anisotropic Morphology of Nonpolar a-Plane GaN Quantum Dots and Quantum Wells, Journal of Applied Physics, vol. 102, No. 7, Oct. 2, 2007, pp. 074304-1-074304-6.
Franssila, Tools for CVD and Epitaxy, Introduction to Microfabrication, 2004, pp. 329-336.
Fujii et al., Increase in the Extraction Efficiency of GaN-Based Light-Emitting Diodes via Surface Roughening, Applied Physics Letters, vol. 84, No. 6, Feb. 9, 2004, pp. 855-857.
Fujito et al., Development of Bulk GaN Crystals and Nonpolar/Semipolar Substrates by HVPE, MRS Bulletin, vol. 34, No. 5, May 2009, pp. 313-317.
Fukuda et al., Prospects for the Ammonothermal Growth of Large GaN Crystal, Journal of Crystal Growth vol. 305, Jul. 2007, pp. 304-310.
Funato et al., Blue, Green, and Amber InGaN/GaN Light-Emitting Diodes on Semipolar (1122) GaN Bulk Substrates, Journal of Japanese Applied Physics, vol. 45, No. 26, Jun. 30, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, 2008, pp. 011106-1-011106-3.
Gardner et al., Blue-Emitting InGaN-GaN Double-Heterostructure Light-Emitting Diodes Reaching Maximum Quantum Efficiency Above 200 A/cm2, Applied Physics Letters, vol. 91, No. 24, Dec. 12, 2007, pp. 243506-1-243506-3.
Gladkov et al., Effect of Fe Doping on Optical Properties of Freestanding Semi-insulating HVPE GaN:Fe, Journal of Crystal Growth, vol. 312, 2010, pp. 1205-1209.
Grzegory et al., High Pressure Growth of Bulk GaN from Solutions in Gallium, Journal of Physics Condensed Matter, vol. 13, 2001, pp. 6875-6892.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, No. 1-3, May 6, 1999, pp. 104-111.
Iso et al., High Brightness Blue InGaN/GaN Light Emitting Diode on Nonpolar m-Plane Bulk GaN Substrate, Japanese Journal of Applied Physics, vol. 46, No. 40, Oct. 12, 2007, pp. L960-L962.
Japanese Application No. 2012-011589, Office Action dated Jul. 11, 2013, 15 pages (7 pages of Original Document and 8 pages of English Translation).
Japanese Application No. 2012-513336, Ofice Action dated Dec. 5, 2014, 4 pages (2 pages of Original Document and 2 pages of English Translation).
Japanese Application No. 2012-513336, Office Action dated Nov. 29, 2013, 2 pages.
Japanese Application No. 2013-512174, Office Action dated Sep. 5, 2014, 2 pages.
Japanese Application No. 2013-512174, Office Action dated Oct. 31, 2013, 6 pages (3 pages of Original Document and 3 pages of English Translation).
Japanese Application No. 2015-000195, Office Action dated Jan. 7, 2016, 7 pages (3 pages of Original Document and 4 pages of English Translation).
Japanese Application No. 2015-77274, Office Action dated Mar. 3, 2016, 2 pages.
Japanese Application No. 2015-77274, Office Action dated Jul. 16, 2017, 3 pages.
Japanese Application No. 2015-77274, Office Action dated Jan. 27, 2017, 8 pages (4 pages of Original Document and 4 pages of English Translation).
Japanese Application No. 2017-199922, Office Action dated Dec. 4, 2018, 8 pages (4 pages of Original Document and 4 pages of English Translation).
Kendall et al., Energy Savings Potential of Solid State Lighting in General Lighting Applications, Report for the Department of Energy, Apr. 2001, 35 pages.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.
Kim et al., Improved Electroluminescence on Nonpolar m-Plane InGaN/GaN Qantum Wells LEDs, Physica Status Solidi (RRL), vol. 1, No. 3. Apr. 12, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, Sep. 15, 2001, pp. L925-L927.
Lide et al., Thermal Conductivity of Ceramics and Other Insulating Materials, CRC Handbook of Chemistry and Physics, 91st Edition, 2010-2011, pp. 12-203-12-204.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, Oct. 8, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, Nov. 6, 2007, pp. 7309-7310.
Michiue et al., Recent Development of Nitride LEDs and LDs, Proceedings of SPIE, vol. 7216, Feb. 16, 2009, pp. 7216Z-1-7218Z-6.
Moutanabbir et al., Bulk GaN Ion Cleaving, Journal of Electronic Materials, vol. 39, No. 5. Nov. 5, 2010, pp. 482-488.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, Jan. 12, 1998, pp. 211-213.
Nam et al., Lateral Epitaxial Overgrowth of GaN Films on SiO2 Areas Via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics, vol. 46, No. 9, Feb. 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, No. 7, Jun. 20. 2008, pp. 072201-1-072201-3.
Okamoto et al., Pure Blue Laser Diodes Based on Nonpolar m-Plane Gallium Nitride with InGaN Waveguiding Layers, Journal of Japanese Applied Physics, vol. 46, No. 35, Sep. 7, 2007, pp. L820-L822.
Okubo, Nichia Develops Blue-Green Semiconductor Laser w/ 488nm Wavelength, Nikkei Technology Online, Available Online at: http://techon.nikkeibp.co.jp/english/NEWS_EN/20080122/1460097, Jan. 22, 2008, pp. 1-3.
Oshima et al., Thermal and Optical Properties of Bulk GaN Crystals Fabricated Through Hydride Vapor Phase Epitaxy with Void-Assisted Separation, Journal of Applied Physics, vol. 98, No. 10, 2005, pp. 103509-1-103509-4.
Park, Crystal Orientation Effects on Electronic Properties of Wurtzite InGaN/GaN Quantum Wells, Journal of Applied Physics, vol. 91, No. 12, Jun. 15, 2002, pp. 9904-9908.
Pattison et al., Gallium Nitride Based Microcavity Light Emitting Diodes With 27 Effective Cavity Thickness, Applied Physics Letters, vol. 90, No. 3, 2007, pp. 031111-1-031111-3.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.

(56) References Cited

OTHER PUBLICATIONS

International Application No. PCT/US2008/052611, International Search Report and Written Opinion dated Sep. 29, 2009, 11 pages.
International Application No. PCT/US2009/067745, International Search Report and Written Opinion dated Feb. 5, 2010, 9 pages.
International Application No. PCT/US2010/030939, International Search Report and Written Opinion dated Jun. 16, 2010, 9 pages.
International Application No. PCT/US2010/036739, International Preliminary Report on Patentability dated Dec. 8, 2011, 7 pages.
International Application No. PCT/US2010/036739, International Search Report and Written Opinion dated Nov. 8, 2010, 10 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
International Application No. PCT/US2011/060030, International Search Report and Written Opinion dated Mar. 21, 2012, 8 pages.
International Application No. PCT/US2015/014567, International Search Report and Written Opinion dated Jul. 8, 2015, 19 pages.
International Application No. PCT/US2016/047834, International Preliminary Report on Patentability dated Mar. 1, 2018, 12 pages.
International Application No. PCT/US2016/047834, International Search Report and Written Opinion dated Oct. 28, 2016, 13 pages.
Porowski et al., High Resistivity GaN Single Crystalline Substrates, Acta Physica Polonica A, vol. 92, No. 5, 1997, pp. 958-962.
Porowski, Near Defect Free GaN Substrates, Journal of Nitride Semiconductor, 1999, 11 pages.
Purvis, Changing the Crystal Face of Gallium Nitride, The Advance Semiconductor Magazine, vol. 18, No. 8, Nov. 2005, 3 pages.
Romanov et al., Strain-Induced Polarization in Wurtzite III-Nitride Semipolar Layers, Journal of Applied Physics, vol. 100, No. 2, Jul. 25, 2006, pp. 023522-1-023522-10.
Sarva et al., Dynamic Compressive Strength of Silicon Carbide Under Uniaxial Compression, Material Sciences and Engineering, vol. A317, 2001, pp. 140-144.
Sato et al., High Power and High Efficiency Green Light Emitting Diode on Free-Standing Semipolar (1122) Bulk GaN Substrate, Physica Status Solidi (RRL), vol. 1, No. 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, Jun. 2008, pp. 221110-1-221110-3.
Schmidt et al., Demonstration of Nonpolar m-Plane InGaN/GaN Laser Diodes, Japanese Journal of Applied Physics, vol. 46, No. 9, Feb. 23, 2007, pp. L190-L191.
Schmidt et al., High Power and High External Efficiency m-Plane InGaN Light Emitting Diodes, Japanese Journal of Applied Physics, vol. 46, No. 7, Feb. 2007, pp. L126-L128.
Schoedl et al., Facet Degradation of GaN Heterostructure Laser Diodes, Journal of Applied Physics, vol. 97, No. 12, Jun. 16, 2005, pp. 123102-1-123102-8.
Schremer et al., Progress in Etched Facet Technology for GaN and Blue Lasers, Proceedings of SPIE, vol. 6473, 2007, pp. 64731F-1-64731F-8.
Sharma et al., Vertically Oriented GaN-based Air-Gap Distributed Bragg Reflector Structure Fabricated Using Band- Gap-Selective Photoelectrochemical Etching, Applied Physics Letters, vol. 87, 2005, pp. 051107-1-051107-3.
Shchekin et al., High Performance Thin-Film Flip-Chip InGaN—GaN Light-Emitting Diodes, Applied Physics Letters, vol. 89, No. 7, Aug. 16, 2006, pp. 071109-1-071109-3.
Shen et al., Auger Recombination in InGaN Measured by Photoluminescence, Applied Physics Letters, vol. 91, No. 14, Oct. 1, 2007, pp. 141101-1-141101-3.
Sizov et al., 500-nm Optical Gain Anisotropy of Semipolar (1122) InGaN Quantum Wells, Applied Physics Express, vol. 2, No. 7, Jun. 19, 2009, pp. 071001-1-071001-3.
Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.
Tyagi et al., High Brightness Violet InGan/Gan Light Emitting Diodes on Semipolar (1011) Bulk GaN Substrates, Japanese Journal of Applied Physics, vol. 46, No. 7, Feb. 9, 2007, pp. L129-L131.
Tyagi et al., Partial Strain Relaxation via Misfit Dislocation Generation at Heterointerfaces in (Al,In)GaN Epitaxial Layers Grown on Semipolar (1122) GaN Free Standing Substrates, Applied Physics Letter, vol. 95, No. 25, Dec. 2009, pp. 251905-1-251905-3.
Tyagi et al., Semipolar (1011) InGaN/GaN Laser Diodes on Bulk GaN Substrates, Japanese Journal of Applied Physics, vol. 46, No. 19, May 11, 2007, pp. L444-L445.
Uchida et al., Recent Progress in High-Power Blue-Violet Lasers, IEEE Journal of Selected Topics in Quantum Electronics, vol. 9, No. 5, Sep.-Oct. 2003, pp. 1252-1259.
Waltereit et al., Nitride Semiconductors Free of Electrostatic Fields for Efficient White Light-Emitting Diodes, Nature, vol. 406, Aug. 24, 2000, pp. 865-868.
Wang et al., Ammonothermal Growth of GaN Crystals in Alkaline Solutions, Journal of Crystal Growth, vol. 287, 2006, pp. 376-380.
Weisbuch et al., Recent Results and Latest Views on Microactivity LEDs, Light Emitting Diodes: Research, Manufacturing, and Applications, SPIE, vol. 5366, 2004, pp. 1-19.
Wierer et al., High-Power AlGaInN Flip-Chip Light-Emitting Diodes, Applied Physics Letters, vol. 78, No. 22, May 28, 2001, pp. 3379-3381.
Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.
Yibing, Phenomenon Analysis and Solution Measure for Blue GaN-Based LEDs Peak Wavelength Blue Moves, Journal of Human University of Technology, vol. 22 No. 3, May 2008, pp. 87-90.
Yoshizumi et al., Continuous-Wave Operation of 520 nm Green InGaN-Based Laser Diodes on Semi-Polar (2021) GaN Substrates, Applied Physics Express, vol. 2, No. 9. Aug. 2009, pp. 092101-1-092101-3.
Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, May 2007, 2 pages.
Zhong et al., Demonstration of High Power Blue-Green Light Emitting Diode on Semipolar (1122) Bulk GaN Substrate, Electronics Letters, vol. 43, No. 15, Jul. 19, 2007, pp. 825-826.
Zhong et al., High Power and High Efficiency Blue Light Emitting Diode on Freestanding Semipolar (1011) Bulk GaN Substrate, Applied Physics Letter, vol. 90, No. 23, Jun. 5, 2007, pp. 233504-1-233504-3.
U.S. Appl. No. 16/140,357 Final Office Action dated Oct. 15, 2019, 20 pages.
U.S. Appl. No. 14/829,927 Non-Final Office Action dated May 12, 2020, 28 pages.
U.S. Appl. No. 16/353,657 Non-Final Office Action dated May 19, 2020, 12 pages.
International Search Report and Written Opinion for Application No. PCT/US2020/014476, dated Jun. 9, 2020, 24 pages.
U.S. Appl. No. 16/796,272 Non-Final Office Action dated Jun. 22, 2020, 21 pages.
U.S. Appl. No. 16/796,368 Non-Final Office Action dated Jun. 22, 2020, 19 pages.
U.S. Appl. No. 16/252,570 Final Office Action dated Aug. 27, 2020, 68 pages.
U.S. Appl. No. 16/796,272 Notice of Allowance dated Sep. 25, 2020, 10 pages.
U.S. Appl. No. 16/140,357 Non-Final Office Action dated Sep. 25, 2020, 25 pages.
U.S. Appl. No. 16/140,357 Notice of Allowance dated Jan. 22, 2021, 9 pages.
U.S. Appl. No. 14/829,927 Notice of Allowance dated Oct. 28, 2020, 16 pages.

(56) References Cited

OTHER PUBLICATIONS

U.S. Appl. No. 16/796,368 Non-Final Office Action dated Nov. 18, 2020, 17 pages.
U.S. Appl. No. 16/353,657 Non-Final Office Action dated Nov. 18, 2020, 17 pages.
U.S. Appl. No. 16/597,791 Non-Final Office Action dated Nov. 24, 2020, 35 pages.
U.S. Appl. No. 16/597,795 Non-Final Office Action dated Dec. 7, 2020, 46 pages.
U.S. Appl. No. 16/835,897 Non-Final Office Action dated Jan. 1, 2021, 32 pages.
Machine Translation of WO2019086176A1, retrieved from espacenet on Nov. 9, 2020, 6 pages.
U.S. Appl. No. 16/252,570 Non-Final Office Action dated Feb. 23, 2021, 73 pages.
U.S. Appl. No. 16/353,657 Notice of Allowance dated Apr. 8, 2021, 7 pages.
U.S. Appl. No. 16/796,368 Notice of Allowance dated Apr. 13, 2021, 8 pages.
U.S. Appl. No. 16/597,791 Final Office Action dated Apr. 13, 2021, 49 pages.
U.S. Appl. No. 16/597,795 Final Office Action dated Apr. 13, 2021, 39 pages.
U.S. Appl. No. 16/835,897 Final Office Action dated May 5, 2021, 34 pages.
International Preliminary Report on Patentability for Application No. PCT/US2019/068091, dated Jul. 1, 2021, 13 pages.
International Preliminary Report on Patentability for Application No. PCT/US2019/068428, dated Jul. 1, 2021, 10 pages.
International Preliminary Report on Patentability for Application No. PCT/US2020/014479, dated Jul. 29, 2021, 22 pages.
International Preliminary Report on Patentability for Application No. PCT/US2020/014476, dated Jul. 29, 2021, 13 pages.
U.S. Appl. No. 16/597,791 Non-Final Office Action dated Aug. 9, 2021, 42 pages.
U.S. Appl. No. 16/597,795 Non-Final Office Action dated Aug. 9, 2021, 50 pages.
U.S. Appl. No. 16/252,570 Non-Final Office Action dated Aug. 17, 2021, 64 pages.
U.S. Appl. No. 16/835,897 Advisory Action Before the Filing of an Appeal Brief dated Aug. 20, 2021, 3 pages.
U.S. Appl. No. 16/230,158 Notice of Allowance dated Sep. 21, 2021, 12 pages.
U.S. Appl. No. 16/597,795 Final Office Action dated Feb. 2, 2022, 52 pages.
U.S. Appl. No. 16/597,791 Final Office Action dated Feb. 2, 2022, 46 pages.
U.S. Appl. No. 16/252,570 Final Office Action dated Feb. 2, 2022, 77 pages.
U.S. Appl. No. 17/009,599 Non-Final Office Action dated Feb. 25, 2022, 22 pages.
U.S. Appl. No. 17/009,599 Non-Final Office Action dated Jun. 20, 2022, 24 pages.
U.S. Appl. No. 16/230,365 Notice of Allowance dated Apr. 18, 2022, 10 pages.
Extended European Search Report for Application No. 19899609.2-1201, dated Jul. 15, 2022, 13 pages.
U.S. Appl. No. 16/597,795 Non-Final Office Action dated Jul. 19, 2022, 47 pages.
U.S. Appl. No. 17/318,976 Restriction Requirement dated Sep. 8, 2022, 6 pages.
U.S. Appl. No. 16/597,791 Advisory Action dated Jul. 19, 2022, 8 pages.
U.S. Appl. No. 16/252,570 Advisory Action dated Jul. 19, 2022, 11 pages.
U.S. Appl. No. 16/252,570 Non-Final Office Action dated Aug. 26, 2022, 64 pages.
U.S. Appl. No. 17/009,599 Advisory Action dated Aug. 26, 2022, 3 pages.
U.S. Appl. No. 17/563,986 Notice of Allowance dated Sep. 28, 2022, 9 pages.
U.S. Appl. No. 17/318,976 Final Office Action dated May 5, 2023, 43 pages.
U.S. Appl. No. 16/252,570 Final Office Action dated May 10, 2023, 64 pages.
U.S. Appl. No. 16/252,570 Notice of Allowance dated Aug. 22, 2023, 12 pages.
U.S. Appl. No. 17/839,135 Non-Final Office Action dated Sep. 22, 2023, 26 pages.
U.S. Appl. No. 17/839,135 Final Office Action mailed Mar. 7, 2024, 19 pages.

\* cited by examiner

LASER-BASED FIBER-COUPLED WHITE LIGHT SYSTEM FOR A VEHICLE

CROSS-REFERENCE TO RELATED APPLICATIONS

This application is a continuation-in-part of U.S. patent application Ser. No. 16/252,570, filed Jan. 18, 2019, the contents of which are incorporated herein by reference in their entirety for all purposes.

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:
  The conventional light bulb dissipates more than 90% of the energy used as thermal energy.
  The conventional light bulb routinely fails due to thermal expansion and contraction of the filament element.
  The conventional light bulb emits light over a broad spectrum, much of which is not perceived by the human eye.
  The conventional light bulb emits in all directions, which is undesirable for applications requiring strong directionality or focus, e.g. projection displays, optical data storage, etc.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 µW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 µW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

Although useful, LEDs still have limitations that are desirable to overcome in accordance to the inventions described in the following disclosure.

SUMMARY

The present invention provides a device and method for an integrated white colored electromagnetic radiation source using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials, such as yellow phosphors configured with designated scattering centers on an excitation surface or inside a bulk, to form a compact, high-brightness, and highly-efficient, white light source. In an example, the source can be provided for specialized applications, among general applications, and the like.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source. In some embodiments the light source and phosphor are configured on a common support member wherein the common support member may be a package member.

In various embodiments, the laser device and phosphor device are mounted on a common support member with or without intermediate submounts and the phosphor materials are operated in a transmissive mode, a reflective mode, or a side-pumped mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) more than 10,000 times higher than conventional LEDs, extreme directionality of the laser emission, and without the droop phenomenon that plagues LEDs, laser diodes enable characteristics unachievable by LEDs and other light sources. Specifically, since the laser diodes output beams carrying over 0.5 W, over 1 W, over 3 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm$^2$, 100 W/mm$^2$, or even over 2,500 W/mm$^2$ can be achieved. When this very small and powerful beam of laser excitation light is incident on a phosphor material an extremely bright spot or point source of white light can be achieved. Assuming a phosphor conversion ratio of 200 lumens of emitted white light per optical watt of excitation light, a 5 W excitation power could generate 1000 lumens in a beam diameter of 100 microns, or 50 microns, or less. This unprecedented source brightness can be game changing in applications such as spotlighting or range finding where parabolic reflectors or lensing optics can be combined with the point source to create highly collimated white light spots that can travel drastically higher distances than ever possible before using LEDs or bulb technology.

In one embodiment, the present invention provides a CPoS laser-based white light source comprising a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations. The apparatus has a support member and at least one gallium and nitrogen containing laser diode devices and phosphor material overlying the support member. The laser device is capable of an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In some embodiments two or more laser diodes or laser stripes are included in the integrated white light source. Combining multiple laser sources can offer many potential benefits according to this invention. First, the excitation power can be increased by beam combining to provide a more powerful excitation spit and hence produce a brighter light source. Similarly, the reliability of the source can be increased by using multiple sources at lower drive conditions to achieve the same excitation power as a single source driven at more harsh conditions such as higher current and voltage. A second advantage is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color or wavelength lasers can be included to offer improved performance such as an improved color rendering or color quality. For example, two or more blue excitation lasers with slightly detuned wavelengths (e.g. 5 nm 10 nm, 15 nm, etc.) can be included to create a larger blue spectrum. In one embodiment, separate individual laser chips are configured within the laser-phosphor light source. By positioning multiple laser chips in a predetermined configuration, multiple excitation beams can be overlapped on the phosphor spot to create a more ideal spot geometry. In alternative embodiments, laser diodes with multiple adjacent laser stripes, multi-stripe lasers" are included in the integrated white light source. The multiple stripes can enable an increased excitation power for a brighter light source and/or an improved or modified spot pattern on the phosphor. In a preferred embodiment the phosphor material can provide a yellowish emission in the 550 nm to 590 nm range such that when mixed with the blue emission of the laser diode a white light is produced. In other embodiments, phosphors with red, green, yellow, and even blue emission can be used in combination with the laser diode excitation source to produce a white light with color mixing.

In an embodiment, the device layers comprise a superluminescent light emitting diode or SLED. A SLED is in many ways similar to an edge emitting laser diode; however, the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 $cm^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In alternative embodiments laser diodes with multiple parallel adjacent emitter stripes can be configured to result in a wider and/or more powerful excitation spot on the phosphor. By making the spot wider in the lateral direction the spot could become more circular to the faster divergence angle of the laser emission in the vertical direction. For example, two or more laser stripes may be spaced by 10-30 µm, 30-60 µm, 60-100 µm, or 100-300 µm. In some embodiments the parallel stripes have slightly detuned wavelengths for an improved color quality. In other embodiments free space optics such as collimating lenses can be used to shape the beam prior to incidence on the phosphor. In one example, a re-imaging optic is used to reflect and reshape the beam onto the phosphor member. In an alternative example, the otherwise wasted reflected incident light from the phosphor is recycled with a re-imaging optic by being reflected back to the phosphor.

The excitation beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 20 W.

The phosphor material can be operated in a transmissive mode, a reflective mode, or a combination of a transmissive mode and reflective mode, or a side-pumped mode, or other modes. The phosphor material is characterized by a conversion efficiency, a resistance to thermal damage, a resistance to optical damage, a thermal quenching characteristic, a porosity to scatter excitation light, and a thermal conductivity. The phosphor may have an intentionally roughened surface to increase the light extraction from the phosphor. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the laser diode device to generate the laser beam and excite the phosphor material. The white light source configured to produce greater than 1 lumen, 10 lumens, 100 lumens, 250 lumens, 500 lumens, 1000 lumens, 3000 lumens, or 10000 lumens of white light output. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AlN, or other metals, ceramics, or semiconductors.

In a preferred configuration of this integrated white light source, the common support member comprises the same submount that the gallium and nitrogen containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Similarly, the phosphor material may be bonded to the submount using a soldering technique, or a sintered Ag technique, but it can be other techniques such as gluing technique or epoxy technique. Optimizing the bond for the lowest thermal impedance is a key parameter for heat dissipation from the phosphor, which is critical to prevent phosphor degradation and thermal quenching of the phosphor material.

In an alternative configuration of this white light source, the laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, a SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper or copper tungsten. The phosphor material may be bonded using a soldering technique, a sintered Ag technique, or other technique. In this configuration, the common support member should be configured of a thermally conductive material such as copper or copper tungsten. Optimizing the bond for the lowest thermal impedance is a key parameter for heat dissipation from the phosphor, which is critical to prevent phosphor degradation and thermal quenching of the phosphor material.

In yet another preferred variation of this CPoS integrated white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In all embodiments of this integrated white light source, the present invention may include safety features and design considerations. In any based laser based source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the white light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor. In some embodiments thermal fuses are incorporated wherein the fuse creates an open circuit and turns the laser diode off in an un-safe condition.

In some embodiments of this invention, safety features and systems use active components. Example active components include photodiodes/photodetectors and thermistors. Strategically located detectors designed to detect direct blue emission from the laser, scatter blue emission, or phosphor emission such as yellow phosphor emission can be used to detect failures of the phosphor where a blue beam could be exposed. Upon detection of such an event, a close circuit or feedback loop would be configured to cease power supply to the laser diode and effectively turn it off. As an example, a detector used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system. In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off. Of course, these are merely example embodiments, there are several configurations for photodiodes and/or thermistors to be integrated with a laser based white light source to form a safety feature such as a feedback loop to cease operation of the laser.

In many embodiments of the present invention an electrostatic discharge (ESD) protection element is included. For example, an ESD protection element would be used to protect the integrated white light source from damage that could occur with a sudden flow of current resulting from a build-up of charge. In one example a transient voltage suppression (TVS) element is employed.

In all embodiments of the integrated white light source final packaging would need to be considered. There are many aspects of the package that should be accounted for such as form factor, cost, functionality, thermal impedance, sealing characteristics, and basic compatibility with the application. Form factor will depend on the application, but in general making the smallest size packaged white source will be desirable. Cost should be minimized in all applications, but in some applications cost will be the most important consideration. In such cases using an off-the-shelf packages produced in high volume may be desirable. Functionality options include direction and properties of the exiting light emission for the application as well as integration of features such as photodetectors, thermistors, or other electronics or optoelectronics. For best performance and lifetime the thermal impedance of the package should be minimized, especially in high power applications. Examples of sealing configurations include open environment, environmentally sealed, or hermetically sealed. Typically for GaN based lasers it is desirable for hermetically sealed packages, but other packages can be considered and deployed for various applications. Examples of off the shelf packages for the integrated white light source include TO cans such as TO38, TO56, TO9, TO5, or other TO can type packages. Flat packages configured with windows can also be used. Examples of flat packages include a butterfly package like a TOSA. Surface mount device (SMD) packages can also be used, which are attractive due to their low price, hermetic sealing, and potentially low thermal impedance. In other embodiments, custom packages are used. In another embodiment, a "Flash" package could be used for the integrated white light source. For example, this package could be used to adapt the laser based white light source to camera flash applications. One of the standard packaging formats for today's LEDs employ the use of a flat ceramic package, sometimes called "Flash" packages as devices built on these platforms have primarily been used in Camera Flash and Cell Phone applications. The typical flash package consists of a flat ceramic substrate (Alumina or AlN) with attach pads for LED and ESD devices as well as leads providing a location for clipping or soldering external electrical connections to power the device. The phosphor is contained near the LED die via molding or other silicone containing dispensing application. This layer is then typically over molded with a clear silicone lens to improve light extraction. The primary benefits of a package in this format is a very small overall package dimension (~3 mm×~5 mm), reasonable light output performance (hundreds of Lumens), small source size and overall low-cost LED device. This package style could also be achieved by employing a laser plus phosphor design style which would potentially could eliminate the encapsulation and lensing steps, providing an LED replacement with superior spot size and brightness. If a protective cover were needed to house the laser and phosphor subcomponents, a hollow glass dome could be used to provide protection.

In some embodiments of this invention, the integrated white light source is combined with optical members to manipulate the generated white light. In an example the white light source could serve in a spot light system such as a flashlight or an automobile headlamp or other light applications where the light must be directed or projected to a specified location or area. In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector. In another example a lens is used to collimate the white light into a projected beam. In one example a simple aspheric lens would be positioned in front of the phosphor to collimate the white light. In another example, a total internal reflector optic is used for collimation. In other embodiments other types of collimating optics may be used such as spherical lenses or aspherical lenses. In several embodiments, a combination of optics is used.

In a specific embodiment of the general invention described above, the present invention is configured for a side-pumped phosphor operated in transmissive mode. In this configuration, the phosphor is positioned in front of the laser facet outputting the laser beam, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back of the laser diode. The phosphor is comprised of Ce doped YAG and emits yellow emission. The phosphor is shaped as a block, plate, sphere, cylinder, or other geometrical form. Specifically, the phosphor geometry primary dimensions may be less than 50 µm, less than 100 µm, less than 200 µm, less than 500 µm, less than 1 mm, or less than 10 mm. Operated in transmissive mode, the phosphor has a first primary side for receiving the incident laser beam and at least a second primary side where most of the useful white light will exit the phosphor to be coupled to the application. To improve the efficiency by maximizing the amount of light exiting the second side of the phosphor, the phosphor may be coated with layers configured to modify the reflectivity for certain colors. In one example, a coating configured to increase the reflectivity for yellow light is applied to the first side of the phosphor such that the amount of yellow light emitted from the first side is reduce. In another example, a coating to increase the reflectivity of the blue light is spatially patterned on the first side of the phosphor to allow the excitation light to pass, but prevent backward propagating scattered light to escape. In another example, optical coatings configured to reduce the reflectivity to yellow and blue light are applied to at least the second side of the phosphor to maximize the light escaping from this primary side where the useful light exits. In an alternative embodiment, a powdered phosphor such as a yellow phosphor is dispensed onto a transparent plate or into a solid structure using a binder material and is configured to emit a white light when excited by and combined with the blue laser beam. The powdered phosphors could be comprised of YAG based phosphors, and other phosphors.

With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm·cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively, the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, alumina, SiC, sapphire, AlN, or other metals, ceramics, or semiconductors. The side-pumped transmissive apparatus has a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

In alternative embodiments of the present invention, multiple phosphors are operated in a transmissive mode for a white emission. In one example, a violet laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the laser beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration, the laser beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light. In an alternative embodiment, a powdered mixture of phosphors would be dispensed onto a transparent plate or into a solid structure using a binder material such that the different color phosphors such as blue and yellow phosphors are co-mingled and are configured to emit a white light when excited by the violet laser beam. The powdered phosphors could be comprised of YAG based phosphors, LuAG phosphors, and other phosphors.

In an alternative embodiment of a multi-phosphor transmissive example according to the present invention, a blue laser diode operating with a wavelength of 425 nm to 480 nm is configured to excite a first green phosphor and a second red phosphor. In this configuration, a first green phosphor plate could be fused or bonded to the second red phosphor plate. In a practical configuration the laser beam would be directly incident on the first green phosphor wherein a fraction of the green emission would excite the second red phosphor to emit red emission to combine with green phosphor emission and blue laser diode emission to generate a white light. In an alternative practical configuration the laser beam would be directly incident on the second red phosphor wherein a fraction of the blue electromagnetic emission would be absorbed in the red phosphor to excite red emission and a portion of the remaining blue laser emission would pass to the green phosphor and create a green emission to combine with the red phosphor emission and blue laser diode emission to generate a white light. In an alternative embodiment, a powdered mixture of phosphors would be dispensed onto a transparent plate or into a solid structure using a binder material such that the different color phosphors such as red and green phosphors are co-mingled and are configured to emit a white light when excited by and combined with the blue laser beam. The powdered phosphors could be comprised of YAG based phosphors, LuAG phosphors, and other phosphors. The benefit or feature of this embodiment is the higher color quality that could be achieved from a white light comprised of red, green, and blue emission. Of course, there could be other variants of this invention including integrating more than two phosphor and could include one of or a combination of a red, green, blue, and yellow phosphor.

In several embodiments according to the present invention, the laser based integrated white light sources is configured as a high CRI white light source with a CRI over 70, over 80, or over 90. In these embodiments, multiple phosphors are used in the form of a mixed power phosphor composition or multiple phosphor plate configuration or others. Examples of such phosphors include, but are not limited to YAG, LuAG, red nitrides, aluminates, oxynitrides, $CaMgSi_2O_6:Eu^{2+}$, $BAM:Eu^{2+}$, $AlN:Eu^{2+}$, $(Sr,Ca)_3MgSi_2O_8:Eu^{2+}$, and JEM.

In some configurations of the high CRI embodiments of the integrated laser based white light source a blue laser diode excitation source operating in the wavelength range of 430 nm to 470 nm is used to excite;
1) Yellow phosphor+red phosphor, or
2) Green phosphor+red phosphor, or
3) Cyan phosphor+orange phosphor, or
4) Cyan phosphor+orange phosphor+red phosphor, or
5) Cyan phosphor+yellow phosphor+red phosphor, or
6) Cyan phosphor+green phosphor+red phosphor In some alternative configurations of the high CRI embodiments of the integrated laser based white light source a violet laser diode excitation source operating in the wavelength range of 390 nm to 430 nm is used to excite;
1) Blue phosphor+yellow phosphor+red phosphor, or
2) Blue phosphor+green phosphor+red phosphor, or
3) Blue phosphor+cyan phosphor+orange phosphor, or
4) Blue phosphor+cyan phosphor+orange phosphor+red phosphor, or
5) Blue phosphor+cyan phosphor+yellow phosphor+red phosphor, or
6) Blue phosphor+cyan phosphor+green phosphor+red phosphor In an alternative embodiment of a multi-phosphor transmissive example according to the present invention, a blue laser diode operating with a wavelength of 395 nm to 425 nm is configured to excite a first blue phosphor, a second green phosphor, and a third red phosphor. In this one embodiment of this configuration, a first blue phosphor plate could be fused or bonded to the second green phosphor plate which is fused or bonded to the third red phosphor plate. In a practical configuration the laser beam would be directly incident on the first blue phosphor wherein a fraction of the blue emission would excite the second green phosphor and third red phosphor to emit green and red emission to combine with first phosphor blue emission to generate a white light. In an alternative practical configuration the violet laser beam would be directly incident on the third red phosphor wherein a fraction of the violet electromagnetic emission would be absorbed in the red phosphor to excite red emission and a portion of the remaining violet laser emission would pass to the second green phosphor and create a green emission to combine with the red phosphor emission and a portion of the violet laser diode would pass to the first blue phosphor to create a blue emission to combine the red and green emission to generate a white light. In an alternative embodiment, a powdered mixture of phosphors would be dispensed onto a transparent plate or into a solid structure using a binder material such that the different color phosphors such as red, green, and blue phosphors are co-mingled and are configured to emit a white light when excited by the violet laser beam. The powdered phosphors could be comprised of YAG based phosphors, LuAG phosphors, and other phosphors. The benefit or feature of this embodiment is the higher color quality and color rendering quality that could be achieved from a white light comprised of red, green, and blue emission. Of course there could be other variants of this invention including integrating more than two phosphor and could include one of or a combination of a red, green, blue, and yellow phosphor.

In yet another variation of a side pumped phosphor configuration, a "point source" or "point source like" integrated white emitting device is achieved. In this configuration the phosphor would most likely have a cube geometry or spherical geometry such that white light can be emitted from more than 1 primary emission surface. For example, in a cube geometry up to all six faces of the cube can emit white light or in a sphere configuration the entire surface can emit to create a perfect point source. A first strong advantage to this configuration is that the white light spot size is controlled by the phosphor size, which can enable smaller spot sizes than alternative transmissive or reflective mode configurations by avoiding the spot size growth that happens within the phosphor due to scattering, reflection, and lack of efficient absorption in the phosphor. Ultra-small spot sizes are ideal for most efficient collimation in directional applications. A second advantage to this configuration is the ideal heat sinking configuration wherein for the phosphor member it is identical to a reflection mode configuration with the entire bottom surface of the phosphor can be thermally and mechanically attached to a heat-sink. Further, since the laser diode member does not require thick or angled intermediate support members to elevate the beam and dictate an angled incidence as in the reflection mode configurations, the laser can be mounted closer to the base member for a shorter thermal conduction path to the heat-sink. A third advantage is the inherent design for safety since the primary emission may be from the top surface of the phosphor orthogonal to the laser beam direction such that in the event of a phosphor breakage or compromise the laser beam would not be pointing the direction of white light capture. In this configuration, if the phosphor were to be removed or compromised the laser beam would be incident on the side of the package. Moreover, this configuration would avoid the potential issue in a reflective configuration where an escaped beam can result from a reflection of the incident beam on the top of the surface. In this side pumped configuration, the reflected beam would be substantially contained in the package. A fourth advantage is that since the laser diode or SLED device can be mounted flat on the base member, the assembly process and components can be simplified. In this side pumped configuration, it may be advantageous to promote primary emission from the top surface of the phosphor. This could be achieved with treatments to promote light escape from the top surface such as application of an anti-reflective coating or roughening, and treatments to reduce light escape from the side and bottom surfaces such as application of highly reflective layers such as metal or dielectric layers.

In some configurations of this embodiment the phosphor is attached to the common support member wherein the common support member may not be fully transparent. In this configuration the surface or side of the phosphor where it is attached would have impeded light emission and hence would reduce the overall efficiency or quality of the point source white light emitter. However, this emission impediment can be minimized or mitigated to provide a very efficient illumination. In other configurations, the phosphor is supported by a optically transparent member such that the light is free to emit in all directions from the phosphor point source. In one variation, the phosphor is fully surrounded in or encapsulated by an optically transparent material such as a solid material like SiC, diamond, GaN, or other, or a liquid material like water or a more thermally conductive liquid.

In another variation, the support member could also serve as a waveguide for the laser light to reach the phosphor. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics and/or reflector assembly are applied to a large point source, the optical control and collimation is diminished.

In some embodiments according to the present invention a periodic 2D photonic crystal structure can be applied to the single crystal or poly crystal phosphor materials structure. The photonic crystal structure would be employed to suppress emission in given directions and re-direct light out of the photonic crystal in a direction suitable and chosen for the device design. Phosphor structures today are largely Lambertian emitters except where waveguiding and critical angle comes into play. Many phosphors today satisfy the basic materials requirements needed to create photonic crystal structures—(dielectric or metallo-dielectric materials with low optical absorption). Adding photonic crystal structures to phosphor plate materials would allow light extraction to be enhanced in 1 direction over another in these materials. This can separate the excitation and emission characteristics thereby allowing greater flexibility in design.

In yet another variation of a side pumped phosphor embodiment, a phosphor is excited from the side and configured to emit a substantial portion of the white light from a top surface. In this configuration the phosphor would most likely have a cubic geometry, a cylindrical geometry, a faceted geometry, a hexagonal geometry, a triangular geometry, a pyramidal geometry, or other multi-sided geometries wherein the white light is configured to be emitted primarily from the top surface of the phosphor. In this configuration the laser beam would enter the phosphor from a first of side of the phosphor where a fraction of the laser excitation light with a first wavelength would be converted to a second wavelength. This first side of the phosphor may be configured for a modified reflectivity such as a coating or treatment to reduce the reflectivity in the blue or violet wavelength range and/or for increased reflectivity for the phosphor emission wavelength range such as yellow. In one example of the side pumped embodiment the laser excitation beam is incident on the first side of the phosphor at the Brewster angle. In further examples, the additional sides of the phosphor may be coated, treated, or shaped for an increased reflectivity to both the laser excitation wavelength and the phosphor conversion wavelength such that the light within the phosphor would be reflected inside the phosphor until it escaped from the top. Special phosphor shaping or coating techniques could be used to enhance the fraction of light escaping the top surface. A first strong advantage to this configuration is that the white light spot size is controlled by the phosphor size, which can enable smaller spot sizes than alternative transmissive or reflective mode configurations by avoiding the spot size growth that happens within the phosphor due to scattering, reflection, and lack of efficient absorption in the phosphor. Ultra-small spot sizes are ideal for most efficient collimation in directional applications. A second advantage to this configuration is the ideal heat sinking configuration wherein for the phosphor member it is identical to a reflection mode configuration with the entire bottom surface of the phosphor can be thermally and mechanically attached to a heat-sink. Further, since the laser diode member does not require thick or angled intermediate support members to elevate the beam and dictate an angled incidence as in the reflection mode configurations, the laser can be mounted closer to the base member for a shorter thermal conduction path to the heat-sink. A third advantage is the inherent design for safety since the primary emission may be from the top surface of the phosphor orthogonal to the laser beam direction such that in the event of a phosphor breakage or compromise the laser beam would not be pointing the direction of white light capture. In this configuration, if the phosphor were to be removed or compromised the laser beam would be incident on the side of the package. Moreover, this configuration would avoid the potential issue in a reflective configuration where an escaped beam can result from a reflection of the incident beam on the top of the surface. In this side pumped configuration, the reflected beam would be substantially contained in the package. A fourth advantage is that since the laser diode or SLED device can be mounted flat on the base member, the assembly process and components can be simplified. In this side pumped configuration, it may be advantageous to promote primary emission from the top surface of the phosphor.

In all of the side pumped and transmissive embodiments of this invention the additional features and designs can be included. For example, shaping of the excitation laser beam for optimizing the beam spot characteristics on the phosphor can be achieved by careful design considerations of the laser beam incident angle to the phosphor or with using integrated optics such as free space optics like collimating lens. In some embodiments re-imaging optics such as re-imaging reflectors are used to shape the excitation beam and/or re-capture excitation light reflected from the phosphor. Safety features can be included such as passive features like physical design considerations and beam dumps and/or active features such as thermal fuses, photodetectors, or thermistors that can be used in a closed loop to turn the laser off when a signal is indicated.

A point source omni-directional light source is configurable into several types of illumination patterns including 4-pi steradian illumination to provide a wide illumination to a three-dimensional volume such as a room, lecture hall, or stadium. Moreover, optical elements can be included to manipulate the generated white light to produce highly directional illumination. In some embodiments, reflectors such as parabolic reflectors or lenses such as collimating lenses are used to collimate the white light or create a spot light that could be applicable in an automobile headlight, flashlight, spotlight, or other lights. In other embodiments, the point source illumination can be modified with cylindrical optics and reflectors into linear omni-directional illumination, or linear directional illumination. Additionally, the point source illumination coupled into planar waveguides for planar 2-pi steradian emission, planar 4-pi steradian emission to produce glare-free illumination patterns that emit from a plane.

In a specific preferred embodiment of the integrated white light source, the present invention is configured for a reflective mode phosphor operation. In one example the excitation laser beam enters the phosphor through the same primary surface as the useful white light is emitted from. That is, operated in reflective mode the phosphor could have a first primary surface configured for both receiving the incident excitation laser beam and emitting useful white light. In this configuration, the phosphor is positioned in front of the laser facet outputting the laser beam, wherein both the laser and the phosphor are configured on a support member. The gallium and nitrogen containing laser diode is configured with a cavity that has a length greater than 100 μm, greater than 500 μm, greater than 1000 μm, or greater than 1500 μm long and a width greater than 1 μm, greater than 10 μm, greater than 20 μm, greater than 30 μm, or greater than 45 μm. The cavity is configured with a front facets and back facet on the end wherein the front facet comprises the output facet and emits the laser beam incident on the phosphor. The output facet may contain an optical coating to reduce the reflectivity in the cavity. The back facet can be coated with a high reflectivity coating to reduce the amount of light exiting the back facet of the laser diode. In one example, the phosphor can be comprised of Ce doped YAG and emits yellow emission. The phosphor may be a powdered ceramic phosphor, a ceramic phosphor plate, or could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 μm, greater than 100 μm, greater than 200 μm, greater than 500 μm, greater than 1 mm, or greater than 10 mm and a thickness of less than 500 μm, less than 200 μm, less than 100 μm or less than 50 μm.

In one example of the reflective mode CPoS white light source embodiment of this invention optical coatings, material selections are made, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light and is applied to the phosphor prior to attaching the phosphor to the common support member. In another example, a reflective material is used as a bonding medium that attaches the phosphor to the support member or to an intermediate submount member. Examples of reflective materials include reflective solders and reflective glues, but could be others. In some configurations the top primary surface of the phosphor wherein the laser excitation beam is incident is configured for a reduced reflectivity to the blue or violet excitation beam wavelength and/or the phosphor emission wavelength such as a yellow wavelength. The reduced reflectivity can be achieved with an optical coating of the phosphor using dielectric layers, a shaping of the phosphor surface, and roughening of the phosphor surface, or other techniques. In some examples the laser beam incident angle is configured at or near Brewster's angle, wherein the light with a particular polarization is perfectly transmitted through the primary surface of the phosphor. Due to the divergence of the laser resulting in a variation of incident angles for the plane waves within the beam a perfect transmission may be challenging, but ideally a substantial fraction of the light incident on the phosphor could be at or near Brewster's angle. For example, a YAG or LuAG phosphor may have a refractive index of about 1.8 in the violet and blue wavelength range. With the Brewster angle, $\theta_B$, given as arctan (n2/n1), where n1 is the index of air and n2 is the index of the phosphor, would be about 61 degrees [or about 55 to 65 degrees], off of the axis of normal incidence. Or alternatively, about 29 degrees [or about 25 to 35 degrees] rotated from the axis parallel to the phosphor surface.

With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode integrated white light source embodiment of this invention is configured with the phosphor member attached to the common support member with the large primary surface configured for receiving laser excitation light and emitting useful white light positioned at an angle normal (about 90 degrees) or off-normal (about 0 degrees to about 89 degrees) to the axis of the laser diode output beam functioning to excite the phosphor. That is, the laser output beam is pointing toward the phosphor's emission surface at an angle of between 0 and 90 degrees. The nature of this configuration wherein the laser beam is not directed in the same direction the primary phosphor emission surface emits is a built-in safety feature. That is, the laser beam is directed away from or opposite of the direction the useful white light will exit the phosphor. As a result, if the phosphor is to break or get damaged during normal operation or from tampering, the laser beam would not be directed to the outside world where it could be harmful. Instead, the laser beam would be incident on the backing surface where the phosphor was attached. As a result, the laser beam could be scattered or absorbed instead of exiting the white light source and into the surrounding environment. Additional safety measure can be taken such as using a beam dump feature or use of an absorbing material such as a thermal fuse that heats up and creates an open circuit within the laser diode drive circuit.

One example of this reflective mode integrated white light source embodiment is configured with the laser beam normal to the primary phosphor emission surface. In this configuration the laser diode would be positioned in front of the primary emission surface of the phosphor where it could impede the useful white light emitted from the phosphor. In a preferable embodiment of this reflective mode integrated white light source, the laser beam would be configured with an incident angle that is off-axis to the phosphor such that it hits the phosphor surface at an angle of between 0 and 89 degrees or at a "grazing" angle. In some configurations the incident angle is configured at or near Brewster's angle to maximize the transmission of the laser excitation light into the phosphor. In this preferable embodiment the laser diode device is positioned to the side of the phosphor instead of in front of the phosphor where it will not substantially block or impede the emitted white light. Moreover, in this configuration the built in safety feature is more optimal than in the normal incidence configuration since when incident at an angle in the case of phosphor damage or removal the incident laser beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

In all of the reflective mode embodiments of this invention the additional features and designs can be included. For example, shaping of the excitation laser beam for optimizing the beam spot characteristics on the phosphor can be achieved by careful design considerations of the laser beam incident angle to the phosphor or with using integrated optics such as free space optics like collimating lens. Beam shaping can also be achieved by using two or more adjacent parallel emitter stripes spaced by 10 μm to 30 μm, or 30 μm to 50 μm, or 100 μm to 250 μm such that the beam is enlarged in the slow-divergence axis from the laser emission apertures. Beam shaping may also be achieved with re-imaging optics. Safety features can be included such as passive features like physical design considerations and beam dumps and/or active features such as photodetectors or thermistors that can be used in a closed loop or a type of feedback loop to turn the laser off when a signal is indicated. Moreover, optical elements can be included to manipulate the generated white light. In some embodiments, reflectors such as parabolic reflectors or lenses such as collimating lenses are used to collimate the white light or create a spot light that could be applicable in an automobile headlight, flashlight, spotlight, or other lights.

In some embodiments according to the present invention, multiple laser diode sources are configured to excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Similarly, the reliability of the source can be increased by using multiple sources at lower drive conditions to achieve the same excitation power as a single source driven at more harsh conditions such as higher current and voltage. A second advantage is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in a emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm 10 nm, 15 nm, etc.) can be included to excite a yellow phosphor and create a larger blue spectrum.

In a specific embodiment, the present invention provides a laser-based fiber-coupled white light system. The white light system includes a laser device including a gallium and nitrogen containing material and configured as an excitation source with an output facet configured to output a laser emission with a first wavelength ranging from 385 nm to 495 nm. The white light system further includes a phosphor member configured as a wavelength converter and an emitter and coupled to the laser device in a free space between the output facet and an excitation surface of the phosphor member to receive the laser emission in a range of off-normal angles of incidence so that the laser beam lands from one side of the excitation surface to a spot on the excitation surface with a size greater than 5 μm. Additionally, the white light system includes a support member configured to support the laser device and/or the phosphor member. Furthermore, the phosphor member converts the laser emission with the first wavelength to a phosphor emission with a second wavelength that is longer than the first wavelength, the phosphor emission being reflected from the spot to the same side of the excitation surface to mix at least partially with laser emission to produce a white light emission. Moreover, the white light system includes a fiber coupled to the phosphor member to capture the white light emission with at least 20% efficiency to deliver or distribute the white light emission.

In another specific embodiment, the present invention provides a laser-based fiber-coupled white light system. The white light system includes a laser device comprising a gallium and nitrogen containing material and configured as an excitation source with an output facet configured to emit a laser emission with a first wavelength ranging from 385 nm to 495 nm. Additionally, the white light system includes a phosphor plate configured as a wavelength converter and an emitter in a free space with a receiving surface to receive the laser emission in a substantial normal direction. The phosphor plate converts the laser emission with the first wavelength to a phosphor emission with a second wavelength that is longer than the first wavelength. The phosphor emission is mixed at least partially with laser emission in the phosphor plate to generate a white light emission transmitted through the phosphor plate to exit from an output surface at opposite side of the receiving surface. Furthermore, the white light system includes a support member configured to support the laser device and/or the phosphor plate. Moreover, the white light system includes a fiber coupled to the phosphor plate to capture the white light emission with at least 20% efficiency to deliver or distribute the white light emission.

In yet another specific embodiment, the present invention provides a laser-based fiber-delivered white automobile headlight system. The automobile headlight system includes one or more white light source modules. Each of the one or more white light source modules includes a laser device comprising a gallium and nitrogen containing material and configured as an excitation source having an output facet configured to output a laser emission with a first wavelength ranging from 385 nm to 495 nm. Each of the one or more white light sources further includes a phosphor member configured as a wavelength converter and an emitter and coupled to the laser device in a free space between the output facet and an excitation surface of the phosphor member to receive the laser emission in a range of off-normal angles of incidence so that the laser beam lands from one side of the excitation surface to a spot on the excitation surface with a size greater than 5 μm. Additionally, each of the one or more white light sources includes a support member configured to support the laser device and/or the phosphor member. The phosphor member converts the laser emission with the first wavelength to a phosphor emission with a second wavelength that is longer than the first wavelength. The phosphor emission is reflected from the spot to the same side of the excitation surface to mix at least partially with laser emission to produce a white light emission. Furthermore, the automobile headlight system includes one or more transport fibers configured to have first ends to couple with the one or more white light source modules to capture the white light emission and transport the white light emission to second ends. Moreover, the automobile headlight system includes a headlight module attached at a remote location and coupled with the second ends of the one or more transport fibers, the headlight module being configured to project the white light onto road.

In an alternative embodiment, the present invention provides a laser-based fiber-coupled white light illumination source for automobile. The laser-based fiber-coupled white light illumination source includes one or more white light source modules. Each white light source module includes a laser device comprising a gallium and nitrogen containing material and configured as an excitation source. The laser device includes an output facet configured to output a laser emission with a first wavelength ranging from 385 nm to 495 nm. Each white light source module also includes a phosphor member configured as a wavelength converter and an emitter and disposed to allow the laser electromagnetic radiation being optically coupled to a primary surface of the phosphor member. Additionally, each white light source module includes an angle of incidence configured between the laser electromagnetic radiation and the primary surface of the phosphor member. The phosphor member is configured to convert at least a fraction of the laser electromagnetic radiation with the first wavelength landed in a spot greater than 5 μm on the primary surface to a phosphor emission with a second wavelength that is longer than the first wavelength. Furthermore, each white light source module includes a reflection mode characterizing the phosphor member with a white light emission being generated from at least an interaction of the laser electromagnetic radiation with the phosphor emission emitted from the primary surface. The white light emission includes of a mixture of wavelengths characterized by at least the second wavelength from the phosphor member. The laser-based fiber-coupled white light illumination source further includes one or more fibers configured to have first ends to couple with the one or more white light source modules to capture the white light emission and transport the white light emission to respective second ends, each of the one or more fibers being configured at least partially as a leaky fiber to form an illumination source for the automobile.

In another alternative embodiment, the present invention provides a laser-based-fiber-coupled white light illumination source for a vehicle. The fiber-coupled white light illumination source includes a laser device comprising a gallium and nitrogen containing material and configured as an excitation source. The laser device includes an output facet configured to output a laser emission with a first wavelength ranging from 385 nm to 495 nm. The fiber-coupled white light illumination source further includes a phosphor member configured as a wavelength converter and an emitter and disposed to convert the laser emission to emit an electromagnetic radiation with a second wavelength longer than the first wavelength. The electromagnetic radiation is combined with the laser emission partially to generate a white light, the phosphor member is integrated with an optical collimator to focus the white light. Furthermore, the fiber-coupled white light illumination source includes a fiber configured to couple the collimated white light and deliver the white light. The fiber also is at least partially configured as a leaky fiber to scatter the white light partially out of fiber body arranged in a custom shape at a feature location.

In yet another alternative embodiment, the present invention provides a fiber-coupled white light illumination source for vehicle lighting applications. The fiber-coupled white light illumination source includes a laser module disposed in vehicle power system. The laser module includes a gallium and nitrogen containing laser chip and a driver receiving power from the vehicle power system to drive the laser chip to output a laser emission with a first wavelength ranging from 385 nm to 495 nm. The fiber-coupled white light illumination source further includes a white light module comprising a phosphor member coupled with the laser module. The phosphor member is configured as a wavelength converter and an emitter to convert the laser emission to a phosphor radiation with a second wavelength longer than the first wavelength and to combine the phosphor radiation with the laser emission partially to generate a white light. The phosphor member is integrated with an optical collimator to focus the white light. Furthermore, the fiber-coupled white light illumination source includes a fiber configured to couple the collimated white light and deliver the white light to an exterior or interior feature location of the vehicle. The fiber includes a leaky fiber configured as an illumination element disposed at the exterior or interior feature location. The leaky fiber is configured to emit the white light partially by directional side scattering to generate effective luminous flux of greater than 25 lumens, or greater than 50 lumens, or greater than 150 lumens, or greater than 300 lumens, or greater than 600 lumens, or greater than 800 lumens, or greater than 1200 lumens in an optical efficiency of greater than 35% out of a surface of the leaky fiber. The feature location of the vehicle includes, but not limited to, front grill structure, license plate, lower and side bumper, dashboard, door handle and panel, entry sill, window frame, ceiling, moonroof, floor, and seat.

In still another alternative embodiment, the present invention provides a laser-based fiber-coupled white headlight for vehicle. The laser-based fiber-coupled white headlight for vehicle includes a laser module disposed in vehicle power system, the laser module comprising a gallium and nitrogen containing laser chip and a driver receiving power from the vehicle power system to drive the laser chip to output a laser emission with a first wavelength ranging from 385 nm to 495 nm. The laser-based fiber-coupled white headlight for vehicle also includes a white light module comprising a phosphor member coupled with the laser module. The phosphor member is configured as a wavelength converter and an emitter to convert the laser emission to a phosphor radiation with a second wavelength longer than the first wavelength and to combine the phosphor radiation with the laser emission partially to generate a white light. The phosphor member is integrated with an optical collimator to focus the white light. Additionally, the laser-based fiber-coupled white headlight for vehicle includes a transport fiber configured to couple the collimated white light and deliver the white light to a feature location for headlight of the vehicle. Furthermore, the laser-based fiber-coupled white headlight for vehicle includes a headlight module disposed at the feature location comprising a beam projection unit configured to receive the white light from the transport fiber and project a beam of the white light onto road with effective luminous flux of greater than 150 lumens, or greater than 300 lumens, or greater than 600 lumens, or greater than 800 lumens, or greater than 1200 lumens in an optical efficiency of greater than 35%. The feature location of the vehicle includes some area in front grill structure, some area on each wheel cover, some area between the hood and front bumper. The beam projection unit is configured to have a miniaturized size of less than 5 cm, less than 3 cm, or less than 1 cm.

A further understanding of the nature and advantages of the present invention may be realized by reference to the latter portions of the specification and attached drawings.

BRIEF DESCRIPTION OF THE DRAWINGS

The following drawings are merely examples for illustrative purposes according to various disclosed embodiments and are not intended to limit the scope of the present invention.

DETAILED DESCRIPTION

The present invention provides a method and device for emitting white colored electromagnetic radiation using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials to form a compact, high-brightness, and highly-efficient, white light source.

Figure 1:
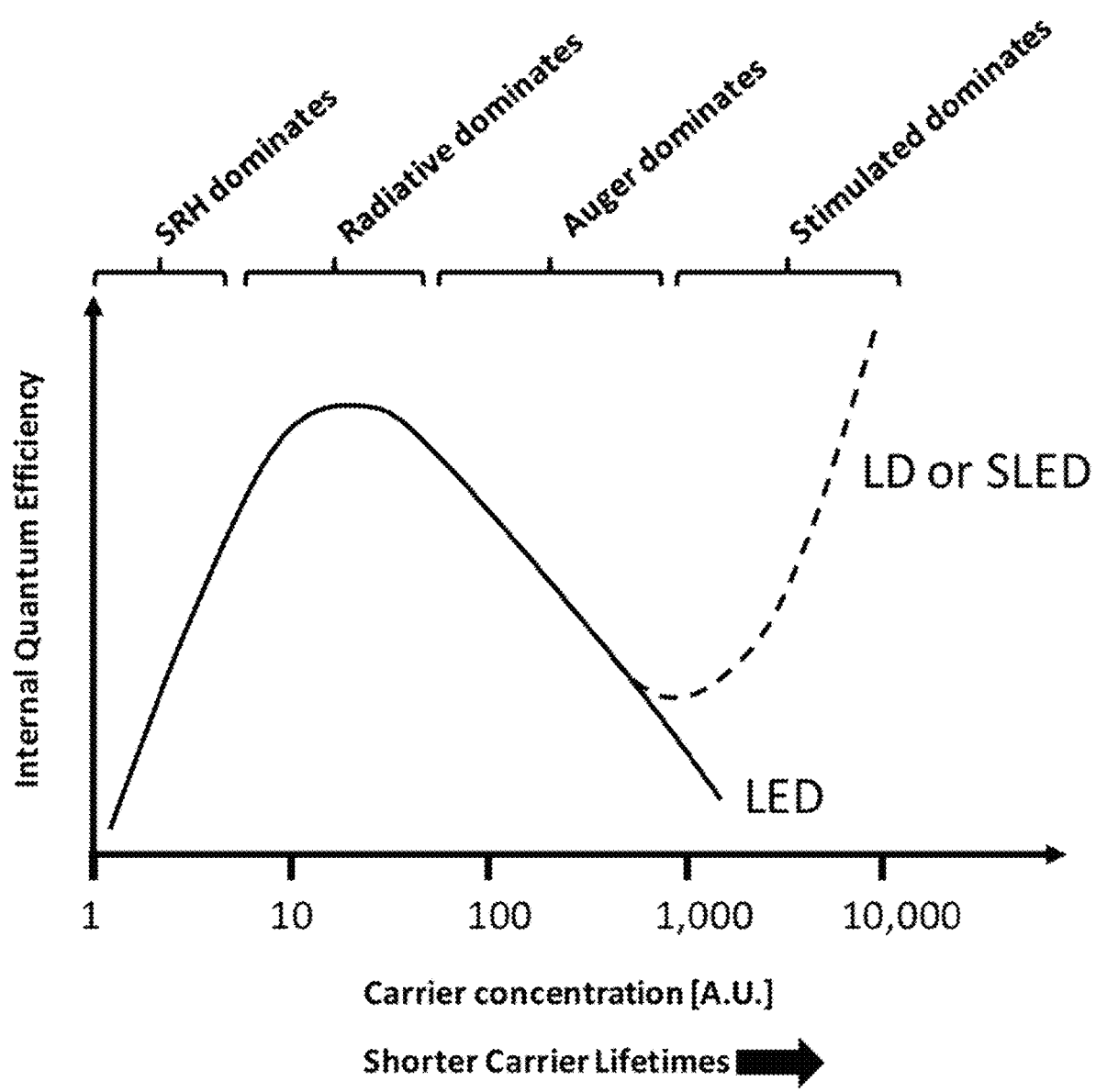
FIG. 1 is a schematic diagram showing dependence of internal quantum efficiency in a laser diode on carrier concentration in the light emitting layers of the device.
Figure 2:
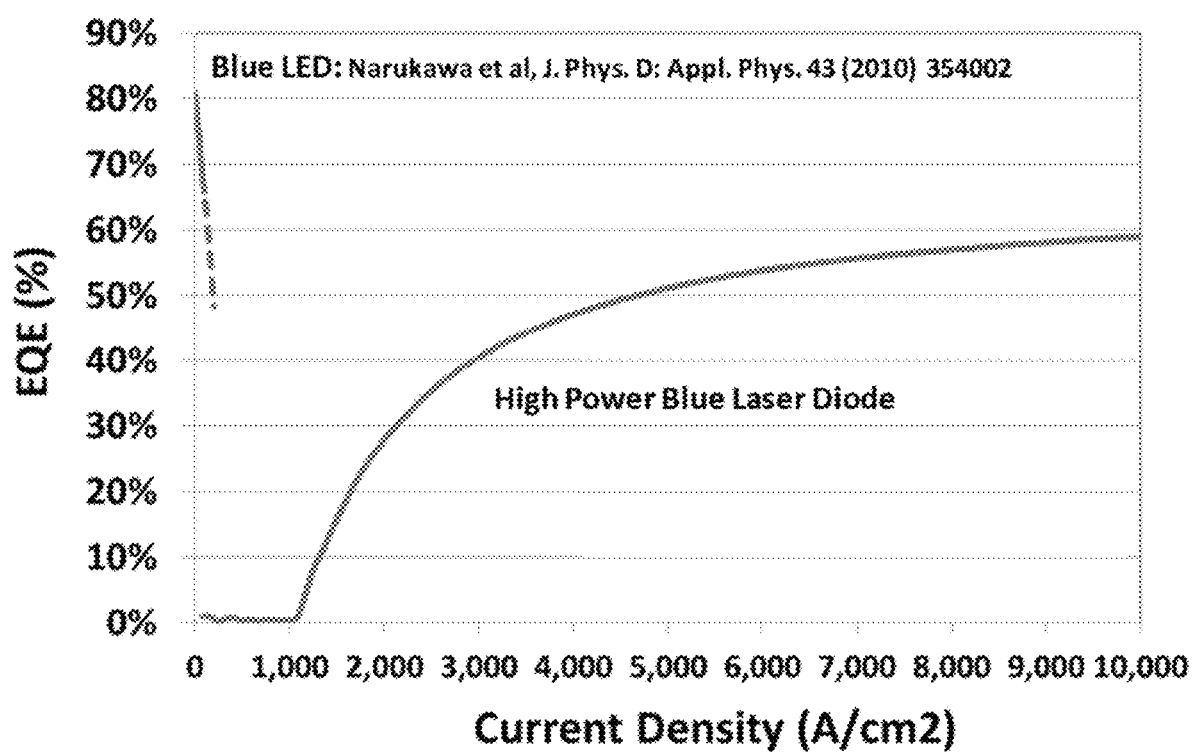
FIG. 2 is a plot of external quantum efficiency as a function of current density for a high-power blue laser diode compared to the high-power blue light emitting diode.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm$^2$ range. FIG. 1 shows a schematic diagram of the relationship between internal quantum efficiency [IQE] and carrier concentration in the light emitting layers of a light emitting diode [LED] and light-emitting devices where stimulated emission is significant such as laser diodes [LDs] or super-luminescent LEDs. IQE is defined as the ratio of the radiative recombination rate to the total recombination rate in the device. At low carrier concentrations Shockley-Reed-Hall recombination at crystal defects dominates recombination rates such that IQE is low. At moderate carrier concentrations, spontaneous radiative recombination dominates such that IQE is relatively high. At high carrier concentrations, non-radiative auger recombination dominates such that IQE is again relatively low. In devices such as LDs or SLEDs, stimulated emission at very high carrier densities leads to a fourth regime where IQE is relatively high. FIG. 2 shows a plot of the external quantum efficiency [EQE] for a typical blue LED and for a high-power blue laser diode. EQE is defined as the product of the IQE and the fraction of generated photons that is able to exit the device. While the blue LED achieves a very high EQE at very low current densities, it exhibits very low EQE at high current densities due to the dominance of auger recombination at high current densities. The LD, however, is dominated by stimulated emission at high current densities, and exhibits very high EQE. At low current densities, the LD has relatively poor EQE due to re-absorption of photons in the device. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm$^2$ to 30 mm$^2$ of epi area.

A second limitation of LEDs is also related to their brightness, more specifically it is related to their spatial brightness. A conventional high brightness LED emits ~1 W per mm$^2$ of epi area. With some advances and breakthrough this can be increased up to 5-10× to 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 μm wide by about 0.5 μm tall, which equates to over 250,000 W/mm$^2$. This spatial brightness is over 5 orders of magnitude higher than LEDs or put another way, 10,000 times brighter than an LED.

Based on essentially all the pioneering work on GaN LEDs, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective laser-based remotely delivered white light source. In a specific embodiment, the present optical device can be manufactured in a relatively simple and cost-effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a laser chip on submount (CoS) with the laser light being delivered by a waveguide to a phosphor supported on a remotely disposed submount and/or a remote support member to form a remotely-delivered white light source. In some embodiments, the waveguide is a semiconductor waveguide integrated on an intermediate submount coupled with the CoS. In some embodiments the waveguide includes an optical fiber disposed substantially free in space or in custom layout, making the white light source a fiber-delivered white light source. In some embodiments the white light source includes beam collimation and focus elements to couple the laser light into the waveguide or fiber. In some embodiments, the white light source includes multiple laser chips either independently or co-packaged in a same package case and the phosphor member are supported in a separate submount heatsink packaged in a remote case. In some embodiments there could be additional beam shaping optical elements included for shaping or controlling the white light out of the phosphor.

In various embodiments, the laser device and phosphor device are separately packaged or mounted on respective support member and the phosphor materials are operated in a reflective mode to result in a white emitting laser-based light source. In additional various embodiments, the electromagnetic radiation from the laser device is remotely coupled to the phosphor device through means such as free space coupling or coupling with a waveguide such as a fiber optic cable or other solid waveguide material, and wherein the phosphor materials are operated in a reflective mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, autonomous vehicles, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 µm in diameter, less than 100 µm in diameter, or even less than 50 µm in diameter, power densities of over 1 W/mm$^2$, 100 W/mm$^2$, or even over 2,500 W/mm$^2$ can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 µm, or 50 µm, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In some embodiments of the present invention the gallium and nitrogen containing light emitting device may not be a laser device, but instead may be configured as a superluminescent diode or superluminescent light emitting diode (SLED) device. For the purposes of this invention, a SLED device and laser diode device can be used interchangeably. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. The advantage of a SLED device is that SLED it can combine the unique properties of high optical emission power and extremely high spatial brightness of laser diodes that make them ideal for highly efficient long throw illumination and high brightness phosphor excitation applications with a broad spectral width of (>5 nm) that provides for an improved eye safety and image quality in some cases. The broad spectral width results in a low coherence length similar to an LED. The low coherence length provides for an improved safety such has improved eye safety. Moreover, the broad spectral width can drastically reduce optical distortions in display or illumination applications. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width. In the present specification, both a laser diode (LD) device and a superluminescent light emitting diode (SLED) device are sometime simply referred to "laser device".

A gallium and nitrogen containing laser diode (LD) or super luminescent light emitting diode (SLED) may comprise at least a gallium and nitrogen containing device having an active region and a cavity member and are characterized by emitted spectra generated by the stimulated emission of photons. In some embodiments a laser device emitting red laser light, i.e. light with wavelength between about 600 nm to 750 nm, are provided. These red laser diodes may comprise at least a gallium phosphorus and arsenic containing device having an active region and a cavity member and are characterized by emitted spectra generated by the stimulated emission of photons. The ideal wavelength for a red device for display applications is ~635 nm, for green ~530 nm and for blue 440-470 nm. There may be tradeoffs between what colors are rendered with a display using different wavelength lasers and also how bright the display is as the eye is more sensitive to some wavelengths than to others.

In some embodiments according to the present invention, multiple laser diode sources are configured to excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Beyond scaling the power of each single laser diode emitter, the total luminous flux of the white light source can be increased by continuing to increase the total number of laser diodes, which can range from 10 s, to 100 s, and even to 1000 s of laser diode emitters resulting in 10 s to 100 s of kW of laser diode excitation power. Scaling the number of laser diode emitters can be accomplished in many ways such as including multiple lasers in a co-package, spatial beam combining through conventional refractive optics or polarization combining, and others. Moreover, laser diode bars or arrays, and mini-bars can be utilized where each laser chip includes many adjacent laser diode emitters. For example, a bar could include from 2 to 100 laser diode emitters spaced from about 10 microns to about 400 microns apart. Similarly, the reliability of the source can be increased by using multiple sources at lower drive conditions to achieve the same excitation power as a single source driven at more harsh conditions such as higher current and voltage.

In a specific area of light source application is automobile headlamp. Semiconductor based light emitting diode (LED) headlight sources were fielded in 2004, the first solid-state sources. These featured high efficiency, reliability, and compactness, but the limited light output per device and brightness caused the optics and heat sinks to be still are quite large, and the elevated temperature requirements in auto applications were challenging. Color uniformity from the blue LED excited yellow phosphor needed managed with special reflector design. Single LED failure meant the entire headlamp needed to be scrapped, resulting in challenging costs for maintenance, repair, and warranty. Moreover, the LED components are based on spontaneous emission, and therefore are not conducive to high-speed modulation required for advanced applications such as 3D sensing (LiDAR), or optical communication (LiFi). The low luminance also creates challenges for spatially dynamic automotive lighting systems that utilize spatial modulators such as MEMS or liquid crystal devices. Semiconductor laser diode (LD) based headlights started production in 2014 based on laser pumped phosphor architectures, since direct emitting lasers such as R-G-B lasers are not safe to deploy onto the road and since R-G-B sources leave gaps in the spectrum that would leave common roadside targets such as yellow or orange with insufficient reflection back to the eye. Laser pumped phosphor are solid state light sources and therefore featured the same benefits of LEDs, but with higher brightness and range from more compact headlamp reflectors. Initially, these sources exhibited high costs, reduced reliability compared to LEDs, due to being newer technology. In some cases, the laser and phosphor were combined in a single unit, and in other cases, the blue laser light was delivered by fiber to a remotely disposed phosphor module to produce white light emission. Special precautions were needed to ensure safe white light emission occurred with passive and active safety measures. Color uniformity from the blue laser excited yellow phosphor needed managed with special reflector design.

In some embodiments, the invention described herein can be applied to a fiber delivered headlight comprised of one or more gallium and nitrogen containing visible laser diode for emitting laser light that is efficiently coupled into a waveguide (such as an optical fiber) to deliver the laser emission to a remote phosphor member configured on the other end of the optical fiber. The laser emission serves to excite the phosphor member and generate a high brightness white light. In a headlight application, the phosphor member and white light generation occurs in a final headlight module, from where the light is collimated and shaped onto the road to achieve the desired light pattern.

This disclosure utilizes fiber delivery of visible laser light from a gallium and nitrogen containing laser diode to a remote phosphor member to generate a white light emission with high luminance, and has several key benefits over other approaches. One advantage lies in production of controllable light output or amount of light for low beam or high beam using modular design in a miniature headlight module footprint. Another advantage is to provide high luminance and long range of visibility. For example, based on recent driving speeds and safe stopping distances, a range of 800 meters to 1 km is possible from 200 lumens on the road using a size <35 mm optic structure with light sources that are 1000 cd per mm$^2$. Using higher luminance light sources allows one to achieve longer-range visibility for the same optics size. Further advantage of the fiber-delivered whitelight headlight is able to provide high contrast. It is important to minimize glare and maximize safety and visibility for drivers and others including oncoming traffic, pedestrians, animals, and drivers headed in the same direction traffic ahead. High luminance is required to produce sharp light gradients and the specific regulated light patterns for automotive lighting. Moreover, using a waveguide such as an optical fiber, extremely sharp light gradients and ultra-safe glare reduction can be generated by reshaping and projecting the decisive light cutoff that exists from core to cladding in the light emission profile.

Another advantage of the present invention is to provide rich spectrum white color light. Laser pumped phosphors are broadband solid-state light sources and therefore featured the same benefits of LEDs, but with higher luminance. Direct emitting lasers such as R-G-B lasers are not safe to deploy onto the road since R-G-B sources leave gaps in the spectrum that would leave common roadside targets such as yellow or orange with insufficient reflection back to the eye. Also, because of the remote nature of the light sources, the headlight module can be mounted onto a pre-existing heat sink with adequate thermal mass that is located anywhere in the vehicle, eliminating the need for heat sink in the headlight.

One big advantage is small form factor of the light source and a low-cost solution for swiveling the light for glare mitigation and enhancing aerodynamic performance. For example, miniature optics <1 cm in diameter in a headlight module can be utilized to capture nearly 100% of the light from the fiber. The white light can be collimated and shaped with tiny diffusers or simple optical elements to produce the desired beam pattern on the road. it is desired to have extremely small optics sizes for styling of the vehicle. Using higher luminance light sources allows one to achieve smaller optics sizes for the same range of visibility. This headlight design allows one to integrate the headlight module into the grill, onto wheel cover, into seams between the hood and front bumper, etc. This headlight design features a headlight module that is extremely low mass and lightweight, and therefore minimized weight in the front of the car, contributing to safety, fuel economy, and speed/acceleration performance. For electric vehicles, this translates to increased vehicle range. Moreover, the decoupled fiber delivered architecture use pre-existing heat sink thermal mass already in vehicle, further minimizing the weight in the car. Furthermore, this headlight module is based on solid-state light source, and has long lifetime >10,000 hours. Redundancy and interchangeability are straightforward by simply replacing the fiber-delivered laser light source.

Because of the fiber configuration in the design of the fiber-delivered laser-induced white light headlight module, reliability is maximized by positioning the laser-induced light source away from the hot area near engine and other heat producing components. This allows the headlight module to operate at extremely high temperatures >100° C., while the laser module can operate in a cool spot with ample heat sinking. In a specific embodiment, the present invention utilizes thermally stable, military standard style, telcordia type packaging technology. The only elements exposed to the front of the car are the complexly passive headlight module, comprised tiny macro-optical elements. There is no laser directly deployed in the headlight module, only incoherent white light and a reflective phosphor architecture inside. Direct emitting lasers such as R-G-B lasers are not safe to deploy onto the road at high power and are not used in this design. It is safe and cost efficient to assemble this fiber-delivered white light source into the car while manufacturing the vehicle.

In LED-based headlights, if one high power LED element dies, the entire headlamp is typically scrapped. The fiber-delivered headlight design enables "plug and play" replacement of the light source, eliminating wasted action of completely scrapping headlights due to a failed component. The plug and play can occur without alignment, like replacing a battery, minimize warranty costs. This eliminates excessive replacement cost, customer wait times, dangerous driving conditions, and expensive loaner vehicles. Because of the ease of generating new light patterns, and the modular approach to lumen scaling, this fiber-delivered light source allows for changing lumens and beam pattern for any region without retooling for an entirely new headlamp. This convenient capability to change beam pattern can be achieved by changing tiny optics and or diffusers instead of retooling for new large reflectors. Moreover, the fiber-delivered white light source can be used in interior lights and daytime running lights (DRL), with transport or side emitting plastic optical fiber (POF).

Spatially dynamic beam shaping devices such as digital-light processing (DLP), liquid-crystal display (LCD), 1 or 2 MEMS or Galvo mirror systems, lightweight swivels, scanning fiber tips. Future spatially dynamic sources may require even brighter light, such as 5000-10000 lumens from the source, to produce high definition spatial light modulation on the road using MEMS or liquid crystal components. Such dynamic lighting systems are incredibly bulky and expensive when co-locating the light source, electronics, heat sink, optics, and light modulators, and secondary optics. Therefore, they require-fiber delivered high luminance white light to enable spatial light modulation in a compact and more cost-effective manner.

An additional advantage of combining the emission from multiple laser diode emitters is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in an emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm, 10 nm, 15 nm, etc.) can be included to excite a yellow phosphor and create a larger blue spectrum.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

The laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane. In some embodiments, a gallium and nitrogen containing laser diode laser diode comprises a gallium and nitrogen containing substrate. The substrate member may have a surface region on the polar {0001} plane (c-plane), nonpolar plane (m-plane, a-plane), and semipolar plain ({11-22}, {10-1-1}, {20-21}, {30-31}) or other planes of a gallium and nitrogen containing substrate. The laser device can be configured to emit a laser beam characterized by one or more wavelengths from about 390 nm to about 540 nm.

Figure 3:
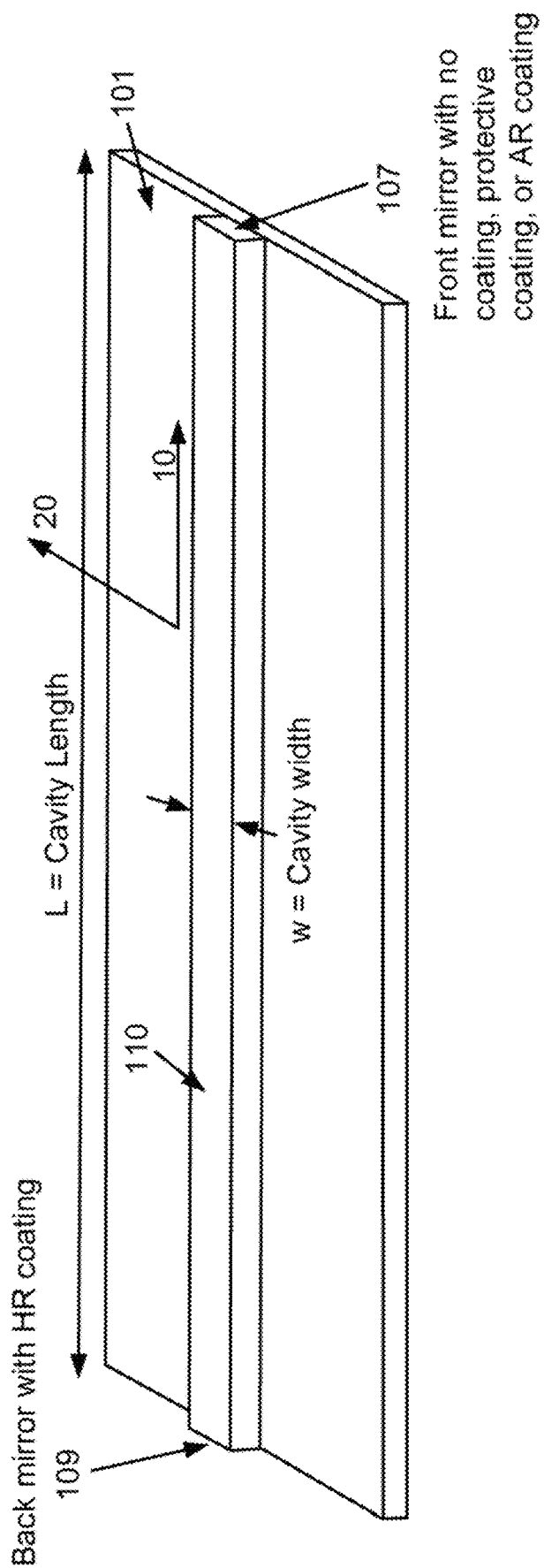
FIG. 3 is a simplified schematic diagram of a laser diode formed on a gallium and nitrogen containing substrate with the cavity aligned in a direction ended with cleaved or etched mirrors according to some embodiments of the present invention.

FIG. 3 is a simplified schematic diagram of a laser diode formed on a gallium and nitrogen containing substrate with the cavity aligned in a direction ended with cleaved or etched mirrors according to some embodiments of the present invention. In an example, the substrate surface 101 is a polar c-plane and the laser stripe region 110 is characterized by a cavity orientation substantially in an m-direction 10, which is substantially normal to an a-direction 20, but can be others such as cavity alignment substantially in the a-direction. The laser strip region 110 has a first end 107 and a second end 109 and is formed on an m-direction on a {0001} gallium and nitrogen containing substrate having a pair of cleaved or etched mirror structures, which face each other. In another example, the substrate surface 101 is a semipolar plane and the laser stripe region 110 is characterized by a cavity orientation substantially in a projection of a c-direction 10, which is substantially normal to an a-direction 20, but can be others such as cavity alignment substantially in the a-direction. The laser strip region 110 has a first end 107 and a second end 109 and is formed on a semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. Optionally, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In some embodiments, the GaN substrate has threading dislocations, at a concentration between about $10^5$ cm$^{-2}$ and about $10^8$ cm$^{-2}$, in a direction that is substantially orthogonal or oblique with respect to the surface.

The exemplary laser diode devices in FIG. 3 have a pair of cleaved or etched mirror structures 109 and 107, which face each other. The first cleaved or etched facet 109 comprises a reflective coating and the second cleaved or etched facet 107 comprises no coating, an antireflective coating, or exposes gallium and nitrogen containing material. The first cleaved or etched facet 109 is substantially parallel with the second cleaved or etched facet 107. The first and second cleaved facets 109 and 107 are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The reflective coating is selected from silicon dioxide, hafnia, and titania, tantalum pentoxide, zirconia, aluminum oxide, aluminum nitride, and aluminum oxynitride including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for a ridge laser. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In some embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 μm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe 110 is characterized by a length and width. The length ranges from about 50 μm to about 3000 μm, but is preferably between about 10 μm and about 400 μm, between about 400 μm and about 800 μm, or about 800 μm and about 1600 μm, but could be others. The stripe also has a width ranging from about 0.5 μm to about 50 μm, but is preferably between about 0.8 μm and about 2.5 μm for single lateral mode operation or between about 2.5 μm and about 50 μm for multi-lateral mode operation, but can be other dimensions. In a specific embodiment, the present device has a width ranging from about 0.5 μm to about 1.5 μm, a width ranging from about 1.5 μm to about 3.0 μm, a width ranging from about 3.0 μm to about 50 μm, and others. In a specific embodiment, the width is substantially constant in dimension, although there may be slight variations. The width and length are often formed using a masking and etching process, which are commonly used in the art.

The laser stripe region 110 is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

In a specific embodiment, the laser device may emit red light with a center wavelength between 600 nm and 750 nm. Such a device may comprise layers of varying compositions of $Al_xIn_yGa_{1-x-y}As_zP_{1-z}$, where x+y≤1 and z≤1. The red laser device comprises at least an n-type and p-type cladding layer, an n-type SCH of higher refractive index than the n-type cladding, a p-type SCH of higher refractive index than the p-type cladding and an active region where light is emitted. In a specific embodiment, the laser stripe is provided by an etching process selected from dry etching or wet etching. In a preferred embodiment, the etching process is dry, but can be others. The device also has an overlying dielectric region, which exposes the contact region. In a specific embodiment, the dielectric region is an oxide such as silicon dioxide, but can be others. Of course, there can be other variations, modifications, and alternatives. The laser stripe is characterized by a length and width. The length ranges from about 50 µm to about 3000 µm, but is preferably between 10 µm and 400 µm, between about 400 µm and 800 µm, or about 800 and 1600 µm, but could be others such as greater than 1600 µm. The stripe also has a width ranging from about 0.5 µm to about 80 µm, but is preferably between 0.8 µm and 2.5 µm for single lateral mode operation or between 2.5 µm and 60 µm for multi-lateral mode operation, but can be other dimensions. The laser strip region has a first end and a second end having a pair of cleaved or etched mirror structures, which face each other. The first facet comprises a reflective coating and the second facet comprises no coating, an antireflective coating, or exposes gallium and nitrogen containing material. The first facet is substantially parallel with the second cleaved or etched facet.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

Similar to an edge emitting laser diode, a SLED is typically configured as an edge-emitting device wherein the high brightness, highly directional optical emission exits a waveguide directed outward from the side of the semiconductor chip. SLEDs are designed to have high single pass gain or amplification for the spontaneous emission generated along the waveguide. However, unlike laser diodes, they are designed to provide insufficient feedback to in the cavity to achieve the lasing condition where the gain equals the total losses in the waveguide cavity. In a typical example, at least one of the waveguide ends or facets is designed to provide very low reflectivity back into the waveguide. Several methods can be used to achieve reduced reflectivity on the waveguide end or facet. In one approach an optical coating is applied to at least one of the facets, wherein the optical coating is designed for low reflectivity such as less than 1%, less than 0.1%, less than 0.001%, or less than 0.0001% reflectivity. In another approach for reduced reflectivity the waveguide ends are designed to be tilted or angled with respect to the direction of light propagation such that the light that is reflected back into the chip does not constructively interfere with the light in the cavity to provide feedback. The tilt angle must be carefully designed around a null in the reflectivity versus angle relationship for optimum performance. The tilted or angled facet approach can be achieved in a number of ways including providing an etched facet that is designed with an optimized angle lateral angle with respect to the direction of light propagation. The angle of the tilt is pre-determined by the lithographically defined etched facet patter. Alternatively, the angled output could be achieved by curving and/or angling the waveguide with respect to a cleaved facet that forms on a pre-determined crystallographic plane in the semiconductor chip. Another approach to reduce the reflectivity is to provide a roughened or patterned surface on the facet to reduce the feedback to the cavity. The roughening could be achieved using chemical etching and/or a dry etching, or with an alternative technique. Of course, there may be other methods for reduced feedback to the cavity to form a SLED device. In many embodiments a number of techniques can be used in combination to reduce the facet reflectivity including using low reflectivity coatings in combination with angled or tilted output facets with respect to the light propagation.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with a of the following epitaxially grown elements:

- an n-GaN or n-AlGaN cladding layer with a thickness from 100 nm to 3000 nm with Si doping level of $5 \times 10^{17}$ cm$^{-3}$ to $3 \times 10^{18}$ cm$^{-3}$;
- an n-side SCH layer comprised of InGaN with molar fraction of indium of between 2% and 15% and thickness from 20 nm to 250 nm;
- a single quantum well or a multiple quantum well active region comprised of at least two 2.0 nm to 8.5 nm InGaN quantum wells separated by 1.5 nm and greater, and optionally up to about 12 nm, GaN or InGaN barriers;
- a p-side SCH layer comprised of InGaN with molar a fraction of indium of between 1% and 10% and a thickness from 15 nm to 250 nm or an upper GaN-guide layer;
- an electron blocking layer comprised of AlGaN with molar fraction of aluminum of between 0% and 22% and thickness from 5 nm to 20 nm and doped with Mg;
- a p-GaN or p-AlGaN cladding layer with a thickness from 400 nm to 1500 nm with Mg doping level of $2 \times 10^{17}$ cm$^{-3}$ to $2 \times 10^{19}$ cm-3; and
- a p$^{++}$-GaN contact layer with a thickness from 20 nm to 40 nm with Mg doping level of $1 \times 10^{19}$ cm$^{-3}$ to $1 \times 10^{21}$ cm$^{-3}$.

A gallium and nitrogen containing laser diode laser device may also include other structures, such as a surface ridge architecture, a buried heterostructure architecture, and/or a plurality of metal electrodes for selectively exciting the active region. For example, the active region may comprise first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material. In a specific embodiment, the device also has an overlying n-type gallium nitride layer, an active region, and an overlying p-type gallium nitride layer structured as a laser stripe region. Additionally, the device may also include an n-side separate confinement heterostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about $10^{19}$ to $10^{21}$ Mg/am$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$.

Figure 4:
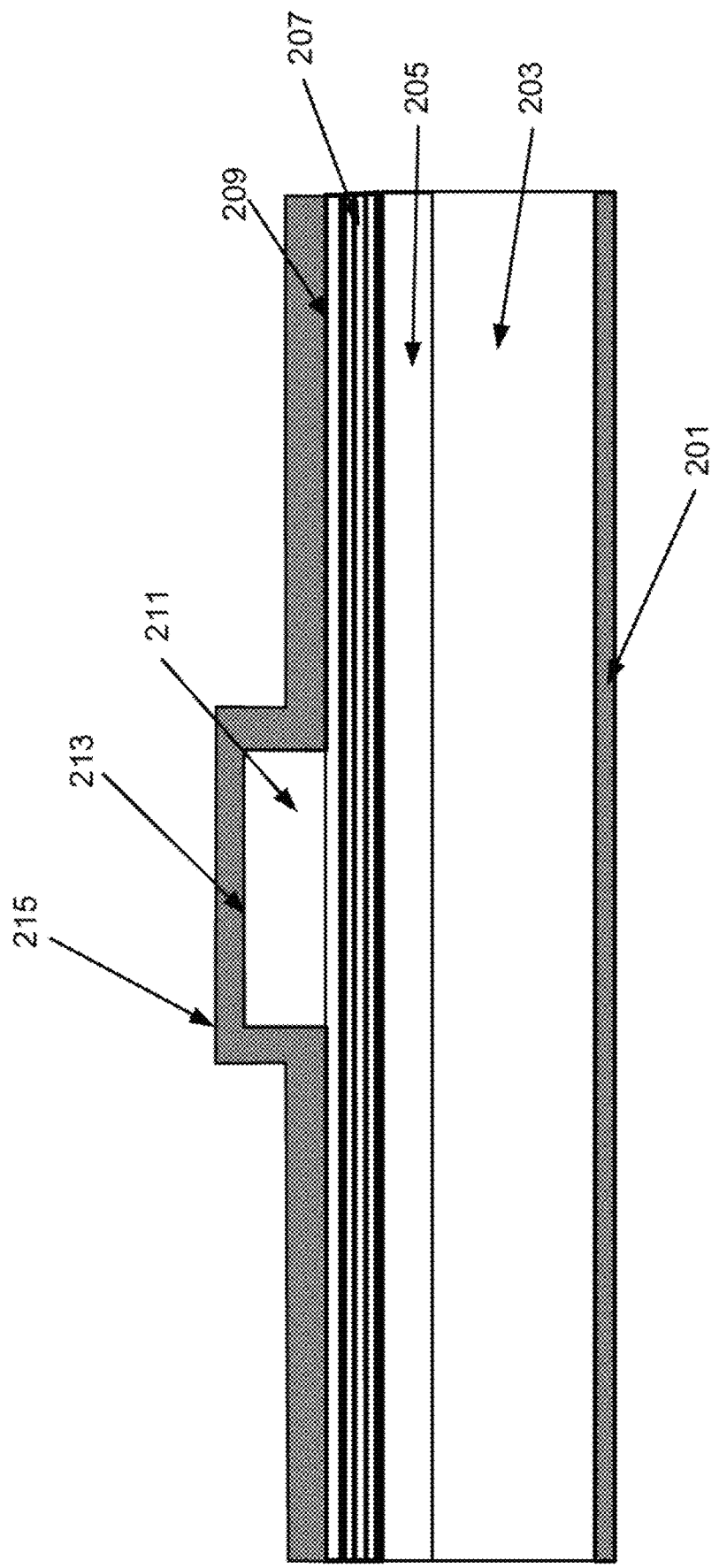
FIG. 4 is a cross-sectional view of a laser device according to an embodiment of the present invention.

FIG. 4 is a cross-sectional view of a laser device 200 according to some embodiments of the present disclosure.

As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$.

An n-type $Al_uIn_vGa_{1-u-v}N$ layer, where $0 \le u$, v, $u+v \le 1$, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes a contact region 213. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof. In some embodiments, barrier layers and more complex metal stacks are included.

Active region 207 preferably includes one to ten quantum-well regions or a double heterostructure region for light emission. Following deposition of the n-type layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_wIn_xGa_{1-w-x}N$ and $Al_yIn_zGa_{1-y-z}N$, respectively, where $0 \le w$, x, y, z, $w+x$, $y+z \le 1$, where $w<u$, y and/or $x>v$, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ $cm^{-3}$ and $10^{22}$ $cm^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes the contact region 213.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIG. 3 and FIG. 4 and described above are typically suitable for low-power applications.

In various embodiments, the present invention realizes high output power from a diode laser is by widening a portion of the laser cavity member from the single lateral mode regime of 1.0-3.0 µm to the multi-lateral mode range 5.0-20 µm. In some cases, laser diodes having cavities at a width of 50 µm or greater are employed.

The laser stripe length, or cavity length ranges from 100 to 3000 µm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

Optionally, FIG. 4 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlInGaN, or InGaN and n-type cladding layers comprised of GaN, AlGaN, or AlInGaN. The n-typed layers may have thickness in the range of 0.3 µm to about 3 µm or to about 5 µm and may be doped with an n-type carrier such as Si or O to concentrations between $1 \times 10^{16}$ $cm^{-3}$ to $1 \times 10^{19}$ $cm^{-3}$. Overlying the n-type layers is the active region and waveguide layers 207. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlInGaN, or a combination thereof. The thickness of the p-type cladding layers is in the range of 0.3 µm to about 2 µm and is doped with Mg to a concentration of between $1 \times 10^{16}$ $cm^{-3}$ to $1 \times 10^{19}$ $cm^{-3}$. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing a of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing Au, Al, Pd, Pt, Ni, Ti, or Ag and may be deposited with electron beam deposition, sputter deposition, or thermal evaporation.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however, the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode.

In an embodiment, the LD or SLED device is characterized by a ridge with non-uniform width. The ridge is comprised by a first section of uniform width and a second section of varying width. The first section has a length between 100 and 500 µm long, though it may be longer. The first section has a width of between 1 and 2.5 µm, with a width preferably between 1 and 1.5 µm. The second section of the ridge has a first end and a second end. The first end connects with the first section of the ridge and has the same width as the first section of the ridge. The second end of the second section of the ridge is wider than the first section of the ridge, with a width between 5 and 50 µm and more preferably with a width between 15 and 35 µm. The second section of the ridge waveguide varies in width between its first and second end smoothly. In some embodiments the second derivative of the ridge width versus length is zero such that the taper of the ridge is linear. In some embodiments, the second derivative is chosen to be positive or negative. In general, the rate of width increase is chosen such that the ridge does not expand in width significantly faster than the optical mode. In specific embodiments, the electrically injected area is patterned such that only a part of the tapered portion of the waveguide is electrically injected.

In an embodiment, multiple laser dice emitting at different wavelengths are transferred to the same carrier wafer in close proximity to one another; preferably within one millimeter of each other, more preferably within about 200 micrometers of each other and most preferably within about 50 µm of each other. The laser die wavelengths are chosen to be separated in wavelength by at least twice the full width at half maximum of their spectra. For example, three dice, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based visible light communication (VLC) source in that bandwidth would scale easily with the number of laser emitters. Of course, a similar embodiment with similar advantages could be constructed from SLED emitters.

After the laser diode chip fabrication as described above, the laser diode can be mounted to a submount. In some examples the submount is comprised of AlN, SiC, BeO, diamond, or other materials such as metals, ceramics, or composites. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 µm to about 2 mm. In the example wherein the submount is an intermediate submount between the laser diode chip and the common support member it could be characterized by width and length ranging in dimension from about 0.5 mm to about 5 mm and the thickness may range from about 50 µm to about 500 µm. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 5:
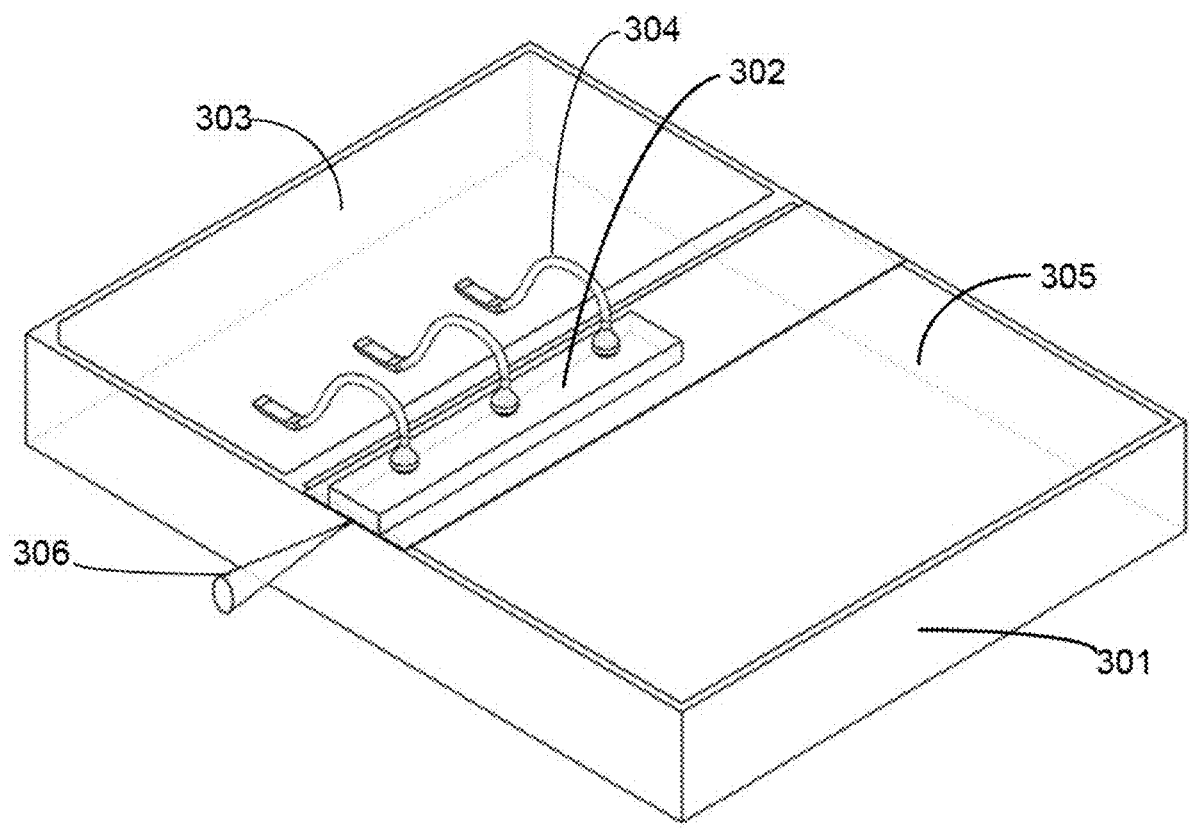
FIG. 5 is a schematic diagram illustrating a chip on submount (CoS) based on a conventional laser diode formed on gallium and nitrogen containing substrate technology according to an embodiment of the present invention.

A schematic diagram illustrating a CoS based on a conventional laser diode formed on gallium and nitrogen containing substrate technology according to this present invention is shown in FIG. 5. The CoS is comprised of submount material 301 configured to act as an intermediate material between a laser diode chip 302 and a final mounting surface. The submount is configured with electrodes 303 and 305 that may be formed with deposited metal layers such as Au. In one example, Ti/Pt/Au is used for the electrodes. Wirebonds 304 are configured to couple the electrical power from the electrodes 303 and 305 on the submount to the laser diode chip to generate a laser beam output 306 from the laser diode. The electrodes 303 and 305 are configured for an electrical connection to an external power source such as a laser driver, a current source, or a voltage source. Wirebonds 304 can be formed on the electrodes to couple electrical power to the laser diode device and activate the laser.

In another embodiment, the gallium and nitrogen containing laser diode fabrication includes an epitaxial release step to lift off the epitaxially grown gallium and nitrogen layers and prepare them for transferring to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In this embodiment, gallium and nitrogen containing epitaxial layers are grown on a bulk gallium and nitrogen containing substrate. The epitaxial layer stack comprises at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to a carrier wafer. In one embodiment, a bonding material is deposited on the surface overlying the semiconductor device layers. A bonding material is also deposited either as a blanket coating or patterned on the carrier wafer. Standard lithographic processes are used to selectively mask the semiconductor device layers. The wafer is then subjected to an etch process such as dry etch or wet etch processes to define via structures that expose the sacrificial layers on the sidewall of the mesa structure. As used herein, the term mesa region or mesa is used to describe the patterned epitaxial material on the gallium and nitrogen containing substrate and prepared for transferring to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

In a preferred embodiment, a semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below a sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 µm to about 500 µm or to about 5000 µm. Each of these mesas is a 'die'.

In a preferred embodiment, these dice are transferred to a carrier wafer at a second pitch using a selective bonding process such that the second pitch on the carrier wafer is greater than the first pitch on the gallium and nitrogen containing substrate. In this embodiment the dice are on an expanded pitch for so called "die expansion". In an example, the second pitch is configured with the dice to allow each die with a portion of the carrier wafer to be a semiconductor device, including contacts and other components. For example, the second pitch would be about 50 µm to about 1000 µm or to about 5000 µm, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 6:
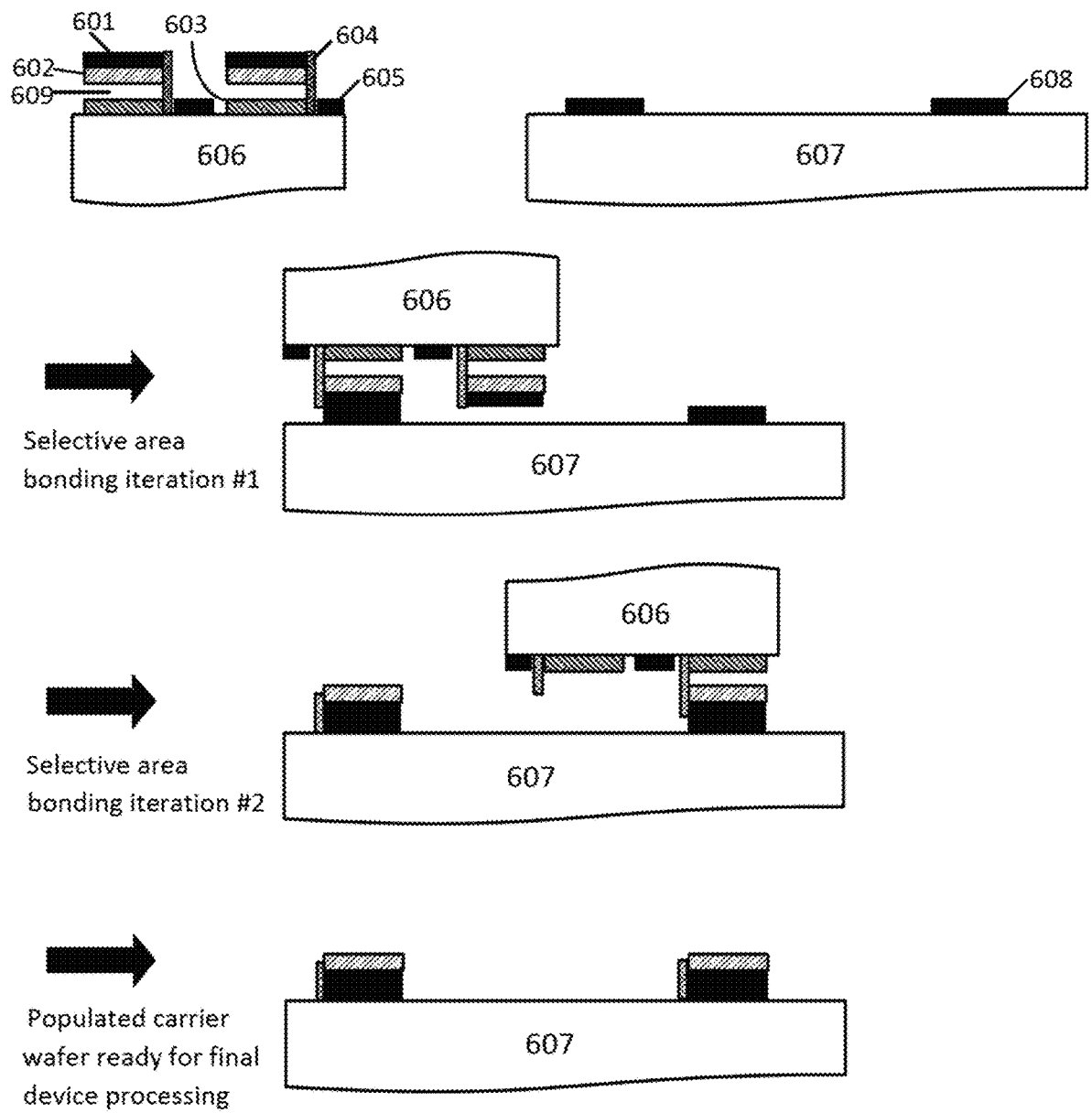
FIG. 6 is a simplified diagram illustrating a side view of die expansion with selective area bonding according to the present invention.

FIG. 6 is a schematic representation of the die expansion process with selective area bonding according to the present invention. A device wafer is prepared for bonding in accordance with an embodiment of this invention. The device wafer consists of a substrate 606, buffer layers 603, a fully removed sacrificial layer 609, device layers 602, bonding media 601, cathode metal 605, and an anchor material 604. The sacrificial layer 609 is removed in the PEC etch with the anchor material 604 is retained. The mesa regions formed in the gallium and nitrogen containing epitaxial wafer form dice of epitaxial material and release layers defined through processing. Individual epitaxial material die is formed at first pitch. A carrier wafer is prepared consisting of the carrier wafer substrate 607 and bond pads 608 at second pitch. The substrate 606 is aligned to the carrier wafer 607 such that a subset of the mesa on the gallium and nitrogen containing substrate 606 with a first pitch aligns with a subset of bond pads 608 on the carrier wafer 607 at a second pitch. Since the first pitch is greater than the second pitch and the mesas will comprise device die, the basis for die expansion is established. The bonding process is carried out and upon separation of the substrate from the carrier wafer 607 the subset of mesas on the substrate 606 are selectively transferred to the carrier wafer 607. The process is then repeated with a second set of mesas and bond pads 608 on the carrier wafer 607 until the carrier wafer 607 is populated fully by epitaxial mesas. The gallium and nitrogen containing epitaxy substrate 201 can now optionally be prepared for reuse.

In the example depicted in FIG. 6, one quarter of the epitaxial dice on the epitaxy wafer 606 are transferred in this first selective bond step, leaving three quarters on the epitaxy wafer 606. The selective area bonding step is then repeated to transfer the second quarter, third quarter, and fourth quarter of the epitaxial die to the patterned carrier wafer 607. This selective area bond may be repeated any number of times and is not limited to the four steps depicted in FIG. 6. The result is an array of epitaxial die on the carrier wafer 607 with a wider die pitch than the original die pitch on the epitaxy wafer 606. The die pitch on the epitaxial wafer 606 will be referred to as pitch 1, and the die pitch on the carrier wafer 607 will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial dice which are in contact with a bond bad 608 on the carrier wafer 607 will bond. Submicron alignment tolerances are possible on commercial die bonders. The epitaxy wafer 606 is then pulled away, breaking the epitaxy material at a weakened epitaxial release layer 609 such that the desired epitaxial layers remain on the carrier wafer 607. Herein, a 'selective area bonding step' is defined as a single iteration of this process.

In one embodiment, the carrier wafer 607 is patterned in such a way that only selected mesas come in contact with the metallic bond pads 608 on the carrier wafer 607. When the epitaxy substrate 606 is pulled away the bonded mesas break off at the weakened sacrificial region, while the un-bonded mesas remain attached to the epitaxy substrate 606. This selective area bonding process can then be repeated to transfer the remaining mesas in the desired configuration. This process can be repeated through any number of iterations and is not limited to the two iterations depicted in FIG. 6. The carrier wafer can be of any size, including but not limited to about 2 inches, 3 inches, 4 inches, 6 inches, 8 inches, and 12 inches. After all desired mesas have been transferred, a second bandgap selective PEC etching can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 µm and about 500 µm wide or between about 500 µm and about 3000 µm wide and between about 100 and about 3000 µm long. In an example, the second die pitch on the carrier wafer is between about 100 µm and about 200 µm or between about 200 µm and about 1000 µm or between about 1000 µm and about 3000 µm. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring dice at close spacing from multiple epitaxial wafers, it is important for the un-transferred dice on the epitaxial wafer to not inadvertently contact and bond to die already transferred to the carrier wafer. To achieve this, epitaxial dice from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the dice from the second epitaxial wafer. A second epitaxial wafer transfers a second set of dice to the carrier wafer. Finally, the semiconductor devices are fabricated, and passivation layers are deposited followed by electrical contact layers that allow each die to be individually driven. The dice transferred from the first and second substrates are spaced at a pitch which is smaller than the second pitch of the carrier wafer. This process can be extended to transfer of dice from any number of epitaxial substrates, and to transfer of any number of devices per dice from each epitaxial substrate.

Figure 7:
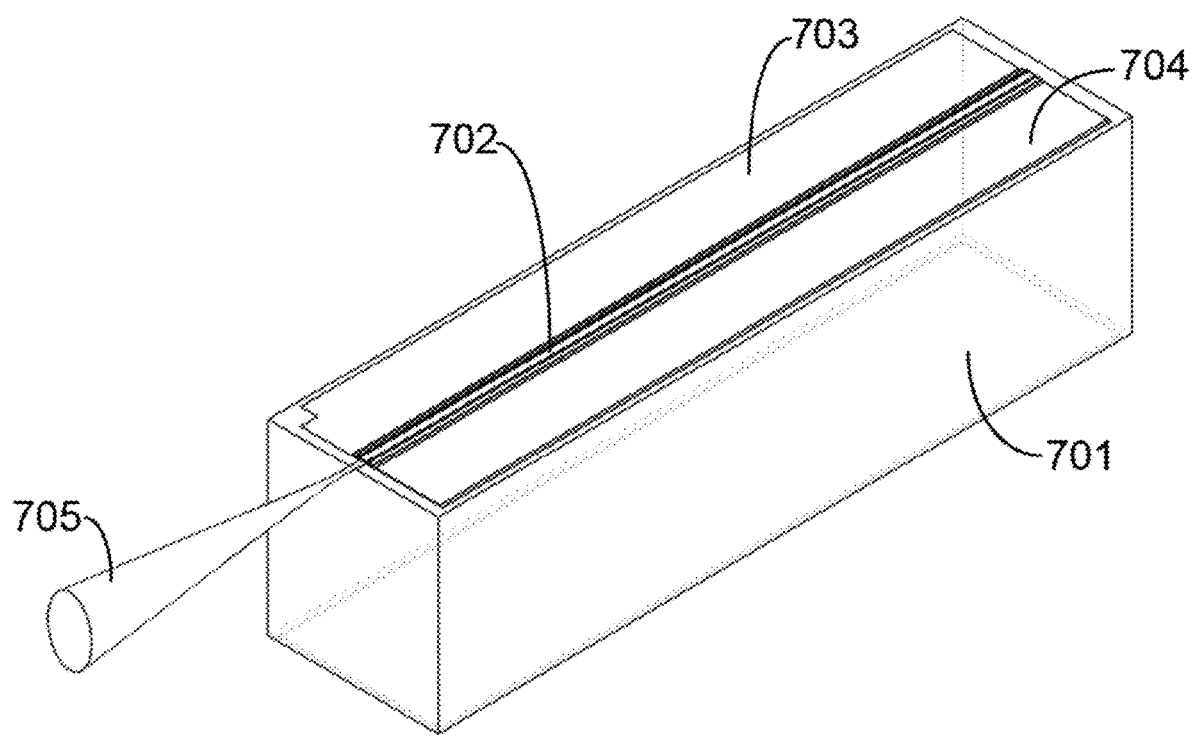
FIG. 7 is a schematic diagram illustrating a CoS based on lifted off and transferred epitaxial gallium and nitrogen containing layers according to an embodiment of this present invention.

A schematic diagram illustrating a CoS based on lifted off and transferred epitaxial gallium and nitrogen containing layers according to this present invention is shown in FIG. 7. The CoS is comprised of submount material 701 configured from the carrier wafer with the transferred epitaxial material with a laser diode stripe configured within the epitaxy 702. Electrodes 703 and 704 are electrically coupled to the n-side and the p-side of the laser diode device and configured to transmit power from an external source to the laser diode to generate a laser beam output 705 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration such as size, cost, and performance due to the low thermal impedance.

Further process and device description for this embodiment describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

In this embodiment, the carrier wafer can be selected to provide an ideal submount material for the integrated CPoS white light source. That is, the carrier wafer serving as the laser diode submount would also serve as the common support member for the laser diode and the phosphor to enable an ultra-compact CPoS integrated white light source. In one example, the carrier wafer is formed from silicon carbide (SiC). SiC is an ideal candidate due to its high thermal conductivity, low electrical conductivity, high hardness and robustness, and wide availability. In other examples AlN, diamond, GaN, InP, GaAs, or other materials can be used as the carrier wafer and resulting submount for the CPoS. In one example, the laser chip is diced out such that there is an area in front of the front laser facet intended for the phosphor. The phosphor material would then be bonded to the carrier wafer and configured for laser excitation according to this embodiment.

After fabrication of the laser diode on a submount member, in some embodiments of this invention the construction of the integrated white source would proceed to integration of the phosphor with the laser diode and common support member. Phosphor selection is a key consideration within the laser based integrated white light source. The phosphor must be able to withstand the extreme optical intensity and associated heating induced by the laser excitation spot without severe degradation. Important characteristics to consider for phosphor selection include;

- A high conversion efficiency of optical excitation power to white light lumens. In the example of a blue laser diode exciting a yellow phosphor, a conversion efficiency of over 150 lumens per optical watt, or over 200 lumens per optical watt, or over 300 lumens per optical watt is desired.
- A high optical damage threshold capable of withstanding 1-20 W of laser power in a spot comprising a diameter of 1 mm, 500 µm, 200 µm, 100 µm, or even 50 µm.
- High thermal damage threshold capable of withstanding temperatures of over 150° C., over 200° C., or over 300° C. without decomposition.
- A low thermal quenching characteristic such that the phosphor remains efficient as it reaches temperatures of over 150° C., 200° C., or 250° C.
- A high thermal conductivity to dissipate the heat and regulate the temperature. Thermal conductivities of greater than 3 W/(m·K), greater than 5 W/(m·K), greater than 10 W/(m·K), and even greater than 15 W/(m·K) are desirable.
- A proper phosphor emission color for the application.
- A suitable porosity characteristic that leads to the desired scattering of the coherent excitation without unacceptable reduction in thermal conductivity or optical efficiency.
- A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.
- A surface condition optimized for the application. In an example, the phosphor surfaces can be intentionally roughened for improved light extraction.

In a preferred embodiment, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase out-coupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, a ceramic yttrium aluminum garnets (YAG) doped with Ce' ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:Ce can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt, or greater. Additionally, the ceramic YAG:Ce phosphors is characterized by a temperature quenching characteristics above 150° C., above 200° C., or above 250° C. and a high thermal conductivity of 5-10 W/(m·K) to effectively dissipate heat to a heat sink member and keep the phosphor at an operable temperature.

In another preferred embodiment according to this invention, the white light source is configured with a single crystal phosphor (SCP) such as YAG:Ce. In one example the Ce:Y3Al5O12 SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt, or greater. Additionally, the single crystal YAG:Ce phosphors is characterized by a temperature quenching characteristics above 150° C., above 200° C., or above 300° C. and a high thermal conductivity of 8-20 W/(m·K) to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:Ce can be configured to emit a yellow emission. In alternative or the same embodiments a YAG:Ce can be configured to emit a green emission.

In yet alternative or the same embodiments the YAG can be doped with Eu to emit a red emission. In some embodiments a LuAG is configured for emission. In alternative embodiments, silicon nitrides or aluminum-oxi-nitrides can be used as the crystal host materials for red, green, yellow, or blue emissions.

In an alternative embodiment, a powdered single crystal or ceramic phosphor such as a yellow phosphor or green phosphor is included. The powdered phosphor can be dispensed on a transparent member for a transmissive mode operation or on a solid member with a reflective layer on the back surface of the phosphor or between the phosphor and the solid member to operate in a reflective mode. The phosphor powder may be held together in a solid structure using a binder material wherein the binder material is preferable in inorganic material with a high optical damage threshold and a favorable thermal conductivity. The phosphor power may be comprised of colored phosphors and configured to emit a white light when excited by and combined with the blue laser beam or excited by a violet laser beam. The powdered phosphors could be comprised of YAG, LuAG, or other types of phosphors.

In one embodiment of the present invention the phosphor material contains a yttrium aluminum garnet host material and a rare earth doping element, and others. In an example, the wavelength conversion element is a phosphor which contains a rare earth doping element, selected from one of Ce, Nd, Er, Yb, Ho, Tm, Dy and Sm, or combinations thereof, and the like. In an example, the phosphor material is a high-density phosphor element. In an example, the high-density phosphor element has a density greater than 90% of pure host crystal. Cerium (III)-doped YAG (YAG:$Ce^{3+}$, or $Y_3Al_5O_{12}:Ce^{3+}$) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (blueish) white. The yellow emission of the $Ce^{3+}$:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with $Ce^{3+}$ ions $(Y_{1-a}Gd_a)_3(Al_{1-b}Ga_b)_5O_{12}:Ce^{3+}$, $SrGa_2S_4:Eu^{2+}$, $SrS:Eu^{2+}$, terbium aluminum based garnets (TAGs) ($Tb_3Al_5O_5$), colloidal quantum dot thin films containing CdTe, ZnS, ZnSe, ZnTe, CdSe, or CdTe.

In further alternative examples, some rare-earth doped Sialons can serve as phosphors. Europium(II)-doped β-SiA-lON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red $CaAlSiN_3$-based (CASN) phosphor may be used.

In yet a further example, white light sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from a of (Y, Gd, Tb, Sc, Lu, La)$_3$(Al, Ga, In)$_5$O$_{12}$:$Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from the group consisting of $(Gd,Y,Lu,La)_2O_3{:}Eu^{3+}$, $Bi^{3+}$; $(Gd,Y,Lu,La)_2O_2S{:}Eu^{3+}$, $Bi^{3+}$; $(Gd,Y,Lu,La)VO_4{:}Eu^{3+}$, $Bi^{3+}$; $Y_2(O,S)_3{:}Eu^{3+}$; $Ca_{1-x}Mo_{1-y}Si_yO_4$: where $0.05 \le x \le 0.5$, $0 \le y \le 0.1$; $(Li,Na,K)_5Eu(W,Mo)O_4$; $(Ca,Sr)S{:}Eu^{2+}$; $SrY_2S_4{:}Eu^{2+}$; $CaLa_2S_4{:}Ce^{3+}$; $(Ca,Sr)S{:}Eu^{2+}$; $3.5MgO{\times}0.5MgF_2{\times}GeO_2{:}Mn^{4+}$ (MFG); $(Ba,Sr,Ca)Mg_xP_2O_7{:}Eu^{2+}$, $Mn^{2+}$; $(Y,Lu)_2WO_6{:}Eu^{3+}$, $Mo^{6+}$; $(Ba,Sr,Ca)_3Mg_xSi_2O_8{:}Eu^{2+}$, $Mn^{2+}$, wherein $1 < x < 2$; $(RE_{1-y}Ce_y)Mg_{2-x}Li_xSi_{3-x}P_xO_{12}$, where RE is at least one of Sc, Lu, Gd, Y, and Tb, $0.0001 < x < 0.1$ and $0.001 < y < 0.1$; $(Y, Gd, Lu, La)_{2-x}Eu_xW_{1-y}Mo_yO_6$, where $0.5 \le x \le 1.0$, $0.01 \le y \le 1.0$; $(SrCa)_{1-x}Eu_xSi_5N_8$, where $0 \le x \le 0.3$; $SrZnO_2{:}Sm^{3+}$; $M_mO_nX$, wherein M is selected from the group of Sc, Y, a lanthanide, an alkali earth metal and mixtures thereof; X is a halogen; $1 \le m \le 3$; and $1 \le n \le 4$, and wherein the lanthanide doping level can range from 0.1 to 40% spectral weight; and $Eu^{3+}$ activated phosphate or borate phosphors; and mixtures thereof. Further details of other phosphor species and related techniques can be found in U.S. Pat. No. 8,956,894, in the name of Raring et al. issued Feb. 17, 2015, and titled White light devices using non-polar or semipolar gallium containing materials and phosphors, which is commonly owned, and hereby incorporated by reference herein.

In another preferred embodiment according to this invention, the white light source is configured with a single crystal phosphor (SCP) or Ceramic plate phosphor selected from a Lanthanum Silicon Nitride compound and Lanthanum aluminum Silicon Nitrogen Oxide compound containing $Ce^{3+}$ ions atomic concentration ranging from 0.01% to 10%. Optionally, the Lanthanum Silicon Nitride compound and Lanthanum aluminum Silicon Nitrogen Oxide compound containing $Ce^{3+}$ ions includes $LaSi_3N_5{:}Ce^{3+}$ or $LaAl(Si_{6-z}Al_z)(N_{10-z}O_z){:}Ce^{3+}$ (wherein z=1). In this embodiment according the present invention the SCP or Ceramic plate based on $LaSi_3N_5{:}Ce^{3+}$ or $LaAl(Si_{6-z}Al_z)(N_{10-z}O_z){:}Ce^{3+}$ (wherein z=1) is characterized by an optical conversion efficiency of greater than 100 lumens per optical excitation watt, or greater than 200 lumens per optical excitation watt, or even greater than 300 lumens per optical excitation watt, or greater. Additionally, the single crystal phosphor (SCP) or Ceramic plate phosphor $LaSi_3N_5{:}Ce^{3+}$ or $LaAl(Si_{6-z}Al_z)(N_{10-z}O_z){:}Ce^{3+}$ (wherein z=1) is characterized by a temperature quenching characteristics above 150° C., above 200° C., or above 300° C. and a high thermal conductivity of >10 W/m·K to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the integrated white light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 0.5 W to 100 W range focused to spot sizes of less than 1 mm in diameter, less than 500 microns in diameter, or even less than 100 microns in diameter, power densities of over 1 W/mm², 100 W/mm², or even over 2,500 W/mm² can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm², 10 W/mm², or even over 250 W/mm². Thus, even for this best-case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is either attached to the common support member as the laser diode as in the CPoS or is attached to an intermediate submount member that is subsequently attached to the common support member. Candidate materials for the common support member or intermediate submount member are SiC, AlN, BeO, diamond, copper, copper tungsten, sapphire, aluminum, or others. The interface joining the phosphor to the submount member or common support member must be carefully considered. The joining material should be comprised of a high thermal conductivity material such as solder (or other) and be substantially free from voids or other defects that can impede heat flow. In some embodiments, glue materials can be used to fasten the phosphor. Ideally the phosphor bond interface will have a substantially large area with a flat surface on both the phosphor side and the support member sides of the interface.

In the present invention, the laser diode output beam must be configured to be incident on the phosphor material to excite the phosphor. In some embodiments the laser beam may be directly incident on the phosphor and in other embodiments the laser beam may interact with an optic, reflector, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The white light apparatus also has an electrical input interface configured to couple electrical input power to the laser diode device to generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 250 lumens, 500 lumens, 1000 lumens, 3000 lumens, 10,000 lumens, or greater of white light output.

The support member is configured to transport thermal energy from the at least one laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(m·K), aluminum with a thermal conductivity of about 200 W/(m·K), 4H-SiC with a thermal conductivity of about 370 W/(m·K), 6H-SiC with a thermal conductivity of about 490 W/(m·K), AlN with a thermal conductivity of about 230 W/(m·K), a synthetic diamond with a thermal conductivity of about >1000 W/(m·K), sapphire, or other metals, ceramics, or semiconductors. The support member may be formed from a growth process such as SiC, AlN, or synthetic diamond, and then mechanically shaped by machining, cutting, trimming, or molding. Alternatively, the support member may be formed from a metal such as copper, copper tungsten, aluminum, or other by machining, cutting, trimming, or molding.

In a preferred configuration of this CPoS white light source, the common support member comprises the same submount that the gallium and nitrogen containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, but can be other techniques such as SAC solder such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm*cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Similarly, the phosphor material may be bonded to the submount using a soldering technique such as AuSn solder, SAC solder, lead containing phosphor, or with indium, but it can be other techniques such as sintered Ag interface materials. The joint could also be formed from thermally conductive glues, thermal epoxies such as silver epoxy, thermal adhesives, and other materials. Alternatively, the joint could be formed from a metal-metal bond such as a Au—Au bond. Optimizing the bond for the lowest thermal impedance is a key parameter for heat dissipation from the phosphor, which is critical to prevent phosphor degradation and thermal quenching of the phosphor material.

In an alternative configuration of this CPoS white light source, the laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, but can be other techniques. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper. The phosphor material may be bonded using a soldering technique. In this configuration, the common support member should be configured of a thermally conductive material such as copper. Optimizing the bond for the lowest thermal impedance is a key parameter for heat dissipation from the phosphor, which is critical to prevent phosphor degradation and thermal quenching of the phosphor material.

In a specific embodiment of the present invention, the CPoS white light source is configured for a side-pumped phosphor operated in transmissive mode. In this configuration, the phosphor is positioned in front of the laser facet that outputs the laser beam such that upon activation the generated laser beam is incident on a backside of the phosphor, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 µm, greater than 10 µm, greater than 20 µm, greater than 30 µm, or greater than 45 µm. The cavity is configured with a front facet or mirror and back facet or mirror on the end, wherein the front facet comprises the output facet and configured to emit the laser beam incident on the phosphor. The front facet can be configured with an anti-reflective coating to decrease the reflectivity or no coating at all thereby allowing radiation to pass through the mirror without excessive reflectivity. In some cases, the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor is comprised of a ceramic yttrium aluminum garnet (YAG) doped with Ce' ions and emits yellow emission. The phosphor is shaped as a block, plate, sphere, cylinder, or other geometrical form. Specifically, the phosphor geometry primary dimensions may be less than 50 µm, less than 100 µm, less than 200 µm, less than 500 µm, less than 1 mm, or less than 10 mm. Operated in transmissive mode, the phosphor has a first primary side (back side) for receiving the incident laser beam and at least a second primary side (front side) where most of the useful white light will exit the phosphor to be coupled to the application. The phosphor is attached to the common support member or submount positioned in front of the laser diode output facet such that the first primary side of the phosphor configured for receiving the excitation light will be in the optical pathway of the laser output beam. The laser beam geometrical shape, size, spectral width, wavelength, intensity, and polarization are configured to excite the phosphor material. An advantage to transmissive mode phosphor operation is mitigation of the excitation source blocking or impeding any useful white light emitted from the primary emitting surface. Additionally, by exciting from the backside of the phosphor there will not be an obstruction relating to the excitation source or beam that may make integration of optics to collimate or project the white light difficult. In alternative embodiments the YAG:Ce can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

Figure 8:
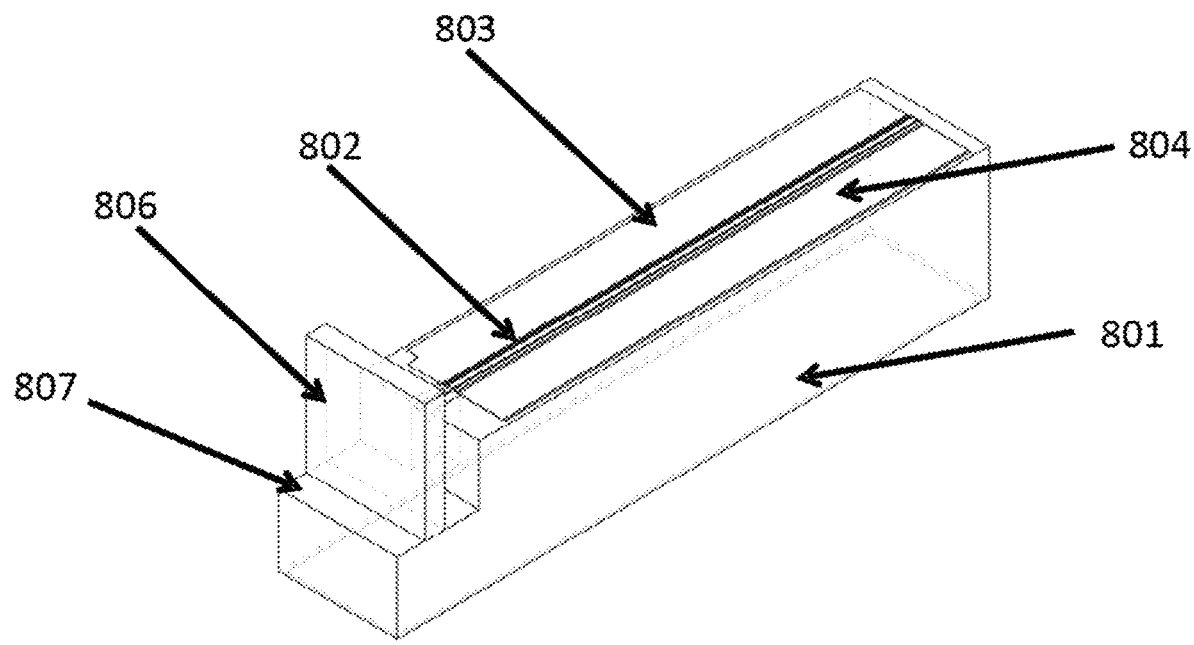
FIG. 8 is a simplified diagram illustrating a laser-based white light source with a laser diode fabricated in gallium and nitrogen containing epitaxial layers transferred to a submount member and a phosphor member integrated onto the submount member wherein the phosphor member is configured for transmissive operation according to an embodiment of the present invention.

FIG. 8 presents a schematic diagram illustrating an alternative transmissive embodiment of a CPoS integrated white light source based according to the present invention. In this embodiment the gallium and nitrogen containing lift-off and transfer technique is deployed to fabricate a very small and compact submount member with the laser diode chip formed from transferred epitaxy layers. The laser based CPoS white light device is comprised of submount material 801 that serves as the common support member configured to act as an intermediate material between a laser diode 802 formed in transferred gallium and nitrogen containing epitaxial layers and a final mounting surface and as an intermediate material between the phosphor plate material 806 and a final mounting surface 807. The laser diode or CoS submount 801 is configured with electrodes 803 and 804 that may be formed with deposited metal layers and combination of metal layers including, but not limited to Au, Pd, Pt, Ni, Al, titanium, or others. The laser beam output excites a phosphor plate 806 positioned in front of the output laser facet. The phosphor plate 806 is attached to the submount on a ledge 807 or recessed region. The electrodes 803 and 804 are configured for an electrical connection to an external power source such as a laser driver, a current source, or a voltage source. Wirebonds (not shown) can be formed on the electrodes to couple electrical power to the laser diode device 802 to generate a laser beam output from the laser diode. Of course, this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In many embodiments of the present invention the attachment interface between the phosphor and the common support member must be designed and processed with care. The thermal impedance of this attachment joint should be minimized using a suitable attaching material, interface geometry, and attachment process practices for a thermal impedance sufficiently low to allow the heat dissipation. Moreover, the attachment interface may be designed for an increased reflectivity to maximize the useful white light exiting the emission surface of the phosphor. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors. The side-pumped transmissive apparatus has a form factor characterized by a length, a width, and a height. In an example, the height is characterized by a dimension of less than 25 mm and greater than 0.5 mm, although there may be variations.

To improve the efficiency of the integrated white light source, measures can be taken to minimize the amount of light exiting from the first surface wherein the laser excitation light is incident on the phosphor and maximize the light exiting the second primary white light emission side of the phosphor where the useful white light exits. Such measures can include the use of filters, spectrally selective reflectors, conventional mirrors, spatial mirrors, polarization based filters, holographic elements, or coating layers, but can be others.

In one example for a transmissive mode phosphor, a filter is positioned on the backside of the phosphor to reflect the backward propagating yellow emission toward the front of the phosphor where it has another opportunity to exit the primary emitting surface into useful white light. In this configuration the reflector would have to be designed to not block the blue excitation light from the laser. The reflector could be configured from the spectrally selective distributed Bragg reflector (DBR) mirror comprised of 2 or more alternating layers with different refractive indices designed to reflect yellow light over a wide range of angles. The DBR could be deposited directly on the phosphor using techniques such as e-beam deposition, sputter deposition, or thermal evaporation. Alternatively, the DBR could be in the form of a plate-like element that is applied to the phosphor. Since in a typical white light source configured from a mixing of yellow and blue emission the yellow emission comprised about 70% of the energy, this approach of reflecting the yellow light may be a sufficient measure in many applications. Of course, there can be additional variations, modifications, and alternatives.

In another example for a transmissive mode phosphor, a filter system is positioned on the backside of the phosphor to reflect the backward propagating yellow emission and the scattered blue excitation light back toward the front of the phosphor where it has another opportunity to exit the primary emitting surface into useful white light. The challenge of this configuration is to allow the forward propagating blue pump excitation light to pass through the filter without allowing the scattered backward propagating blue light to pass. One approach to overcoming this challenge is deploying a filter designed for incident angular reflectivity dependence and configuring the laser at an incident angle wherein the reflectivity is a minimum such as a normal incidence. Again, in this configuration the reflector could be configured from DBR mirrors such that one DBR mirror pair would reflect yellow and a second DBR pair would serve to reflect the blue light with the determined angular dependence. The DBR could be deposited directly on the phosphor using techniques such as e-beam deposition, sputter deposition, or thermal evaporation. Alternatively, the DBR could be in the form of a plate-like element that is applied to the phosphor. Of course, there can be additional variations, modifications, and alternatives.

Figure 9:
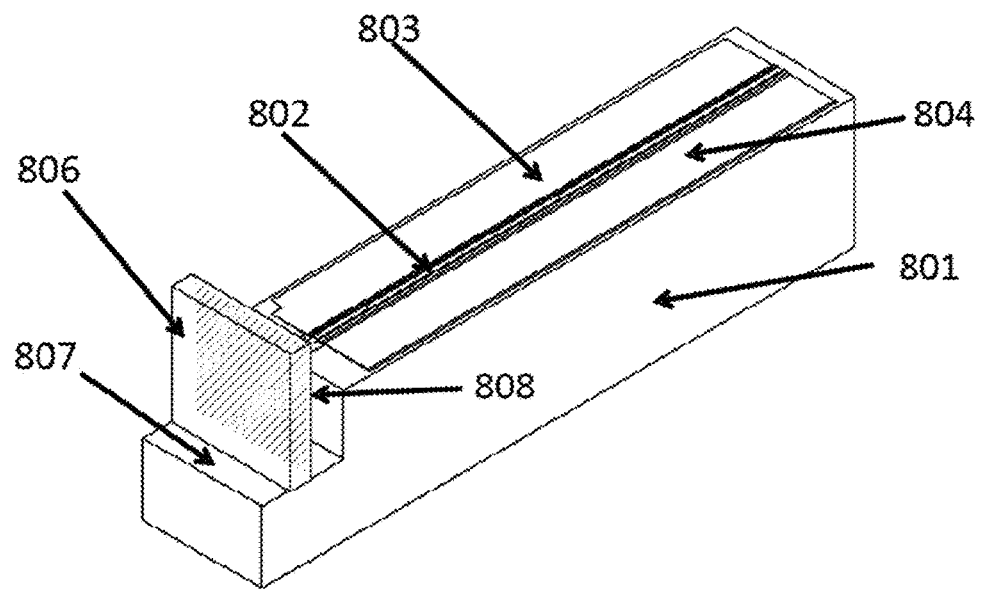
FIG. 9 is a simplified diagram illustrating the apparatus configuration of FIG. 8 but with modification of the phosphor member configured with a coating or modification to increase the useful white light output according to an embodiment of the present invention.

FIG. 9 presents a schematic diagram illustrating an alternative transmissive embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. The laser based CPoS white light device is comprised of submount material 801 that serves as the common support member configured to act as an intermediate material between a laser diode 802 formed in transferred gallium and nitrogen containing epitaxial layers and a final mounting surface and as an intermediate material between the phosphor plate material 806 and a final mounting surface 807. The laser diode 802 or CoS submount 801 is configured with electrodes 803 and 804 that may be formed with deposited metal layers and combination of metal layers including, but not limited to Au, Pd, Pt, Ni, Al, titanium, or others. The laser beam output excites a phosphor plate 806 positioned in front of the output laser facet. In this embodiment, the phosphor plate 806 is coated with a material 808 configured to increase the efficiency of the white source such that more of the useful white light escapes from the primary emitting surface of the phosphor plate 806. In this embodiment, the coating 808 is configured to increase the reflectivity of yellow and possibly blue emission to reflect the light back toward the front emitting surface. The phosphor plate is attached to the submount on a ledge 807 or recessed region. The electrodes 803 and 804 are configured for an electrical connection to an external power source such as a laser driver, a current source, or a voltage source. Wirebonds can be formed on the electrodes to couple electrical power to the laser diode device to generate a laser beam output from the laser diode. Of course, this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 10:
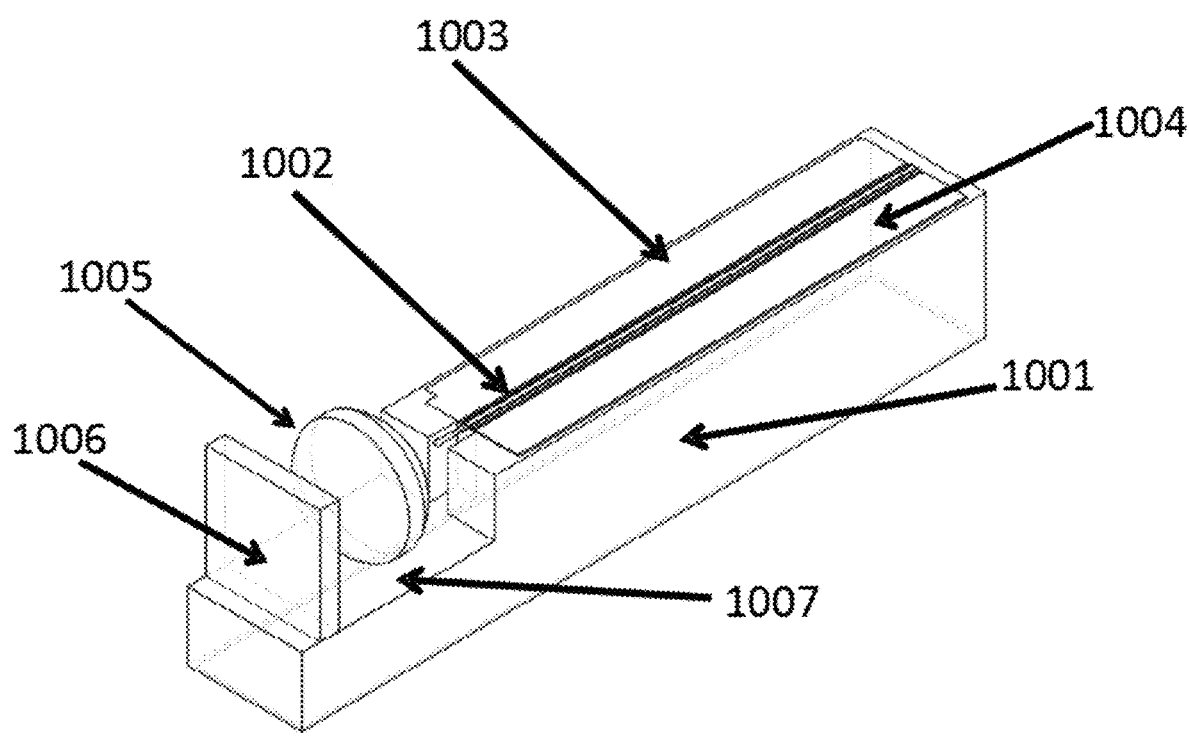
FIG. 10 is a simplified diagram illustrating the apparatus configuration of FIG. 8 but with modification of the laser beam configured through a collimating optic prior to incidence on the phosphor member according to an embodiment of the present invention.

FIG. 10 presents a schematic diagram illustrating a transmissive phosphor embodiment of a CPoS integrated white light source including free-space optics to collimate and shape the laser beam for incidence on the phosphor according to the present invention. In this embodiment the gallium and nitrogen containing lift-off and transfer technique is deployed to fabricate a very small and compact submount member with the laser diode chip formed from transferred epitaxy layers. Of course, a conventional chip on submount could be used for this integrated free-space optic embodiment. The laser based CPoS white light device is comprised of submount material 1001 that serves as the common support member configured to act as an intermediate material between a laser diode 1002 formed in transferred gallium and nitrogen containing epitaxial layers and a final mounting surface and as an intermediate material between the phosphor plate material 1005 and a final mounting surface. The laser diode 1002 and/or submount 1001 is configured with electrodes 1003 and 1004 that may be formed with deposited metal layers and combination of metal layers including, but not limited to Au, Pd, Pt, Ni, Al, titanium, or others. The laser beam output is coupled into an aspheric lens 1005 for collimation and beam shaping to create a more circular beam, which then excites a phosphor plate 1006 positioned in front of aspheric lens 1005. The phosphor plate 1006 is attached to the submount on a ledge 1007 or recessed region. The electrodes 1003 and 1004 are configured for an electrical connection to an external power source such as a laser driver, a current source, or a voltage source. Wirebonds can be formed on the electrodes to couple electrical power to the laser diode device to generate a laser beam output from the laser diode. Of course, this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In an alternative preferred embodiment, beam shaping can achieved by tilting the phosphor excitation surface with respect the laser diode aperture and positioning the laser diode at a designed distance from the phosphor to exploit the beam divergence properties of the laser diode and achieve the desired spot size. This "optics-less" beam shaping embodiment is advantageous over embodiments where optical elements are introduced for beam shaping and collimation. These advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor.

In another specific preferred embodiment of the CPoS white light source, the present invention is configured for a reflective mode phosphor operation. In one example the excitation laser beam enters the phosphor through the same primary surface as the useful white light is emitted from. That is, operated in reflective mode the phosphor could have a first primary surface configured for both receiving the incident excitation laser beam and emitting useful white light. In this configuration, the phosphor is positioned in front of the laser facet that outputs the laser beam, wherein both the laser and the phosphor are configured on a support member. The gallium and nitrogen containing laser diode is configured with a cavity that has a length greater than 100 µm, greater than 500 µm, greater than 1000 µm, or greater than 1500 µm long and a width greater than 1 um, greater than 10 µm, greater than 20 µm, greater than 30 µm, or greater than 45 µm. The cavity is configured with a front facets and back facet on the end wherein the front facet comprises the output facet and emits the laser beam incident on the phosphor. The front facet can be configured with an anti-reflective coating to decrease the reflectivity or no coating at all thereby allowing radiation to pass through the mirror without excessive reflectivity. In some cases, the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor can be comprised of Ce doped YAG and emits yellow emission. The phosphor may be a ceramic phosphor and could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 µm, greater than 100 µm, greater than 200 µm, greater than 500 µm, greater than 1 mm, or greater than 10 mm and a thickness of less than 500 µm, less than 200 µm, less than 100 µm or less than 50 µm.

A key benefit to a reflective mode phosphor is the ability to configure it for excellent heat dissipation since the backside of surface of the phosphor can be directly heat-sunk to the common support member or intermediate submount member. Since the phosphor is preferably thin, the thermal path is short and can rapidly travel to the support member. In alternative or the same embodiments a YAG:Ce can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one example of the reflective mode CPoS white light source embodiment of this invention optical coatings, material selections, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light is applied to the phosphor prior to attaching the phosphor to the common support member. Such coatings could be comprised of metal layers such as silver or aluminum, or others such as gold, which would offer good thermal conductivity and good reflectance or could be comprised of dielectric layers configured as single layers, multi layers, or DBR stacks, but could be others. In another example, a reflective material is used as a bonding medium that attaches the phosphor to the support member or to an intermediate submount member. Examples of reflective materials include reflective solders like AuSn, SnAgC (SAC), or Pb containing phosphors, or reflective glues, but could be others. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, Pb containing solders, indium, and other solders. In an alternative approach sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively, the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode CPoS white light source embodiment of this invention is configured with the phosphor member attached to the common support member with the large primary surface configured for receiving laser excitation light and emitting useful white light positioned at an angle normal (about 90 degrees) or off-normal (about 0 degrees to about 89 degrees) to the axis of the laser diode output beam functioning to excite the phosphor. That is, the laser output beam is pointing toward the phosphor's emission surface at an angle of between 0 and 90 degrees, wherein 90 degrees (orthogonal) is considered normal incidence. The inherent geometry of this configuration wherein the laser beam is directed away from or in an opposite direction that the useful white light will exit the phosphor toward the outside world is ideal for safety. As a result of this geometry, if the phosphor get damaged or removed during operation or from tampering, the laser beam would not be directed to the outside world where it could be harmful. Instead, the laser beam would be incident on the backing surface where the phosphor was attached. With proper design of this backing surface the laser beam can be scattered, absorbed, or directed away from the outside world instead of exiting the white light source and into the surrounding environment.

In one embodiment of this reflective mode CPoS white light source the laser beam is configured normal to the primary phosphor emission surface. In this configuration the laser diode would be positioned in front of the primary emission surface of the phosphor where it could impede the useful white light emitted from the phosphor. This could create losses in or inefficiencies of the white light device and would lead to difficulty in efficiently capturing all white light emitted from the phosphor. Such optics and reflectors include, but are not limited to, aspheric lenses or parabolic reflectors. To overcome the challenges of normal incident reflective mode phosphor excitation, in a preferable embodiment the laser beam would be configured with an incident angle that is off-axis to the phosphor such that it hits the phosphor surface at an angle of between 0 and 89 degrees or at a "grazing" angle. In this preferable embodiment the laser diode device is positioned adjacent to or to the side of the phosphor instead of in front of the phosphor where it will not substantially block or impede the emitted white light, and importantly, allow for optics such as collimating lenses or reflectors to access the useful light and project it to the application. Additionally, in this configuration the built-in safety feature is more optimal than in the normal incidence configuration since when incident at an angle in the case of phosphor damage or removal the incident laser beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

In some configurations the top primary surface of the phosphor wherein the laser excitation beam is incident is configured for a reduced reflectivity to the blue or violet excitation beam wavelength and/or the phosphor emission wavelength such as a yellow wavelength. The reduced reflectivity can be achieved with an optical coating of the phosphor using dielectric layers, a shaping of the phosphor surface, and/or roughening of the phosphor surface, or other techniques. In some examples the laser beam incident angle is configured at or near Brewster's angle, wherein the light with a particular polarization mode is perfectly transmitted through the primary surface of the phosphor. Due to the divergence of the laser resulting in a variation of incident angles for the plane waves within the beam a perfect transmission may be challenging, but ideally a substantial fraction of the light incident on the phosphor could be at or near Brewster's angle. For example, a YAG or LuAG phosphor may have a refractive index of about 1.8 in the violet and blue wavelength range. With the Brewster angle, $\theta_B$, given as arctan where $n_1$ is the index of air and $n_2$ is the index of the phosphor, would be about 61 degrees [or about 55 to 65 degrees], off of the axis of normal incidence. Or alternatively, about 29 degrees [or about 25 to 35 degrees] rotated from the axis parallel to the phosphor surface.

Figure 11:
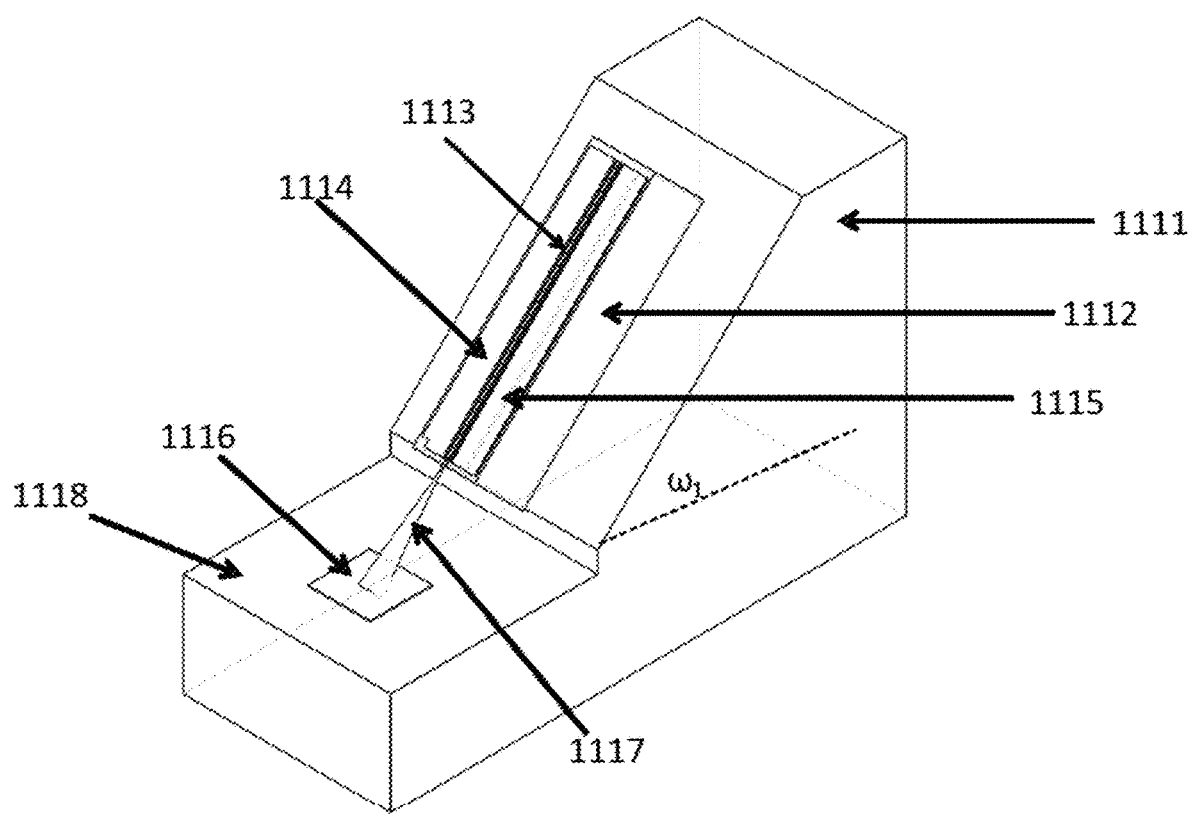
FIG. 11 is a simplified diagram illustrating an integrated laser-based white light source with a laser diode and a phosphor member integrated onto a common support member wherein the phosphor member is configured for reflective operation and the laser beam has an off-normal incidence to the phosphor member according to an embodiment of the present invention.

FIG. 11 presents a schematic diagram illustrating an off-axis reflective mode embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based CPoS white light device is comprised of a common support member 1111 that serves as the common support member configured to act as an intermediate material between a laser diode or laser diode CoS 1112 formed in transferred gallium and nitrogen containing epitaxial layers 1113 and a final mounting surface and as an intermediate material between the phosphor plate material 1116 and a final mounting surface. The laser diode or CoS 1112 is configured with electrodes 1114 and 1115 that may be formed with deposited metal layers and combination of metal layers including, but not limited to Au, Pd, Pt, Ni, Al, titanium, or others. A laser beam 1117 excites a phosphor plate 1116 positioned in front of the output laser facet. The phosphor plate 1116 is attached to the common support member on a flat surface 1118. The electrodes 1114 and 1115 are configured for an electrical connection to an external power source such as a laser driver, a current source, or a voltage source. Wirebonds can be formed on the electrodes to couple electrical power to the laser diode device 1112 to generate the laser beam 1117 output from the laser diode and incident on the phosphor 1116. Of course, this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 12:
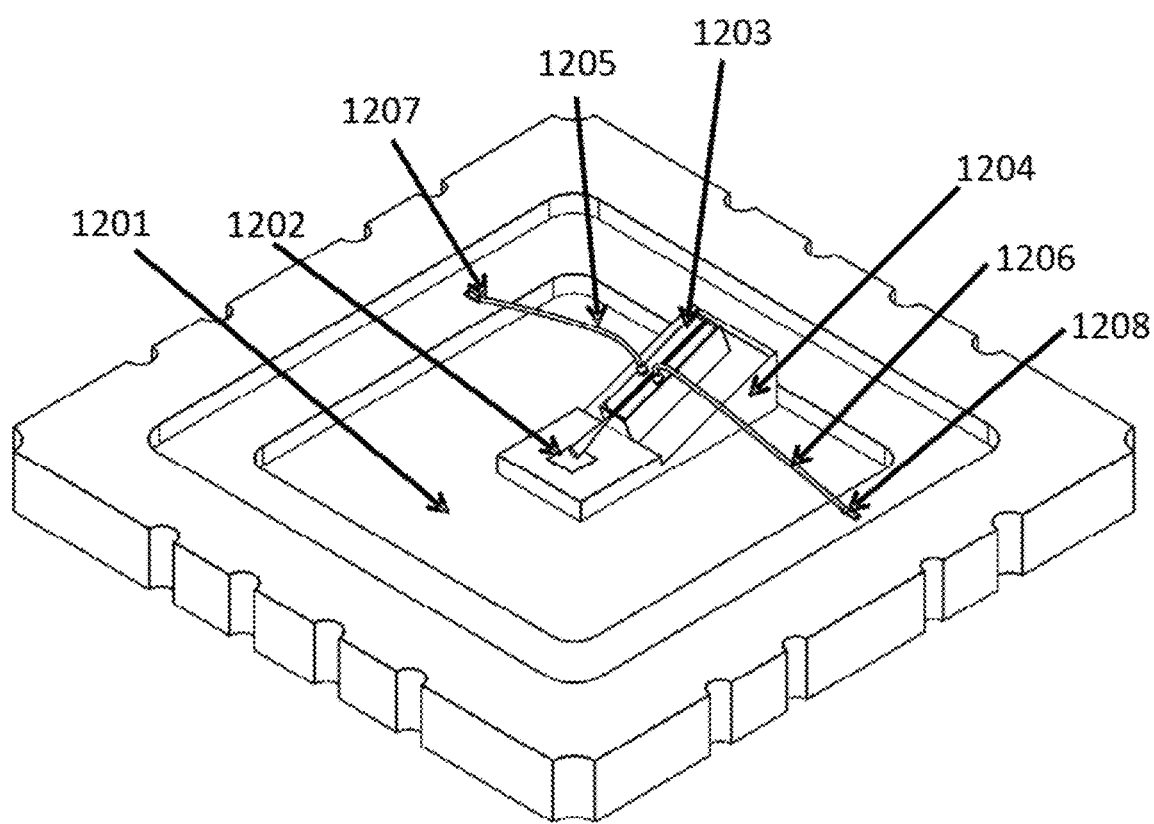
FIG. 12 is a simplified diagram illustrating a reflective mode phosphor member integrated laser-based white light source mounted in a surface mount package according to an embodiment of the present invention.

An example of a packaged CPoS white light source according to the present invention is provided in a reflective mode white light source configured in a surface mount device (SMD) type package. FIG. 12 is a simplified diagram illustrating a reflective mode phosphor integrated laser-based white light source mounted in a surface mount package according to an embodiment of the present invention. In this example, a reflective mode white light source is configured in a surface mount device (SMD) type package. The example SMD package has a base member 1201 with the reflective mode phosphor member 1202 mounted on a support member or on a base member. The laser diode device 1203 may be mounted on a support member 1204 or a base member. The support member and base members are configured to conduct heat away from the phosphor member and laser diode members. The base member is comprised of a thermally conductive material such as copper, copper tungsten, aluminum, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diode are made to using wirebonds 1205 and 1206 to internal feedthroughs 1207 and 1208. The feedthroughs are electrically coupled to external leads. The external leads can be electrically coupled to a power source to electrify the white light source and generate white light emission. The top surface of the base member 1201 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, FIG. 12 is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 13:
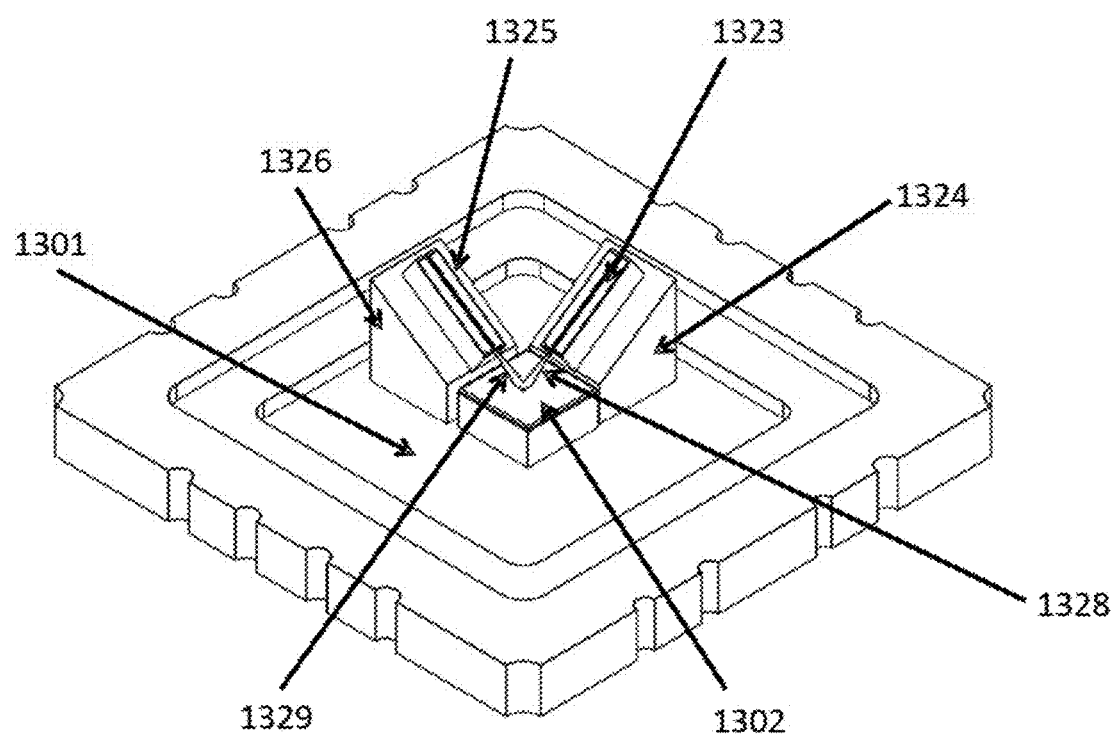
FIG. 13 is a simplified diagram illustrating a reflective mode phosphor member integrated laser-based white light source with multiple laser diode devices mounted in a surface mount package according to an embodiment of the present invention.

An alternative example of a packaged white light source including 2 laser diode chips according to the present invention is provided in the schematic diagram of FIG. 13. In this example, a reflective mode white light source is configured in a surface mount device (SMD) type package. The example SMD package has a base member 1301 with the reflective mode phosphor member 1302 mounted on a support member or on a base member. A first laser diode device 1323 may be mounted on a first support member 1324 or a base member. A second laser diode device 1325 may be mounted on a second support member 1326 or a base member. The first and second support members and base members are configured to conduct heat away from the phosphor member 1302 and laser diode members 1323 and 1325. The base member is comprised of a thermally conductive material such as copper, copper tungsten, aluminum, alumina, SiC, steel, diamond, composite diamond, AlN, sapphire, or other metals, ceramics, or semiconductors. The mounting to the base member can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The mounting joint could also be formed from thermally conductive glues, thermal epoxies such as silver epoxy, and other materials. Electrical connections from the p-electrode and n-electrode of the laser diodes can be made to using wirebonds to internal feedthroughs. The feedthroughs are electrically coupled to external leads. The external leads can be electrically coupled to a power source to electrify the laser diode sources to emit a first laser beam 1328 from the first laser diode device 1323 and a second laser beam 1329 from a second laser diode device 1325. The laser beams are incident on the phosphor member 1302 to create an excitation spot and a white light emission. The laser beams are preferably overlapped on the phosphor 1302 to create an optimized geometry and/or size excitation spot. For example, in the example according to FIG. 13 the laser beams from the first and second laser diodes are rotated by 90 degrees with respect to each other such that the slow axis of the first laser beam is aligned with the fast axis of the second laser beam. The top surface of the base member 1301 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, FIG. 13 is merely an example and is intended to illustrate one possible simple configuration of a surface mount packaged white light source. Specifically, since surface mount type packages are widely popular for LEDs and other devices and are available off the shelves they could be one option for a low cost and highly adaptable solution.

Figure 14:
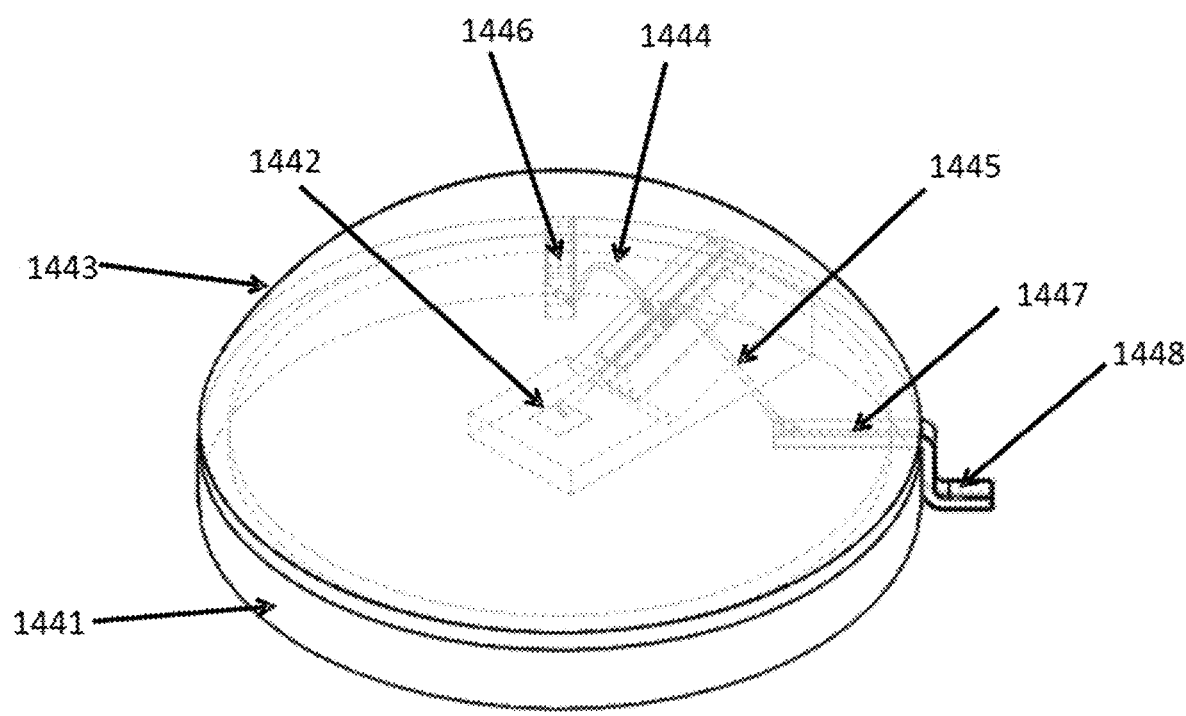
FIG. 14 is a simplified diagram illustrating an integrated laser-induced white light source mounted in a surface mount-type package and sealed with a cap member according to an embodiment of the present invention.

FIG. 14 is a schematic illustration of the CPoS white light source configured in a SMD type package, but with an additional cap member to form a seal around the white light source. As seen in FIG. 14, the SMD type package has a base member 1441 with the white light source 1442 mounted to the base. The mounting to the base can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the white light source is a cap member 1443, which is attached to the base member around the peripheral. In an example, the attachment can be a soldered attachment, a brazed attachment, a welded attachment, or a glued attachment to the base member. The cap member 1443 has at least a transparent window region and in preferred embodiments would be primarily comprised of a transparent window region such as the transparent dome cap illustrated in FIG. 14. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 1444 and 1445. The wirebonds connect the electrode to electrical feedthroughs 1446 and 1447 that are electrically connected to external leads such as 1448 on the outside of the sealed SMD package. The leads are then electrically coupled to a power source to electrify the white light source and generate white light emission. In some embodiments, a lens or other type of optical element to shape, direct, or collimate the white light is included directly in the cap member. Of course, the example in FIG. 14 is merely an example and is intended to illustrate one possible configuration of sealing a white light source. Specifically, since SMD type packages are easily hermetically sealed, this embodiment may be suitable for applications where hermetic seals are needed.

Figure 15:
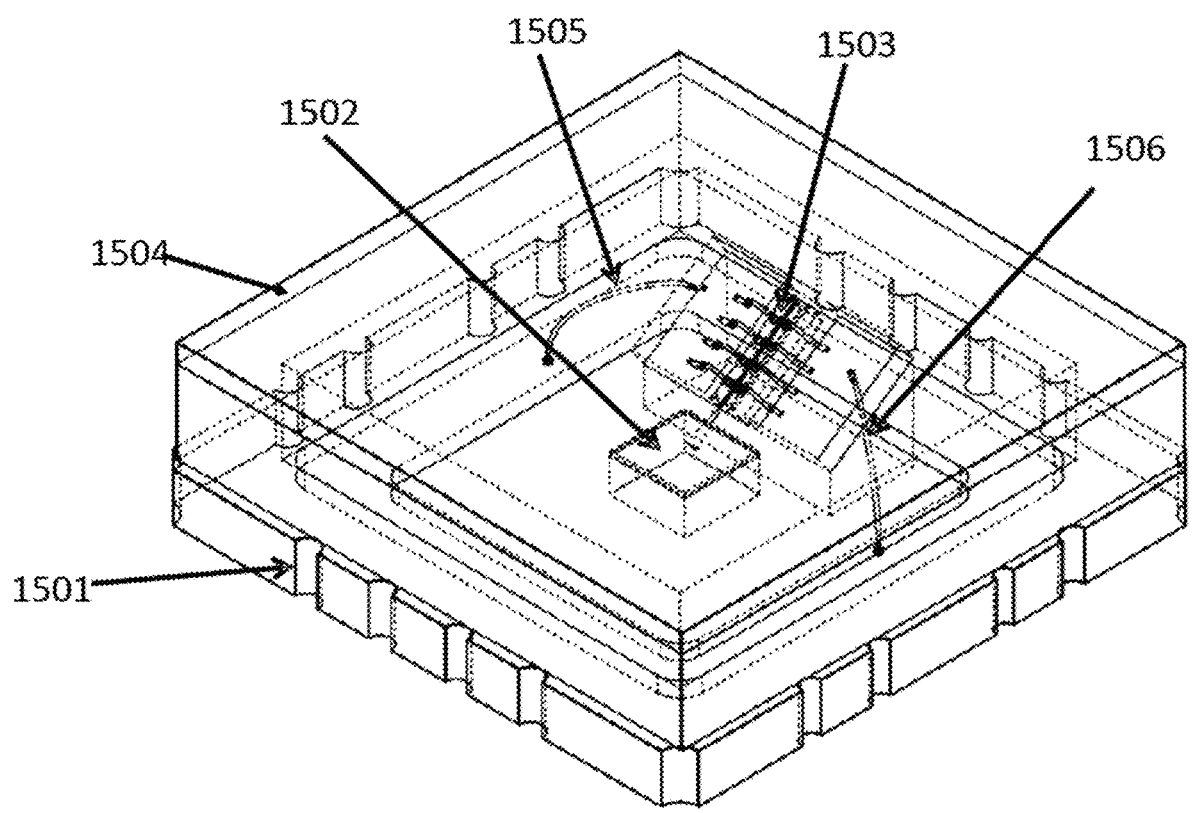
FIG. 15 is a simplified diagram illustrating an integrated laser-induced white light source mounted in a surface mount-type package and sealed with a cap member according to another embodiment of the present invention.

FIG. 15 is a schematic illustration of the white light source configured in a SMD type package, but with an additional cap member to form a seal around the white light source. As seen in FIG. 15, the SMD type package has a base member 1501 with the white light source comprised of a reflective mode phosphor member 1502 and a laser diode member 1503 mounted to submount members or the base member 1501. The mounting to submount and/or the base member 1501 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Overlying the white light source is a cap member 1504, which is attached to the base member around the sides. In an example, the attachment can be a soldered attachment, a brazed attachment, a welded attachment, or a glued attachment to the base member. The cap member 1504 has at least a transparent window region and in preferred embodiments would be primarily comprised of a transparent window region such as the transparent flat cap member 1504 illustrated in FIG. 15. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 1505 and 1506. The wirebonds connect the electrode to electrical feedthroughs that are electrically connected to external leads on the outside of the sealed SMD package. The leads are electrically coupled to a power source to electrify the white light source and generate white light emission. In some embodiments, a lens or other type of optical element to shape, direct, or collimate the white light is included directly in the cap member. Of course, the example in FIG. 15 is merely an example and is intended to illustrate one possible configuration of sealing a white light source. Specifically, since SMD type packages are easily hermetically sealed, this embodiment may be suitable for applications where hermetic seals are needed.

Of course, a suitable assembly process is required for the fabrication of integrated laser based white light sources as shown in FIG. 15 and other embodiments according to the present invention. In many embodiments, assembly processes suitable for a such a device would follow standard semiconductor and LED assembly processes as they are today. As an example, a general assembly process would follow the subsequent steps:
  I) The laser is attached to heat a conducting member such as a first submount member and optionally a second submount member, or a second and a third submount member
  II) The composite laser and heat conducting member are attached to common support member such as the package member [e.g. SMD package], or substrate member.
  III) The phosphor is attached to the common support member such as a package member [e.g. SMD] or a substrate member.

IV) An ESD protection device [e.g. TVS] or other peripheral component is attached to a package member, submount member, or substrate member.

V) The subcomponents that require electrical connection to package are wirebonded to feedthroughs.

VI) An operation verification test is performed.

VII) The frame assembly is attached to package or substrate or the frame+lid assembly is attached to the package or substrate.

VIII) The completed SMD package is attached to a next level board such as an MCPCB, FR4, or suitable carrier substrate.

In step I the laser device would be attached to the heat conducting member by a selection of various materials to provide mechanical stability, alignment and thermal conductivity to suit the particular requirements of the product application. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step II the combined member consisting of a laser and heat conducting member would then be presented with a similar set of materials choices for its attachment into the package or onto the substrate. The materials choices and processes selection would be as follows. Depending on the materials selection, the process flow could be adjusted such that each subsequent step in the process puts a lower temperature excursion on the device than the previous steps. In this way, the early joints or connections do not experience a secondary reflow. A typical pick and place style operation either with in situ heating/pressure or post reflow would be utilized for this attach process. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In step III the phosphor subcomponent attach would depend on the structure and design of the subcomponent. For a single piece, solid state object. The phosphor could be handled by a pick and place operation, as one would handle an LED attach today. This requires that the base of the phosphor subcomponent be prepared for standard metallized attaches would could utilize the following materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In the case of a less rigid phosphor subcomponent, which utilizes phosphor powders and binders like silicones. The method of attach would simply be the adhesion of the phosphor and silicone slurry to the package surface during the silicone drying steps. Methods of application of a phosphor slurry would include but not limited to a dispense and cure process, a spray and cure process, an electropheretic deposition with silicone dispense and cure process, a mechanical coining of powder/embedding into the surface of the package metallization process, a sedimentation deposition process, or a jet dispense and cure process.

In step IV an ESD or other peripheral component attach process could follow industry standard attach protocols which would include one or more of a solder dispense/ stencil or preform attach process, an ESD or peripheral attach via pick and place operation, or a reflow process.

In step V wirebonding of the attached subcomponents would utilize industry standard materials and processes. This would include wire materials selection Al, Cu, Ag and Au. Alternatively ribbon bonding could be employed if necessary or suitable for the application. Normal wirebonding techniques would include ball bonding, wedge bonding and compliant bonding techniques known to the semiconductor industry.

In step VI with device fully connected with subcomponents, an operation verification test could be placed in the assembly process to verify proper operation before committing the final assembly pieces (frame and Lid) to the SMD component. In case of a non-working device, this provides an opportunity to repair the unit before being sealed. This test would consist of a simple electrical turn on for the device to verify proper operation of the laser and possibly a soft ESD test to verify the ESD/TVS component is working. Typical operating values for voltage, current, light output, color, spot size and shape would be used to determine proper operation.

In step VII the frame assembly and attach steps would be used to prepare the device to be sealed from the environment. The frame would be attached to the SMD via a choice of materials depending on the level of sealing required by the device. In one example of sealing materials and processes include a AuSn attach to metalized frame and package surface to provide a true hermetic seal. AuSn dispense, stencil processes would place AuSn in the proper locations on the SMD. This would be followed by a pick and place of the frame onto the wet AuSn and followed by a reflow step. In a second example of sealing materials and processes include epoxy materials are used if the hermeticity and gas leak requirements are sufficient for product use conditions. Epoxy materials would typically be stenciled or dispensed followed by a pick and place of the frame and subsequent epoxy cure. In a third example of sealing materials and processes includes indium metal used by placing thin indium wire on the attach surface and applying heat and pressure to the indium using the frame as a pressing member to compress and mechanical attach the Indium to both the SMD and Frame surfaces.

An alternative approach to the frame assembly process would first attach the transparent Lid (typically Glass) to the frame and this combined unit would then be attached to the SMD as described by the methods above otherwise the lid attach separately would follow the same processes and materials choices, but the surfaces would be the top of the frame and the bottom of the lid.

In step VIII the completed SMD attach to next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

In all embodiments, transmissive and reflective mode, of the integrated CPoS white light source according to the present invention safety features and design considerations can be included. In any laser-induced source, safety is a key aspect. It is critical that the light source cannot be compromised or modified in such a way to create laser diode beam that can be harmful to human beings, animals, or the environment. Thus, the overall design should include safety considerations and features, and in some cases even active components for monitoring. Examples of design considerations and features for safety include positioning the laser beam with respect to the phosphor in a way such that if the phosphor is removed or damaged, the exposed laser beam would not make it to the outside environment in a harmful form such as collimated, coherent beam. More specifically, the white light source is designed such that laser beam is pointing away from the outside environment and toward a surface or feature that will prevent the beam from being reflected to the outside world. In an example of a passive design features for safety include beam dumps and/or absorbing material can be specifically positioned in the location the laser beam would hit in the event of a removed or damaged phosphor.

In one embodiment, an optical beam dump serves as an optical element to absorb the laser beam that could otherwise be dangerous to the outside environment. Design concerns in the beam dump would include the management and reduction of laser beam back reflections and scattering as well as dissipation of heat generated by absorption. Simple solutions where the optical power is not too high, the absorbing material can be as simple as a piece of black velvet or flock paper attached to a backing material with a glue, solder, or other material. In high power applications such as those that would be incorporated into high power laser systems, beam dumps must often incorporate more elaborate features to avoid back-reflection, overheating, or excessive noise. Dumping the laser beam with a simple flat surface could result in unacceptably large amounts of light escaping to the outside world where it could be dangerous to the environment even though the direct reflection is mitigated. One approach to minimize scattering is to use a porous or deep dark cavity material deep lined with an absorbing material to dump the beam.

A commonly available type of beam dump suitable for most medium-power lasers is a cone of aluminum with greater diameter than the beam, anodized to a black color and enclosed in a canister with a black, ribbed interior. Only the point of the cone is exposed to the beam head-on; mostly, incoming light grazes the cone at an angle, which eases performance requirements. Any reflections from this black surface are then absorbed by the canister. The ribs both help to make light less likely to escape, and improve heat transfer to the surrounding air. (https://en.wikipedia.org/wikiBeam_dump).

In some embodiments of the present invention a thermal fuse is integrated into the package with the phosphor member. Thermal fuses are simple devices configured to conduct electricity under normal operation and typically consist of a low melting point alloy. In one example, the thermal fuse is comprised of metal material with a low melting point and configured to rapidly heat when irradiated directly or indirectly with the violet or blue laser beam light. The rapid heat rise in the thermal fuse material causes the material to melt, creating a discontinuity in the fuse metal, which opens the electrical conduction pathway and prevents current flow through the fuse.

In this embodiment of the present invention, a thermal fuse is contained within the electrical pathway providing the current input from an external power source to the gain element of the laser diode. The thermal fuse is physically positioned in locations where the output of the violet or blue laser beam would be incident in the case that the phosphor member is comprised, broken, or removed. That is, the thermal fuse is placed in the package where the beam is not expected to be unless an upstream failure in the beam line has occurred. In the case of such an event, the violet or blue laser light would irradiate the fuse material inducing a temperature rise at or above the melting point and hence causing a melting of thermal fuse element. This melting would then open the electrical pathway and break the electrical circuit from the external power supply to the laser diode gain element and thereby shutting the laser device off. In this preferred example, the thermal fuse could cutoff power to the laser without requiring external control mechanisms.

There are numbers of variations on the fusible alloy thermal fuse structure according to the present invention. In another example, one could utilize a tensioned spring which is soldered in place inside a ball of fusible allow. The spring and alloy are provided in the electrical circuit. When the alloy becomes soft enough, the spring pulls free, thereby breaking the circuit connection. In some embodiments the melting point could be suitably chosen to only break connection in the operating device when a sufficiently-high temperature had been met or exceeded.

In some embodiments of this invention, safety features and systems use active components. Example active components include photodetectors/photodiode and thermistors. A photodiode is a semiconductor device that converts light into current wherein a current is generated when light within a certain wavelength range is incident on the photodiode. A small amount of current is also produced when no light is present. Photodiodes may be combined with components such as optical filters to provide a wavelength or polarization selection of the light incident on the detector, built-in lenses to focus the light or manipulate the light incident on the detector, and may have large or small surface areas to select a certain responsivity and/or noise level. The most prevalent photodiode type is based on Si as the optical absorbing material, wherein a depletion region is formed. When a photon is absorbed in this region an electron-hole pair is formed, which results in a photocurrent. The primary parameter defining the sensitivity of a photodiode is its quantum efficiency (QE) which is defined as the percentage of incident photons generating electron-hole pairs which subsequently contribute to the output signal. Quantum efficiencies of about 80% are usual for silicon detectors operating at wavelengths in the 800-900 nm region. The sensitivity of a photodiode may also be expressed in units of amps of photodiode current per watt of incident illumination. This relationship leads to a tendency for responsivity to reduce as the wavelength becomes shorter. For example, at 900 nm, 80% QE represents a responsivity of 0.58 A/W, whereas at 430 nm, the same QE gives only 0.28 A/W. In alternative embodiments, photodiodes based on other materials such as Ge, InGaAs, GaAs, InGaAsP, InGaN, GaN, InP, or other semiconductor-based materials can be used. The photodiode can be a p-n type, a p-i-n type, an avalanche photodiode, a uni-traveling carrier photodiode, a partially depleted photodiode, or other type of diode.

The decreasing responsivity with such shorter wavelengths presents difficulty in achieving a high-performance silicon-based photodiode in the violet or blue wavelength range. To overcome this difficulty blue enhancement and/or filter techniques can be used to improve the responsivity this wavelength range. However, such techniques can lead to increased costs, which may not be compatible with some applications. Several techniques can be used to overcome this challenge including deploying new technologies for blue enhanced silicon photodiodes or using photodiodes based on different material systems such as photodiodes based on GaN/InGaN. In one embodiment an InGaN and/or GaN-containing photodiode is combined with the integrated white light source. In a specific embodiment, the photodiode is integrated with the laser diode either by a monolithic technique or by an integration onto a common submount or support member as the laser diode to form an integrated GaN/InGaN based photodiode.

In another embodiment of this invention to overcome the difficulty of achieving a low cost silicon based photodiode operable with high responsivity in the blue wavelength region, a wavelength converter material such as a phosphor can be used to down convert ultraviolet, violet, or blue laser light to a wavelength more suitable for high-responsivity photo-detection according to the criteria required in an embodiment for this invention. For example, if photodiodes operating in the green, yellow, or red wavelength regime can be lower cost and have a suitable responsivity for the power levels associated with a converted wavelength, the photodiode can be coated with phosphors to convert the laser light to a red, green, or yellow emission. In other embodiments the detectors are not coated, but a converter member such as a phosphor is place in the optical pathway of the laser beam or scattered laser beam light and the photodiode.

Strategically located detectors designed to detect direct blue emission from the laser, scattered blue emission, or phosphor emission such as yellow phosphor emission can be used to detect failures of the phosphor where a blue beam could be exposed or other malfunctions of the white light source. Upon detection of such an event, a close circuit or feedback loop would be configured to cease power supply to the laser diode and effectively turn it off.

As an example, a photodiode can be used to detect phosphor emission could be used to determine if the phosphor emission rapidly reduced, which would indicate that the laser is no longer effectively hitting the phosphor for excitation and could mean that the phosphor was removed or damaged. In another example of active safety features, a blue sensitive photodetector could be positioned to detect reflected or scatter blue emission from the laser diode such that if the phosphor was removed or compromised the amount of blue light detected would rapidly increase and the laser would be shut off by the safety system.

In a preferred embodiment, a InGaN/GaN-based photodiode is integrated with the white light source. The InGaN/GaN-based photodiode can be integrated using a discrete photodiode mounted in the package or can be directly integrated onto a common support member with the laser diode. In a preferable embodiment, the InGaN/GaN-based photodiode can be monolithically integrated with the laser diode.

In yet another example of active safety features a thermistor could be positioned near or under the phosphor material to determine if there was a sudden increase in temperature which may be a result of increased direct irradiation from the blue laser diode indicating a compromised or removed phosphor. Again, in this case the thermistor signal would trip the feedback loop to cease electrical power to the laser diode and shut it off.

In some embodiments additional optical elements are used to recycle reflected or stray excitation light. In one example, a re-imaging optic is used to re-image the reflected laser beam back onto the phosphor and hence re-cycle the reflected light.

In some embodiments of the present invention additional elements can be included within the package member to provide a shield or blocking function to stray or reflected light from the laser diode member. By blocking optical artifacts such as reflected excitation light, phosphor bloom patterns, or the light emitted from the laser diode not in the primary emission beam such as spontaneous light, scattered light, or light escaping a back facet the optical emission from the white light source can be more ideal for integration into lighting systems. Moreover, by blocking such stray light the integrated white light source will be inherently more safer. Finally, a shield member can act as an aperture such that white emission from the phosphor member is aperture through a hole in the shield. This aperture feature can form the emission pattern from the white source.

In many applications according to the present invention, the packaged integrated white light source will be attached to a heat sink member. The heat sink is configured to transfer the thermal energy from the packaged white light source to a cooling medium. The cooling medium can be an actively cooled medium such as a thermoelectric cooler or a microchannel cooler, or can be a passively cooled medium such as an air-cooled design with features to maximize surface and increase the interaction with the air such as fins, pillars, posts, sheets, tubes, or other shapes. The heat sink will typically be formed from a metal member, but can be others such as thermally conductive ceramics, semiconductors, or composites.

The heat sink member is configured to transport thermal energy from the packaged laser diode based white light source to a cooling medium. The heat sink member can be comprised of a metal, ceramic, composite, semiconductor, plastic and is preferably comprised of a thermally conductive material. Examples of candidate materials include copper which may have a thermal conductivity of about 400 W/(m·K), aluminum which may have a thermal conductivity of about 200 W/(m·K), 4H-SiC which may have a thermal conductivity of about 370 W/(m·K), 6H-SiC which may have a thermal conductivity of about 490 W/(m·K), AlN which may have a thermal conductivity of about 230 W/(m·K), a synthetic diamond which may have a thermal conductivity of about >1000 W/(m·K), a composite diamond, sapphire, or other metals, ceramics, composites, or semiconductors. The heat sink member may be formed from a metal such as copper, copper tungsten, aluminum, or other by machining, cutting, trimming, or molding.

The attachment joint joining the packaged white light source according to this invention to the heat sink member should be carefully designed and processed to minimize the thermal impedance. Therefore, a suitable attaching material, interface geometry, and attachment process practice must be selected for appropriate thermal impedance with sufficient attachment strength. Examples include AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. The joint could also be formed from thermally conductive glues, thermal epoxies such as silver epoxy, thermal adhesives, and other materials. Alternatively, the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink.

In many embodiments according to the present invention the completed SMD is attached to the next level board would employ industry standard attach methodologies and materials. These materials choices and processes could include but are not limited to a Au—Au interconnection, a standard Pb free solder attach via dispense or stencil application or the use of preform attach, a standard Pb containing solder attach via dispense or stencil application or the use of preform attach, a die attach epoxies using dispense and screening application, or a sintered silver solder using dispense, stencil or preform.

Figure 16:
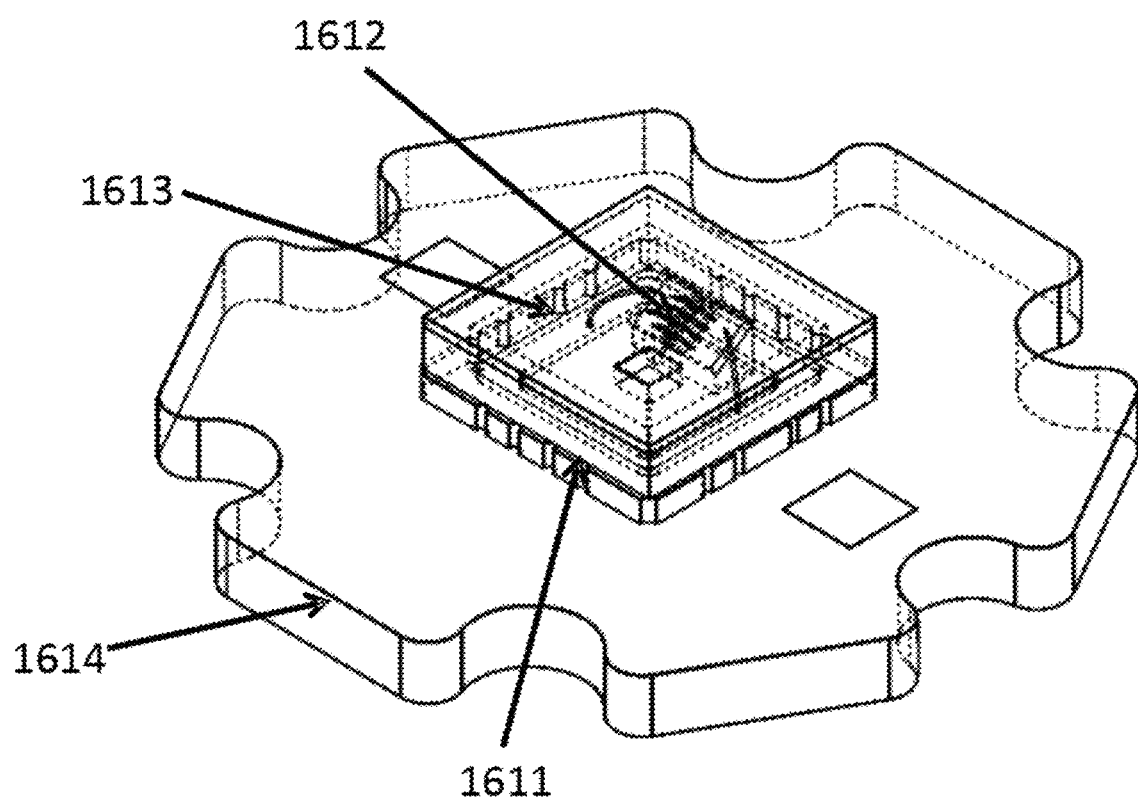
FIG. 16 is a simplified diagram illustrating an integrated laser-induced white light source mounted in a surface mount package mounted onto a starboard according to an embodiment of the present invention.

FIG. 16 is a schematic illustration of a white light source configured in a sealed SMD mounted on a board member such as a starboard according to the present invention. The sealed white light source 1612 in an SMD package is similar to that example shown in FIG. 15. As seen in FIG. 16, the SMD type package has a base member 1611 (i.e., the base member 1401 of FIG. 14) with the white light source 1612 mounted to the base and a cap member 1613 providing a seal for the light source 1612. The mounting to the base member 1611 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900×C), processes can avoid thermal load restrictions on downstream processes, allowing completed devices to have very good and consistent bonds throughout. The cap member 1613 has at least a transparent window region. The transparent material can be glass, quartz, sapphire, silicon carbide, diamond, plastic, or any suitable transparent material. The base member 1611 of the SMD package is attached to a starboard member 1614 configured to allow electrical and mechanical mounting of the integrated white light source, provide electrical and mechanical interfaces to the SMD package, and supply the thermal interface to the outside world such as a heat-sink. The heat sink member 1614 can be comprised of a material such as a metal, ceramic, composite, semiconductor, or plastic and is preferably comprised of a thermally conductive material. Examples of candidate materials include aluminum, alumina, copper, copper tungsten, steel, SiC, AlN, diamond, a composite diamond, sapphire, or other materials. Of course, FIG. 16 is merely an example and is intended to illustrate one possible configuration of a white light source according to the present invention mounted on a heat sink. Specifically, the heat sink could include features to help transfer heat such as fins.

In some embodiments of this invention, the CPoS integrated white light source is combined with an optical member to manipulate the generated white light. In an example the white light source could serve in a spot light system such as a flashlight or an automobile headlamp or other light applications where the light must be directed or projected to a specified location or area. As an example, to direct the light it should be collimated such that the photons comprising the white light are propagating parallel to each other along the desired axis of propagation. The degree of collimation depends on the light source and the optics using to collimate the light source. For the highest collimation a perfect point source of light with 4-pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector.

In another example a simple singular lens or system of lenses is used to collimate the white light into a projected beam. In a specific example, a single aspheric lens is place in front of the phosphor member emitting white light and configured to collimate the emitted white light. In another embodiment, the lens is configured in the cap of the package containing the integrated white light source. In some embodiments, a lens or other type of optical element to shape, direct, or collimate the white light is included directly in the cap member. In an example the lens is comprised of a transparent material such as glass, SiC, sapphire, quartz, ceramic, composite, or semiconductor.

Such white light collimating optical members can be combined with the white light source at various levels of integration. For example, the collimating optics can reside within the same package as the integrated white light source in a co-packaged configuration. In a further level of integration, the collimating optics can reside on the same submount or support member as the white light source. In another embodiment, the collimating optics can reside outside the package containing the integrated white light source.

Figure 17:
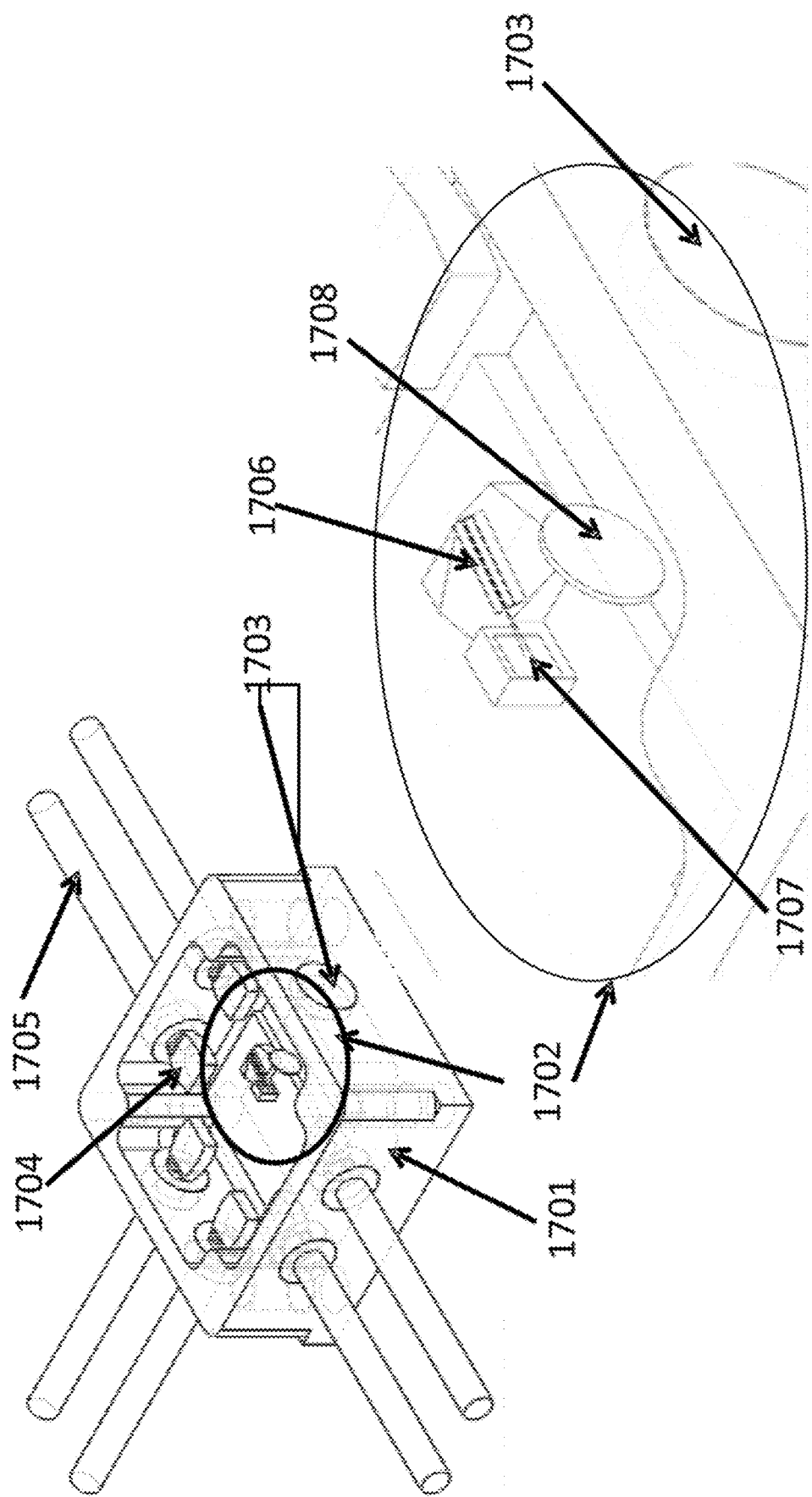
FIG. 17 is a simplified diagram illustrating an integrated laser-induced white light source mounted in a flat-type package with a collimating optic according to an embodiment of the present invention.

In one embodiment according to the present invention, a reflective mode integrated white light source is configured in a flat type package with a lens member to create a collimated white beam as illustrated in FIG. 17. As seen in FIG. 17, the flat type package has a base or housing member 1701 with a collimated white light source 1702 mounted to the base and configured to create a collimated white beam to exit a window 1703 configured in the side of the base or housing member 1701. The mounting to the base or housing can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source 1702 can be made with wire bonds to the feedthroughs 1704 that are electrically coupled to external pins 1705. In this example, the collimated reflective mode white light source 1702 comprises the laser diode 1706, the phosphor wavelength converter 1707 configured to accept a laser beam emitted from the laser diode 1706, and a collimating lens such as an aspheric lens 1708 configured in front of the phosphor 1707 to collect the emitted white light and form a collimated beam. The collimated beam is directed toward the window 1703 formed from a transparent material. The transparent material can be glass, quartz, sapphire, silicon carbide, diamond, plastic, or any suitable transparent material. The external pins 1705 are electrically coupled to a power source to electrify the white light source 1702 and generate white light emission. As seen in the Figure, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIG. 17 is merely an example and is intended to illustrate one possible configuration of sealing a white light source.

Figure 18:
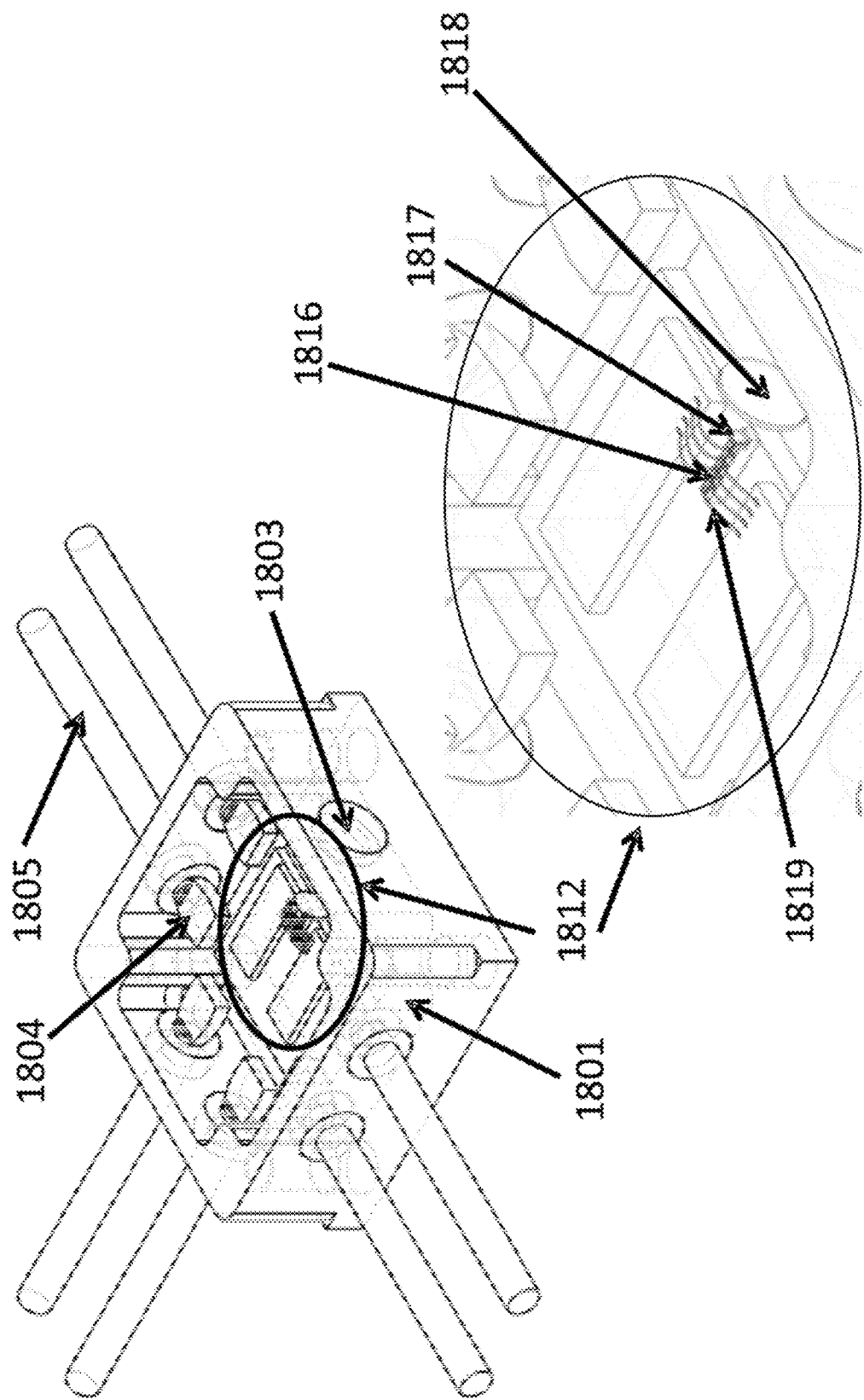
FIG. 18 is a simplified diagram illustrating an integrated laser-induced white light source mounted in a flat-type package with a collimating optic according to an embodiment of the present invention.

In one embodiment according to the present invention, a transmissive mode integrated white light source is configured in a flat type package with a lens member to create a collimated white beam as illustrated in FIG. 18. As seen in FIG. 18, the flat type package has a base or housing member 1801 with a collimated white light source 1812 mounted to the base member 1801 and configured to create a collimated white beam to exit a window 1803 configured in the side of the base or housing member 1801. The mounting to the base or housing member 1801 can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/(m·K) and electrical conductivity of about 16 micro-ohm×cm whereas pressureless sintered Ag can have a thermal conductivity of about 125 W/(m·K) and electrical conductivity of about 4 micro-ohm×cm, or pressured sintered Ag can have a thermal conductivity of about 250 W/(m·K) and electrical conductivity of about 2.5 micro-ohm×cm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source 1812 can be made with wire bonds to the feedthroughs 1804 that are electrically coupled to external pins 1805. In this example, the collimated transmissive mode white light source 1812 comprises the laser diode 1816, the phosphor wavelength converter 1817 configured to accept a laser beam emitted from the laser diode 1816, and a collimating lens such as an aspheric lens 1818 configured in front of the phosphor 1817 to collect the emitted white light and form a collimated beam. The collimated beam is directed toward the window 1803 formed from a transparent material. The transparent material can be glass, quartz, sapphire, silicon carbide, diamond, plastic, or any suitable transparent material. The external pins 1805 are electrically coupled to a power source to electrify the white light source 1812 and generate white light emission. As seen in the FIG. 18, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, the example in FIG. 18 is merely an example and is intended to illustrate one possible configuration of sealing a white light source.

Figure 19:
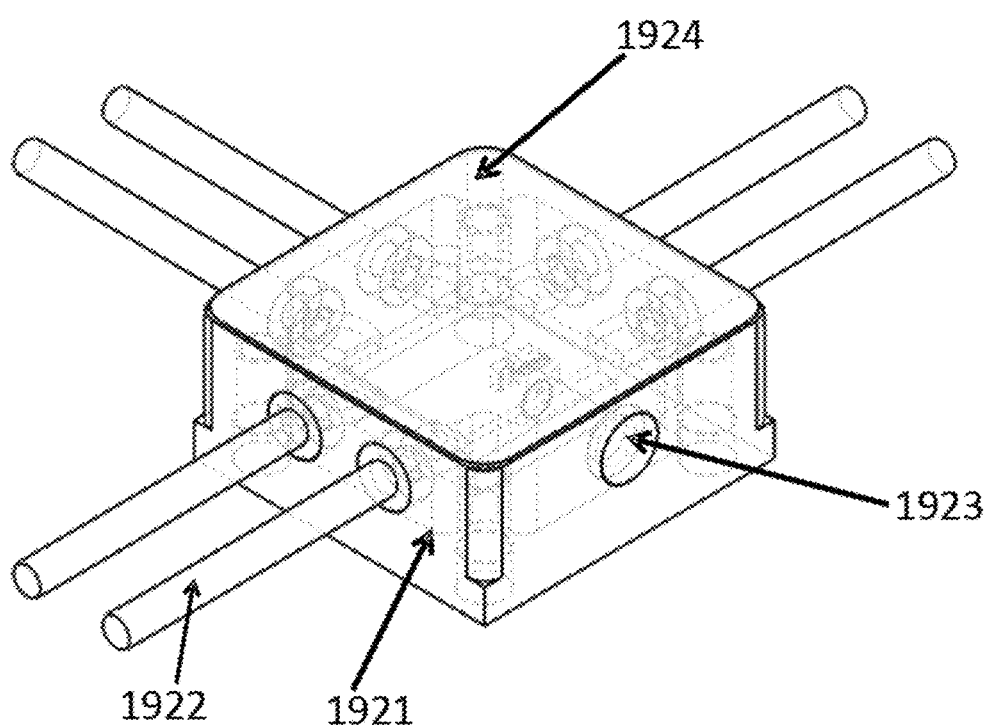
FIG. 19 is a simplified diagram illustrating an integrated laser-induced white light source mounted in a flat-type package and sealed with a cap member according to an embodiment of the present invention.

The flat type package examples shown in FIGS. 17 and 18 according to the present invention are illustrated in an unsealed configuration without a lid to show examples of internal configurations. However, flat packages are easily sealed with a lid or cap member. FIG. 19 is an example of a sealed flat package with a collimated white light source inside. As seen in FIG. 19, the flat type package has a base or housing member 1921 with external pins 1922 configured for electrical coupling to internal components such as the white light source, safety features, and thermistors. The sealed flat package is configured with a window 1923 for the collimated white beam to exit and a lid or cap 1924 to form a seal between the external environment and the internal components. The lid or cap can be soldered, brazed, welded, glued to the base, or other. The sealing type can be an environmental seal or a hermetic seal, and in an example the sealed package is backfilled with a nitrogen gas or a combination of a nitrogen gas and an oxygen gas.

Figure 20:
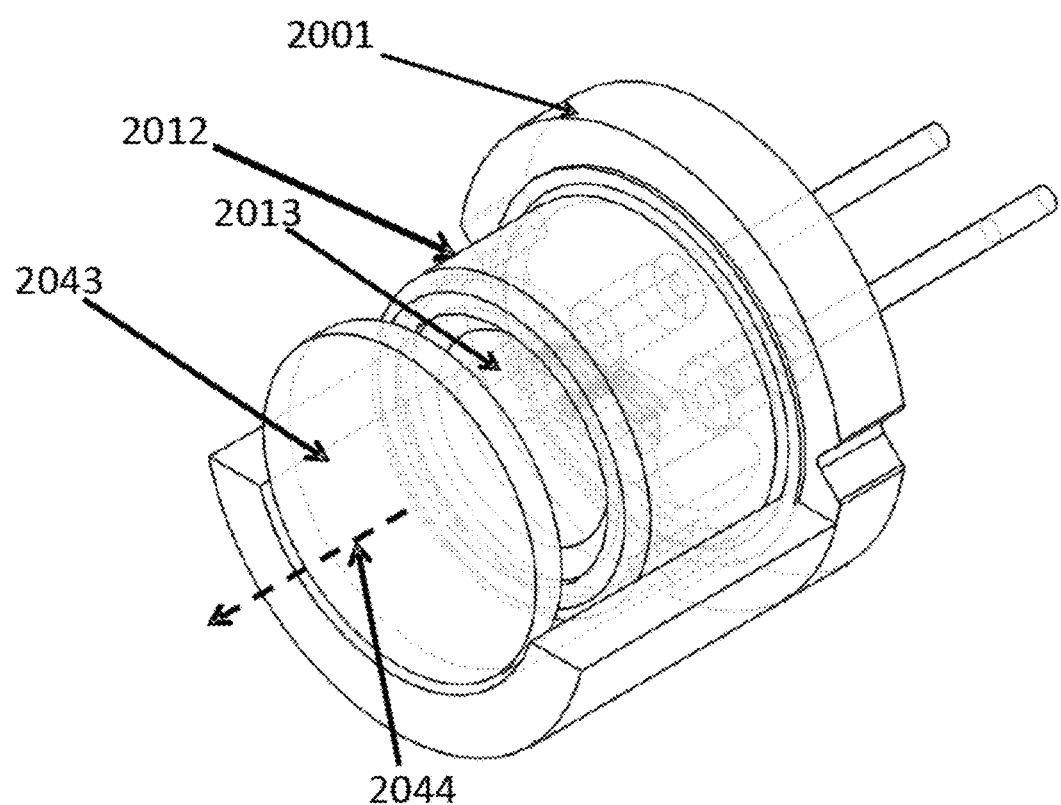
FIG. 20 is a simplified diagram illustrating an integrated laser-induced white light source mounted in a can-type package with a collimating lens according to an embodiment of the present invention.

In an alternative embodiment, FIG. 20 provides a schematic illustration of the CPoS white light source configured in a TO-can type package, but with an additional lens member configured to collimate and project the white light. The example configuration for a collimated white light from TO-can type package according to FIG. 20 comprises a TO-can base 2001, a cap 2012 configured with a transparent window region 2013 mounted to the base 2001. The cap 2012 can be soldered, brazed, welded, or glue to the base. An aspheric lens member 2043 configured outside the window region 2013 wherein the lens 2043 functions to capture the emitted white light passing the window, collimate the light, and then project it along the axis 2044. Of course, this is merely an example and is intended to illustrate one possible configuration of combining the integrated white light source according to this invention with a collimation optic. In another example, the collimating lens could be integrated into the window member on the cap or could be included within the package member.

Figure 21:
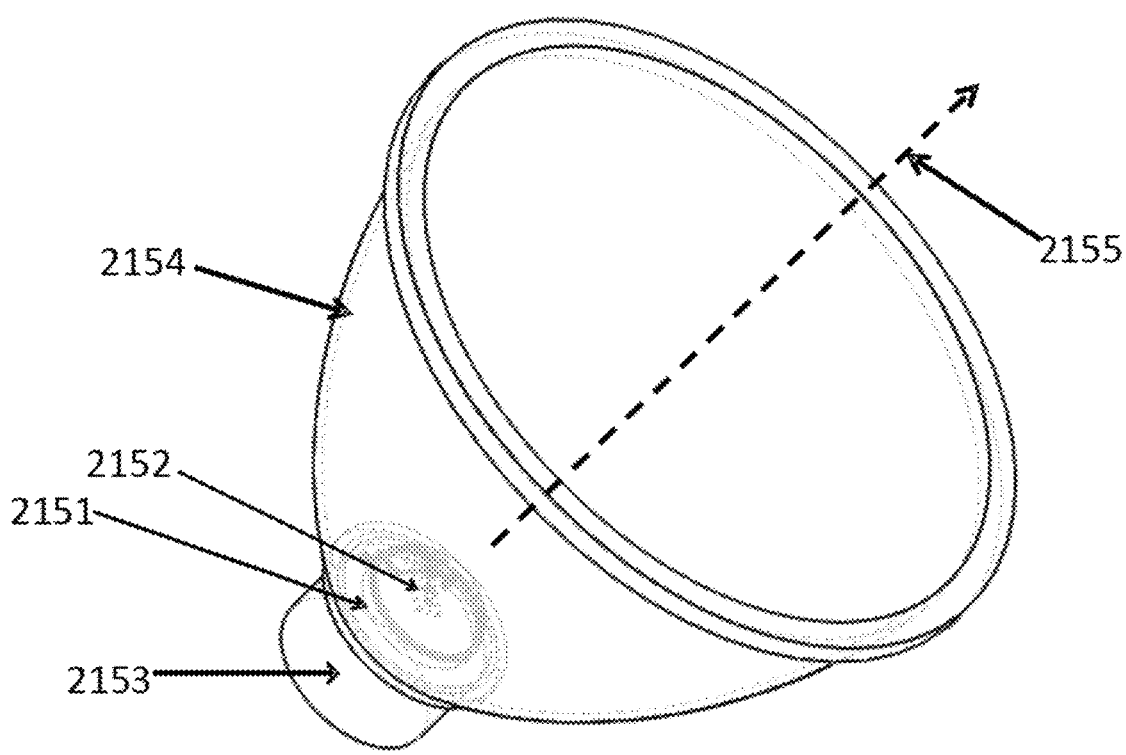
FIG. 21 is a simplified diagram illustrating an integrated laser-induced white light source mounted in a surface mount type package mounted on a heat sink with a collimating reflector according to an embodiment of the present invention.

In an alternative embodiment, FIG. 21 provides a schematic illustration of a white light source according to this invention configured in an SMD-type package but with an additional parabolic member configured to collimate and project the white light. The example configuration for a collimated white light from SMD-type package according to FIG. 21 comprises an SMD type package 2151 comprising a based and a cap or window region and the integrated white light source 2152. The SMD package is mounted to a heat-sink member 2153 configured to transport and/or store the heat generated in the SMD package from the laser and phosphor member. A reflector member 2154 such as a parabolic reflector is configured with the white light emitting phosphor member of the white light source at or near the focal point of the parabolic reflector. The parabolic reflector functions to collimate and project the white light along the axis of projection 2155. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Figure 22:
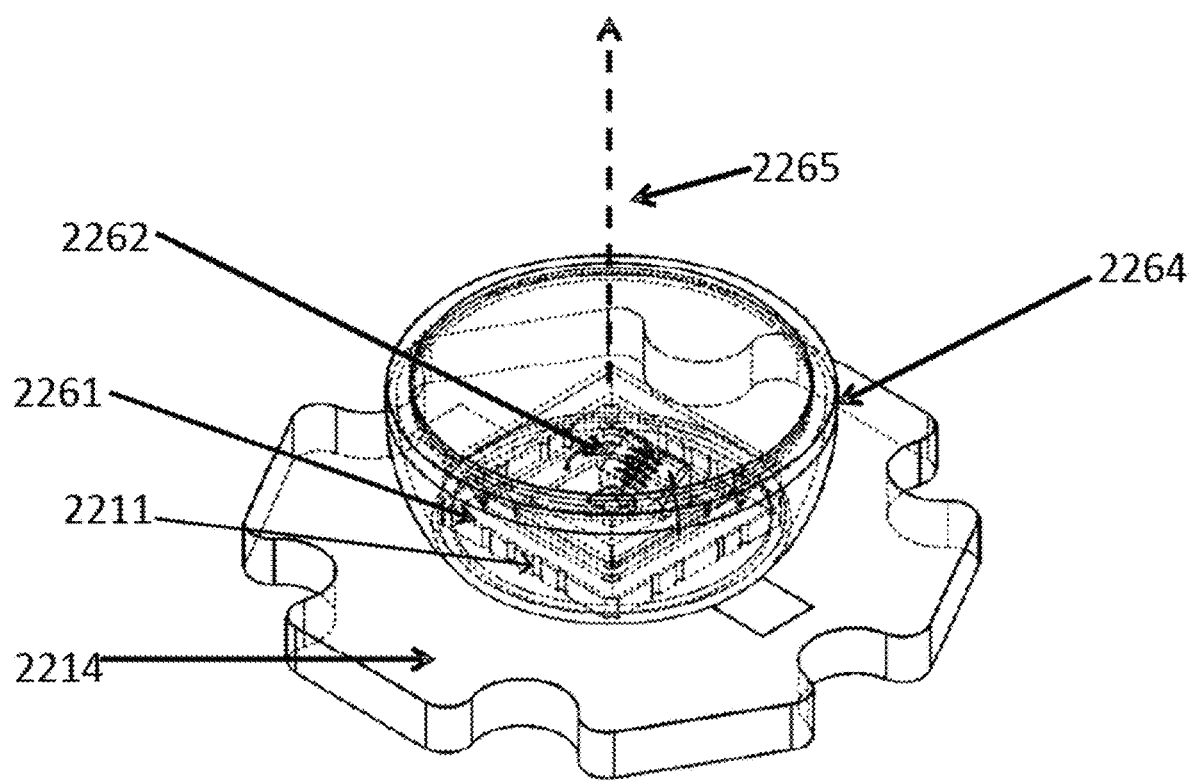
FIG. 22 is a simplified diagram illustrating an integrated laser-induced white light source mounted in a surface mount type package mounted on a starboard with a collimating reflector according to an embodiment of the present invention.

In an alternative embodiment, FIG. 22 provides a schematic illustration of a white light source according to this invention configured in an SMD-type package, but with an additional parabolic reflector member or alternative collimating optic member such as lens or TIR optic configured to collimate and project the white light. The example configuration for a collimated white light from SMD-type package according to FIG. 22 comprises an SMD type package 2261 comprising a based 2211 and a cap or window region and the integrated white laser based light source 2262. The SMD package 2261 is mounted to a starboard member 2214 configured to allow electrical and mechanical mounting of the integrated white light source, provide electrical and mechanical interfaces to the SMD package 2261, and supply the thermal interface to the outside world such as a heat-sink. A reflector member 2264 such as a parabolic reflector is configured with the white light emitting phosphor member of the white light source at or near the focal point of the parabolic reflector. The parabolic reflector 2264 functions to collimate and project the white light along the axis of projection 2265. Of course, this is merely an example and is intended to illustrate one possible configuration of combining the integrated white light source according to this invention with a reflector collimation optic. In another example, the collimating reflector could be integrated into the window member of the cap or could be included within the package member. The collimating optic could be a lens member, a TIR optic member, a parabolic reflector member, or an alternative collimating technology, or a combination. In an alternative embodiment, the reflector is integrated with or attached to the submount.

Figure 23:
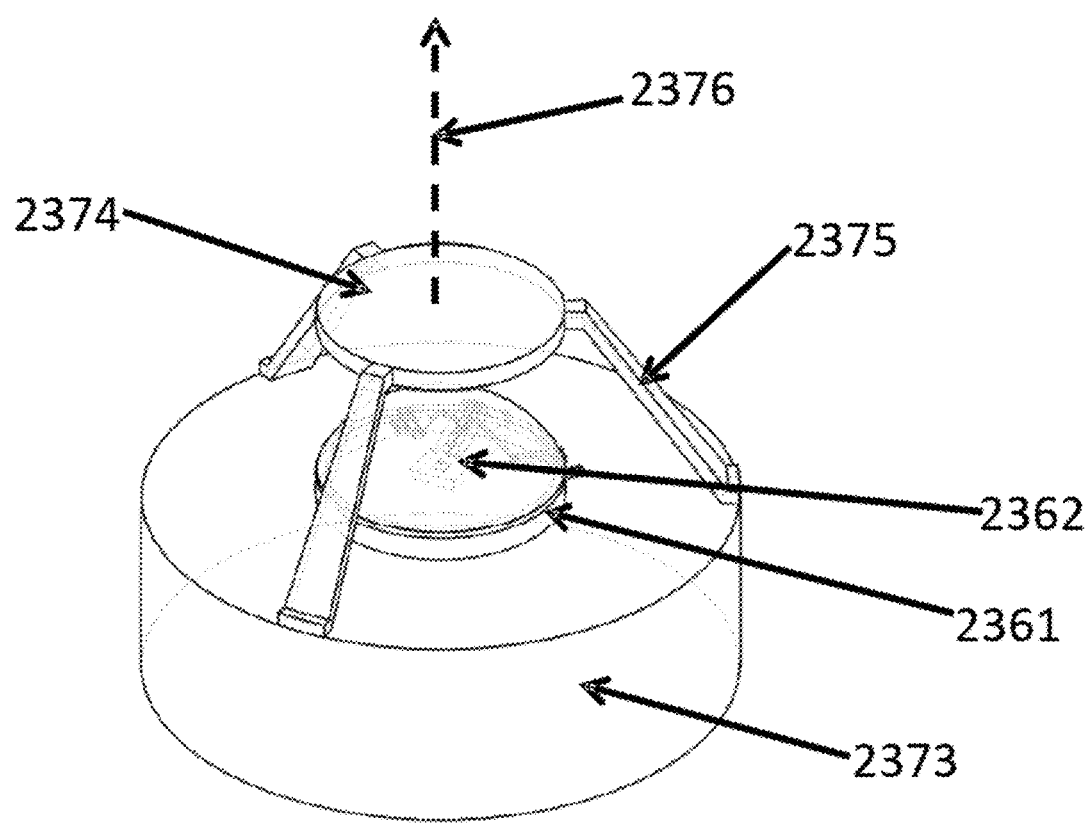
FIG. 23 is a simplified diagram illustrating an integrated laser-induced white light source mounted in a surface mount type package mounted on a heat sink with a collimating lens according to an embodiment of the present invention.

In an alternative embodiment, FIG. 23 provides a schematic illustration of a white light source according to this invention configured in an SMD-type package, but with an additional lens member configured to collimate and project the white light. The example configuration for a collimated white light from SMD-type package according to FIG. 23 comprises an SMD type package 2361 comprising a based and a cap or window region and the integrated white light source 2362. The SMD package 2361 is mounted to a heat-sink member 2373 configured to transport and/or store the heat generated in the SMD package 2361 from the laser and phosphor member. A lens member 2374 such as an aspheric lens is configured with the white light emitting phosphor member of the white light source 2362 to collect and collimate a substantial portion of the emitted white light. The lens member 2374 is supported by support members 2375 to mechanically brace the lens member 2374 in a fixed position with respect to the white light source 2362. The support members 2375 can be comprised of metals, plastics, ceramics, composites, semiconductors or other. The lens member 2374 functions to collimate and project the white light along the axis of projection 2376. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Figure 24:
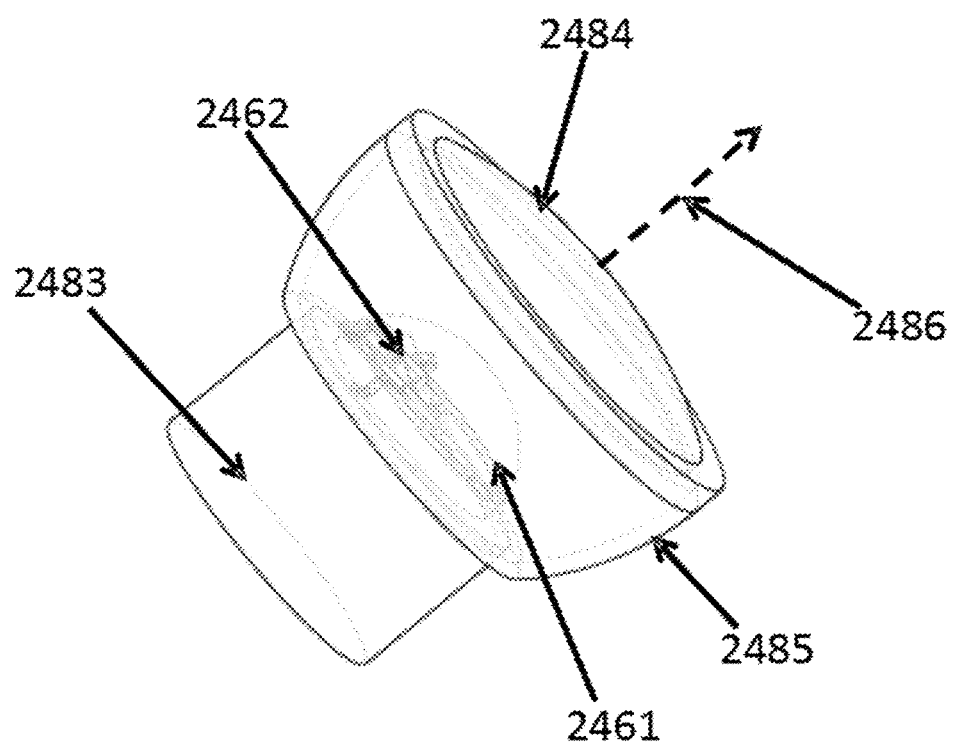
FIG. 24 is a simplified diagram illustrating an integrated laser-induced white light source mounted in a surface mount type package mounted on a heat sink with a collimating lens and reflector member according to an embodiment of the present invention.

In an embodiment according to the present invention, FIG. 24 provides a schematic illustration of a white light source according to this invention configured in an SMD-type package, but with an additional lens member and reflector member configured to collimate and project the white light. The example configuration for a collimated white light from SMD-type package according to FIG. 24 comprises an SMD type package 2461 comprising a based and a cap or window region and the integrated white light source 2462. The SMD package 2461 is mounted to a heat-sink member 2483 configured to transport and/or store the heat generated in the SMD package 2461 from the laser and phosphor member. A lens member 2484 such as an aspheric lens is configured with the white light source 2462 to collect and collimate a substantial portion of the emitted white light. A reflector housing member 2485 or lens member 2484 is configured between the white light source 2462 and the lens member 2484 to reflect any stray light or light (that would not otherwise reach the lens member) into the lens member for collimation and contribution to the collimated beam. In one embodiment the lens member 2484 is supported by the reflector housing member 2485 to mechanically brace the lens member 2484 in a fixed position with respect to the white light source 2462. The lens member 2484 functions to collimate and project the white light along the axis of projection 2486. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

Laser device plus phosphor excitation sources integrated in packages such as an SMD can be attached to an external board to allow electrical and mechanical mounting of packages. In addition to providing electrical and mechanical interfaces to the SMD package, these boards also supply the thermal interface to the outside world such as a heat-sink. Such boards can also provide for improved handling for small packages such as an SMD (typically less than 2 cm×2 cm) during final assembly. In addition to custom board designs, there are a number of industry standard board designs that include metal core printed circuit board (MCPCB) with base being Cu, Al or Fe alloys, fiber filled epoxy boards such as the FR4, Flex/Hybrid Flex boards that are typically polyimide structures with Cu interlayers and dielectric isolation to be used in applications which need to be bent around a non-flat surface, or a standard heat sink material board that can be directly mounted to an existing metal frame in a larger system.

A further understanding of the nature and advantages of the present invention may be realized by reference to the latter portions of the specification and attached drawings.

Figure 25:
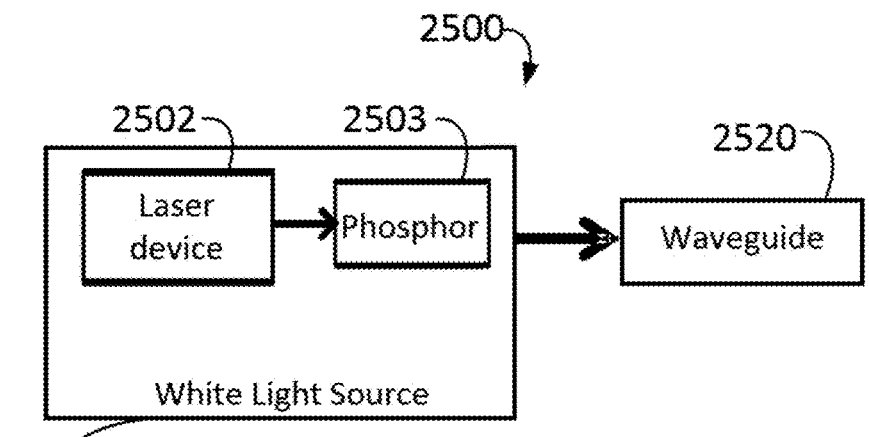
FIG. 25 is a simplified block diagram of a laser-based fiber-coupled white light system according to an embodiment of the present invention.

In an aspect, the present disclosure provides a waveguide-coupled white light system based on integrated laser-induced white light source. FIG. 25 shows a simplified block diagram of a functional waveguide-coupled white light system according to some embodiments of the present disclosure. This diagram is merely an example, which should not unduly limit the scope of the claims. One of ordinary skill in the art would recognize many variations, alternatives, and modifications. As shown, the waveguide-coupled white light system 2500 includes a white light source 2510 and a waveguide 2520 coupled to it to deliver the white light for various applications. In some embodiments, the white light source 2510 is a laser-based white light source including at least one laser device 2502 configured to emit a laser light with a blue wavelength in a range from about 385 nm to about 495 nm. Optionally, the at least one laser device 2502 is a laser diode (LD) chip configured as a chip-on-submount (CoS) form having a Gallium and Nitrogen containing emitting region operating in a first wavelength selected from 395 nm to 425 nm wavelength range, 425 nm to 490 nm wavelength range, and 490 nm to 550 nm range. Optionally, the laser device 2502 is configured as a chip-on-submount (CoS) structure based on lifted off and transferred epitaxial gallium and nitrogen containing layers according to this present invention is shown in FIG. 7. Optionally, the at least one laser device 2502 includes a set of multiple laser diode (LD) chips. Each includes an GaN-based emission stripe configured to be driven by independent driving current or voltage from a laser driver to emit a laser light. All emitted laser light from the multiple LD chips can be combined to one beam of electromagnetic radiation. Optionally, the multiple LD chips are blue laser diodes with an aggregated output power of less than 1 W, or about 1 W to about 10 W, or about 10 W to about 30 W, or about 30 W to 100 W, or greater. Optionally, each emitted light is driven and guided separately.

In some embodiments, the laser-based waveguide-coupled white light system 2500 further includes a phosphor member 2503. Optionally, the phosphor member 2503 is mounted on a remote/separate support member co-packaged within the white light source 2510. Optionally, the phosphor member 2503 is mounted on a common support member with the laser device 2502 in a chip-and-phosphor-on-submount (CPoS) structure. The phosphor member 2503 comprises a flat surface or a pixelated surface disposed at proximity of the laser device 2502 in a certain geometric configuration so that the beam of electromagnetic radiation emitted from the laser device 2502 can land in a spot on the excitation surface of the phosphor member 2503 with a spot size limited in a range of about 50 µm to 5 mm.

Optionally, the phosphor member 2503 is comprised of a ceramic yttrium aluminum garnet (YAG) doped with Ce or a single crystal YAG doped with Ce or a powdered YAG comprising a binder material. The phosphor plate has an optical conversion efficiency of greater than 50 lumen per optical watt, greater than 100 lumen per optical watt, greater than 200 lumen per optical watt, or greater than 300 lumen per optical watt.

Optionally, the phosphor member 2503 is comprised of a single crystal plate or ceramic plate selected from a Lanthanum Silicon Nitride compound and Lanthanum aluminum Silicon Nitrogen Oxide compound containing Ce' ions atomic concentration ranging from 0.01% to 10%.

Optionally, the phosphor member 2503 absorbs the laser emission of electromagnetic radiation of the first wavelength in violet, blue (or green) spectrum to induce a phosphor emission of a second wavelength in yellow spectra range. Optionally, the phosphor emission of the second wavelength is partially mixed with a portion of the incoming/reflecting laser beam of electromagnetic radiation of the first wavelength to produce a white light beam to form a laser induced white light source 2510. Optionally, the laser beam emitted from the laser device 2502 is configured with a relative angle of beam incidence with respect to a direction of the excitation surface of the phosphor member 2503 in a range from 5 degrees to 90 degrees to land in the spot on the excitation surface. Optionally, the angle of laser beam incidence is narrowed in a smaller range from 25 degrees to 35 degrees or from 35 degrees to 40 degrees. Optionally, the white light emission of the white light source 2510 is substantially reflected out of the same side of the excitation surface (or pixelated surface) of the phosphor member 2503. Optionally, the white light emission of the white light source 2510 can also be transmitted through the phosphor member 2503 to exit from another surface opposite to the excitation surface. Optionally, the white light emission reflected or transmitted from the phosphor member is redirected or shaped as a white light beam used for various applications. Optionally, the white light emission out of the phosphor material can be in a luminous flux of at least 250 lumens, at least 500 lumens, at least 1000 lumens, at least 3000 lumens, or at least 10,000 lumens. Alternatively, the white light emission out of the white light system 2500 with a luminance of 100 to 500 $cd/mm^2$, 500 to 1000 $cd/mm^2$, 1000 to 2000 $cd/mm^2$, 2000 to 5000 $cd/mm^2$, and greater than 5000 $cd/mm^2$.

In some embodiments, the white light source 2510 that co-packages the laser device 2502 and the phosphor member 2503 is a surface-mount device (SMD) package. Optionally, the SMD package is hermetically sealed. Optionally, the common support member is provided for supporting the laser device 2502 and the phosphor member 2503. Optionally, the common support member provides a heat sink configured to provide thermal impedance of less than 10 degrees Celsius per watt, an electronic board configured to provide electrical connections for the laser device, a driver for modulating the laser emission, and sensors associated with the SMD package to monitor temperature and optical power. Optionally, the electronic board is configured to provide electrical contact for anode(s) and cathode(s) of the SMD package. Optionally, the electronic board may include or embed a driver for providing temporal modulation for applications related to communication such as LiFi free-space light communication, and/or data communications using optic fiber. Or, the driver may be configured to provide temporal modulation for applications related to LiDAR remote sensing to measure distance, generate 3D images, or other enhanced 2D imaging techniques. Optionally, the sensors include a thermistor for monitor temperatures and photodetectors for providing alarm or operation condition signaling. Optionally, the sensors include fiber sensors. Optionally, the electronic board has a lateral dimension of 50 mm or smaller.

In some embodiments, the white light source 2510 includes one or more optics members to process the white light emission out of the phosphor member 2503 either in reflection mode or transmissive mode. Optionally, the one or more optics members include lenses with high numerical apertures to capture Lambertian emission (primarily for the white light emission out of the surface of the phosphor member 2503. Optionally, the one or more optics members include reflectors such as mirrors, MEMS devices, or other light deflectors. Optionally, the one or more optics members include a combination of lenses and reflectors (including total-internal-reflector). Optionally, each or all of the one or more optics members is configured to be less than 50 mm in dimension for ultra-compact packaging solution.

In some embodiments, the laser-based waveguide-coupled white light system 2500 also includes a waveguide device 2520 coupled to the white light source 2510 to deliver a beam of white light emission to a light head module at a remote destination or directly serve as a light releasing device in various lighting applications. In an embodiment, the waveguide device 2520 is an optical fiber to deliver the white light emission from a first end to a second end at a remote site. Optionally, the optical fiber is comprised of a single mode fiber (SMF) or a multi-mode fiber (MMF). Optionally, the fiber is a glass communication fiber with core diameters ranging from about 1 um to 10 um, about 10 um to 50 um, about 50 um to 150 um, about 150 um to 500 um, about 500 um to 1 mm, or greater than 1 mm, yielding greater than 90% per meter transmissivity. The optical core material of the fiber may consist of a glass such as silica glass wherein the silica glass could be doped with various constituents and have a predetermined level of hydroxyl groups (OH) for an optimized propagation loss characteristic. The glass fiber material may also be comprised of a fluoride glass, a phosphate glass, or a chalcogenide glass. In an alternative embodiment, a plastic optical fiber is used to transport the white light emission with greater than 50% per meter transmissivity. In another alternative embodiment, the optical fiber is comprised of lensed fiber which optical lenses structure built in the fiber core for guiding the electromagnetic radiation inside the fiber through an arbitrary length required to deliver the white light emission to a remote destination. Optionally, the fiber is set in a 3-dimensional (3D) setting that fits in different lighting application designs along a path of delivering the white light emission to the remote destination. Optionally, the waveguide device 2520 is a planar waveguide (such as semiconductor waveguide formed in silicon wafer) to transport the light in a 2D setting.

In another embodiment, the waveguide device 2520 is configured to be a distributed light source. Optionally, the waveguide device 2520 is a waveguide or a fiber that allows light to be scattered out of its outer surface at least partially. In one embodiment, the waveguide device 2520 includes a leaky fiber to directly release the white light emission via side scattering out of the outer surface of the fiber. Optionally, the leaky fiber has a certain length depending on applications. Within the length, the white light emission coupled in from the white light source 2510 is substantially leaked out of the fiber as an illumination source. Optionally, the leaky fiber is a directional side scattering fiber to provide preferential illumination in a particular angle. Optionally, the leaky fiber provides a flexible 3D setting for different 3D illumination lighting applications. Optionally, the waveguide device 2520 is a form of leaky waveguide formed in a flat panel substrate that provides a 2D patterned illumination in specific 2D lighting applications.

In an alternative embodiment, the waveguide device 2520 is a leaky fiber that is directly coupled with the laser device to couple a laser light in blue spectrum. Optionally, the leaky fiber is coated or doped with phosphor material in or on surface to induce different colored phosphor emission and to modify colors of light emitted through the phosphor material coated thereover.

Figure 25A:
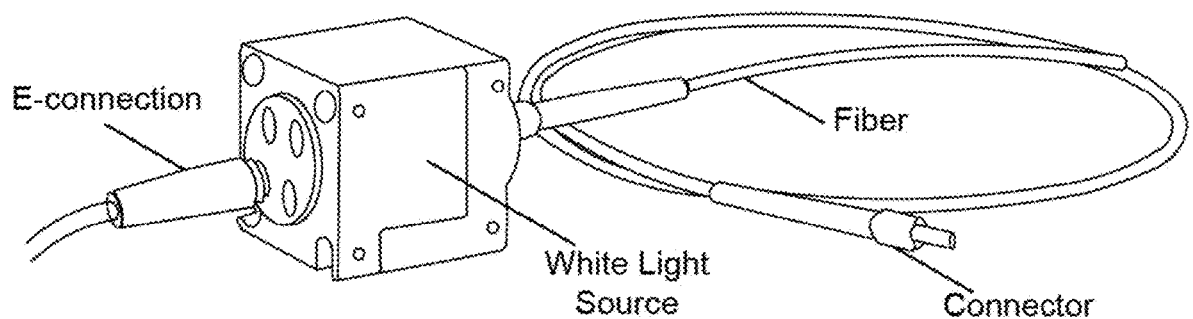
FIG. 25A is an exemplary diagram of a laser-based fiber-coupled white light system according to an embodiment of the present invention.

In a specific embodiment, as shown in FIG. 25A, the laser-based fiber-coupled white light system includes one white light source coupling a beam of white light emission into a section of fiber. Optionally, the white light source is in a SMD package that holds at least a laser device and a phosphor member supported on a common support member. The common support member may be configured as a heat sink coupled with an electronic board having an external electrical connection (E-connection). The SMD package may also be configured to hold one or more optics members for collimating and focusing the emitted white light emission out of the phosphor member to an input end of the second of fiber and transport the white light to an output end. Optionally, referred to FIG. 25A, the white light source is in a package having a cubic shape of with a compact dimension of about 60 mm. The E-connection is provided at one (bottom) side while the input end of the fiber is coupled to an opposite (front) side of the package. Optionally, the output end of the fiber, after an arbitrary length, includes an optical connector. Optionally, the optical connector is just at a middle point, instead of the output end, of the fiber and another section of fiber with a mated connector (not shown) may be included to further transport the white light to the output end. Thus, the fiber becomes a detachable fiber, convenient for making the laser-based fiber-coupled white light system a modular form that includes a white light source module separately and detachably coupled with a light head module. For example, a SMA-905 type connector is used. Optionally, the electronic board also includes a driver configured to modulate (at least temporarily the laser emission for LiFi communication or for LiDAR remote sensing.

In an alternative embodiment, the laser-based fiber coupled white light system includes a white light source in SMD package provided to couple one white light emission to split into multiple fibers. In yet another alternative embodiment, the laser-based fiber-coupled white light system includes multiple SMD-packaged white light sources coupling a combined beam of the white light emission into one fiber.

In an embodiment, the laser-based fiber-coupled white light system 2500 includes one white light source 2510 in SMD package coupled with two detachable sections of fibers joined by an optical connector. Optionally, SMA, FC, or other optical connectors can be used, such as SMA-905 type connector.

Optionally, the fiber 2520 includes additional optical elements at the second end for collimating or shaping or generating patterns of exiting white light emission in a cone angle of 5~50 degrees. Optionally, the fiber 2520 is provided with a numerical aperture of 0.05~0.7 and a diameter of less than 2 mm for flexibility and low-cost.

In an embodiment, the white light source 2510 can be made as one package selected from several different types of integrated laser-induced white light sources shown from FIG. 14 through FIG. 24. Optionally, the package is provided with a dimension of 60 mm for compactness. The package provides a mechanical frame for housing and fixing the SMD packaged white light source, phosphor members, electronic board, one or more optics members, etc., and optionally integrated with a driver. The phosphor member 2503 in the white light source 2510 can be set as either reflective mode or transmissive mode. Optionally, the laser device 2502 is mounted in a mounted in a surface mount-type package and sealed with a cap member. Optionally, the laser device 2502 is mounted in a surface mount package mounted onto a starboard. Optionally, the laser device 2502 is mounted in a flat-type package with a collimating optic member coupled. Optionally, the laser device 2502 is mounted in a flat-type package and sealed with a cap member. Optionally, the laser device 2502 is mounted in a can-type package with a collimating lens. Optionally, the laser device 2502 is mounted in a surface mount type package mounted on a heat sink with a collimating reflector. Optionally, the laser device 2502 is mounted in a surface mount type package mounted on a starboard with a collimating reflector. Optionally, the laser device 2502 is mounted in a surface mount type package mounted on a heat sink with a collimating lens. Optionally, the laser device 2502 is mounted in a surface mount type package mounted on a heat sink with a collimating lens and reflector member.

Many benefits and applications can be yielded out of the laser-based fiber-coupled white light system. For example, it is used as a distributed light source with thin plastic optical fiber for low-cost white fiber lighting, including daytime running lights for car headlights, interior lighting for cars, outdoor lighting in cities and shops. Alternatively, it can be used for communications and data centers. Also, a new linear light source is provided as a light wire with <1 mm in diameter, producing either white light or RGB color light. Optionally, the linear light source is provided with a laser-diode plus phosphor source to provide white light to enter the fiber that is a leaky fiber to distribute side scattered white light. Optionally, the linear light source is coupled RGB laser light in the fiber that is directly leak side-scattered RGB colored light. Optionally, the linear light source is configured to couple a blue laser light in the fiber that is coated with phosphor material(s) to allow laser-pumped phosphor emission be side-scattered out of the outer surface of the fiber. Analogously, a 2D patterned light source can be formed with either arranging the linear fiber into a 2D setting or using 2D solid-state waveguides instead formed on a planar substrate.

Figure 26:
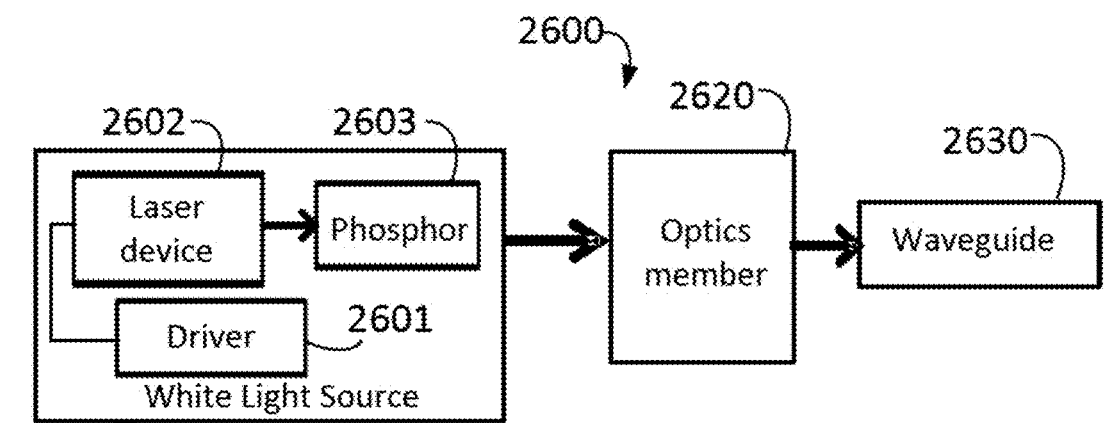
FIG. 26 is a simplified block diagram of a laser-based fiber-coupled white light system according to another embodiment of the present invention.

In an alternative embodiment, FIG. 26 shows a simplified block diagram of a functional laser-based waveguide-coupled white light system 2600. The laser-based waveguide-coupled white light system 2600 includes a white light source 2610, substantially similar to the white light source 2510 shown in FIG. 25, having at least one laser device 2602 configured to emit blue spectrum laser beam of a first wavelength to a phosphor member 2603. The at least one laser device 2602 is driven by a laser driver 2601. The laser driver 2601 generates a drive current adapted to drive one or more laser diodes. In a specific embodiment, the laser driver 2601 is configured to generate pulse-modulated signal at a frequency range of about 50 to 300 MHz. The phosphor member 2603 is substantially the same as the phosphor member 2503 as a wavelength converter and emitter being excited by the laser beam from the at least one laser device 2602 to produce a phosphor emission with a second wavelength in yellow spectrum. The phosphor member 2603 may be packaged together with the laser device 2602 in a CPoS structure on a common support member. The phosphor emission is partially mixed with the laser beam with the first wavelength in violet or blue spectrum to produce a white light emission. Optionally, the waveguide-coupled white light system 2600 includes an laser-induced white light source 2610 containing multiple laser diode devices 2602 in a co-package with a phosphor member 2603 and driven by a driver module 2601 to emit a laser light of 1 W, 2 W, 3 W, 4 W, 5 W or more power each, to produce brighter white light emission of combined power of 6 W, or 12 W, or 15 W, or more. Optionally, the white light emission out of the laser-induced white light source with a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$. Optionally, the white light emission is a reflective mode emission out of a spot of a size greater than 5 um on an excitation surface of the phosphor member 2603 based on a configuration that the laser beam from the laser device 2602 is guided to the excitation surface of the phosphor member 2603 with an off-normal angle of incidence ranging between 0 degrees and 89 degrees.

In the embodiment, the laser-based waveguide-coupled white light system 2600 further includes an optics member 2620 configured to collimate and focus the white light emission out of the phosphor member 2603 of the white light source 2610. Furthermore, the laser-based waveguide-coupled white light system 2600 includes a waveguide device or assembly 2630 configured to couple with the optics member 2620 receive the focused white light emission with at least 20%, 40%, 60%, or 80% coupling efficiency. The waveguide device 2630 serves a transport member to deliver the white light to a remotely set device or light head module. Optionally, the waveguide device 2630 serves an illumination member to direct perform light illumination function. Preferably, the waveguide device 2630 is a fiber. Optionally, the waveguide device 2630 includes all of the types of fiber, including single mode fiber, multiple module, polarized fiber, leaky fiber, lensed fiber, plastic fiber, etc.

Figure 27:
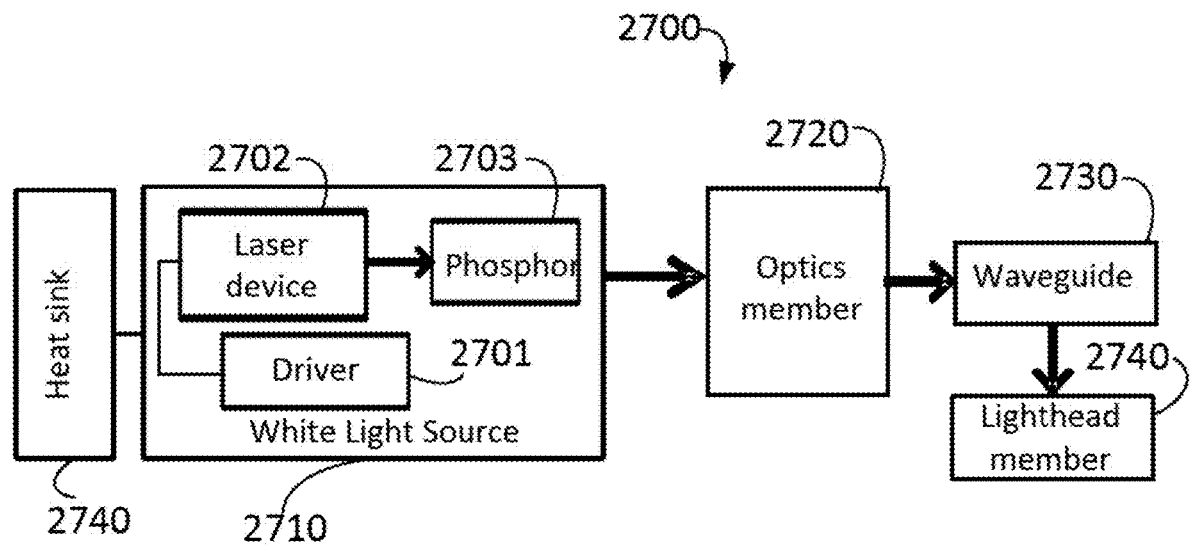
FIG. 27 is a simplified block diagram of a laser-based fiber-coupled white light system according to yet another embodiment of the present invention.

FIG. 27 shows a simplified block diagram of a laser-based waveguide-coupled white light system 2700 according to yet another alternative embodiment of the present disclosure. As shown, a laser-based white light source 2710 including a laser device 2702 driven by a driver module 2701 to emit a laser beam of electromagnetic radiation with a first wavelength in violet or blue spectrum range. The electromagnetic radiation with the first wavelength is landed to an excitation surface of a phosphor member 2703 co-packaged with the laser device 2702 in a CPoS structure in the white light source 2710. The phosphor member 2703 serves as a wavelength converter and an emitter to produce a phosphor emission with a second wavelength in yellow spectrum range which is partially mixed with the electromagnetic radiation of the first wavelength to produce a white light emission reflected out of a spot on the excitation surface. Optionally, the laser device 2702 includes one or more laser diodes containing gallium and nitrogen in active region to produce laser of the first wavelength in a range from 385 nm to 495 nm. Optionally, the one or more laser diodes are driven by the driver module 2701 and laser emission from each laser diode is combined to be guided to the excitation surface of the phosphor member 2703. Optionally, the phosphor member 2703 comprises a phosphor material characterized by a wavelength conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. Additionally, the ceramic YAG:Ce phosphors is characterized by a temperature quenching characteristics above 150° C., above 200° C., or above 250° C. and a high thermal conductivity of 5-10 W/(m·K) to effectively dissipate heat to a heat sink member and keep the phosphor member at an operable temperature.

In the embodiment, the laser device 2702, the diver module 2710, and the phosphor member 2703 are mounted on a support member containing or in contact with a heat sink member 2740 configured to conduct heat generated by the laser device 2702 during laser emission and the phosphor member 2703 during phosphor emission. Optionally, the support member is comprised of a thermally conductive material such as copper with a thermal conductivity of about 400 W/(m·K), aluminum with a thermal conductivity of about 200 W/(m·K), 4H-SiC with a thermal conductivity of about 370 W/(m·K), 6H-SiC with a thermal conductivity of about 490 W/(m·K), AlN with a thermal conductivity of about 230 W/(m·K), a synthetic diamond with a thermal conductivity of about >1000 W/(m·K), sapphire, or other metals, ceramics, or semiconductors. The support member may be formed from a growth process such as SiC, AlN, or synthetic diamond, and then mechanically shaped by machining, cutting, trimming, or molding. Optionally, the support member is a High Temperature Co-fired Ceramic (HTCC) submount structure configured to embed electrical conducting wires therein. This type of ceramic support member provides high thermal conductivity for efficiently dissipating heat generated by the laser device 2702 and the phosphor member 2703 to a heatsink that is made to contact with the support member. The ceramic support member also can allow optimized conduction wire layout so that ESD can be prevented and thermal management of the whole module can be improved. Electrical pins are configured to connect external power with conducting wires embedded in the HTTC ceramic submount structure for providing drive signals for the laser device 2702. Optionally, the white light source 2710 includes a temperature sensor (not shown) that can be disposed on the support member. Alternatively, the support member may be formed from a metal such as copper, copper tungsten, aluminum, or other by machining, cutting, trimming, or molding. Optionally, the one or more laser diodes are producing an aggregated output power of less than 1 W, or about 1 W to about 10 W, or about 10 W to about 30 W, or about 30 W to 100 W, or greater. Each of the laser diodes is configured on a single ceramic or multiple chips on a ceramic, which are disposed on the heat sink member 2740.

In the embodiment, the laser-based waveguide-coupled white light source 2700 includes a package holding the one or more laser diodes 2702, the phosphor member 2703, the driver module 2701, and a heat sink member 2740. Optionally, the package also includes or couples to all free optics members 2720 such as couplers, collimators, mirrors, and more. The optics members 2720 are configured spatially with optical alignment to couple the white light emission out of the excitation surface of the phosphor member 2703 or refocus the white light emission into a waveguide 2730. Optionally, the waveguide 2730 is a fiber or a waveguide medium formed on a flat panel substrate. As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

In the embodiment, the laser-based waveguide-coupled white light source 2700 further includes an optics member 2720 for coupling the white light emission out of the white light source 2710 to a waveguide device 2730. Optionally, the optics member 2720 includes free-space collimation lens, mirrors, focus lens, fiber adaptor, or others. Optionally, the waveguide device 2730 includes flat-panel waveguide formed on a substrate or optical fibers. Optionally, the optical fiber includes single-mode fiber, multi-mode fiber, lensed fiber, leaky fiber, or others. Optionally, the waveguide device 2730 is configured to deliver the white light emission to a lighthead member 2740 which re-shapes and projects the white light emission to different kinds of light beams for various illumination applications. Optionally, the waveguide device 2730 itself serves an illumination source or elements being integrated in the lighthead member 2740.

Figure 28:
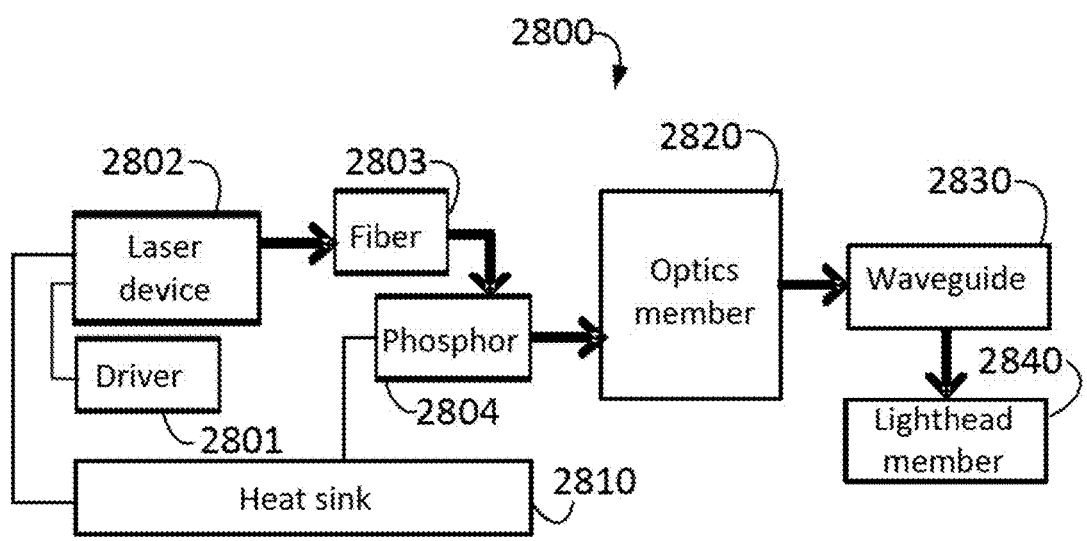
FIG. 28 is a simplified block diagram of a laser-based fiber-coupled white light system according to still another embodiment of the present invention.

FIG. 28 shows a comprehensive diagram of a laser-based waveguide-coupled white light system 2800 according to a specific embodiment of the present disclosure. Referring to FIG. 28, the laser-based waveguide-coupled white light system 2800 includes a laser device 2802 configured as one or more laser diodes (LDs) mounted on a support member and driven by a driver 2801 to emit a beam of laser electromagnetic radiation characterized by a first wavelength ranging from 395 nm to 490 nm. The support member is formed or made in contact with a heat sink 2810 for sufficiently transporting thermal energy released during laser emission by the LDs. Optionally, the laser-based waveguide-coupled white light system 2800 includes a fiber for collecting the laser electromagnetic radiation with at least 20%, 40%, 60%, or 80% coupling efficiency and deliver it to a phosphor 2804 in a certain angular relationship to create laser spot on an excitation surface of the phosphor 2804. The phosphor 2804 also serves an emitter to convert the incoming laser electromagnetic radiation to a phosphor emission with a second wavelength longer than the first wavelength. Optionally, the phosphor 2804 is also mounted or made in contact with the heat sink 2810 common to the laser device 2802 in a CPoS structure to allow heat due to laser emission and wavelength conversion being properly released. Optionally, a blocking member may be installed to prevent leaking out the laser electromagnetic radiation by direct reflection from the excitation surface of the phosphor 2804.

In the embodiment, a combination of laser emission of the laser device 2802, the angular relationship between the fiber-delivered laser electromagnetic radiation and the excitation surface of the phosphor 2804, and the phosphor emission out of the spot on the excitation surface leads to at least a partial mixture of the phosphor emission with the laser electromagnetic radiation, which produces a white light emission. In the embodiment, the laser-based waveguide-coupled white light system 2800 includes an optics member 2820 configured to collimate and focus the white light emission into a waveguide 2830. Optionally, the optics member 2820 is configured to couple the white light emission into the waveguide 2830 with at least 20%, 40%, 60%, or 80% coupling efficiency. Optionally, the optics member 2820 includes free-space collimation lens, mirrors, focus lens, fiber adaptor, or others. Optionally, a non-transparent boot cover structure may be installed to reduce light loss to environment or causing unwanted damage.

In the embodiment, the laser-based waveguide-coupled white light source 2800 further includes a lighthead member 2840 coupled to the waveguide 2830 to receive the white light emission therein. Optionally, the waveguide 2830 includes flat-panel waveguide formed on a substrate or optical fibers. Optionally, the optical fiber includes single-mode fiber, multi-mode fiber, lensed fiber, leaky fiber, or others. Optionally, the waveguide 2830 is configured to deliver the white light emission to the lighthead member 2840 which is disposed at a remote location convenient for specific applications. The lighthead member 2840 is configured to amplify, re-shape, and project the collected white light emission to different kinds of light beams for various illumination applications. Optionally, the waveguide 2830 itself serves an illumination source or element being integrated in the lighthead member 2840.

Figure 29:
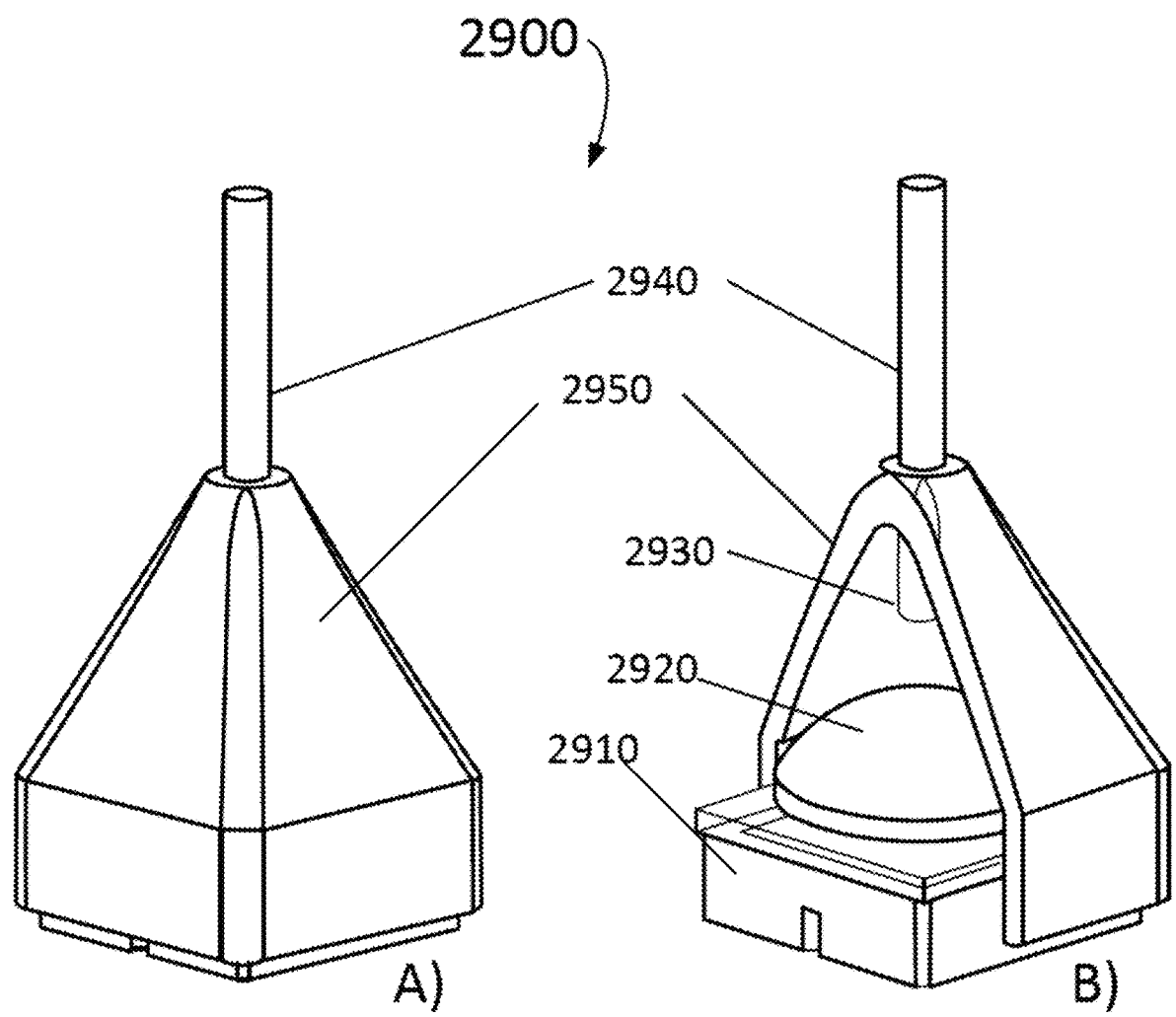
FIG. 29 is a simplified diagram of A) a laser-based fiber-coupled white light system based on surface mount device (SMD) white light source and B) a laser-based fiber-coupled white light system with partially exposed SMD white light source according to an embodiment of the present invention.

FIG. 29 is a simplified diagram of A) a laser-based fiber-coupled white light system based on surface mount device (SMD) white light source and B) a laser-based fiber-coupled white light system with partially exposed SMD white light source according to an embodiment of the present invention. This diagram is merely an example, which should not unduly limit the scope of the claims. One of ordinary skill in the art would recognize many variations, alternatives, and modifications. As shown, the laser-based fiber-coupled white light system 2900 is based on a laser-induced white light source 2910 configured in a surface-mount device (SMD) package. In some embodiments, the laser-induced white light source 2910 is provided as one selected from the SMD-packaged laser-based white light sources shown in FIG. 14 through FIG. 24, and configured to produce a white light emission with a luminance of 100 to 500 cd/mm², 500 to 1000 cd/mm², 1000 to 2000 cd/mm², 2000 to 5000 cd/mm², and greater than 5000 cd/mm². Optionally, the SMD-package white light source is made in contact with a heat sink to conduct the heat away during operation.

In an embodiment shown in FIG. 29, a lens structure 2920 is integrated with the SMD-packaged white light source 2910 and configured to collimate and focus the white light emission outputted by the white light source 2910. Optionally, the lens structure 2920 is mounted on top of the SMD-package. Optionally, the waveguide-coupled white light system 2900 includes a cone shaped boot cover 2950 and the lens structure 2920 is configured to have its peripheral being fixed to the boot cover 2950. The boot cover 2950 also is used for fixing a fiber 2940 with an end facet 2930 inside the boot cover 2950 to align with the lens structure 2920. A geometric combination of the lens structure 2920 and the cone shaped boot structure 2950 provides a physical alignment between the end facet 2930 of the fiber 2940 and the lens structure 2920 to couple the white light emission into the fiber with at least 20%, 40%, 60%, or 80% coupling efficiency. The fiber 2940 is then provided for delivering the white light emission for illumination applications. Optionally, the boot cover 2950 is made by non-transparent solid material, such as metal, plastic, ceramic, or other suitable materials.

Figure 30:
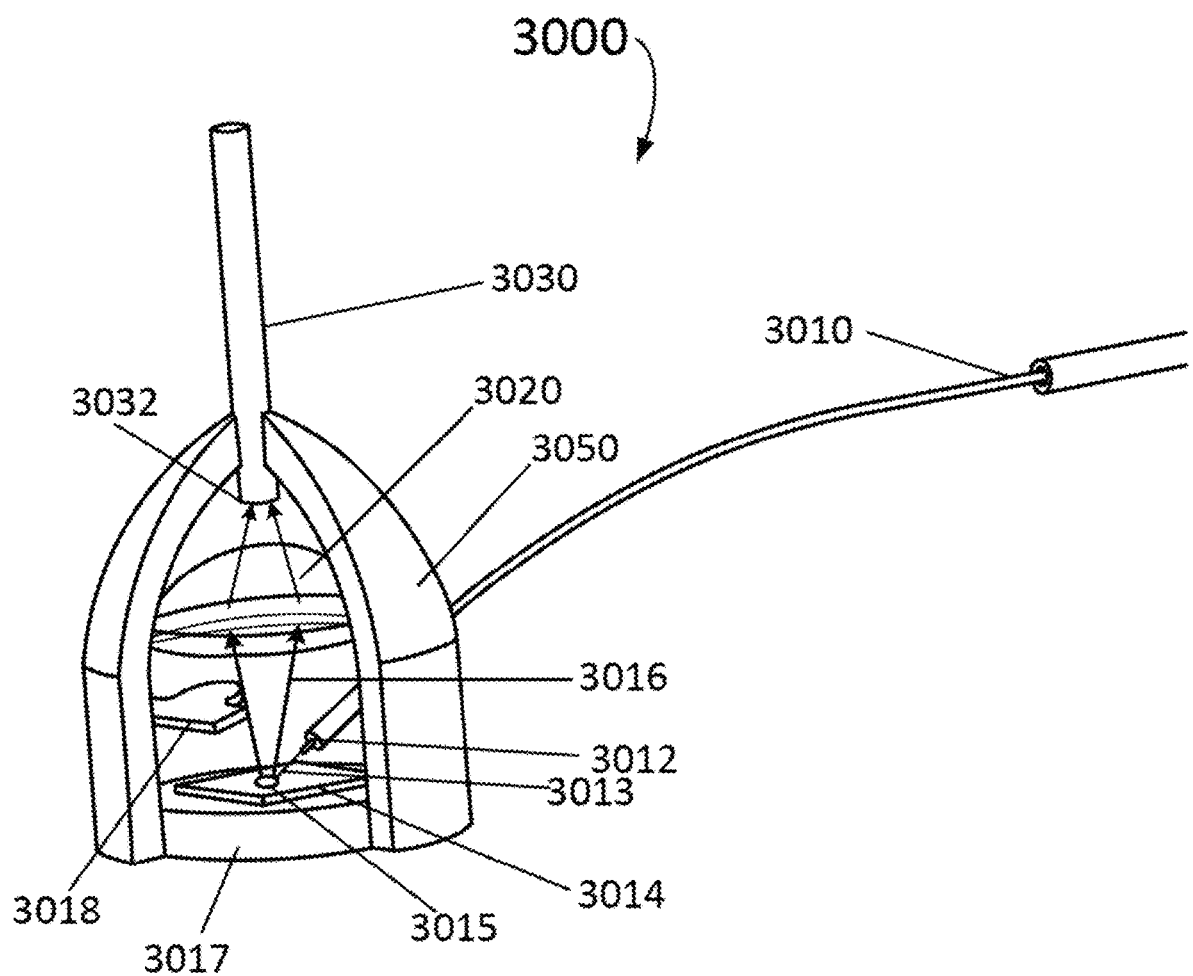
FIG. 30 is a simplified diagram of a laser-based fiber-coupled white light system based on fiber-in and fiber-out configuration according to another embodiment of the present invention.

FIG. 30 is a simplified diagram of a fiber-delivered-laser-induced fiber-coupled white light system based on fiber-in and fiber-out configuration according to another embodiment of the present invention. In the embodiment, the fiber-delivered-laser-induced fiber-coupled white light system 3000 includes a phosphor plate 3014 mounted on a heat sink support member 3017 which is remoted from a laser device. The phosphor plate 3014 is configured as a wavelength converting material and an emission source to receive a laser beam 3013 generated by the laser device and delivered via a first optical fiber 3010 and exited a first fiber end 3012 in an angled configuration (as shown in FIG. 30) to land on a surface spot 3015 of the phosphor plate 3014. The laser beam 3013 includes electromagnetic radiation substantially at a first wavelength in violet or blue spectrum range from 385 nm to 495 nm. The laser beam 3013 exits the fiber end 3012 with a confined beam divergency to land in the surface spot 3015 where it is absorbed at least partially by the phosphor member 3914 and converted to a phosphor emission with a second wavelength substantially in yellow spectrum. At least partially, the phosphor emission is mixed with the laser beam 3013 exited from the first fiber end 3012 or reflected by the surface of the phosphor plate 3014 to produce a white light emission 3016. The white light emission 3016 is outputted substantially in a reflection mode from the surface of the phosphor plate 3014.

In an embodiment, the fiber-delivered-laser-induced fiber-coupled white light system 3000 further includes a lens 3020 configured to collimate and focus the white light emission 3016 to a second end facet 3032 of a second optical fiber 3030. The lens 3020 is mounted inside a boot cover structure 3050 and has its peripheral fixed to the inner side of the boot cover structure 3050. Optionally, the boot cover structure 3050 has a downward cone shape with bigger opening coupled to the heat sink support member 3017 and a smaller top to allow the second optical fiber 3030 to pass through. The second optical fiber 3030 is fixed to the smaller top of the boot cover structure 3050 with a section of fiber left inside thereof and the second end facet 3032 substantially aligned with the lens 3020. The lens 3020 is able to focus the white light emission 3016 into the second end facet 3032 of the second optical fiber 3030 with at least 20%, 40%, 60%, or 80% coupling efficiency. The second optical fiber 3020 can have arbitrary length to either deliver the white light emission coupled therein to a remote destination or functionally serve as an illumination element for direct lighting. For example, the second optical fiber 3030 is a leaky fiber that directly serves as an illumination element by side-scattering the light out of its outer surface either uniformly or restricted in a specific angle range.

Figure 31:
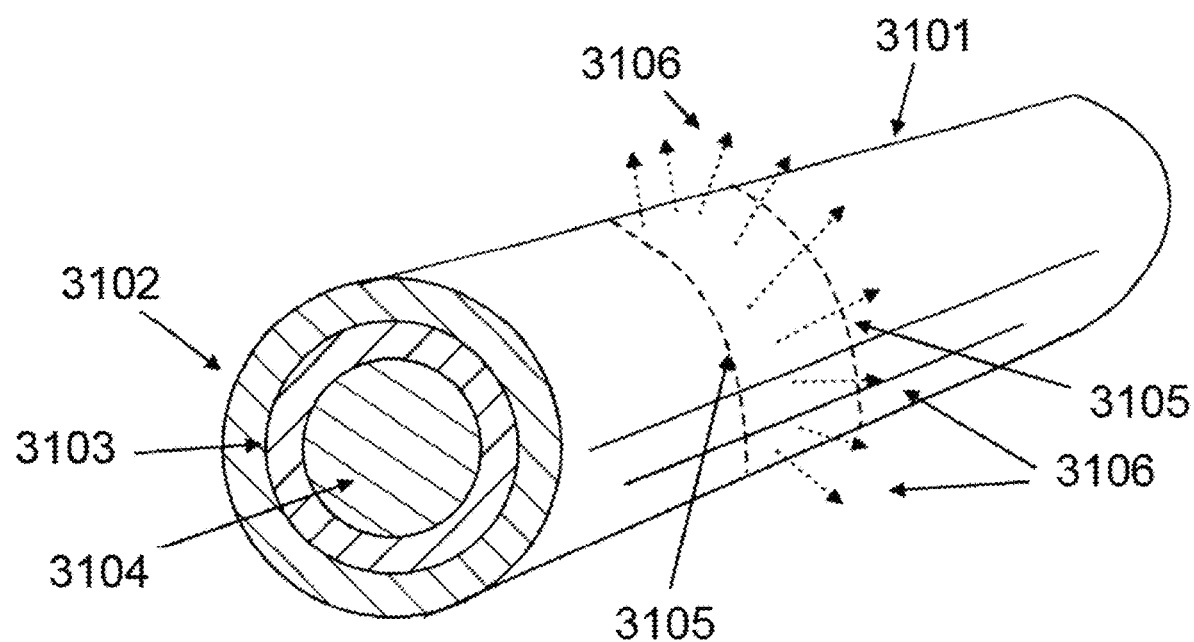
FIG. 31 is a schematic diagram of a leaky fiber used for a laser-based fiber-coupled white light system according to an embodiment of the present invention.

FIG. 31 is a schematic diagram of a leaky fiber used for a laser-based fiber-coupled white light system according to an embodiment of the present invention. Referring to the embodiment shown in FIG. 30, the optical fiber 3030 can be chosen from a leaky fiber that allows electromagnetic radiation coupled therein to leak out via a side firing effect like an illuminating filament. As shown in FIG. 31, a section 3105 of the leaky fiber 3101 allows radiation 3106 to leak from the fiber core 3104 through the cladding 3103. A buffer 3102 is a transparent material covering the cladding 3103. The radiation 3106 is leaked out substantially in a direction normal to the longitudinal axis of the optical fiber 3101.

Figure 32:
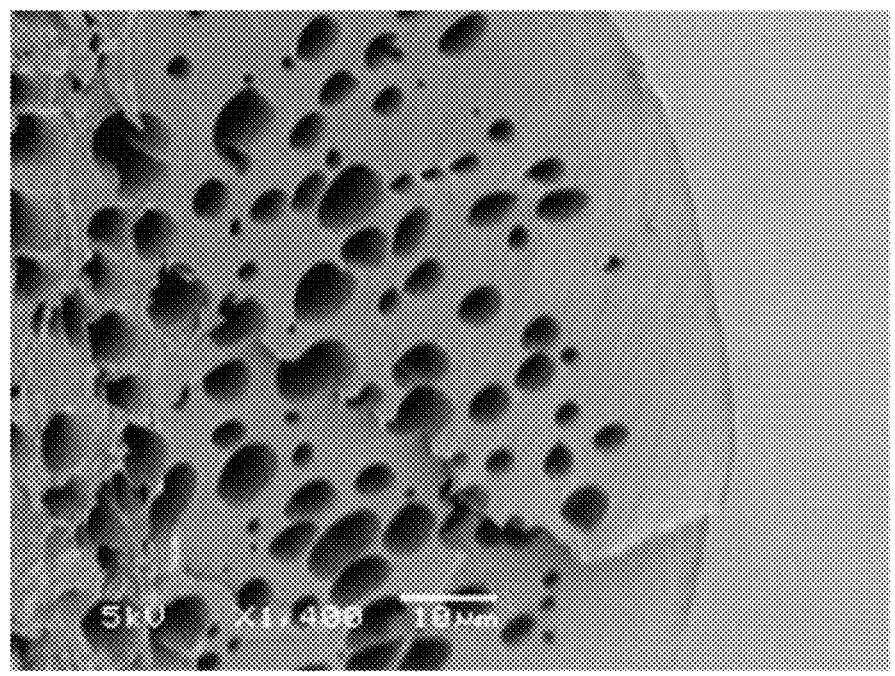
FIG. 32 is an exemplary image of a leaky fiber with a plurality of holes in fiber core according to an embodiment of the present invention.

FIG. 32 is an exemplary image of a leaky fiber with a plurality of holes in fiber core according to an embodiment of the present invention. Referring to FIG. 32, a polymer fiber is provided with a plurality of air bubbles formed in its core. The air bubbles act as light scattering centers to induce leaking from the fiber sidewalls.

Figure 33:
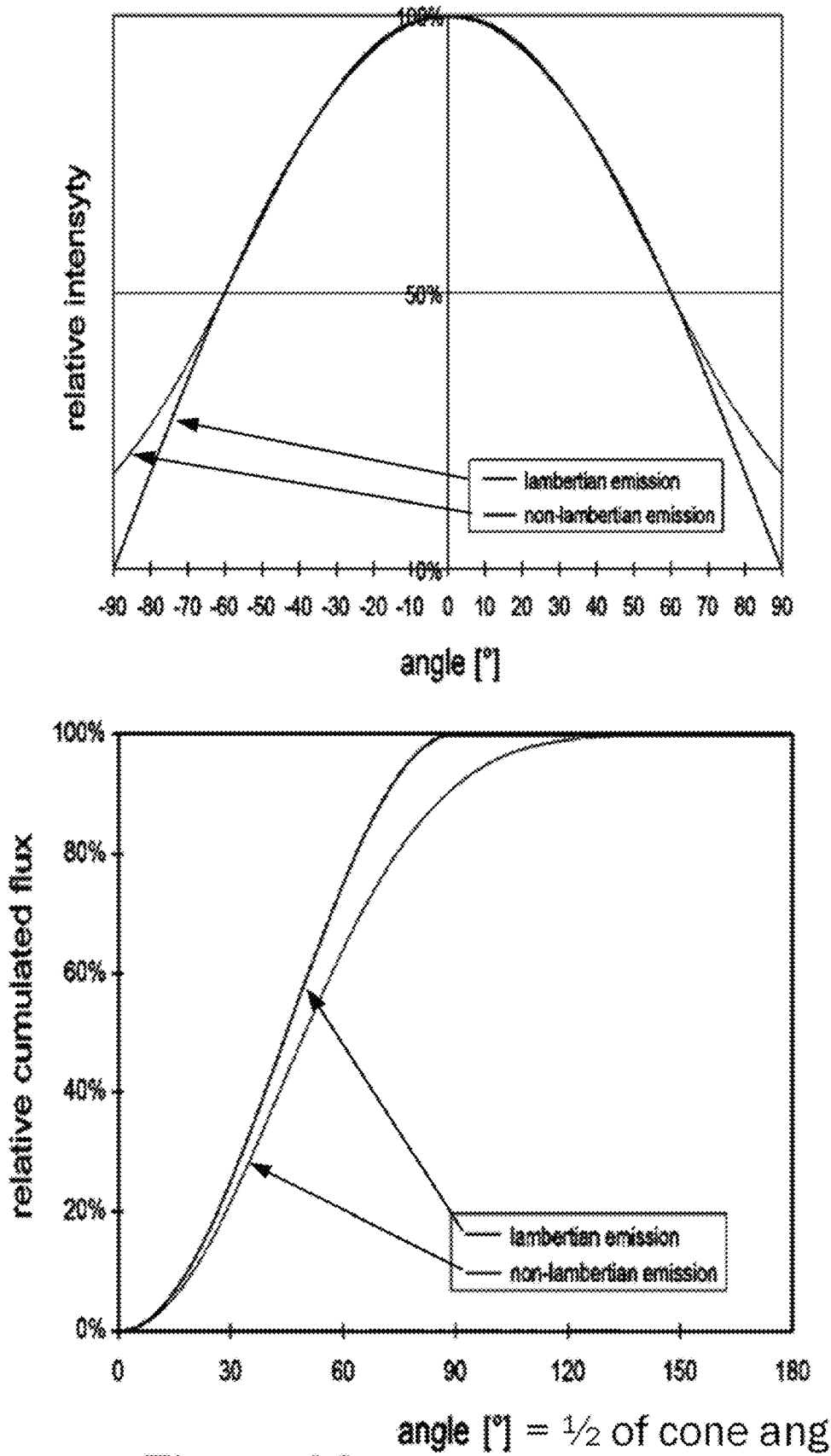
FIG. 33 shows light capture rate for Lambertian emitters according to an embodiment of the present invention.

In some embodiments, each of the laser-based fiber-coupled white light systems described herein includes a white light emitter (such as phosphor-based emitter to convert a laser radiation with a first wavelength to a phosphor emission with a second wavelength) and a fiber configured to couple the emission from the white light emitter with high efficiency. Some assumptions can be laid out to calculate some fundamental features of the light capture requirement for the system. For example, the white light emitter is assumed to be a Lambertian emitter. FIG. 33 shows light capture rate for Lambertian emitters according to an embodiment of the present invention. As shown, a first plot shows relative intensity versus geometric angle of the Lambertian emission comparing with a non-Lambertian emission. A full-width half maximum (FWHM) of the spectrum is at ~120 degrees (−60 deg to 60 deg) for the Lambertian emission. A second plot shows relative cumulated flux versus a half of cone angle for light capture. Apparently, with a FWHM cone angle of 120 deg., 60% of light of the Lambertian emission can be captured. Optionally, all the white emissions out of the phosphor surface in either a reflective mode or transmissive mode in the present disclosure are considered to be substantially Lambertian emission.

In an alternative aspect, the present disclosure provides an improve automobile headlamp based on the laser-based fiber-coupled white light system. In the 1880 s, the world's first automobile headlamps were introduced based on acetylene and oil, similar to gas lamp sources used for general lighting at the time. Although these sources were somewhat robust to wind, rain, and snow, cost and size was an issue. The light sources were large, and light output was modest, and not quite sufficient for typical speed and roadway conditions at the time. The light was difficult to shape using small optics to achieve specific patterns. The first electric headlamp was produced in 1898. Although there were an improvement over previous approach, reliability was an issue due to burned filaments in rugged road conditions, and costs of the small energy sources were high. Low and the high beam electric headlamps were deployed in 1924.

The first halogen headlamp started production in 1962, and xenon high-intensity discharge lamps (HID) hit the road in 1991. These featured higher light output and brightness and range from more reliable and compact sources, and encountered cost challenges until the volumes and adoptions rates climbed high enough for economies of scale in production. Reliability was challenging due to the lamp style design. In order to mitigate the challenges with lamp replacement and alignment, fiber delivered lamps were attempted, but the light sources did not have high enough luminance, and therefore large, thick (5 mm-20 mm) expensive and lossy fiber bundles were used which became impractical for cost and manufacturability reasons.

Semiconductor based light emitting diode (LED) headlight sources were fielded in 2004, the first solid-state sources. These featured high efficiency, reliability, and compactness, but the limited light output per device and brightness caused the optics and heat sinks to be still are quite large, and the elevated temperature requirements in auto applications were challenging. Color uniformity from the blue LED excited yellow phosphor needed managed with special reflector design. Single LED failure meant the entire headlamp needed to be scrapped, resulting in challenging costs for maintenance, repair, and warranty. Moreover, the LED components are based on spontaneous emission, and therefore are not conducive to high-speed modulation required for advanced applications such as 3D sensing (LiDAR), or optical communication (LiFi). The low luminance also creates challenges for spatially dynamic automotive lighting systems that utilize spatial modulators such as MEMS or liquid crystal devices. Semiconductor laser diode (LD) based headlights started production in 2014 based on laser pumped phosphor architectures, since direct emitting lasers such as R-G-B lasers are not safe to deploy onto the road and since R-G-B sources leave gaps in the spectrum that would leave common roadside targets such as yellow or orange with insufficient reflection back to the eye. Laser pumped phosphor are solid state light sources and therefore featured the same benefits of LEDs, but with higher brightness and range from more compact headlamp reflectors. Initially, these sources exhibited high costs, reduced reliability compared to LEDs, due to being newer technology. In some cases, the laser and phosphor were combined in a single unit, and in other cases, the blue laser light was delivered by fiber to a phosphor module to produce white. Special precautions were needed to ensure safe white light emission occurred with passive and active safety measures. Color uniformity from the blue laser excited yellow phosphor needed managed with special reflector design.

Figure 34:
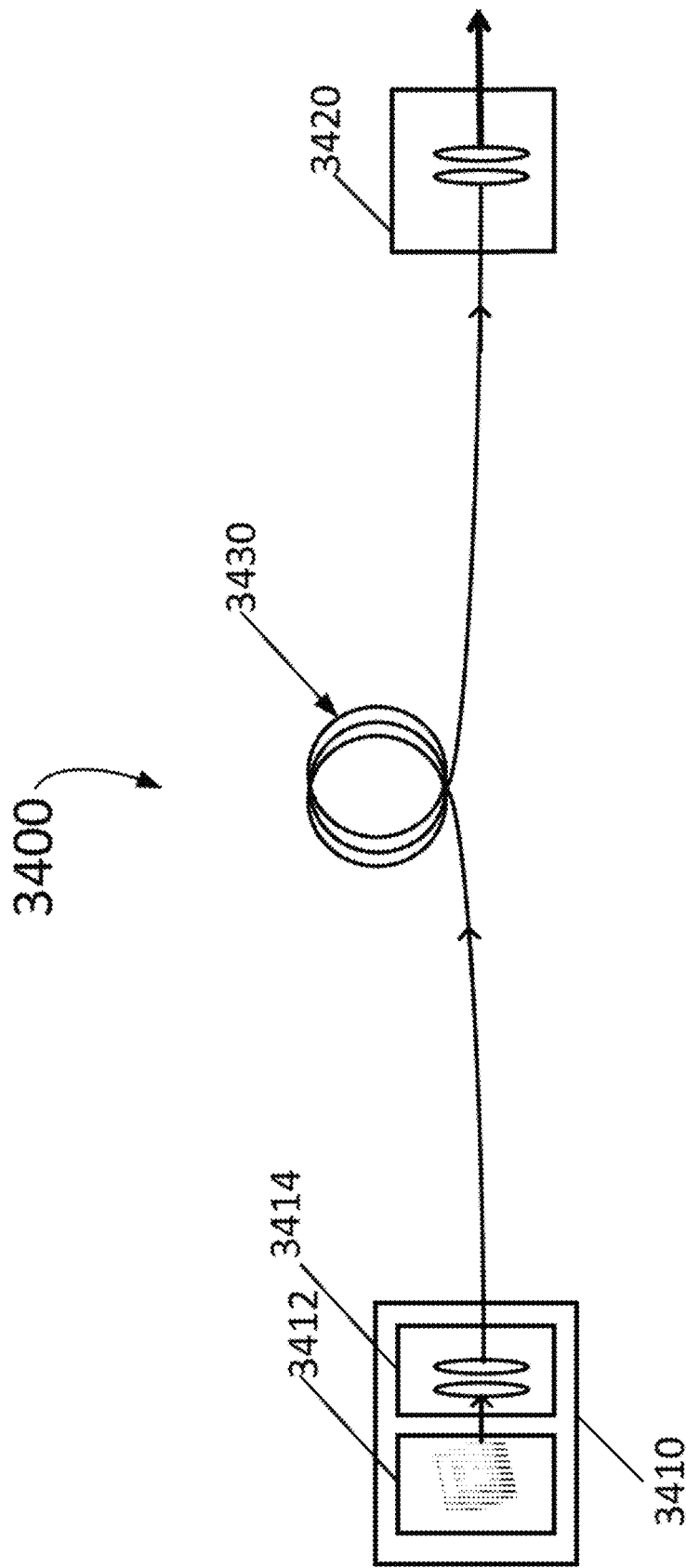
FIG. 34 is a schematic diagram of a fiber-delivered white light for automotive headlight according to an embodiment of the present invention.

In an embodiment, the present disclosure provides a fiber delivered automobile headlight. FIG. 34 shows a schematic functional diagram of the fiber delivered automobile headlight 3400 comprised of a high luminance white light source 3410 that is efficiently coupled into a waveguide 3430 that used to deliver the white light to a final headlight module 3420 that collimates the light and shapes it onto the road to achieve the desired light pattern. The white light source 3410 is based on laser device 3412 configured to generate a blue laser outputted from a laser chip containing gallium and nitride material. The blue laser generated by the laser chip is led to a phosphor device 3414 integrated with optical beam collimation and shaping elements to excite a white light emission. Optionally, the white light source 3410 is a laser-based SMD-packaged white light source (LaserLight-SMD offered by Soraa Laser Diode, Inc.), substantially selected from one of multiple SMD-package white light sources described in FIGS. 14 through 24. Optionally, the waveguide 3430 is an optical transport fiber. Optionally, the headlight module 3420 is configured to deliver 35% or 50% or more light from source 3410 to the road. In an example, the white light source 3410, based on etendue conservation and lumen budget from source to road and Lambertian emitter assumption of FIG. 33, is characterized by about 1570 lumens (assuming 60% optical efficiency for coupling the white light emission into a fiber), 120 deg FWHM cone angle, about 0.33 mm source diameter for the white light emission. In the example, the transport fiber 3430 applied in the fiber-delivered headlight 3400 is characterized by 942 lumens assuming 4 uncoated surfaces with about 4% loss in headlight module 3420, about 0.39 numerical aperture and cone angle of ~40 deg, and about 1 mm fiber diameter. Additionally, in the example, the headlight module 3420 of the fiber-delivered headlight 3400 is configured to deliver light to the road with 800 lumens output in total efficiency of greater than 35%, +/−5 deg vertical and +/−10 deg horizontal beam divergency, and having 4×4 mm in size. Optionally, each individual element above is modular and can be duplicated for providing either higher lumens or reducing each individual lumen setting white increasing numbers of modules. In an embodiment, one or more white light source modules are configured to emit the white light emission from a source diameter of about 0.333 mm to 0.625 mm with a total luminous flus of about 1600 lumens or greater.

In another example, four SMD-packaged white light sources, each providing 400 lumens, can be combined in the white light source 3410 to provide at least 1570 lumens. The transport fiber needs for separate sections of fibers respectively guiding the white light emission to four headlight modules 3420, each outputting 200 lumens, with a combined size of 4×16 mm. In yet another example, each white light source 3410 yields about 0.625 mm diameter for the white light emission. While, the fiber 3430 can be chosen to have 0.50 numerical aperture, cone angle of ~50 deg, and 1.55 mm fiber diameter. In this example, the headlight module 3420 is configured to output light in 800 lumens to the road with total efficiency of greater than 35% and a size as small as ~7.5 mm.

In an embodiment, the design of the fiber delivered automobile headlight 3400 is modular and therefore can produce the required amount of light for low beam and/or high beam in a miniature Headlight Module footprint. An example of a high luminance white light source 3410 is the LaserLight-SMD packaged white light source which contains 1 or more high-power laser diodes (LDs) containing gallium-and-nitrogen-based emitters, producing 500 lumens to thousands of lumens per device. For example, low beams require 600-800 lumens on the road, and typical headlight optics/reflectors have 35% or greater, or 50% or greater optical throughput. High luminance light sources are required for long-range visibility from small optics. For example, based on recent driving speeds and safe stopping distances, a range of 800 meters to 1 km is possible from 200 lumens on the road using an optics layout smaller than 35 mm with source luminance of 1000 cd per mm$^2$. Using higher luminance light sources allows one to achieve longer-range visibility for the same optics size. High luminance is required to produce sharp light gradients and the specific regulated light patterns for automotive lighting. Moreover, using a waveguide 3430 such as an optical fiber, extremely sharp light gradients and ultra-safe glare reduction can be generated by reshaping and projecting the decisive light cutoff that exists from core to cladding in the light emission profile. As a result, the fiber delivered automobile headlight 3400 is configured to minimize glare and maximize safety and visibility for the car driver and others including oncoming traffic, pedestrians, animals, and drivers headed in the same direction traffic ahead.

Color uniformity from typical white LEDs are blue LED pumped phosphor sources, and therefore need careful integration with special reflector design, diffuser, and/or device design. Similarly, typical blue laser excited yellow phosphor needs managed with special reflector design. In an embodiment of the present invention, spatially homogenous white light is achieved by mixing of the light in the waveguide, such as a multimode fiber. In this case, a diffuser is typically not needed. Moreover, one can avoid costly and time-consuming delays associated with color uniformity tuning redesign of phosphor composition, or of reflector designs.

Laser pumped phosphors used in the laser-based fiber-delivered automobile headlight 3400 are broadband solid-state light sources and therefore featured the same benefits of LEDs, but with higher luminance. Direct emitting lasers such as R-G-B lasers are not safe to deploy onto the road since R-G-B sources leave gaps in the spectrum that would leave common roadside targets such as yellow or orange with insufficient reflection back to the eye. The present design is cost effective since it utilizes a high-luminance white light source with basic macro-optics, a low-cost transport fiber, and low-cost small macro-optics to product a miniature headlight module 3420. Because of the remote nature of the light sources 3410, the white light source 3410 can be mounted onto a pre-existing heat sink with adequate thermal mass that is located anywhere in the vehicle, eliminating the need for heat sink in the headlight.

Figure 34A:
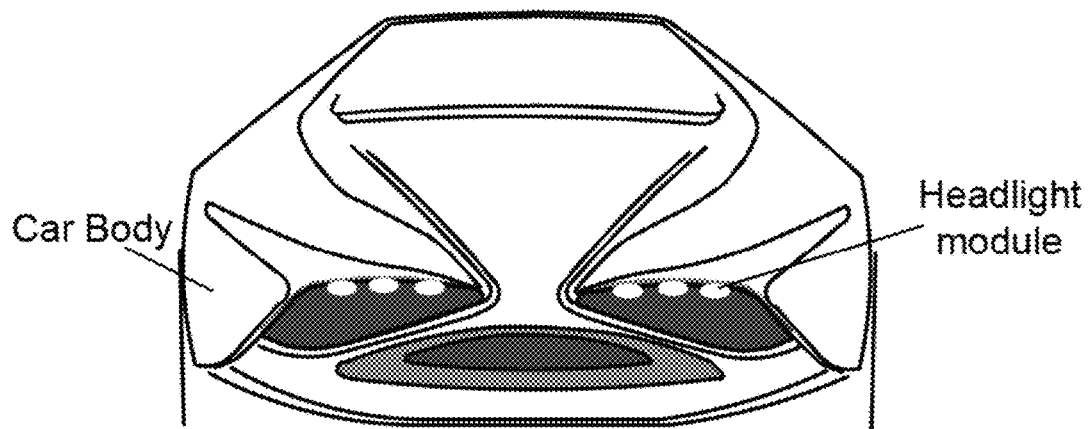
FIG. 34A is a schematic diagram of an automobile with multiple laser-based fiber-delivered headlight modules with small formfactor according to an embodiment of the present invention.
Figure 34B:
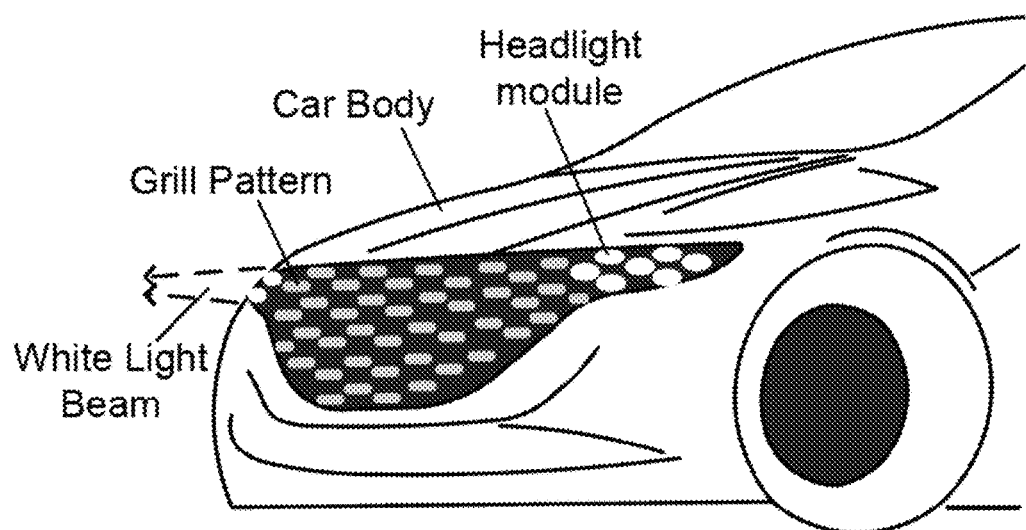
FIG. 34B is a schematic diagram of a laser-based fiber-delivered automotive headlight modules hidden in front grill pattern according to an embodiment of the present invention.

In an embodiment, miniature optics member of <1 cm diameter in the headlight module 3420 can be utilized to capture nearly 100% of the white light from the transport fiber 3430. Using the optics member, the white light can be collimated and shaped with tiny diffusers or simple optical elements to produce the desired beam pattern on the road. This miniature size also enables low cost ability to swivel the light for glare mitigation, and small form factor for enhanced aerodynamic performance. FIG. 34A shows an example of an automobile with multiple laser-based fiber-delivered headlight modules installed in front. As seen, each headlight module has much smaller form factor than conventional auto headlamp. Each headlight module can be independently operated with high-luminance output. FIG. 34B shows an example of several laser-based fiber-delivered automotive headlight modules installed in front panel of car. The small form factor (<1 cm) of the headlight module allow it to be designed to become hidden in the grill pattern of car front panel. Each headlight module includes one or more optics members to shape, redirect, and project the white light beam to a specific shape with controls on direction and luminous flux.

For many vehicles, it is desired to have extremely small optics sizes for styling of the vehicle. Using higher luminance light sources allows one to achieve smaller optics sizes for the same range of visibility. This design of the laser-based fiber-delivered automobile headlight 3400 allows one to integrate the headlight module 3420 into the front grill structure, onto wheel cover, into seams between the hood and front bumper, etc. The headlight module 3420 can be extremely low mass and lightweight, adapting to a minimized weight in the front of the car, contributing to safety, fuel economy, and speed/acceleration performance. For electric vehicles, this translates to increased vehicle range. Moreover, the decoupled fiber delivered architecture use pre-existing heat sink thermal mass already in vehicle, further minimizing the weight in the car.

This headlight 3400 is based on solid-state light source, and has long lifetime >10,000 hours. Additionally, redundancy can be designed in by using multiple laser diodes on the LaserLight-SMD-based white light source 3410, and by using multiple such white light sources. If issues do occur in the field, interchangeability is straightforward by replacing individual white light source 3410. Using the high luminance light sources 3410, the delivered lumens per electrical watt are higher than that with LED sources with the same optic sizes and ranges that are typical of automotive lighting such as 100's of meters. In an embodiment, the headlight 3400 features at least 35% or 50% optical throughput efficiency, which is similar to LED headlights, however, the losses in this fiber delivered design occur at white light source 3410, thereby minimizing temp/size/weight of headlight module 3420.

Because of the fiber configuration in this design, reliability is maximized by positioning the white light source 3410 away from the hot area near engine and other heat producing components. This allows the headlight module 3420 to operate at extremely high temperatures >100° C., whereas the white light source 3410 can operate in a cool spot with ample heat sinking to keep its environment at a temperature less than 85° C. In an embodiment, the present design utilizes thermally stable, mil standard style telcordia type packaging technology. The only elements exposed to the front of the car are the complexly passive headlight module 3420, comprised tiny macro-optical elements. In an embodiment, using a white light source 3410 based on the high-luminance LaserLight-SMD package, UL and IEC safety certifications have been achieved. In this case, there is no laser through fiber, only incoherent white light, and the SMD uses a remote reflective phosphor architecture inside. Unlike direct emitting lasers such as R-G-B lasers that are not safe to deploy on the road at high power, the headlight module 3400 does not use direct emitting laser for road illumination.

In an embodiment, because of the ease of generating new light patterns, and the modular approach to lumen scaling, this headlight design allows for changing lumens and beam pattern for any region without retooling for an entirely new headlamp. This convenient capability to change beam pattern can be achieved by changing tiny optics and or diffusers instead of retooling for new large reflectors. Moreover, the white light source 3410 can be used in interior lights and daytime running lights (DRL), with transport or side emitting plastic optical fiber (POF). The detachable white light source 3410 can be located with the electronics, and therefore allows upgraded high speed or other specialty drivers for illumination for Lidar, LiFi, dynamic beam shaping, and other new applications with sensor integration.

Figure 34C:
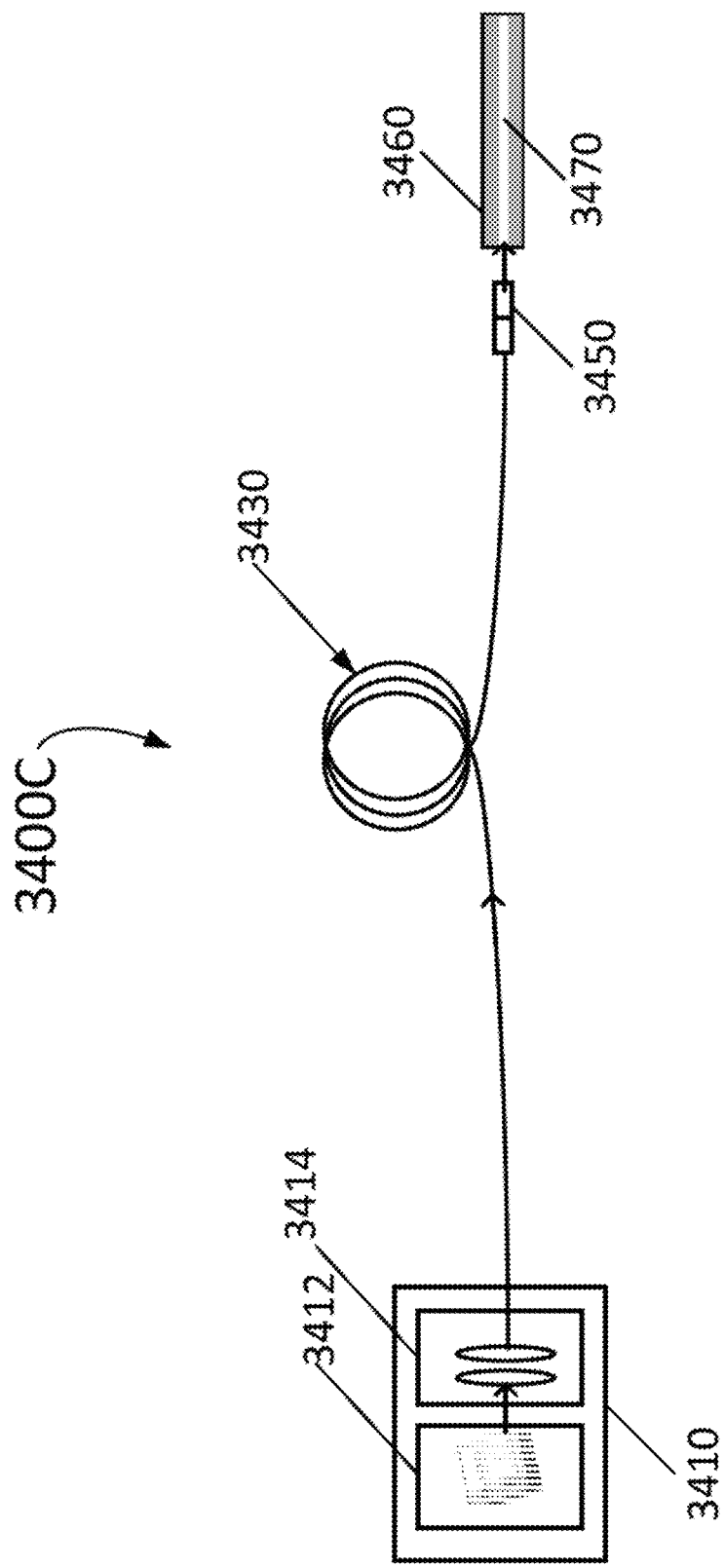
FIG. 34C is a schematic diagram of a laser-based fiber-coupled white light illumination source according to an embodiment of the present invention.

FIG. 34C shows a schematic diagram of a laser-based fiber-coupled white light illumination source according to an embodiment of the present invention. Referring to FIG. 34C, the laser-based fiber-coupled white light illumination source 3400C includes a high luminance white light source 3410 that is efficiently coupled into a transport fiber 3430 that used to deliver the white light to a remote location for illumination application. At the location, optionally an optical connector 3450 is used to connect the transport fiber 3430 with a leaky fiber 3470 configured in a feature structure 3460. Optionally, the white light source 3410 is based on a laser device 3412 configured to generate a blue laser outputted from a laser chip containing gallium and nitride material. The blue laser generated by the laser chip is led to a phosphor device 3414, integrated with optical beam collimation and shaping elements, to excite a white light emission collimated into the transport fiber 3430. Optionally, the white light source 3410 is a laser-based SMD-packaged white light source (LaserLight-SMD offered by Soraa Laser Diode, Inc), substantially selected from one of multiple SMD-package white light sources described in FIGS. 14 through 24. Optionally, there can be multiple lasers disposed in a safe location in the automobile. One or more phosphors are used to be excited by the multiple blue laser chips to produce white light with different spectrum or luminance. Optionally, one of more transport fibers 3430 are disposed to couple with the one or more phosphors to couple the white light and are configured to deliver the white light to remote application locations such as the front grill structure of an automobile. Optionally, the transport fiber 3430 and the leaky fiber 3470 are a same fiber. Optionally, the transport fiber 3430 is coupled with the leaky fiber 3470 via a connector or spliced together. Optionally, the leaky fiber includes one or more sections configured as illumination elements with custom shapes/arrangements and disposed around different feature locations for various vehicle lighting applications.

The leaky fibers 3470 is configured to induce a directional side scattering of the white light carried therein to provide preferential illumination in wide angular ranges off zero degrees along the length of the fibers up to 90 degrees perpendicular to the fiber. Optionally, the leaky fiber is configured to output partial white light therein with an effective luminous flux of greater than 25 lumens, or greater than 50 lumens, 150 lumens, or greater than 300 lumens, or greater than 600 lumens, or greater than 800 lumens, or greater than 1200 lumens in an optical efficiency of greater than 35% out of the fiber body. Optionally, multiple fiber connectors are included to couple the transport fibers and the leaky fibers. Optionally, the leaky fiber is spliced with the transport fiber. The transport fiber is non-leaky fiber. Optionally, the leaky fibers are configured to various linear or partial 2-dimensional shapes with different lengths or widths. Of course, more than one such white light illumination sources can be configured at different locations of the automobile based on one or more blue lasers and one or more phosphors configured to produce a white spectrum with high luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$ with long life-time and low cost.

Figure 34D:
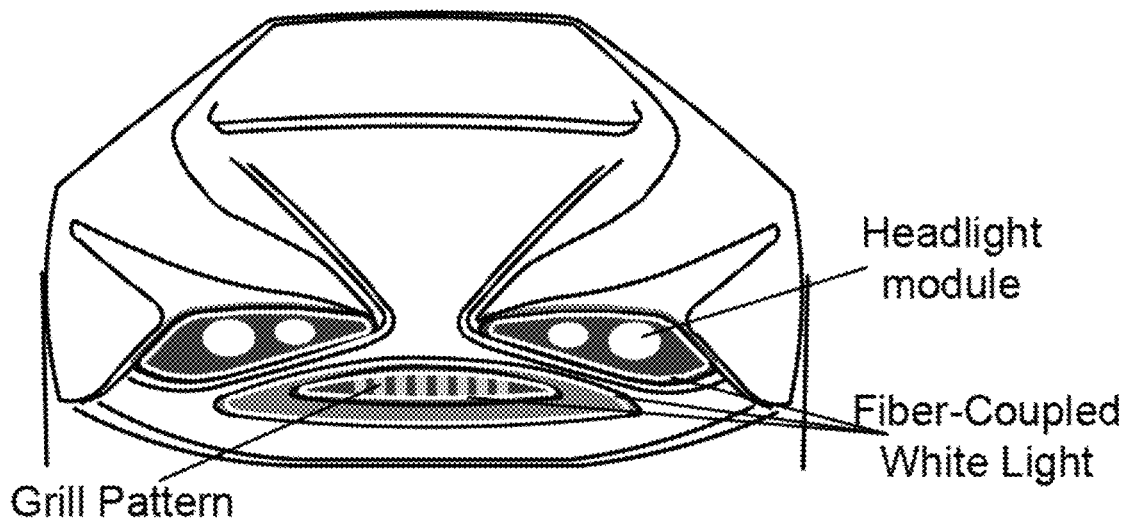
FIG. 34D is a schematic diagram of the laser-based fiber-coupled white light illumination source framed around front grill structure of an automobile according to an embodiment of the present invention.

FIG. 34D shows a schematic diagram of the laser-based fiber-coupled white light illumination source framed around front grill structure of an automobile according to an embodiment of the present invention. Referring to FIG. 34D, the leaky fiber, in general, is configured as an illumination element substantially flexibly disposed around the front grill structure and form a pattern matching with mechanical frame of the grill structure based on specific model of the automobile yet delivering desired illumination. Optionally, the leaky fiber 3470 of the laser-based fiber-coupled white light illumination source 3400C is applied to the grill structure.

Figure 34E:
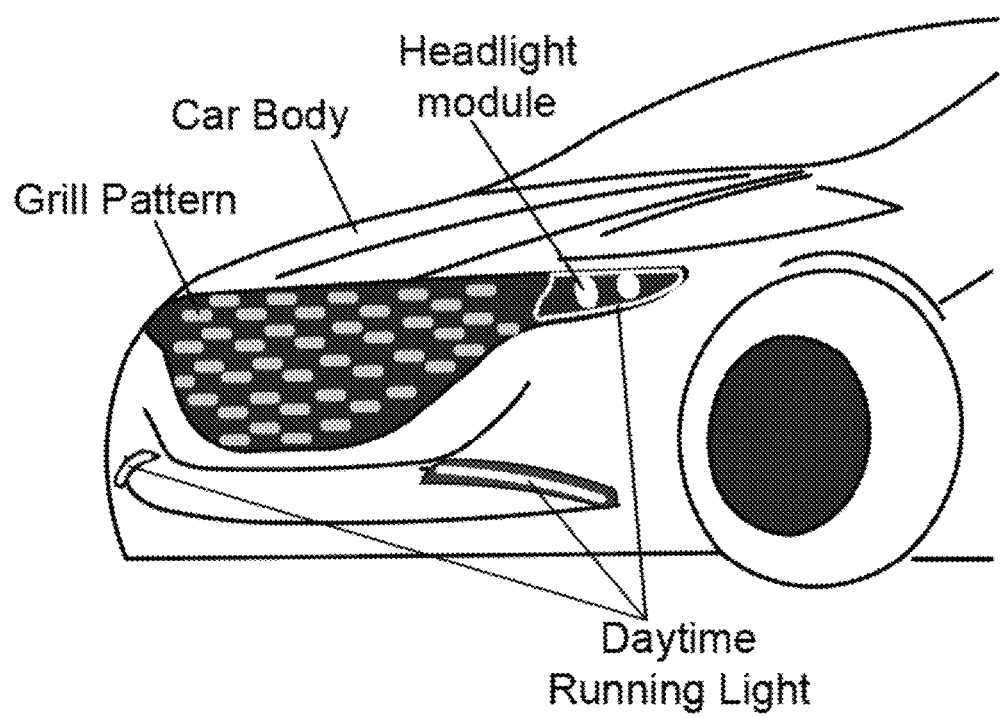
FIG. 34E is a schematic diagram of the laser-based fiber-coupled white light illumination source configured as daytime running light of an automobile according to an embodiment of the present invention.

FIG. 34E shows a schematic diagram of the laser-based fiber-coupled white light source configured as daytime running light of an automobile according to an embodiment of the present invention. Referring to FIG. 34E, the laser-based fiber-coupled white light source based on leaky fiber is directly configured around a headlight module to become a daytime running light module. Optionally, the leaky fiber 3470 of the laser-based fiber-coupled white light illumination source 3400C is applied to flexibly form various shaped illumination elements as daytime running light. Of course, the daytime running light module can be disposed at different locations such as lower or side portion of the front bumper, around license plate mounted in front or backend of the automobile.

Figure 34F:
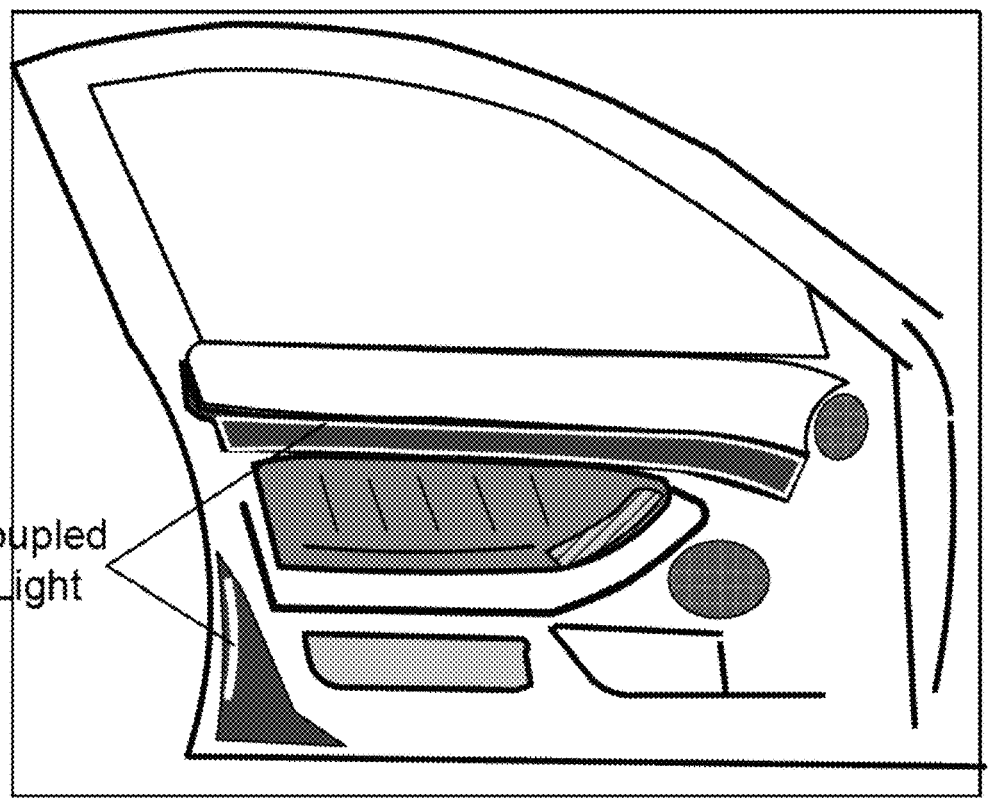
FIG. 34F is a schematic diagram of the laser-based fiber-coupled white light illumination source configured around or along interior features of an automobile according to an embodiment of the present invention.
Figure 34G:
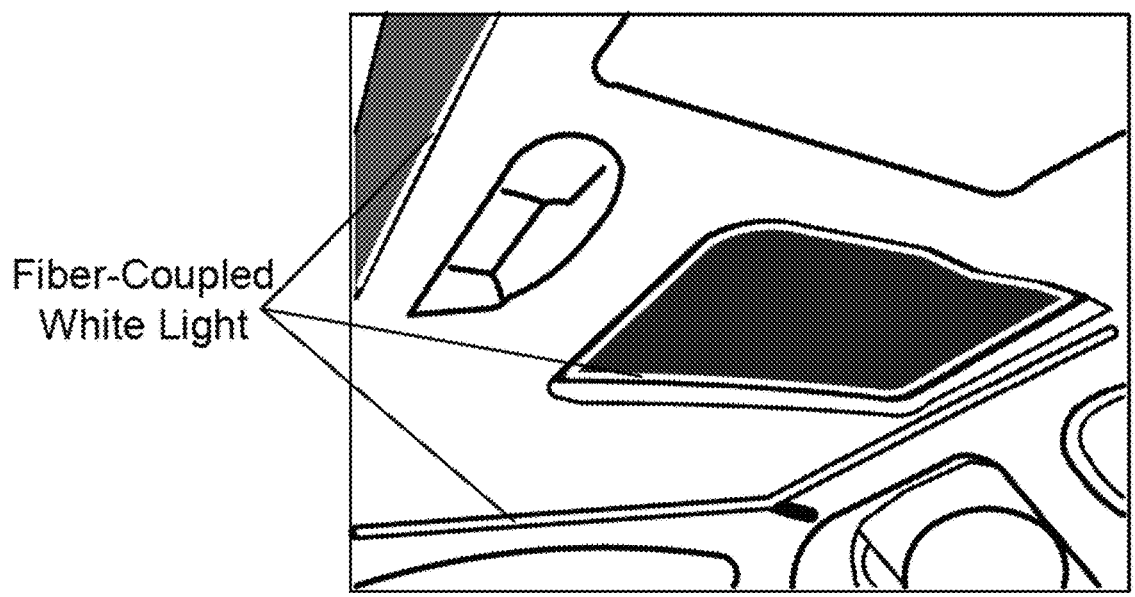
FIG. 34G is a schematic diagram of the laser-based fiber-coupled white light illumination source configured around or along interior features of an automobile according to another embodiment of the present invention.
Figure 34H:
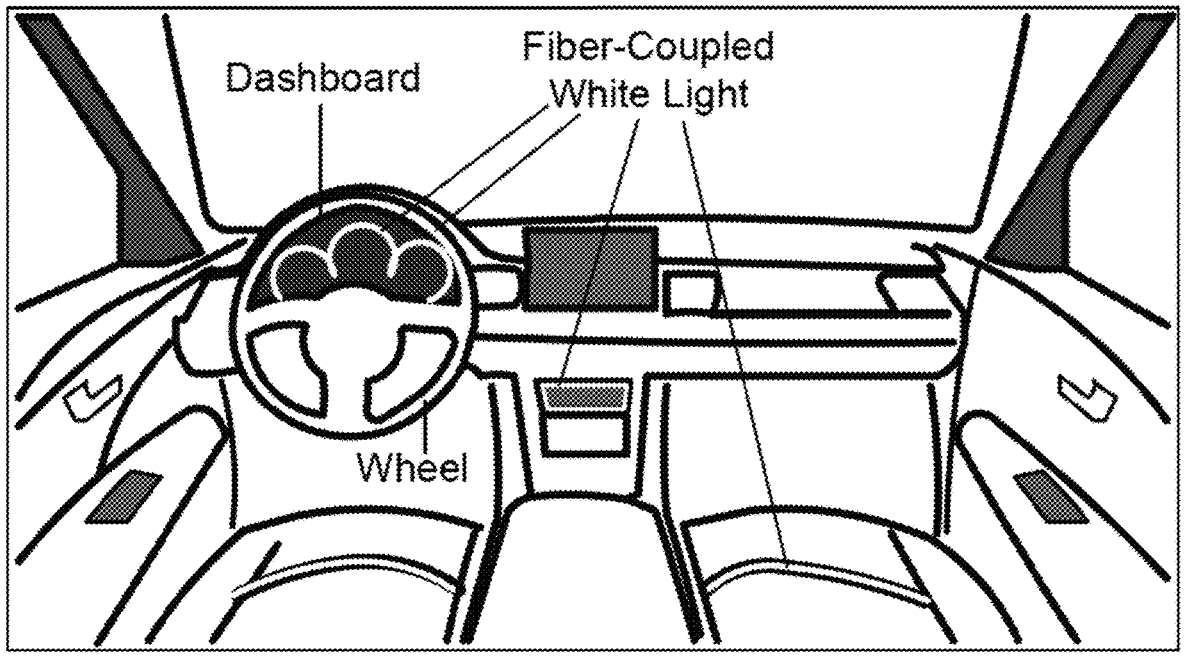
FIG. 34H is a schematic diagram of the laser-based fiber-coupled white light illumination source configured around or along interior features of an automobile according to another embodiment of the present invention.
Figure 34I:
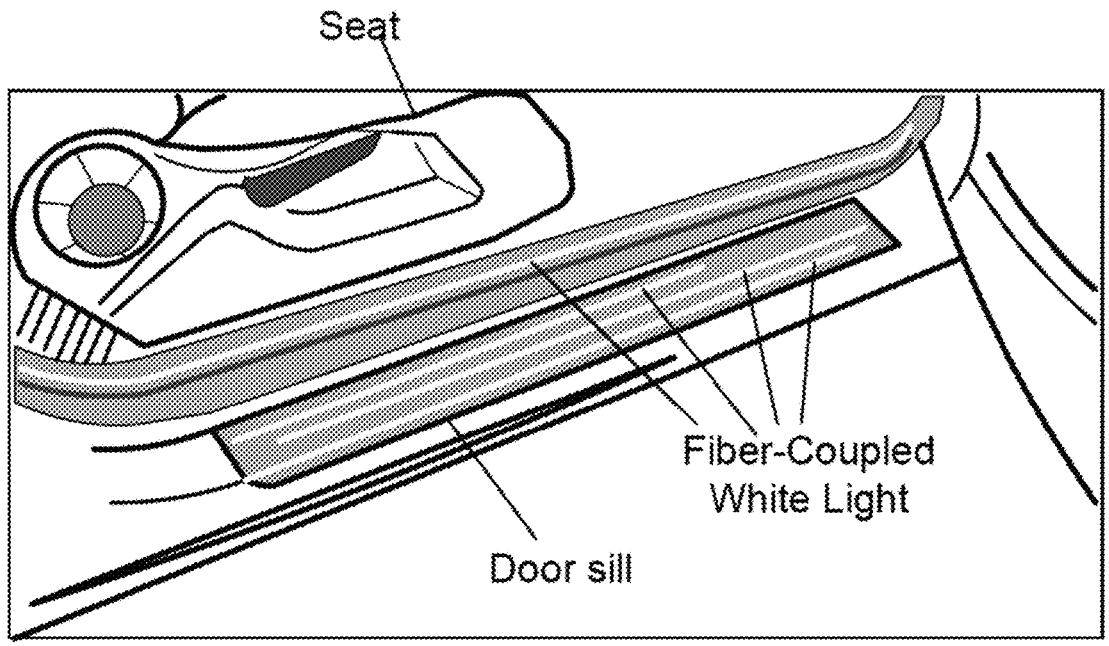
FIG. 34I is a schematic diagram of the laser-based fiber-coupled white light illumination source configured around or along interior features of an automobile according to another embodiment of the present invention.

Alternatively, the laser-based fiber-coupled white light illumination source based on leaky fiber is configured for interior application including car-interior features. Optionally, the laser-based fiber-coupled white light illumination source based on leaky fiber is designed as interior lighting around any interior feature including floor boards, headliners, dashboards, door panel, door handle, door entry sill, moonroof, ceiling frame, and even in seating. FIG. 34F shows an example of the laser-based fiber-coupled white light illumination source configured around door features or along door side edge of an automobile according to an embodiment of the present invention. Optionally, the leaky fiber 3470 of the laser-based fiber-coupled white light illumination source 3400C is applied to the door features. FIG. 34G shows another example of the laser-based fiber-coupled white light illumination source configured around or along ceiling features of an automobile according to another embodiment of the present invention. Optionally, the leaky fiber 3470 of the laser-based fiber-coupled white light illumination source 3400C is applied to the ceiling features. FIG. 34H shows yet another example of the laser-based fiber-coupled white light illumination source configured at dashboard of an automobile according to another embodiment of the present invention. Optionally, the leaky fiber 3470 of the laser-based fiber-coupled white light illumination source 3400C is applied to the dashboard. Optionally, the lamination is controllable in brightness. Optionally, the illumination color can also be tuned. FIG. 34I shows still another example of the laser-based fiber-coupled white light illumination source according to another embodiment of the present invention. Optionally, the leaky fiber 3470 of the laser-based fiber-coupled white light illumination source 3400C is applied to the door sill of the automobile or other floor features.

In an embodiment, spatially dynamic beam shaping may be achieved with DLP, LCD, 1 or 2 Mems or galvo mirror systems, lightweight swivels, scanning fiber tips. Future spatially dynamic sources may require even more light, such as 5000-10000 lumens from the source, to produce high definition spatial light modulation on the road using MEMS or liquid crystal components. Such systems are incredibly bulky and expensive when co-locating the light source, electronics, heat sink, optics, and light modulators, and secondary optics. Therefore, they require fiber delivered high luminance white light to enable spatial light modulation in a compact and more cost-effective manner.

Figure 35:
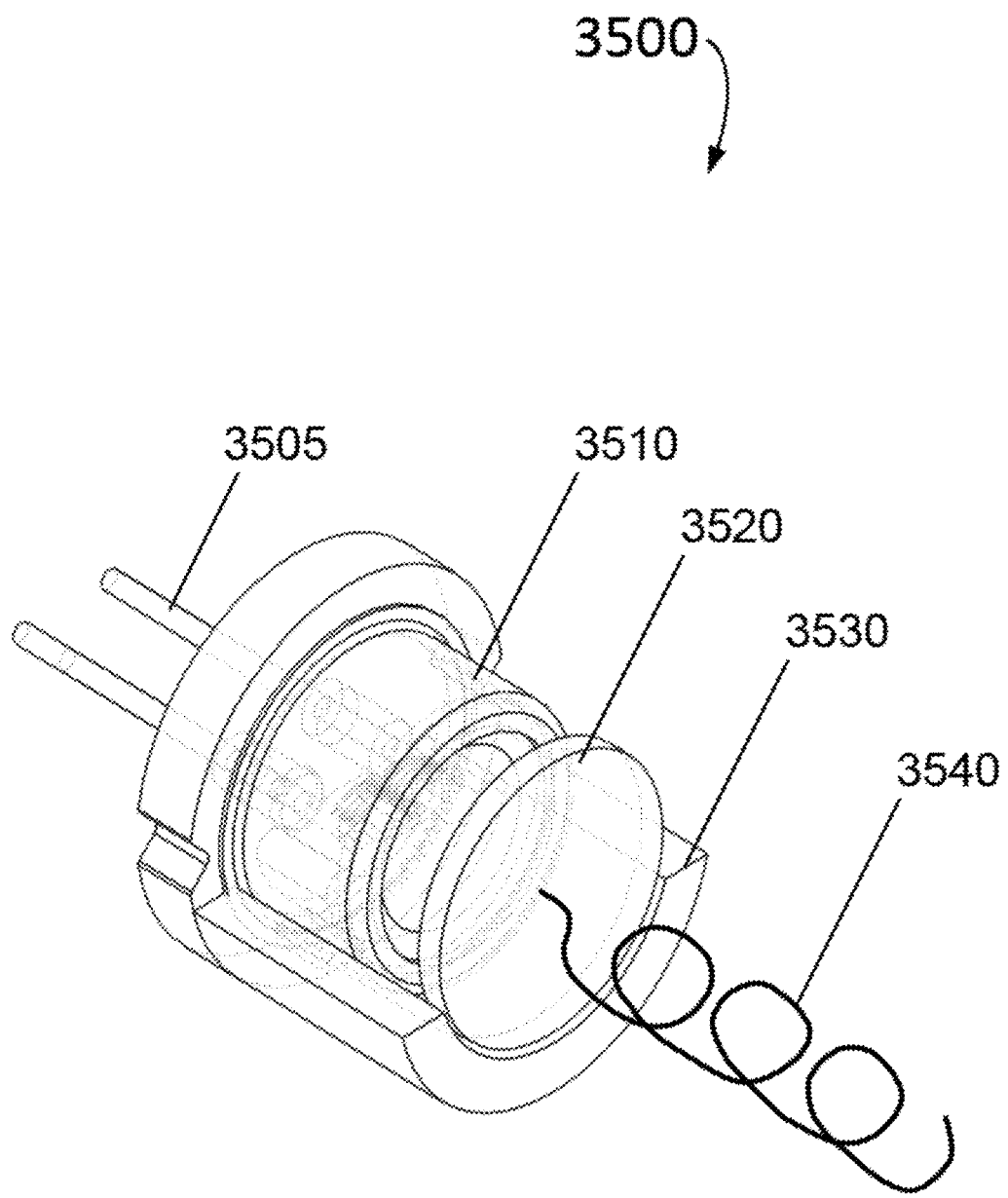
FIG. 35 is a schematic diagram of a laser-based white light source coupled to a leaky fiber according to an embodiment of the present invention.

In another specific embodiment, the present disclosure provides a laser-based white light source coupled to a leaky fiber served as an illuminating filament for direct lighting application. FIG. 35 is a schematic diagram of a laser-based white light source coupled to a leaky fiber according to an embodiment of the present invention. As shown, the laser-based white light source 3500 includes a pre-packaged white light source 3510 configured to produce a white light emission. Optionally, the pre-packaged white light source 3510 is a LaserLight-SMD packaged white light source offered by Soraa Laser Diode, Inc., California, which is substantially vacuum sealed except with two electrical pins for providing external power to drive a laser device inside the package of the white light source 3510. The laser device (not fully shown in this figure) emit a blue laser radiation for inducing a phosphor emission out of a phosphor member that is also disposed inside the package of the white light source 3510. Partial mixture of the phosphor emission, which has a wavelength longer than that of the blue laser radiation, with the blue laser radiation produces the white light emission as mentioned earlier.

The laser-based white light source 3500 further includes an optics member 3520 integrated with the pre-packaged white light source 3510 within an outer housing 3530 (which is cut in half for illustration purpose). The optics member 3520 optionally is a collimation lens configured to couple the white light emission into a section of fiber 3540. Optionally, the section of fiber 3540 is disposed with a free-space gap between an end facet and the collimation lens 3520 that is substantially optical aligned at a focus point thereof. Optionally, the section of fiber 3540 is mounted with a terminal adaptor (not explicitly shown) that is fixed with the outer housing 3530. In the embodiment, the section of fiber 3540 is a leaky fiber that allows the white light incorporated therein to leak out in radial direction through its length. The leaky fiber 3540, once the white light emission being coupled in, becomes an illuminating element that can be used for direct lighting applications.

Figure 36:
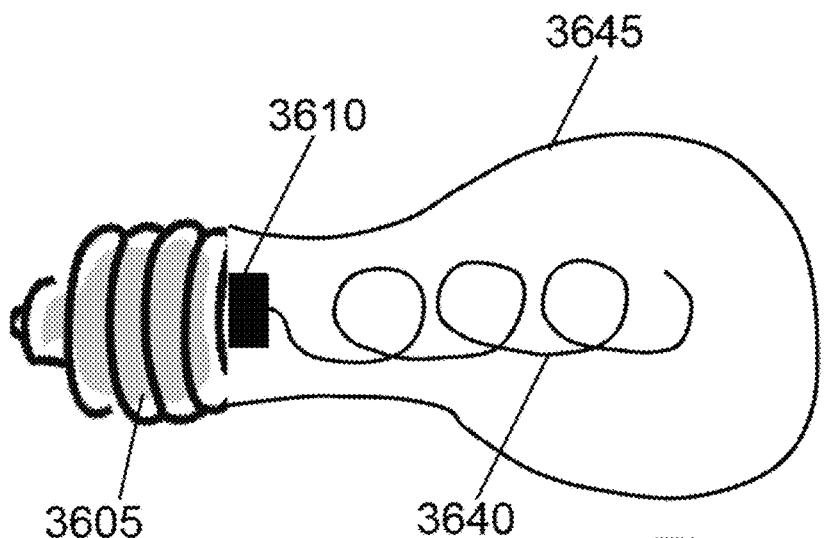
FIG. 36 is a schematic diagram of a laser-based fiber-coupled white light bulb according to an embodiment of the present invention.

FIG. 36 is a schematic diagram of a laser-based fiber-coupled white light bulb according to an embodiment of the present invention. In the embodiment, the laser-based fiber-coupled white light bulb is provided as an application of a leaky fiber in the laser-based fiber-coupled white light source described in FIG. 35. In the embodiment, a base component 3605 of the light bulb includes an electrical connection structure that has a traditional threaded connection feature, although many other connection features can also be implemented. Inside the connection structure, an AC to DC converter and/or a voltage transformer, not explicitly shown, can be included in the base component 3605 to provide a DC driving current for a laser diode mounted in a miniaturized white light emitter 3610. In the embodiment, the white light emitter 3610 includes a wavelength converting material such as a phosphor configured to generate a phosphor emission induced by a laser light emitted from the laser diode therein. The wavelength converting material is packaged together with the white light emitter 3610. The laser diode is configured to have an active region containing gallium and nitrogen element and is driven by the driving current to emit the laser light in a first wavelength in violet or blue spectrum. The phosphor emission has a second wavelength in yellow spectrum longer than the first wavelength in blue spectrum. A white light is generated by mixing the phosphor emission and the laser light and emitted out of the phosphor. In the embodiment, the wavelength converting material is packaged together with the white light emitter 3610 so that only the white light is emitted from the white light emitter 3610. The laser-based fiber-coupled white light bulb further includes a section of leaky fiber 3640 coupled to the white light emitter 3610 to receive (with certain coupling efficiency) the white light. The section of leaky fiber 3640 has a certain length wining in spiral or other shapes and is fully disposed in an enclosure component 3645 of the light bulb which is fixed to and sealed with the base component 3605. As the white light emitter 3610 is operated to emit the white light coupling into the leaky fiber 3640, the leaky fiber 3640 effectively allows the white light to leak out from outer surface of the fiber, becoming a lighting filament in a light bulb that can be used as a white light illumination source.

Figure 37:
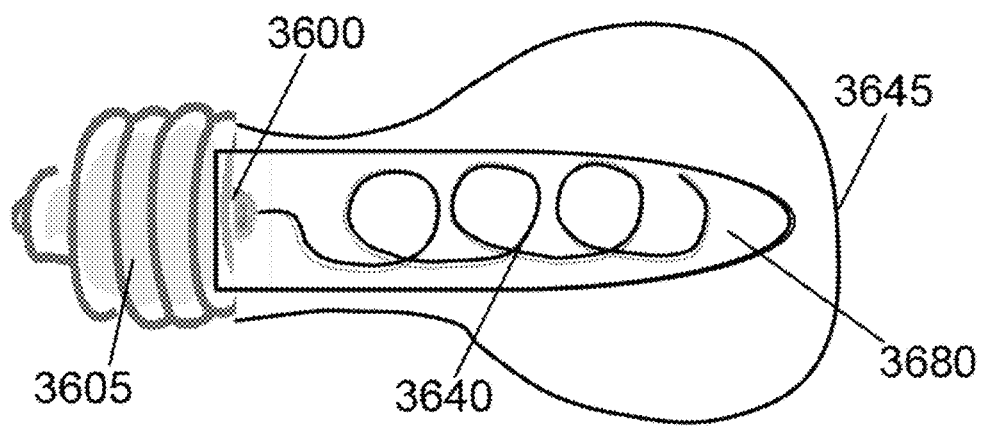
FIG. 37 is a schematic diagram of a laser light bulb according to another embodiment of the present invention.

FIG. 37 is a schematic diagram of a laser light bulb according to another embodiment of the present invention. In this embodiment, the laser light bulb includes a base component 3605 configured as an electrical connection structure, an outer threaded feature similar to one shown in FIG. 36, although other forms of the electrical connection structure can be implemented. An AC to DC converter and/or a voltage transformer are installed inside the base component 3605 to provide a driver current to a laser device 3600 installed near an output side of the base component 3605. The laser device 3600 is configured to be a laser diode having an active region containing gallium and nitrogen element and is driven by the driving current to emit a laser light of a first wavelength in blue spectrum. In the embodiment, the laser device 3600 is coupled to a fiber 3640 configured to be a leaky fiber embedded in a wavelength converting material 3680 such as a phosphor. The fiber 3640 is configured to couple the laser light emitted from the laser device 3600 into its core with a 20%, 40%, or 60% or greater coupling efficiency. As the laser device 3600 is operated to emit the laser light, the laser light that is incorporated into the fiber 3640 is leaked from the core through outer surface of the fiber 3640 into the wavelength converting material 3680. The leaked laser light is thus converted to white light emitted from the wavelength converting material 3680. In the embodiment, the fiber 3640 has a proper length winded into a certain size of the wavelength converting material 3680 which is fully disposed within an enclosure component 3645 of the laser light bulb. The white light emitted out of the wavelength converting material 3680 in the enclosure 3645, which is set to be a transparent one, just forms an illumination source for lighting application.

Figure 38:
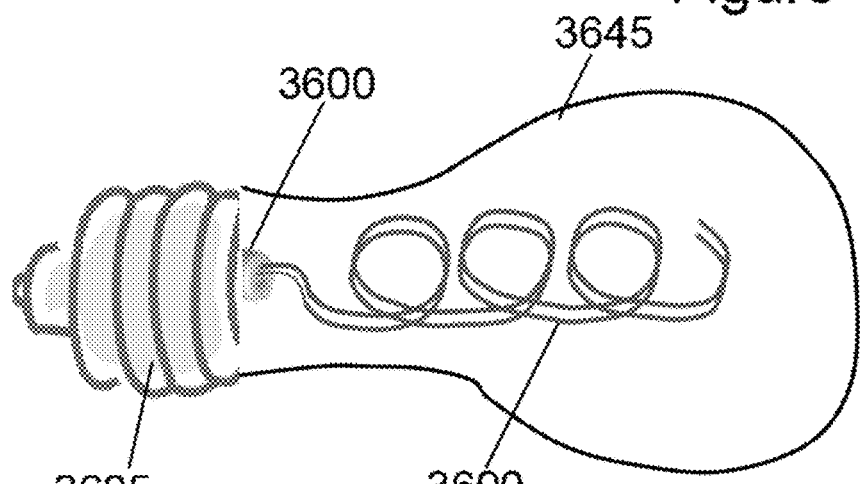
FIG. 38 is a schematic diagram of a multi-filament laser light bulb according to yet another embodiment of the present invention.

FIG. 38 is a schematic diagram of a multi-filament laser light bulb according to yet another embodiment of the present invention. As shown, laser light bulb includes a base component 3605 configured as an electrical connection structure, an outer threaded feature similar to one shown in FIG. 36, although other forms of the electrical connection structure can be implemented. An AC to DC converter and/or a voltage transformer are installed inside the base component 3605 to provide a driver current to a laser device 3600 installed near an output side of the base component

3605. The laser device 3600 is configured to be a packaged gallium and nitrogen containing laser diode and is driven by the driving current to emit a laser light of a first wavelength in blue spectrum. The output of the laser device 3600 is coupled to an input port coupled to multiple optical fibers 3690 to allow the laser light of the first wavelength to be coupled into the fibers 3690 in >20%, >40%, or >60% coupling efficiency. In the embodiment, each of the multiple optical fibers 3690 is a section of leaky fiber coated or embedded (surrounded) with a wavelength converting material such as phosphors. Again, the multiple optical fibers 3690 are all disposed within an enclosure component 3645 of the laser light bulb which is fixed and sealed with the base component 3605. As each section of leaky fiber is received a laser light, the laser light is partially leaked out from outer surface of the fiber into the wavelength converting material and is converted to white light out of outer surface of the wavelength converting material. Each fiber coated by the wavelength converting material thus becomes an illuminating filament for the laser light bulb. In an embodiment, different sections of leaky fibers are coated with different phosphor mixtures so that different (warmer or cooler) white colored light can be respectively emitted from multiple sections of leaky fibers. In the embodiment, overall light color of the laser light bulb is dictated by relative brightness of each illuminating filament based in respective section of leaky fiber and can be controlled by the coated mixtures of phosphors around the multiple sections of leaky fibers.

In all of the side pumped and transmissive and reflective embodiments of this invention the additional features and designs can be included. For example, shaping of the excitation laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated. Moreover, optical elements can be included to manipulate the generated white light. In some embodiments, reflectors such as parabolic reflectors or lenses such as collimating lenses are used to collimate the white light or create a spot light that could be applicable in an automobile headlight, flashlight, spotlight, or other lights.

In one embodiment, the present invention provides a laser-based fiber-coupled white light system. The system has a pre-packaged laser-based white light module mounted on a support member and at least one gallium and nitrogen containing laser diode devices integrated with a phosphor material on the support member. The laser diode device, driven by a driver, is capable of providing an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In a preferred embodiment the phosphor material can provide a yellowish phosphor emission in the 560 nm to 580 nm range such that when mixed with the blue emission of the laser diode a white light is produced. In other embodiments, phosphors with red, green, yellow, and even blue colored emission can be used in combination with the laser diode excitation source to produce a white light emission with color mixing in different brightness. The laser-based white light module is configured a free space with a non-guided laser beam characteristic transmitting the emission of the laser beam from the laser diode device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In other embodiments free space optics such as collimating lenses can be used to shape the beam prior to incidence on the phosphor. The beam can be characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 10 W. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the laser diode device to generate the laser beam and excite the phosphor material. The white light source configured to produce a luminous flux of greater than 1 lumen, 10 lumens, 100 lumens, 250 lumens, 500 lumens, 1000 lumens, 3000 lumens, or 10000 lumens. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

In one embodiment, a laser driver is provided in the pre-packaged laser-based white light module. Among other things, the laser driver is adapted to adjust the amount of power to be provided to the laser diode. For example, the laser driver generates a drive current based one or more pixels from the one or more signals such as frames of images, the drive currents being adapted to drive a laser diode. In a specific embodiment, the laser driver is configured to generate pulse-modulated signal at a frequency range of about 50 to 300 MHz. The driver may provide temporal modulation for applications related to communication such as LiFi free-space light communication, and/or data communications using optic fiber. Alternatively, the driver may provide temporal modulation for applications related to LiDAR remote sensing to measure distance, generate 3D images, or other enhanced 2D imaging techniques.

In certain embodiments, the pre-packaged laser-based white light module includes an electrostatic discharge (ESD) protection element. For example, an ESD protection element would be used to protect the white light module from damage that could occur with a sudden flow of current resulting from a build-up of charge. In one example, a transient voltage suppression (TVS) element is employed. In one example, a temperature sensor such as a thermistor is disposed for monitor laser device temperature. In one example, one or more photodetectors are installed for monitor optical power for safely alarming.

In certain embodiments, the pre-packaged laser-based white light module comprises a heat sink thermally coupled to the common support member. In one example the heat sink has fins or a measure for increased surface area.

In certain embodiments, the pre-packaged laser-based white light module comprises a heat spreader coupled between the common support member and the heat sink.

In certain embodiments, the pre-packaged laser-based white light module comprises an optical coupler coupled with one or more optical fibers.

In certain embodiments of the pre-packaged laser-based white light module, the laser beam emitted from the laser device therein is geometrically configured to optimize an interaction with a phosphor material.

In certain embodiments of the pre-packaged laser-based white light module, a package is hermetically sealed.

In certain embodiments of the pre-packaged laser-based white light module, the package comprises one selected from a flat package(s), surface mount packages such as SMDs, TO9 Can, TO56 Can, TO-5 can, TO-46 can, CS-Mount, G-Mount, C-Mount, micro-channel cooled package(s), and others.

In certain embodiments of the pre-packaged laser-based white light module, the emitted white light is collimated using a lens.

In certain embodiments of the laser-based fiber-coupled white light module, the waveguide device is coupled to the pre-packaged white light module via a collimation lens to capture the white light emission in a FWHM cone angle of at least 120 degrees with 20%, 40%, 60%, or 80% coupling efficiency.

In certain embodiments of the laser-based fiber-coupled white light module, the waveguide device includes an optical fiber of an arbitrary length, including a single mode fiber (SMF) or a multi-mode fiber (MMF), with core diameters ranging from about 1 μm to 10 μm, about 10 μm to 50 μm, about 50 μm to 150 μm, about 150 μm to 500 μm, about 500 μm to 1 mm, or greater than 1 mm. The optical fiber is aligned with a collimation optics member to receive the collimated white light emission with a numerical aperture about 0.05 to 0.7 in a cone angle ranging from 5 deg to 50 deg.

In certain embodiments of the laser-based fiber-coupled white light module, the waveguide device includes a leaky fiber of a certain length for distributing side-scattered light through the length.

In certain embodiments of the laser-based fiber-coupled white light module, the waveguide device includes a lensed fiber of a certain length, the lensed fiber being directly coupled with the pre-packaged white light module without extra collimation lens.

In certain embodiments of the laser-based fiber-coupled white light module, the waveguide device includes a planar waveguide formed on glass, semiconductor wafer, or other flat panel substrate.

In a specific embodiment, the present invention provides a laser-based fiber-delivered white light source. The laser based white light source includes at least one gallium and nitrogen containing laser diode and a wavelength conversion member such as a phosphor. The laser generates a first wavelength in the range of 385 nm to 495 nm and wavelength conversion member generates a second wavelength that is longer than the first wavelength. The laser beam emission generates a spot on the phosphor member to induce a phosphor-excited emission which comprises emission with a mix of the first wavelength and the second wavelength to produce a white light emission. The white light emission from the phosphor member comprises and emission pattern such as a Lambertian emission pattern.

In one embodiment, the white light emission from the laser based white light source is directly coupled into a first end of an optical fiber member. The optical fiber member may be comprised of glass fiber, a plastic optical fiber (POF), a hollow fiber, or an alternative type of multi-mode or single mode fiber member or waveguide member. The first end of the fiber may be comprised of a flat surface or could be comprised of a shaped or lensed surface to improve the input coupling efficiency of the white light into the fiber. The first end of the fiber member may be coated with an anti-reflective coating or a reflection modification coating to increase the coupling efficiency of the white light into the fiber member. The fiber or waveguide member controls the light based on step index or gradual index changes in the waveguide, refractive diffractive sections or elements, holographic sections or elements, polarization sensitive sections or elements, and/or reflective sections or elements. The fiber or waveguide is characterized by a core waveguide diameter and a numerical aperture (NA). The diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The fiber may transport the light to the end, or directional side scattering fiber to provide preferential illumination in a particular angle, or both. The fiber may include a coating or doping or phosphor integrated inside or on a surface to modify color of emission through or from fiber. The fiber may be a detachable fiber and may include a connector such as an SMA, FC and/or alternative optical connectors. The fiber may include a moveable tip mechanism on the entry or exit portion for scanning fiber input or output, where the fiber tip is moved to generate changes in the in coupling amount or color or other properties of the light, or on the output side, to produce a motion of light, or when time averaged, to generate a pattern of light.

In a preferred embodiment, the white light emission from the laser based white light source is directed through a collimating lens to reduce the divergence of the white light. For example, the divergence could be reduced from 180 degrees full angle or 120 degrees full width half maximum, as collected from the Lambertian emission to less than 12 degrees, less than 5 degrees, less than 2 degrees, or less than 1 degree. The lenses may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection (TIR) optic. Lens diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%.

The first end of the fiber may be comprised of a flat surface or could be comprised of a shaped or lensed surface to improve the input coupling efficiency of the white light into the fiber. The first end of the fiber member may be coated with an anti-reflective coating or a reflection modification coating to increase the coupling efficiency of the white light into the fiber member. The optical fiber member may be comprised of glass fiber, a plastic optical fiber (POF), or an alternative type of fiber member. The first end of the fiber may be comprised of a flat surface or could be comprised of a shaped or lensed surface to improve the input coupling efficiency of the white light into the fiber. The fiber is characterized by a core waveguide diameter and a numerical aperture (NA). The diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, and 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The fiber may transport the light to the end, or directional side scattering fiber to provide preferential illumination in a particular angle, or both. The fiber may include a coating or doping or phosphor integrated inside or on a surface to modify color of emission through or from fiber. The fiber may be a detachable fiber and may include a connector such as an SMA, FC and/or alternative optical connectors. The fiber may include a moveable tip mechanism on the entry or exit portion for scanning fiber input or output, where the fiber tip is moved to generate changes in the in coupling amount or color or other properties of the light, or on the output side, to produce a motion of light, or when time averaged, to generate a pattern of light.

In another preferred embodiment, the white light emission from the laser based white light source is directed through a collimating lens to reduce the divergence of the white light. For example, the divergence could be reduced from 120 degrees as collected from the Lambertian emission to less than 12 degrees, less than 5 degrees, less than 2 degrees, or less than 1 degree. The lenses may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection (TIR) optic. Lens diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%.

The first end of the fiber may be comprised of a flat surface or could be comprised of a shaped or lensed surface to improve the input coupling efficiency of the white light into the fiber. The first end of the fiber member may be coated with an anti-reflective coating or a reflection modification coating to increase the coupling efficiency of the white light into the fiber member. The optical fiber member may be comprised of glass fiber, a plastic optical fiber (POF), or an alternative type of fiber member. The first end of the fiber may be comprised of a flat surface or could be comprised of a shaped or lensed surface to improve the input coupling efficiency of the white light into the fiber. The fiber is characterized by a core waveguide diameter and a numerical aperture (NA). The diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, and 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%. The fiber may transport the light to the end, or directional side scattering fiber to provide preferential illumination in a particular angle, or both. The fiber may include a coating or doping or phosphor integrated inside or on a surface to modify color of emission through or from fiber. The fiber may be a detachable fiber and may include a connector such as an SMA, FC and/or alternative optical connectors. The fiber may include a moveable tip mechanism on the entry or exit portion for scanning fiber input or output, where the fiber tip is moved to generate changes in the in coupling amount or color or other properties of the light, or on the output side, to produce a motion of light, or when time averaged, to generate a pattern of light.

As describe previously, the optical fiber member may be comprised of glass fiber, a plastic optical fiber, or an alternative type of fiber member. The core or waveguide region of the fiber may have a diameter ranging from 1 um to 10 um, 10 um to 100 um, 100 um to 1 mm, 1 mm to 10 mm, or 10 mm to 100 mm. The white light emission is then transferred through the fiber to an arbitrary length depending on the application. For example, the length could range from 1 cm to 10 cm, 10 cm to 1 m, 1 m to 100 m, 100 m to 1 km, or greater than 1 km.

In one embodiment, the optical fiber member transport properties are designed to maximize the amount of light traveling from the first end of the fiber to a second end of the fiber. In this embodiment, the fiber is design for low absorption losses, low scattering losses, and low leaking losses of the white light out of the fiber. The white light exits the second end of the fiber where it is delivered to its target object for illumination. In one preferred embodiment the white light exiting the second end of the fiber is directed through a lens for collimating the white light. The lens may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection optic, e.g. TIR optic. Lens diameter ranges from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%.

Additionally, a beam shaping optic can be included to shape the beam of white light into a predetermined pattern. In one example, the beam is shaped into the required pattern for an automotive standard high beam shape or low beam shape. The beam shaping element may be a lens or combination of lenses. The lens may include reflective surfaces, step index or gradual gradient index changes in the material, refractive sections or elements, diffractive sections or elements, holographic sections or elements, polarization sensitive sections or elements, and/or reflective sections or elements including total internal reflective elements. The lens may include combination of diffractive lensing and or reflection sections, such as a total internal reflection optic, e.g. TIR optic. A beam shaping diffusers may also be used, such as a holographic diffuser. Lens and or diffuser diameter ranges from 1 um to 10 um, 10 um to 100 um, 100 um to 1 mm, 1 mm to 10 mm, or 10 mm to 100 mm. Lens shape may be non-circular, such as rectangular or oval or with an alternative shape, with one of the dimensions being from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7. Transmission ranges from 30 to 40%, 40 to 50%, 50 to 60%, 60 to 70%, 70 to 80%, 80 to 90%, and 90 to 100%.

In another embodiment, the optical fiber member is intentionally designed to be leaky such that the white light exits the fiber along its axis to produce a distributed white light source. The fiber design can include air bubbles, voids, composite materials, or other designs to introduce perturbations in the index of refraction along the axis of the waveguide to promote scattering of the white light.

In yet another preferred embodiment, the fiber can be designed allow light to leak out of the core waveguide region and into the cladding region. In some embodiments, the leaky fiber is designed to leak the white light from only certain directions from the fibers circumference. For example, the fiber may directionally leak and emit light from 180 degrees of the fibers 360 degrees circumference. In other examples, the fiber may leak and emit light from 90 degrees of the fibers 360 degrees circumference.

The leaky fiber embodiment of the fiber coupled white light invention described can fine use in many applications. One such example application using the leaky fiber as distributed light source included as day time running lights in an automobile headlight module. Additionally, the distributed light sources could be used in automotive interior lighting and tail lighting. In another application the source is used as distributed lighting for tunnels, streets, underwater lighting, office and residential lighting, industrial lighting, and other types of lighting. In another application the leaky fiber could be included in a light bulb as a filament.

In still another preferred embodiment, an electronic board may be used with the light source. It may include a section that provides initial heatsinking of the light source, with a thermal resistance of less than 1 degree Celsius per watt, or 1 to 2 degree Celsius per watt, or 2 to 3 degree Celsius per watt, or 3 to 4 degree Celsius per watt, or 4 to 5 degree Celsius per watt, or 5 to 10 degree Celsius per watt. The electronic board may provide electrical contact for anode(s) and cathode(s) of the light source. The electronic board may include a driver for light source or a power supply for the light source. The electronic board may include driver elements that provide temporal modulation for applications related to communication such as LiFi free-space light communication, and/or data communications using optic fiber. The electronic board may include driver elements that provide temporal modulation for applications related to LiDAR remote sensing to measure distance, generate 3D images, or other enhanced 2D imaging techniques. The electronic board may include sensors for SMD such as thermistor or process detectors from SMD such as photodetector signal conditioning or fiber sensors. The electronic board may be interfaced with software. The software may provide machine learning or artificial intelligent functionality. The electronic board diameter may range from 1 um to 10 um, 10 um to 100 um, 100 um to 1 mm, 1 mm to 10 mm, or 10 mm to 100 mm. The electronic board shape may be non-circular, such as rectangular or oval or with an alternative shape, with one of the dimensions being from 1 um to 10 um, 10 um to 100 um, 100 um to 1 mm, 1 mm to 10 mm, or 10 mm to 100 mm. The NA could range from 0.05 to 0.1, 0.1 to 0.2, 0.2 to 0.3, 0.3 to 0.4, 0.4 to 0.5, 0.5 to 0.6, or 0.6 to 0.7.

In still a preferred embodiment, a heatsink may be used with the light source. The heatsink may have a thermal resistance of less than 1 degree Celsius per watt, or 1 to 2 degree Celsius per watt, or 2 to 3 degree Celsius per watt, or 3 to 4 degree Celsius per watt, or 4 to 5 degree Celsius per watt, or 5 to 10 degree Celsius per watt. The heat sink may be cylindrical with a diameter that may range from 1 um to 10 um, 10 um to 100 um, 100 um to 1 mm, 1 mm to 10 mm, or 10 mm to 100 mm. The heatsink shape may be non-cylindrical with an alternative shape, with one of the dimensions being from 1 um to 10 um, 10 um to 100 um, 100 um to 1 mm, 1 mm to 10 mm, or 10 mm to 100 mm. The heatsink frame may be manufactured with lathe turning in order to provide flexible aesthetic looks from a common light source module underneath.

Additionally, a mechanical frame may be used, on which to affix the light source, optic, fiber, electronic board, or heatsink. The mechanical frame may be cylindrical with a diameter that may range from 1 um to 10 um, 10 um to 100 um, 100 um to 1 mm, 1 mm to 10 mm, or 10 mm to 100 mm. The heatsink shape may be non-cylindrical with an alternative shape, with one of the dimensions being from 1 um to 10 um, 10 um to 100 um, 100 um to 1 mm, 1 mm to 10 mm, or 10 mm to 100 mm. The mechanical frame may be manufactured with lathe turning in order to provide flexible aesthetic looks from a common light source module underneath.

Optionally, the light source may be configured with a single fiber output with collimating optic and beam pattern generator. Optionally, the light source may be configured with multiple fiber outputs, each with collimating optic and beam pattern generator. Optionally, multiple light sources may be configured to single fiber output with collimating optic and beam pattern generator. Optionally, multiple light sources may be configured to multiple fiber bundle output with collimating optic and beam pattern generator. Optionally, multiple light sources may be configured to multiple fiber bundle output, each with collimating optic and beam pattern generator. Optionally, multiple light sources with different color properties may be configured to one or more fibers to generate different color properties of emission.

While the above is a full description of the specific embodiments, various modifications, alternative constructions and equivalents may be used. Therefore, the above description and illustrations should not be taken as limiting the scope of the present invention which is defined by the appended claims.

What is claimed is:
1. A laser-based fiber-coupled white light illumination source for automobile comprising:
a white light source module having a transparent lid member for emitting a white light emission, comprising:
a laser device comprising a gallium and nitrogen containing material and configured as an excitation source, the laser device comprising an output facet configured to output a laser emission with a first wavelength ranging from 385 nm to 495 nm;
a phosphor member configured as a wavelength converter and an emitter and disposed to allow the laser emission being optically coupled to a primary surface of the phosphor member;
an angle of incidence configured between the laser emission and the primary surface of the phosphor member, the laser emission forming a spot greater than 5 µm on the primary surface of the phosphor member, the phosphor member configured to convert at least a fraction of the laser emission with the first wavelength to a phosphor emission with a second wavelength that is longer than the first wavelength; and a reflection mode characterizing the phosphor member with the white light emission emitted from a source diameter of about 0.33 mm to 0.625 mm with a total luminous flux of about 1600 lumens or greater, the white light emission being generated from at least an interaction of the laser emission with the phosphor emission emitted from the primary surface, the white light emission comprising of a mixture of wavelengths characterized by at least the second wavelength from the phosphor member; and an optics member mounted on the transparent lid member of the white light source module and configured to receive the white light emission from the primary surface of the phosphor member and to focus the white light emission to provide a focused white light emission;

a fiber configured to have a first end to couple with the optics member to capture the focused white light emission with at least 20% coupling efficiency and transport light at least partially along a fiber axis to a respective second end, the fiber being configured at least partially as a leaky fiber to form an illumination source for the automobile; and a cover extending around external edges of the white light source module and coupled to a periphery of the optics member and to a first end portion of the fiber, wherein the first end portion of the fiber extends through a first aperture of the cover and the white light source module is arranged in a second aperture of the cover so that a bottom portion of the white light source module is exposed outside the cover.

2. The white light illumination source of claim 1, wherein white light source module comprises a package in a surface-mount device (SMD) type with a form factor <60 mm.

3. The white light illumination source of claim 1, wherein the white light source module comprises a flat package.

4. The white light illumination source of claim 1, wherein the fiber comprises a glass fiber or a plastic fiber.

5. The white light illumination source of claim 1, wherein the leaky fiber is coupled with the optics member.

6. The white light illumination source of claim 1, wherein the white light emission is a Lambertian emission within a FWHM cone angle of about 120 degrees, and the focused white light emission enters into the first end of the fiber with a coupling efficiency of greater than 40%.

7. The white light illumination source of claim 1, wherein the leaky fiber comprises directional side scattering characteristics yielding preferential illumination in a range of angles off zero degrees along the length of fiber body up to 90 degrees perpendicular to the fiber body.

8. The white light illumination source of claim 7, wherein the leaky fiber comprises a light output characterized by an effective luminous flux of greater than 25 lumens.

9. The white light illumination source of claim 1, wherein the illumination source containing the leaky fiber is disposed around a front grill structure.

10. The white light illumination source of claim 1, wherein the illumination source containing the leaky fiber is disposed near front lower bumper structure or around license plate.

11. The white light illumination source of claim 1, wherein the illumination source containing the leaky fiber is configured as daytime running light around a headlight module of the automobile.

12. The white light illumination source of claim 1, wherein the leaky fiber is disposed on and/or arranged for illuminating at least one of floor board, headliner, dashboard, wheel, door panel, door handle, door entry sill, moonroof, ceiling frame, and seating.

13. A laser-based-fiber-coupled white light illumination source for a vehicle, the fiber-coupled white light illumination source comprising:

a package configured to emit a white light emission, the package comprising:

a laser device comprising a gallium and nitrogen containing material and configured as an excitation source, the laser device comprising an output facet configured to output a laser emission with a first wavelength ranging from 385 nm to 495 nm;

a phosphor member configured as a wavelength converter and an emitter and disposed to convert the laser emission to emit an electromagnetic radiation with a second wavelength longer than the first wavelength, the electromagnetic radiation is combined with the laser emission partially to generate the white light emission of at least 800 lumens;

a support member configured to support the laser device and the phosphor member;

a transparent lid member coupled to the support member and configured to allow the white light emission to pass through the transparent lid member;

an optical member mounted on the transparent lid member and configured to receive the white light emission passing through the transparent lid member and to focus the white light emission to provide a focused white light emission;

a fiber having a diameter of less than 2 mm configured to couple the focused white light emission from the optical member with at least 20% coupling efficiency and deliver the focused white light emission, wherein the fiber also is at least partially configured as a leaky fiber to scatter light partially out of fiber body arranged in a custom shape at a feature location; and a cover extending around external edges of the package and coupled to a periphery of the optical member and to a first end portion of the fiber, wherein the first end portion of the fiber extends through a first aperture of the cover and the package is arranged in a second aperture of the cover so that a bottom portion of the package is exposed outside the cover.

14. The laser-based-fiber-coupled white light illumination source of claim 13, wherein the leaky fiber is configured to provide a directional side scattering of the light via a wide angular range from greater than 0 up to 90 degrees.

15. The laser-based-fiber-coupled white light illumination source of claim 13, wherein the leaky fiber comprises a light output characterized by an effective luminous flux of greater than 25 lumens.

16. The laser-based-fiber-coupled white light illumination source of claim 13 further comprises one optical connector to connect a non-leaky fiber with the leaky fiber.

17. The laser-based-fiber-coupled white light illumination source of claim 13, wherein the leaky fiber is shaped and disposed on and/or arranged for exterior illumination applications including at least one of daytime running light, decorative light around front grill structure, around license plate, and along lower or side bumper features.

18. The laser-based-fiber-coupled white light illumination source of claim 13, wherein the leaky fiber is shaped and disposed on and/or arranged for illumination applications including at least one of decorative light in dashboard, along wheel, at door entry sill, floor board, seating, ceiling, or window.

19. A fiber-coupled white light illumination source for vehicle lighting applications comprising:
 a package having a transparent lid member for emitting a white light, the package comprising:
  a laser module electrically coupled to a vehicle power system, the laser module comprising a gallium and nitrogen containing laser chip and a driver receiving power from the vehicle power system to drive the laser chip to output a laser emission with a first wavelength ranging from 385 nm to 495 nm;
  a white light module comprising a phosphor member coupled with the laser module, the phosphor member being configured as a wavelength converter and an emitter to receive the laser emission at a primary surface of the phosphor member, the phosphor member configured to convert the laser emission to a phosphor radiation with a second wavelength longer than the first wavelength and to combine the phosphor radiation with the laser emission partially to generate the white light, the white light characterized by an emission of at least 300 lumens;
 an optical member mounted on the transparent lid member of the package and configured to receive the white light from the primary surface of the phosphor member and to focus the white light to provide a focused white light;
 a transport fiber having a diameter of 1 mm or less configured to couple the focused white light from the optical member with at least 20% coupling efficiency; and
 a cover extending around external edges of the package and coupled to a periphery of the optical member and to a first end portion of the transport fiber, wherein the first end portion of the transport fiber extends through a first aperture of the cover and the package is arranged in a second aperture of the cover so that a bottom portion of the package is exposed outside the cover;
 wherein the transport fiber is arranged to deliver light to an exterior or interior feature location of a vehicle; and
 wherein the feature location of the vehicle includes at least one of a headlight, front grill structure, license plate, lower and side bumper, dashboard, door handle and panel, entry sill, window frame, ceiling, moonroof, floor, or seat.

20. The fiber-coupled white light illumination source of claim 19, further comprising a leaky fiber coupled to the transport fiber and configured as an illumination element.

21. The fiber-coupled white light illumination source of claim 19, wherein the transport fiber includes a section of non-leaky transport fiber connected or spliced to a section of leaky fiber configured as an illumination element.

* * * * *